US008940476B2

(12) United States Patent
Yamaguchi

(10) Patent No.: US 8,940,476 B2
(45) Date of Patent: Jan. 27, 2015

(54) PATTERN FORMING METHOD, ACTINIC-RAY-SENSITIVE OR RADIATION-SENSITIVE RESIN COMPOSITION, AND RESIST FILM

(75) Inventor: Shuhei Yamaguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 153 days.

(21) Appl. No.: 13/397,358

(22) Filed: Feb. 15, 2012

(65) Prior Publication Data

US 2012/0264054 A1 Oct. 18, 2012

(30) Foreign Application Priority Data

Feb. 18, 2011 (JP) ................................ 2011-034023

(51) Int. Cl.

*G03F 7/30* (2006.01)
*G03F 7/038* (2006.01)
*G03F 7/32* (2006.01)
*G03F 7/004* (2006.01)

(52) U.S. Cl.

CPC .............. *G03F 7/0382* (2013.01); *G03F 7/038* (2013.01); *G03F 7/325* (2013.01); *G03F 7/0045* (2013.01); *G03F 7/0388* (2013.01)

USPC ..................... 430/325; 430/270.1; 430/280.1; 430/281.1; 430/285.1; 430/287.1

(58) Field of Classification Search

None

See application file for complete search history.

(56) References Cited

U.S. PATENT DOCUMENTS 4,491,628 A * 1/1985 Ito et al. ........................ 430/176
5,101,053 A * 3/1992 Boettcher ....................... 556/64
6,391,523 B1 * 5/2002 Hurditch et al. ........... 430/280.1
6,558,871 B1 * 5/2003 Takahashi et al. ......... 430/270.1
2003/0198889 A1 10/2003 Iwasa et al.
2008/0187860 A1 8/2008 Tsubaki et al.
2010/0099042 A1 * 4/2010 Ohashi et al. .............. 430/270.1
2010/0119974 A1 5/2010 Hada et al.
2010/0297541 A1 * 11/2010 Hayoz et al. ...................... 430/5
2011/0171586 A1 7/2011 Hata et al.
2011/0200936 A1 * 8/2011 Ichikawa et al. ........... 430/270.1

FOREIGN PATENT DOCUMENTS

JP 7175225 A 7/1995
JP 08-41116 A * 2/1996
JP 2002040636 A 2/2002
JP 2002207293 A 7/2002
JP 3606291 B2 1/2005
JP 2007-065353 A 3/2007
JP 2008-081470 A 4/2008
JP 2008-281975 A 11/2008
JP 2008-292975 A 12/2008
JP 2010-039483 A 2/2010
JP 2010116353 A 5/2010

OTHER PUBLICATIONS

Full English translation of JP 2002-207293 a downloaded on Nov. 16, 2013, 35 pages.*
English translation of JP,08-041116, A (1996) from machine translation from AIPN Japan Patent Office National Center for Industrial Property Information and Training, generated Nov. 16, 2013,14 pages.*
Notice of Reasons for Rejection, dated Jan. 22, 2013, issued in corresponding JP Application No. 2011-034023, 7 pages in English and Japanese.

* cited by examiner

*Primary Examiner* — Cynthia Hamilton
(74) *Attorney, Agent, or Firm* — Sughrue Mion, PLLC

(57) ABSTRACT

Provided is a pattern forming method that is excellent in resolving power such as pre-bridging dimension, a roughness performance such as line edge roughness, and development time dependency, and an actinic-ray-sensitive or radiation-sensitive resin composition and a resist film used for the pattern forming method.

The pattern forming method includes (1) forming a film using an actinic-ray-sensitive or radiation-sensitive resin composition that contains a resin (A) and a compound (B) which has a polymerizable group and generates an acid by being irradiated with actinic rays or radiations; (2) exposing the film; and (3) developing the exposed film using a developer that contains an organic solvent, wherein a pattern formed in this method is a negative pattern.

18 Claims, No Drawings

PATTERN FORMING METHOD, ACTINIC-RAY-SENSITIVE OR RADIATION-SENSITIVE RESIN COMPOSITION, AND RESIST FILM

BACKGROUND OF THE PRESENT INVENTION

1. Field of the Present Invention

The present invention relates to a pattern forming method, an actinic-ray-sensitive or radiation-sensitive resin composition, and a resist film used for the pattern forming method. More specifically, the present invention relates to a pattern forming method suitable for a production process of a semiconductor such as an IC, a production process of a circuit board of a liquid crystal, a thermal head, or the like, and other lithography processes of photofabrication, and relates to an actinic-ray-sensitive or radiation-sensitive resin composition and a resist film used for the pattern forming method. Particularly, the present invention relates to a pattern forming method suitable for the exposure performed by an ArF exposure apparatus or an ArF liquid immersion projection exposure apparatus that uses far-ultraviolet rays having a wavelength of 300 nm or less as a light source and an EUV exposure apparatus, and to an actinic-ray-sensitive or radiation-sensitive resin composition and a resist film used for the pattern forming method.

2. Description of the Related Art

Since a resist composition for a KrF excimer laser (248 nm) has been developed, a pattern forming method using chemical amplification has been used to compensate for desensitization caused by the light absorption of the resist composition. For example, in positive type chemical amplification, first, a photoacid-generating agent that is included in an exposed portion in a resist composition is degraded by being irradiated with light and generates an acid. Thereafter, in a process such as PEB (Post Exposure Bake), by the catalytic action of the generated acid, an alkali-insoluble group included in the resist composition is changed to an alkali-soluble group. Subsequently, development is performed using, for example, an alkaline solution. In this manner, the exposed portion is removed, and a desired pattern is obtained.

In the above method, various alkaline developers have been suggested, and for example, an aqueous alkaline developer such as 2.38% by mass of aqueous TMAH (tetramethylammonium hydroxide) solution is widely used.

In addition, from the viewpoint of the improvement of a pattern forming performance such as the improvement of the resolution in the above positive type chemical amplification, an attempt to provide a group degraded by an acid in the photoacid-generating agent has been made (for example, see JP3606291B). Moreover, an attempt to add a photoacid-generating agent that has a polymerizable or crosslinkable group to the resist composition has been made (for example, see JP2007-65353A, JP2008-81470A, and JP2010-39483A).

In order to miniaturize semiconductor elements, the wavelength of an exposure light source is being shortened, and a projection lens with a high numerical aperture (high NA) is being made. Currently, an exposure machine using an ArF excimer having a wavelength of 193 nm as a light source has been developed. As a technique for further improving resolving power, a method (that is, liquid immersion) of filling a liquid (also referred to as a "liquid for liquid immersion" hereinafter) having a high refractive index between a projection lens and a sample has been proposed. In addition, EUV lithography that performs exposure by using ultraviolet rays having a shorter wavelength (13.5 nm) has also been proposed.

However, in the current circumstances, it is very difficult to find out a resist composition necessary for forming a pattern that has an excellent performance overall, and an appropriate combination of a developer, a rinsing liquid, and the like. Particularly, as a resolution line width of a resist is increasingly miniaturized, the resolving power, a roughness performance of a line pattern, and development time dependency are required to be improved.

In recent years, a pattern forming method that uses a developer containing an organic solvent has been undergoing development (for example, see JP2008-281975A and JP2008-292975A). For example, JP2008-292975A discloses a pattern forming method that includes coating a resist composition of which the solubility in an alkaline developer increases and the solubility in an organic solvent developer decreases when the composition is irradiated with actinic rays or radiations onto a substrate, exposing, and developing using an organic solvent developer. According to this method, a fine pattern can be formed stably.

However, regarding the above-described composition, the resolving power, the roughness performance, and the development time dependency are required to be further improved.

SUMMARY OF THE PRESENT INVENTION

An object of the present invention is to provide a pattern forming method that is excellent in resolving power such as pre-bridging dimension, a roughness performance such as line edge roughness, and development time dependency, and to provide an actinic-ray-sensitive or radiation-sensitive resin composition and a resist film used for the pattern forming method.

In the present specification, the "pre-bridging dimension" is an index for evaluating the resolving power of the actinic-ray-sensitive or radiation-sensitive resin composition (more specifically, a resist film formed of this composition) of the present invention, and refers to minimum space dimensions in which a pattern can be formed without a bridging defect (a state where two patterns on a wafer are accidentally connected to each other by a thin resist film or the like).

The pattern forming method of the present invention that can achieve the above object includes (1) forming a film using an actinic-ray-sensitive or radiation-sensitive resin composition that contains a resin (A) and a compound (B) which has a polymerizable group and generates an acid by being irradiated with actinic rays or radiations, (2) exposing the film, and (3) developing then exposed film using a developer that contains an organic solvent, wherein a pattern formed in this method is a negative pattern.

As a preferable embodiment of the present invention, the content of the organic solvent in the developer that contains the organic solvent is 90% by mass to 100% by mass based on the total amount of the developer, and the polymerizable group of the compound (B) is an ethylenic unsaturated group, an epoxy group, an oxetane group, or a group represented by the following General Formula (ZII).

(ZII)

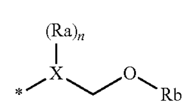

In the General Formula (ZII), X represents an oxygen atom, a nitrogen atom, or an aromatic group having a valency of (n+2), and each of Ra and Rb independently represents a hydrogen atom or a monovalent organic group.

n represents an integer of 0 to 6. In a case that X is an oxygen atom, n is 0; in a case that X is a nitrogen atom, n is 1; and in a case that X is an aromatic group having a valency of (n+2), n is an integer of 0 to 6. * represents a direct link.

As another preferable embodiment of the present invention, the compound (B) is a compound having, as the polymerizable group, a (meth)acrylate group, an epoxy group, or a group represented by the General Formula (ZII), the compound (B) is an onium salt, the resin (A) is a resin which increases the polarity by the action of an acid to decrease the solubility of the resin in a developer containing an organic solvent, and the resin (A) has a polymerizable group.

The present invention includes an actinic-ray-sensitive or radiation-sensitive resin composition that is used for the pattern forming method described above.

As a preferable embodiment of the present invention, the polymerizable group of the compound (B) is a (meth)acrylate group, an epoxy group, or a group represented by the following General Formula (ZII).

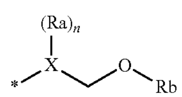

(ZII)

In the General Formula (ZII), X represents an oxygen atom, a nitrogen atom, or an aromatic group having a valency of (n+2), and each of Ra and Rb independently represents a hydrogen atom or a monovalent organic group.

n represents an integer of 0 to 6. In a case that X is an oxygen atom, n is 0; in a case that X is a nitrogen atom, n is 1; and in a case that X is an aromatic group having a valency of (n+2), n is an integer of 0 to 6. * represents a direct link.

As another preferable embodiment of the present invention, the resin (A) further includes a polymerizable group.

Here, the polymerizable group of the compound (B) and the polymerizable group of the resin (A) may be the same as or different from each other.

The present invention includes a resist film formed of the actinic-ray-sensitive or radiation-sensitive resin composition described above.

As a more preferable embodiment of the pattern forming method of the present invention, a non-nucleophilic anion of the compound (B) has the polymerizable group, the actinic-ray-sensitive or radiation-sensitive resin composition further contains a hydrophobic resin, the exposing in (2) is liquid immersion exposure, the developer is a developer containing at least one kind of organic solvent selected from a group consisting of a ketone-based solvent, an ester-based solvent, an alcohol-based solvent, an amide-based solvent, and an ether-based solvent, and the pattern forming method further includes (4) washing using a rinsing liquid containing an organic solvent.

As another preferable embodiment of the actinic-ray-sensitive or radiation-sensitive resin composition of the present invention, the non-nucleophilic anion of the compound (B) has the polymerizable group, and the composition is a chemical amplification type resist composition for organic solvent development or is for liquid immersion development.

According to the present invention, a pattern forming method that is excellent in resolving power such as pre-bridging dimension, a roughness performance such as line edge roughness, and development time dependency, and an actinic-ray-sensitive or radiation-sensitive resin composition and a resist film used for the pattern forming method can be provided.

DESCRIPTION OF THE PREFERRED EMBODIMENTS

Hereinafter, the embodiments of the present invention will be described in detail.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

The term "actinic ray" or "radiation" in this specification refers to, for example, a bright line spectrum of a mercury lamp, far-ultraviolet rays represented by an excimer laser, extreme ultraviolet (EUV) rays, X-rays, or an electron beam (EB). In addition, the term "light" in this specification refers to the actinic rays or the radiations.

Unless otherwise specifically indicated, the term "exposure" in this specification includes not only the exposure performed using a mercury lamp, far-ultraviolet rays represented by an excimer laser, extreme-ultraviolet rays, X-rays, EUV rays, and the like, but also drawing (lithography) performed using a particle beam such as an electron beam or an ion beam. In the following description, "(from) xx to yy" means that it includes numerical values designated by "xx" and "yy" as a lower limit and an upper limit, respectively.

The pattern forming method of the present invention includes (1) forming a film using an actinic-ray-sensitive or radiation-sensitive resin composition that contains a resin (A) and a compound (B) which has a polymerizable group and generates an acid by being irradiated with actinic rays or radiations, (2) exposing the film, and (3) developing the exposed film using a developer that contains an organic solvent, wherein a pattern formed in this method is a negative pattern.

Herein, the term "negative" refers to a phenomenon in which the solubility of the composition (more specifically, a resist film formed of the composition) in a developer decreases when the composition is exposed, and the exposed portion remains after development, whereby a pattern is formed.

The reason why the resolving power such as pre-bridging dimension, the roughness performance such as line edge roughness, and the development time dependency may be improved by the pattern forming method of the present invention is unclear. However, the reason is assumed to be as follows. That is, since the compound (B) as an acid-generating agent has a polymerizable group, the compound (B) forms a polymer by being polymerized in a resist film due to exposure, whereby the solubility of the resist film in an organic solvent can be decreased. As a result, while the resist film is dissolved in the organic solvent in an unexposed portion, the resist film is inhibited from being dissolved in the organic solvent in an exposed portion. Consequently, presumably, dissolution contrast between the exposed portion and the unexposed portion in the organic solvent increases, whereby the resolving power such as pre-bridging dimension of the resist film increases.

In order to obtain various performances required for a chemical amplification type resist film, it is important for the acid-generating agent included in the film to be evenly dispersed in the resist film. This is because resist performances are like to be negatively influenced if the acid-generating agent is unevenly dispersed in the resist film. However, generally, while the acid-generating agent (for example, an ionic acid-generating agent) exhibits low hydrophobicity, the resist film exhibits high hydrophobicity since the resist film contains a resin as a main component, for example. Consequently, there is a tendency for the acid-generating agent to not be evenly dispersed in the resist film, and the acid-generating agent aggregates in some cases.

When the hydrophobicity of the acid-generating agent is heightened to evenly disperse the acid-generating agent in the resist film, the above-described negative influence which is caused when the acid-generating agent is insufficiently dispersed in the resist film can be reduced. On the other hand, the dissolution of the exposed portion of the resist film in an organic solvent is promoted, which leads to a concern that dissolution contrast will be reduced.

However, in a case of the acid-generating agent (compound (B)) used in the present invention, the compound (B) is polymerized in the resist film and forms a polymer, whereby the solubility of the resist film in an organic solvent can be reduced. Accordingly, even if the hydrophobicity of the acid-generating agent (compound (B)) is heightened so as to evenly disperse the acid-generating agent in the resist film, the solubility of the resist film after polymerization can be reduced compared to the solubility of the resist film before polymerization.

For the above reasons, according to the pattern forming method of the present invention, strong dissolution contrast between an exposed portion and an unexposed portion with respect to an organic solvent is obtained, and the negative influence caused when the acid-generating agent (compound (B)) is unevenly dispersed in the resist film can be inhibited. Accordingly, it is considered that not only the resolving power such as pre-bridging dimension but also the roughness performances such as line edge roughness can be improved.

Moreover, by forming a pattern on the resist film containing the compound (B) by using a developer containing an organic solvent, the development time dependency of the obtained pattern size is also improved, even though the reason is unclear.

In the pattern forming method of the present invention, the developer is preferably a developer containing at least one kind of organic solvent selected from a group consisting of a ketone-based solvent, an ester-based solvent, an alcohol-based solvent, an amide-based solvent, and an ether-based solvent.

The pattern forming method of the present invention preferably further includes (4) washing using a rinsing liquid containing an organic solvent.

The rinsing liquid is preferably a rinsing liquid containing at least one kind of organic solvent selected from a group consisting of a hydrocarbon-based solvent, a ketone-based solvent, an ester-based solvent, an alcohol-based solvent, an amide-based solvent, and an ether-based solvent.

The pattern forming method of the present invention preferably includes (5) heating after (2) exposing.

The resin (A) in the pattern forming method of the present invention may be a resin which increases the polarity by the action of an acid to increase the solubility in an alkaline developer, and the pattern forming method of the present invention may further includes (6) developing using an alkaline developer.

In the pattern forming method of the present invention, the (3) exposing may be performed a plurality of times.

In the pattern forming method of the present invention, the (5) heating may be performed a plurality of times.

The resist film of the present invention is a film that is formed of the actinic-ray-sensitive or radiation-sensitive resin composition. For example, the resist film is a film formed by coating the actinic-ray-sensitive or radiation-sensitive resin composition onto a substrate.

Hereinafter, the actinic-ray-sensitive or radiation-sensitive resin composition usable in the present invention will be described.

In addition, the present invention also includes the actinic-ray-sensitive or radiation-sensitive resin composition described below.

The actinic-ray-sensitive or radiation-sensitive resin composition according to the present invention contains the resin (A) and the compound (B) which has a polymerizable group and generates an acid by being irradiated with actinic rays or radiations. The actinic-ray-sensitive or radiation-sensitive resin composition may optionally further contain at least one of (C) a solvent, (D) a hydrophobic resin, (E) a basic compound, (F) a surfactant, (G) a crosslinking agent, and (H) other additives. Hereinafter, the respective components will be described in order.

[1] Resin (A)

The resin (A) in the present invention can be used without particular limitation so long as the resin is dissolved in a developer before being irradiated with actinic rays or radiations. The resin (A) is preferably a resin (hereinafter, also referred to as an "acid-degradable resin" or an "acid-degradable resin (A)") which increases the polarity by the action of an acid to decrease the solubility in a developer containing an organic solvent. The acid-degradable resin (A) is preferably a resin that has a structure (hereinafter, also referred to as an "acid-degradable group") protected with an elimination group in which a polar group is degraded and eliminated by the action of an acid.

Examples of the acid-degradable resin (A) include a resin that has an acid-degradable group in a main chain or a side chain of the resin or in both the main and side chains of the resin.

The acid-degradable resin (A) is also a resin of which the polarity increases due to the action of an acid and the solubility in an alkaline developer increases.

The polar group is not particularly limited so long as the polar group is a group that is poorly-soluble or insoluble in a developer containing an organic solvent. Examples of the polar group include an acidic group (a group dissociated in 2.38% by mass of an aqueous tetramethylammonium hydroxide solution which has been used as a resist developer in the related art) such as a carboxyl group or a sulfonic acid group, an alcoholic hydroxyl group, and the like.

The alcoholic hydroxyl group is a hydroxyl group that is bonded to a hydrocarbon group, and refers to a hydroxyl group other than a hydroxyl group (phenolic hydroxyl group) that is directly bonded to an aromatic ring. This alcoholic hydroxyl group does not include an aliphatic alcohol (for example, a fluorinated alcohol group (a hexafluoroisopropanol group or the like)) in which an α-position has been substituted with an electron-attracting group such as a fluorine atom, as an acid group. The alcoholic hydroxyl group is preferably a hydroxyl group having a pKa of 12 to 20.

As the acid-degradable group, groups obtained by substituting a hydrogen atom of the groups described above with a group eliminated by an acid are preferable.

Examples of the group eliminated by an acid include $-C(R_{36})(R_{37})(R_{38})$, $-C(R_{36})(R_{37})(OR_{39})$, $-C(R_{01})(R_{02})(OR_{39})$, and the like.

In the above general formulae, each of $R_{36}$ to $R_{39}$ independently represents an alkyl group, a cycloalkyl group, an aryl group, an aralkyl group, or an alkenyl group. $R_{36}$ and $R_{37}$ may form a ring by binding to each other.

Each of $R_{01}$ and $R^{02}$ independently represents a hydrogen atom, an alkyl group, a cycloalkyl group, an aryl group, an aralkyl group, or an alkenyl group.

The alkyl group of $R_{36}$ to $R_{39}$ and $R_{01}$ and $R_{02}$ is desirably an alkyl group having 1 to 8 carbon atoms, and examples thereof include a methyl group, an ethyl group, a propyl group, an n-butyl group, a sec-butyl group, a hexyl group, an octyl group, and the like.

The cycloalkyl group of $R_{36}$ to $R_{39}$ and $R_{01}$ and $R_{02}$ may be monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, a cyclooctyl group, and the like. The polycyclic cycloalkyl group is preferably a cycloalkyl group having 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclododecyl group, an androstanyl group, and the like. In addition, at least one carbon atom in the cycloalkyl group may be substituted with a hetero atom such as an oxygen atom.

The aryl group of $R_{36}$ to $R_{39}$ and $R_{01}$ and $R_{02}$ is preferably an aryl group having 6 to 10 carbon atoms, and examples thereof include a phenyl group, a naphthyl group, an anthryl group, and the like.

The aralkyl group of $R_{36}$ to $R_{39}$ and $R_{01}$ and $R_{02}$ is preferably an aralkyl group having 7 to 12 carbon atoms, and examples thereof include a benzyl group, a phenethyl group, a naphthylmethyl group, and the like.

The alkenyl group of $R_{36}$ to $R_{39}$ and $R_{01}$ and $R_{02}$ is preferably an alkenyl group having 2 to 8 carbon atoms, and examples thereof include a vinyl group, an allyl group, a butenyl group, a cyclohexenyl group, and the like.

The ring that $R_{36}$ and $R_{37}$ form by binding to each other is preferably a (monocyclic or polycyclic) cycloalkyl group. As the cycloalkyl group, a monocyclic cycloalkyl group such as a cyclopentyl group or a cyclohexyl group, and a polycyclic cycloalkyl group such as a norbornyl group, a tetracyclodecanyl group, a tetracyclododecanyl group or an adamantyl group are preferable. A monocyclic cycloalkyl group having 5 to 6 carbon atoms is more preferable, and a monocyclic cycloalkyl group having 5 carbon atoms is particularly preferable.

As a repeating unit having an acid-degradable group, which can be contained in the resin (A), the repeating unit represented by the following General Formula (AI) is preferable.

(AI)

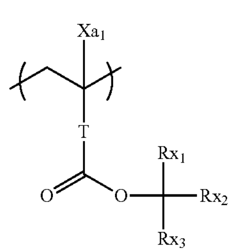

In General Formula (AI), $Xa_1$ represents a hydrogen atom, a methyl group which may have a substituent, or a group represented by —$CH_2$—$R_9$. $R_9$ represents a hydrogen atom or a monovalent organic group. Examples of the monovalent organic group include an alkyl group having 5 or less carbon atoms and an acyl group having 5 or less carbon atoms. An alkyl group having 3 or less carbon atoms is preferable, and a methyl group is more preferable. $Xa_1$ preferably represents a hydrogen atom, a methyl group, a trifluoromethyl group, or a hydroxymethyl group.

T represents a single bond or a divalent linking group.

Each of $Rx_1$ to $Rx_3$ independently represents a (linear or branched) alkyl group or a (monocyclic or polycyclic) cycloalkyl group.

Two out of $Rx_1$ to $Rx_3$ may form a (monocyclic or polycyclic) cycloalkyl group by binding to each other.

Examples of the divalent linking group of T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group of $Rx_1$ to $Rx_3$ is preferably a methyl group, an ethyl group, an n-propyl group, an isopropyl group, an n-butyl group, an isobutyl group, or a t-butyl group having 1 to 4 carbon atoms.

The cycloalkyl group of $Rx_1$ to $Rx_3$ is preferably a monocyclic cycloalkyl group such as a cyclopentyl group or a cyclphexyl group, or a polycyclic cycloalkyl group such as a norbornyl group, a tetracyclodecanyl group, a tetracyclododecanyl group, or an adamantyl group.

The cycloalkyl group that two out of $Rx_1$ to $Rx_3$ form by binding to each other is preferably a monocyclic cycloalkyl group such as a cyclopentyl group or a cyclphexyl group, or a polycyclic cycloalkyl group such as a norbornyl group, a tetracyclodecanyl group, a tetracyclododecanyl group, or an adamantyl group. A monocyclic cycloalkyl group having 5 to 6 carbon atoms is particularly preferable.

As a preferable embodiment, $Rx_1$ is a methyl group or an ethyl group, and $Rx_2$ to $Rx_3$ form the above-described cycloalkyl group by binding to each other.

The respective groups described above may have a substituent, and examples of the substituent include an alkyl group (having 1 to 4 carbon atoms), a halogen atom, a hydroxyl group, an alkoxy group (having 1 to 4 carbon atoms), a carboxyl group, an alkoxycarbonyl group (having 2 to 6 carbon atoms), and the like. The substituent preferably has 8 or less carbon atoms.

The resin (A) may contain two or more kinds of repeating units having an acid-degradable group. If this configuration is employed, the reactivity of the resin (A) and/or the developability of the resist film can be finely adjusted, and various performances are easily optimized.

When the resin (A) contains the repeating unit having an acid-degradable group, the total content of the repeating unit having an acid-degradable group is preferably in a range of from 20 mol % to 80 mol %, and more preferably in a range of from 30 mol % to 70 mol %, based on all repeating units in the resin.

Specific preferable examples of the repeating unit having an acid-degradable group will be shown below, but the present invention is not limited thereto.

In the specific examples, Rx and $Xa_1$ represent a hydrogen atom, $CH_3$, $CF_3$, or $CH_2OH$. Each of Rxa and Rxb represents an alkyl group having 1 to 4 carbon atoms. Z represents a substituent including a polar group, and when there is a plurality of Zs, the plural Zs may be the same as or different form each other. p represents 0 or a positive integer. Specific and preferable examples of Z are the same as the specific and preferable examples of $R_{10}$ in General Formula (2-1) described later.
1
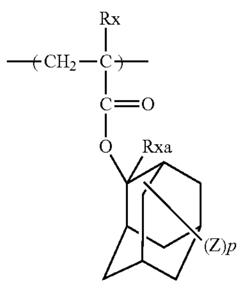
2
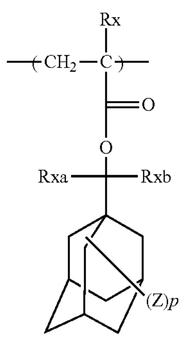
3
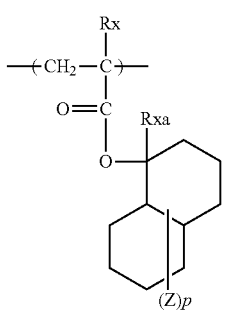
4
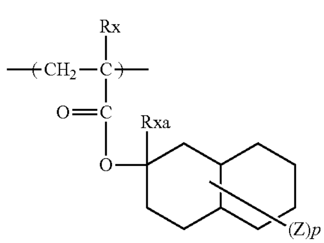
5
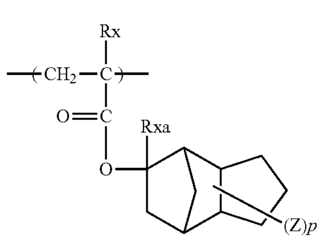
-continued
6
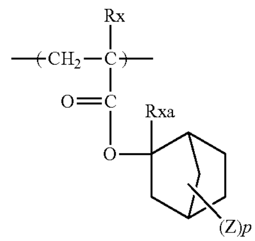
7
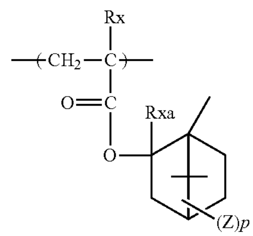
8
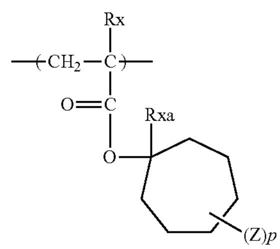
9
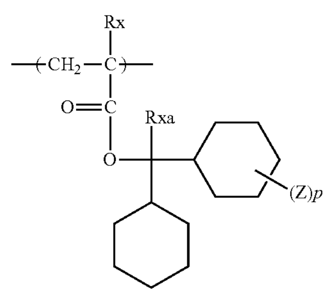
10
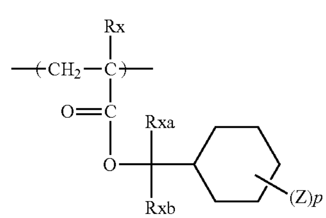
11
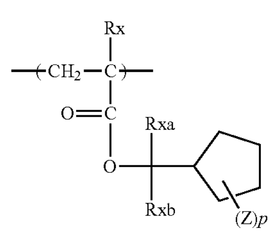

-continued
12
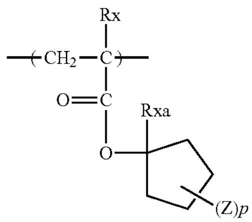
13
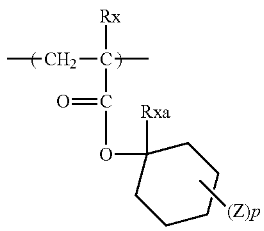
14
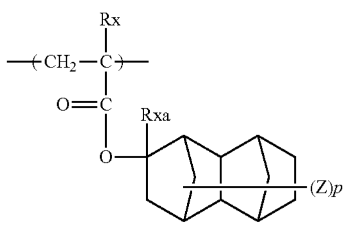
15
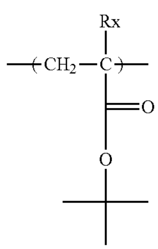
16
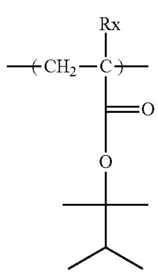
17
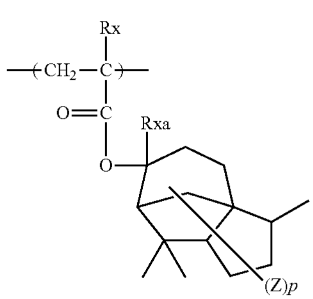
-continued
18
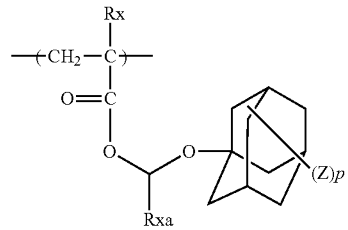
19
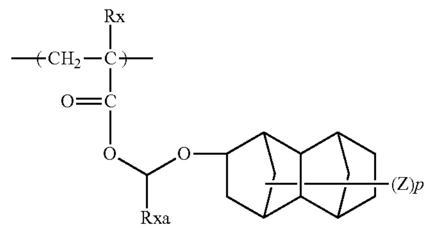
20
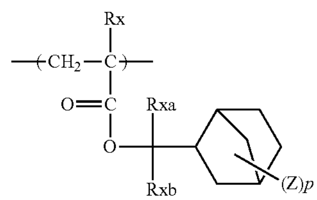
21
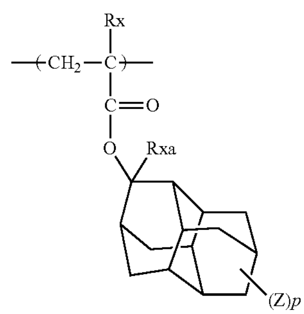
22
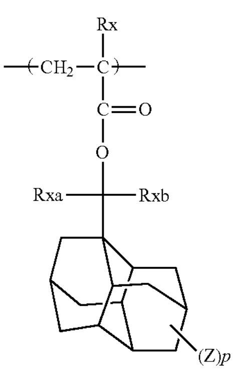
23
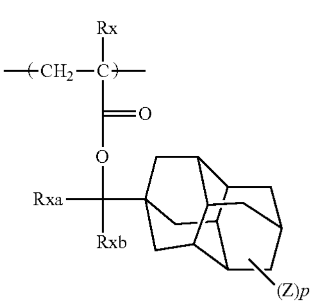

-continued
24
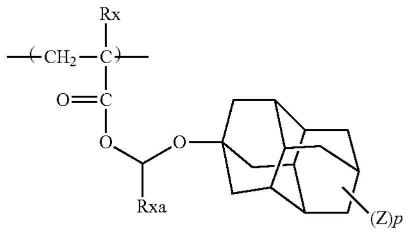
25
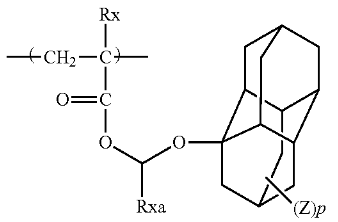
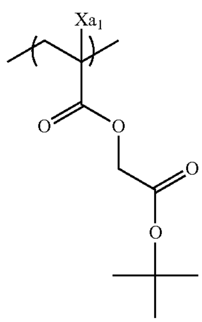
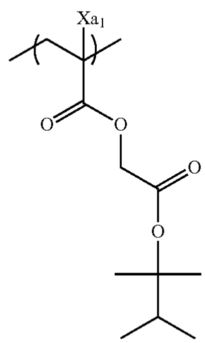
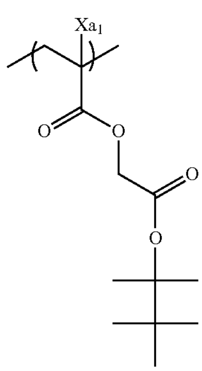
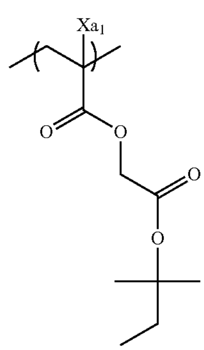
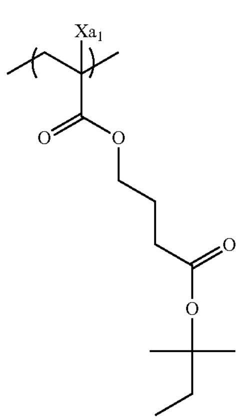
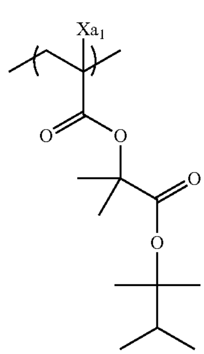
-continued
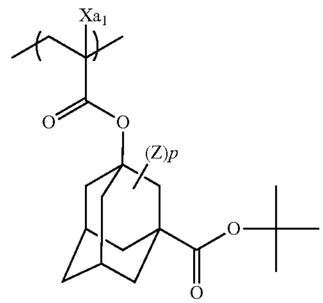
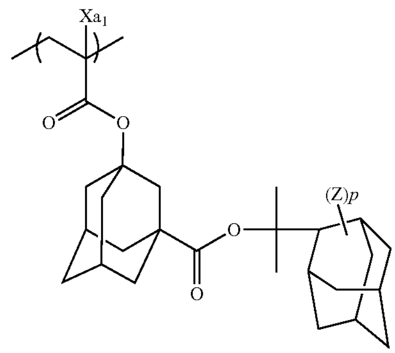
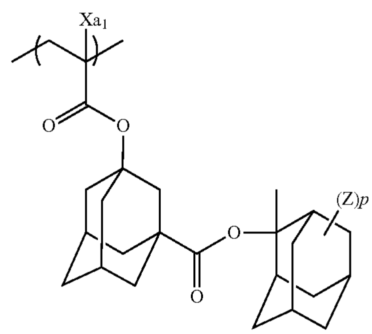
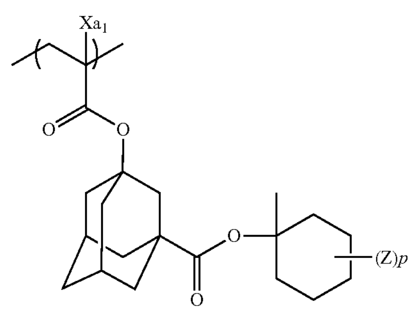
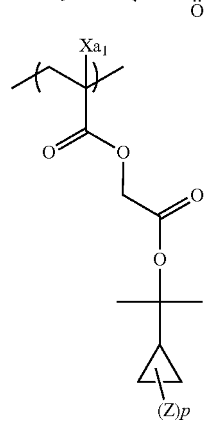
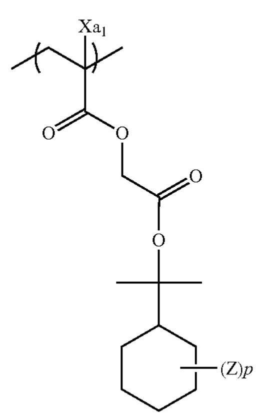

-continued
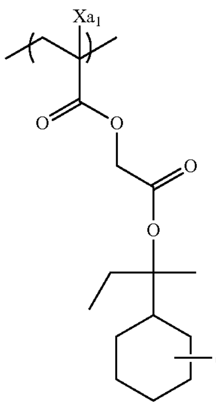
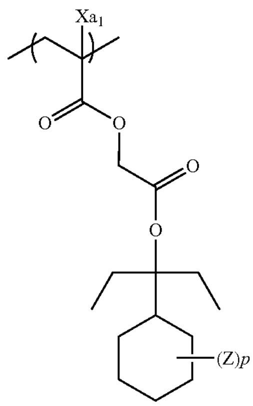
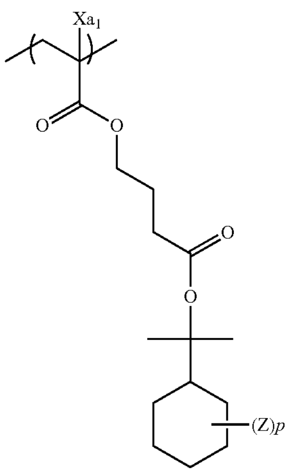
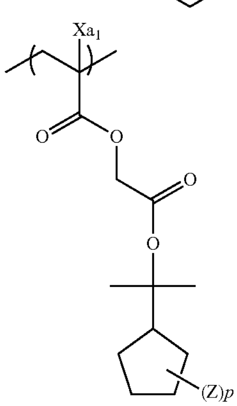
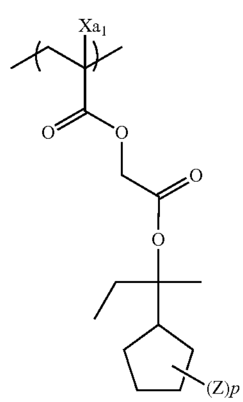
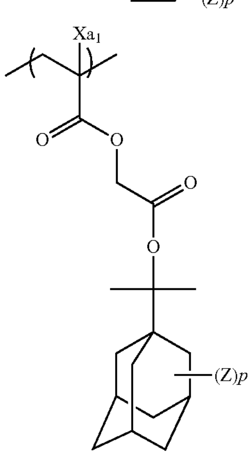
-continued
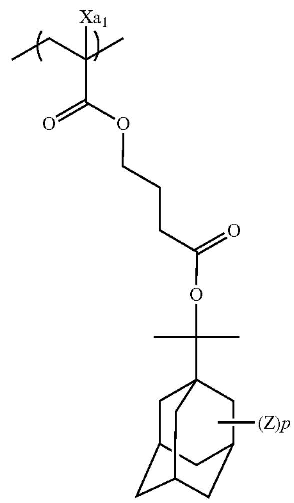
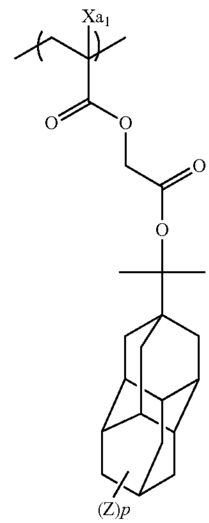
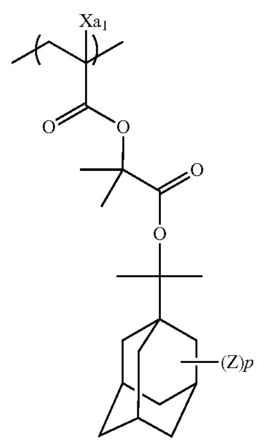
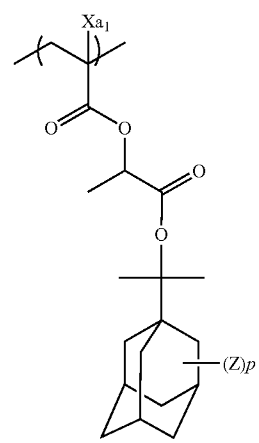
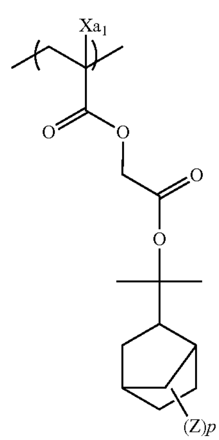
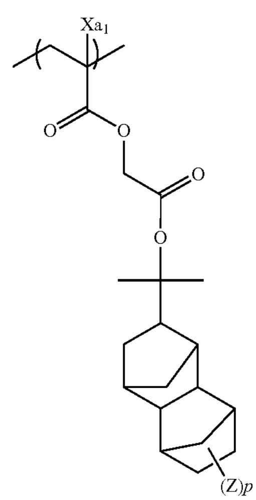

-continued
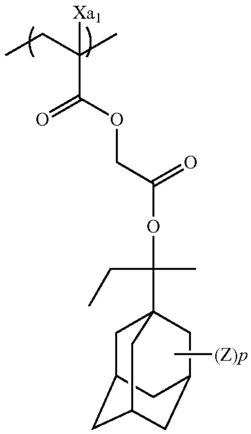
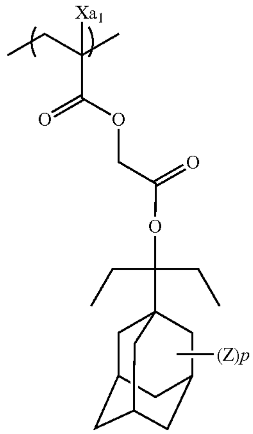
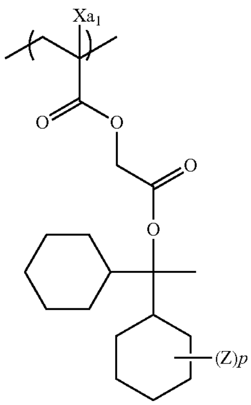
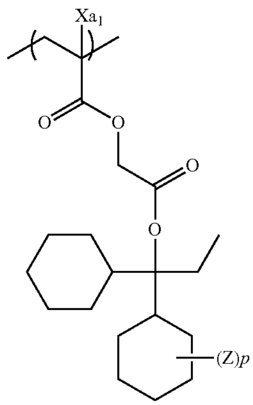
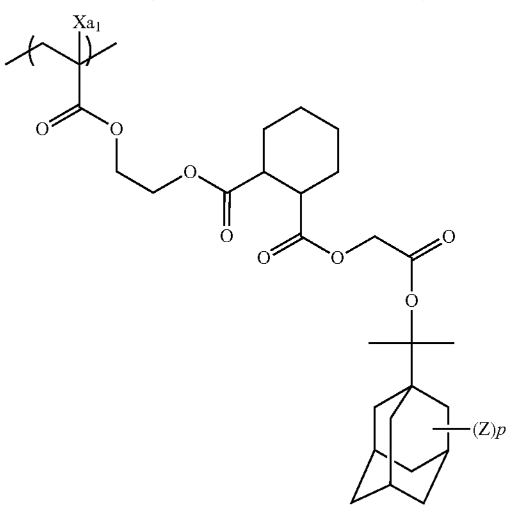
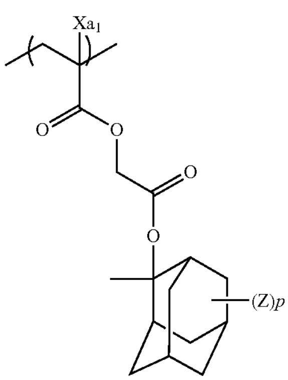
-continued
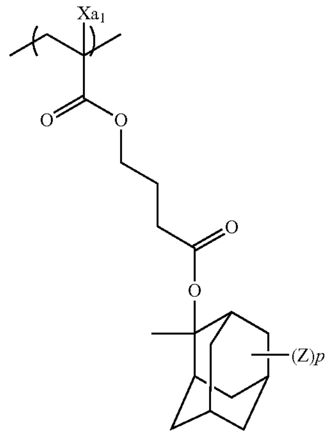
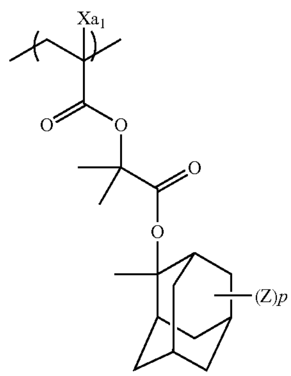
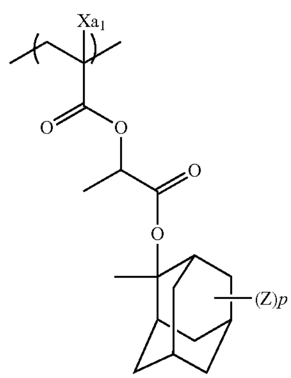
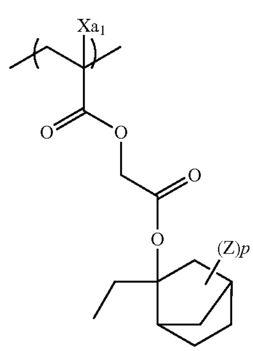

-continued

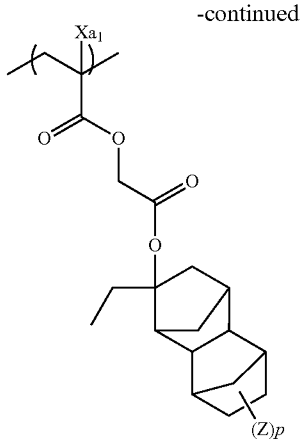

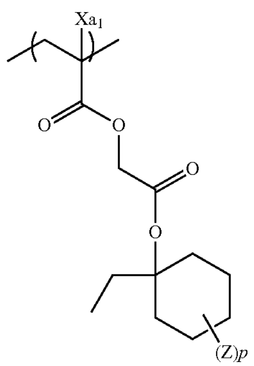

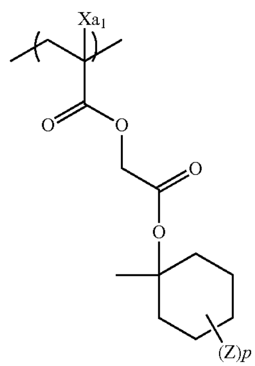

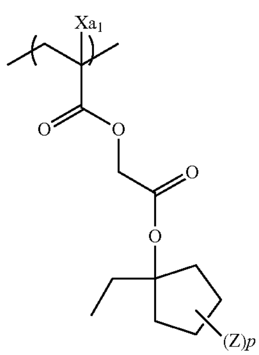

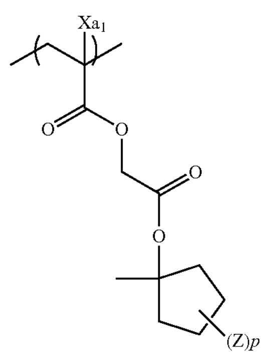

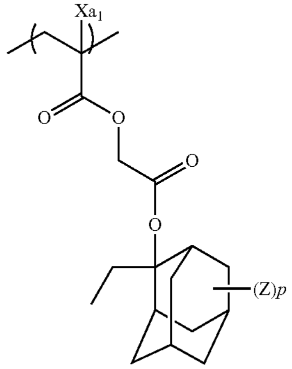

-continued

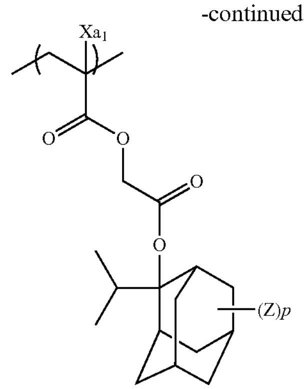

The resin (A) is more preferably a resin that has at least one of the repeating unit represented by General Formula (1) and the repeating unit represented by General Formula (2), as the repeating unit represented by General Formula (AI).

(1)

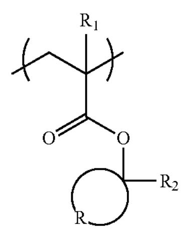

(2)

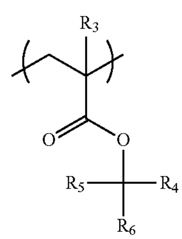

In General Formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$, and $R_6$ independently represents an alkyl group or a cycloalkyl group.

R represents an atomic group that is necessary for forming an alicyclic structure with a carbon atom.

$R_1$ and $R_3$ preferably represent a hydrogen atom, a methyl group, a trifluoromethyl group, or a hydroxymethyl group. Specific and preferable examples of the monovalent organic group in $R_9$ are the same as those described for $R_9$ of General Formula (AI).

The alkyl group in $R_2$ may be linear or branched, and may have a substituent.

The cycloalkyl group in $R_2$ may be monocyclic or polycyclic, and may have a substituent.

$R_2$ is preferably an alkyl group, more preferably an alkyl group having 1 to 10 carbon atoms, and even more preferably an alkyl group having 1 to 5 carbon atoms. Examples of the alkyl group include a methyl group and an ethyl group.

R represents an atomic group necessary for forming an alicyclic structure with a carbon atom. The alicyclic structure that R forms with a carbon atom is preferably a monocyclic alicyclic structure, and this monocyclic alicyclic structure preferably has 3 to 7 carbon atoms, and more preferably has 5 or 6 carbon atoms.

The alkyl group in $R_4$, $R_5$, and $R_6$ may be linear or branched, and may have a substituent. The alkyl group is preferably a methyl group, an ethyl group, an n-propyl group, an isopropyl group, an n-butyl group, an isobutyl group, a t-butyl group, or the like having 1 to 4 carbon atoms.

The cycloalkyl group in $R_4$, $R_5$, and $R_6$ may be monocyclic or polycyclic, and may have a substituent. The cycloalkyl group is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

Examples of the repeating unit represented by General Formula (1) include a repeating unit represented by the following General Formula (1-a).

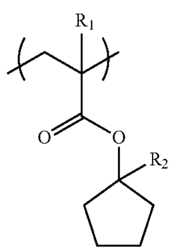

(1-a)

In the formula, $R_1$ and $R_2$ have the same definition as that of the respective $R_1$ and $R_2$ in General Formula (1).

The repeating unit represented by General Formula (2) is preferably the repeating unit represented by the following General Formula (2-1).

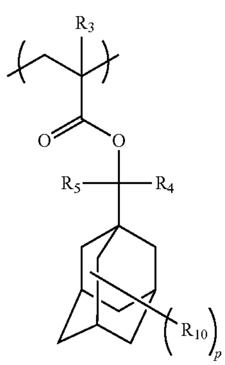

(2-1)

In Formula (2-1), each of $R_3$ to $R_5$ has the same definition as that in General Formula (2).

$R_{10}$ represents a substituent including a polar group. When there is a plurality of $R_{10}$s, $R_{10}$s may be the same as or different from each other. Examples of the substituent including a polar group include a hydroxyl group, a cyano group, an amino group, an alkylamide group, and a sulfonamide group itself, or linear or branched alkyl group and cycloalkyl group having at least one of the above groups. The substituent is preferably an alkyl group having a hydroxyl group, and more preferably a branched alkyl group having a hydroxyl group. As the branched alkyl group, an isopropyl group is particularly preferable.

p represents an integer of 0 to 15. p is preferably 0 to 2, and more preferably 0 or 1.

The resin (A) is more preferably a resin that includes at least one of the repeating unit represented by General Formula (1) and the repeating unit represented by General Formula (2), as the repeating unit represented by General Formula (AI). In addition, as another embodiment, the resin (A) is more preferably a resin that includes at least two kinds of the repeating units represented by General Formula (1), as the repeating unit represented by General Formula (AI).

The repeating unit of the resin (A) that has an acid-degradable group may be used alone, or two or more kinds of the repeating unit may be concurrently used. As combinations in case of the concurrent use, the following ones are preferable. In the following formulae, each R independently represents a hydrogen atom or a methyl group.

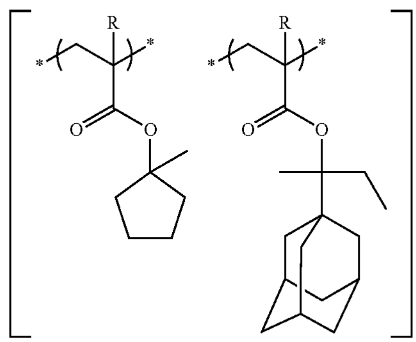

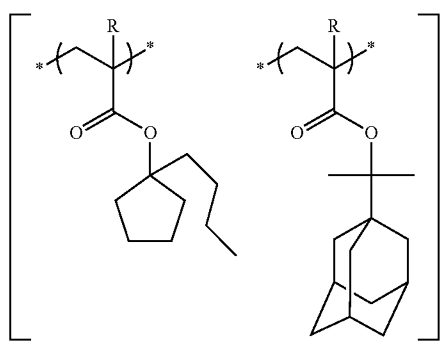

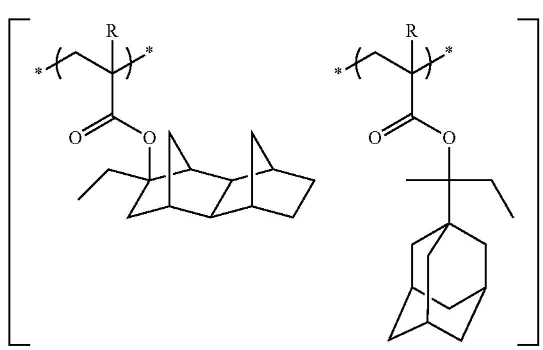

-continued
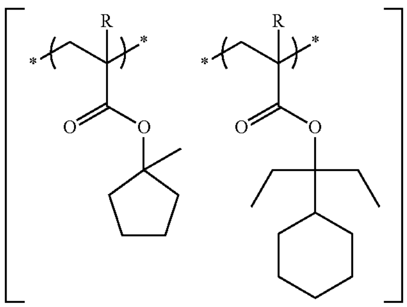
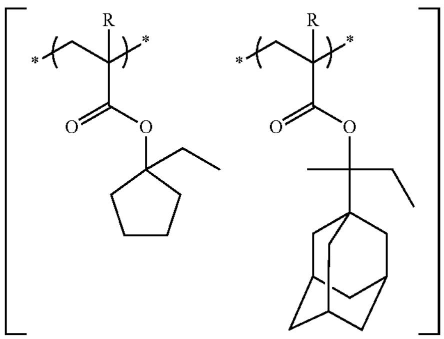
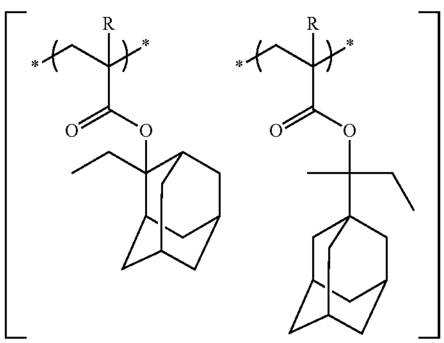
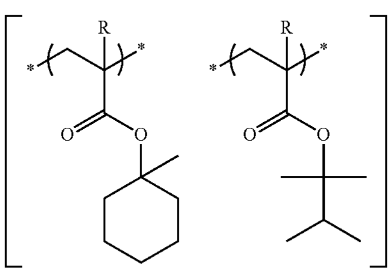
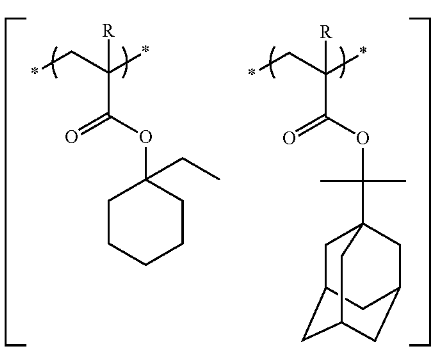
-continued
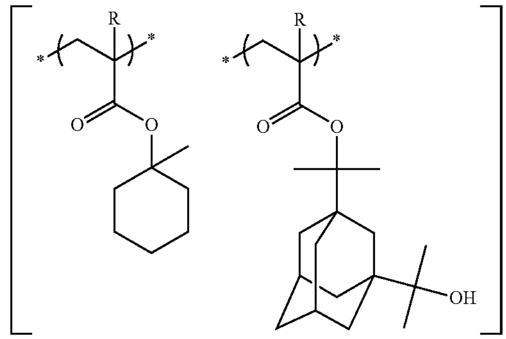
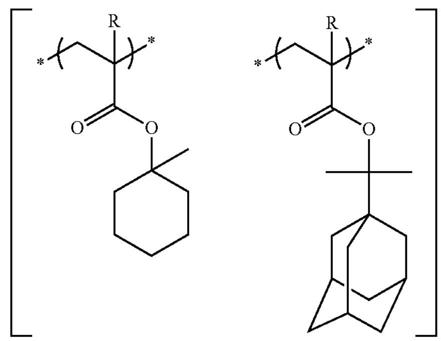
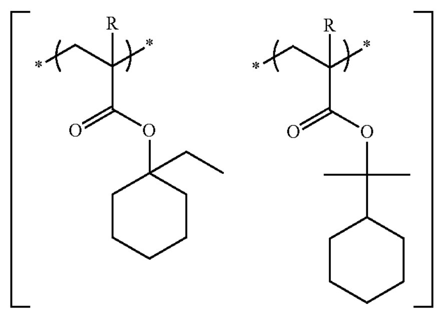
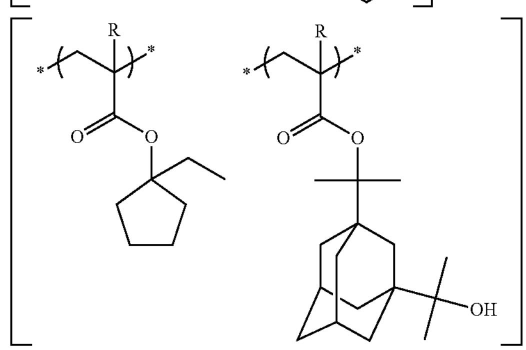
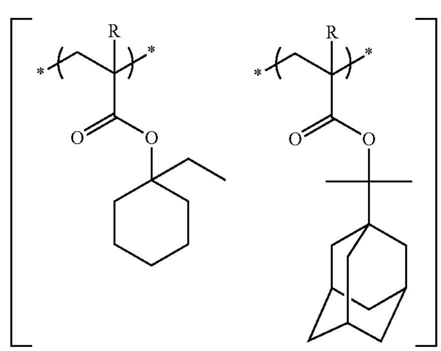

-continued
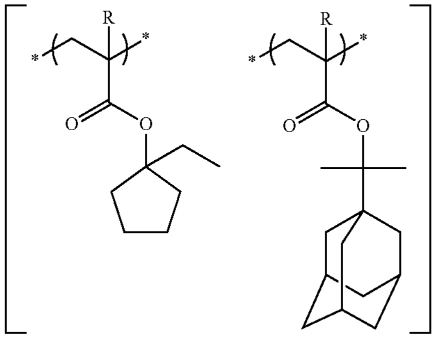
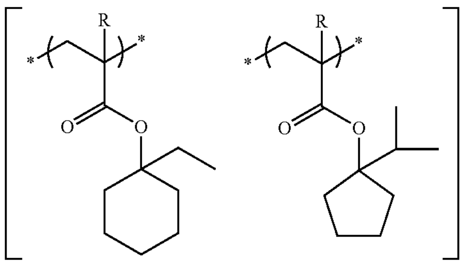
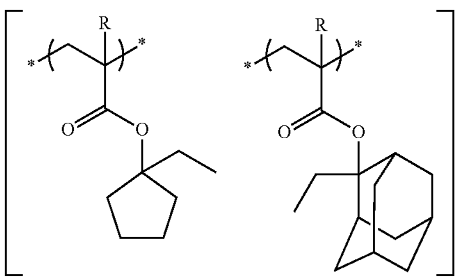
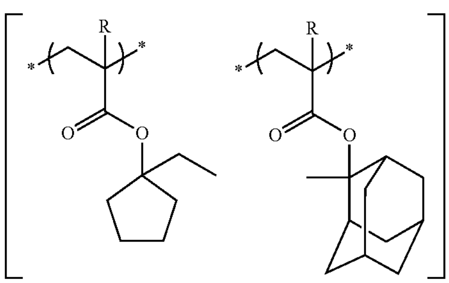
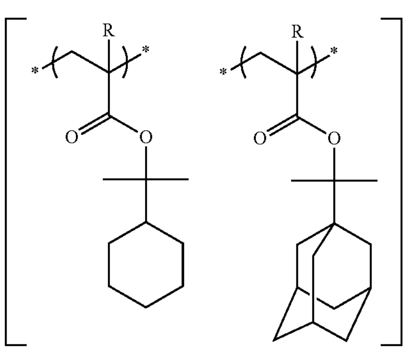
-continued
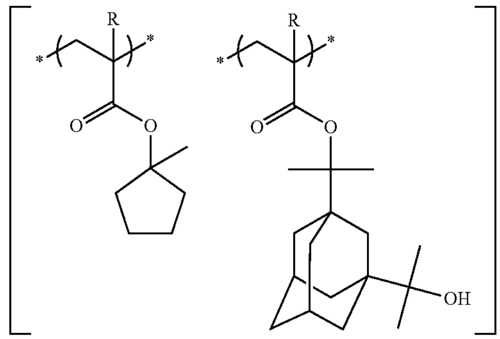
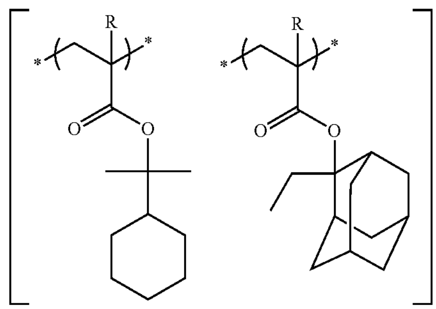
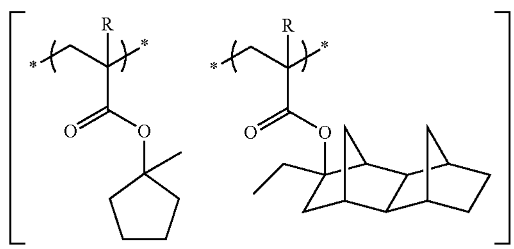
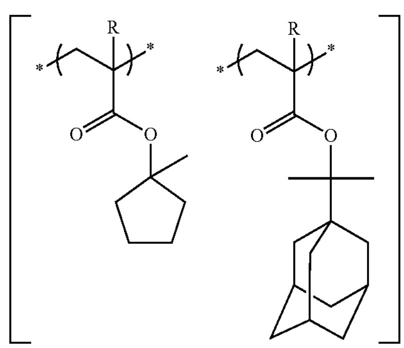
As embodiments different from the repeating units exemplified above, the following repeating units that generate an alcoholic hydroxyl group are also preferable.

In the following specific examples, $Xa_1$ represents a hydrogen atom, $CH_3$, $CF_3$, or $CH_2OH$.
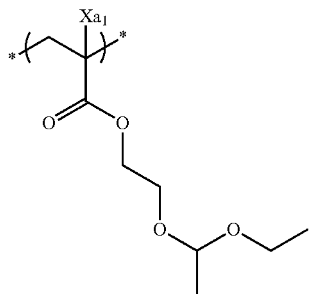
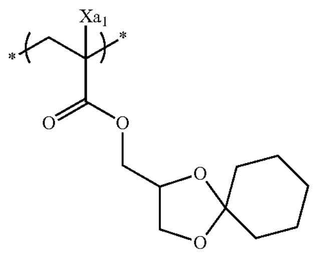
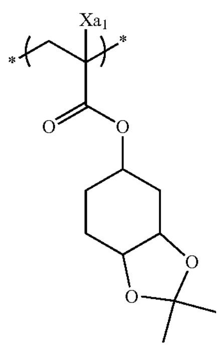
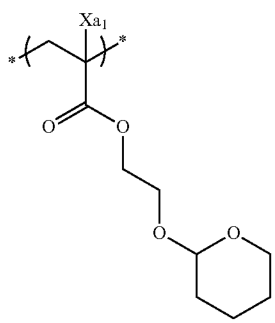
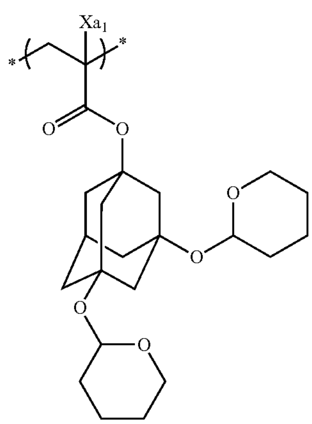
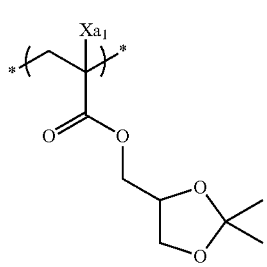
-continued
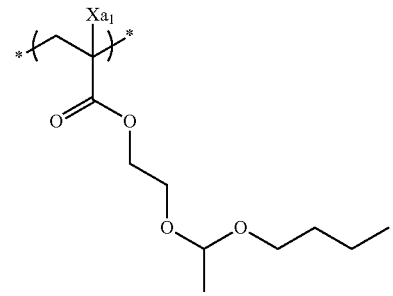
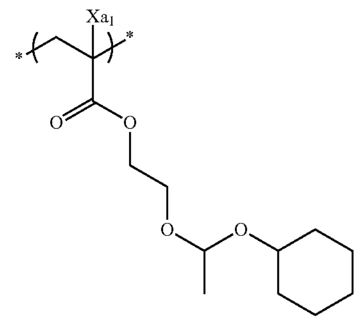
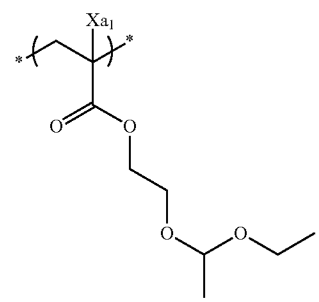
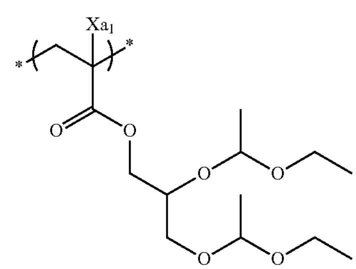
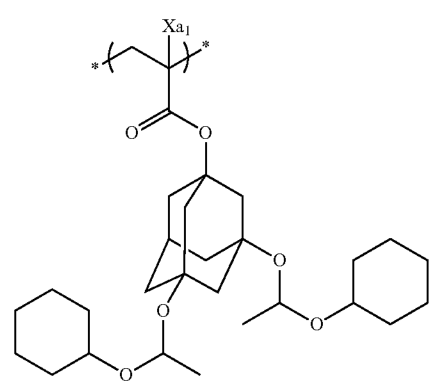

-continued

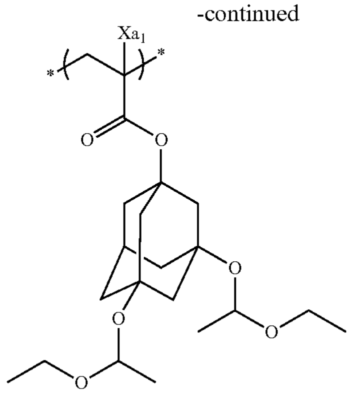

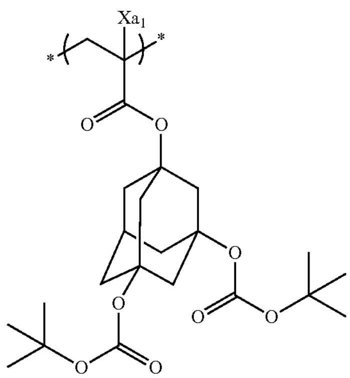

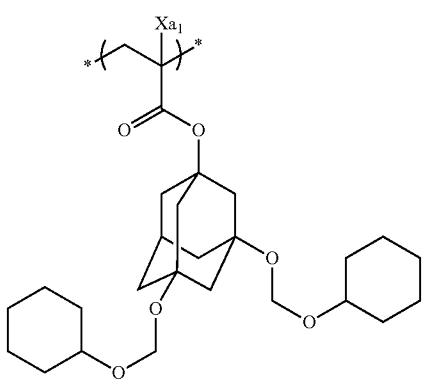

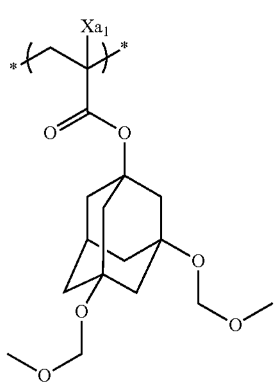

-continued

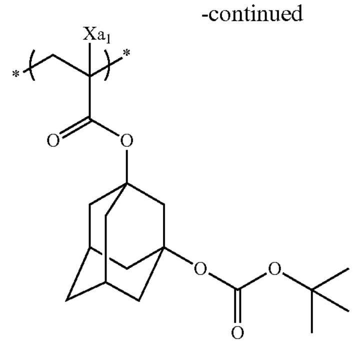

The resin (A) in the present invention preferably includes a group that can be polymerized (hereinafter, also referred to as a polymerizable group), and more preferably contains a repeating unit that has a polymerizable group. In this manner, in the exposed portion of the resist film, not only the polymerization of compounds (B) can be caused due to the polymerizable group of the compound (B), but also the polymerization of the compound (B) and the resin (A) or the polymerization of resins (A) can be caused. Consequently, the solubility of the resist film in an organic solvent is reduced, and the dissolution contrast between an exposed portion and an unexposed portion in the resist film in an organic solvent becomes stronger, whereby the effects of the present invention can be more apparent. The polymerizable group is preferably a polymerizable group that can be polymerized by the action of an acid or a radical. In the present invention, the polymerizable group of the compound (B) and the polymerizable group of the resin (A) may be the same as or different from each other. In addition, the polymerizable group also includes a group that can be crosslinked (hereinafter, also referred to as a crosslinkable group). The crosslinkable group is preferably a crosslinkable group that can be crosslinked by the action of an acid or a radical. The polymerizable group is not particularly limited, and examples thereof include an ethylenic unsaturated group, an epoxy group, an oxetane group, a group represented by the following General Formula (ZII), and the like.

(ZII)

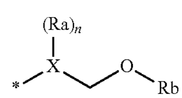

In the General Formula (ZII), X represents an oxygen atom, a nitrogen atom, or an aromatic group having a valency of (n+2), and each of Ra and Rb independently represents a hydrogen atom or a monovalent organic group. n represents an integer of 0 to 6. When X is an oxygen atom, n is 0; when X is a nitrogen atom, n is 1; and when X is an aromatic group having a valency of (n+2), n is an integer of 0 to 6. n is preferably an integer of 0 to 4. * represents a direct link.

The aromatic group having a valency of (n+2), which is represented by X, is preferably an aromatic group having 6 to 10 carbon atoms, and examples thereof include a benzene ring group, a naphthalene ring group, and the like.

Examples of the monovalent organic group represented by Ra and Rb include an alkyl group, an aryl group, —COORc, —CON(Rc)$_2$, —CORc, and the like (Rc represents a monovalent organic group).

Ra and Rb are particularly preferably a hydrogen atom, an alkyl group, a cycloalkyl group, an aryl group, —COORc, —CON(Rc)$_2$, or —CORc.

Examples of the monovalent organic group represented by Rc include an alkyl group, a cycloalkyl group, an aryl group, and the like, and the monovalent organic group is preferably an alkyl group or an aryl group.

Examples of the alkyl group represented by Ra to Rc include an alkyl group having 1 to 10 carbon atoms, and the alkyl group is preferably a methyl group, an ethyl group, an n-propyl group, an isopropyl group, an n-butyl group, an isobutyl group, a t-butyl group, or the like having 1 to 4 carbon atoms.

Examples of the cycloalkyl group represented by Ra to Rc include monocyclic cycloalkyl group having 3 to 20 carbon atoms such as a cyclopentyl group, a cyclohexyl group, and the like.

The aryl group represented by Ra to Rc is preferably an aryl group having 6 to 10 carbon atoms, and specific examples thereof include a phenyl group, a naphthyl group, and the like.

Examples of the ethylenic unsaturated group as the polymerizable group include a (meth)acrylate group, a vinyl group, a crotonate group, an isocrotonate group, an itaconate group, a maleate group, and the like. The ethylenic unsaturated group is preferably a (meth)acrylate group or a vinyl group, and more preferably a (meth)acrylate group.

The polymerizable group that the resin (A) can contain is particularly preferably a (meth)acrylate group, an epoxy group, or a group represented by the General Formula (ZII).

Specific examples of the repeating unit having a polymerizable group will be shown below, but the present invention is not limited thereto. In the specific examples, Xa represents a hydrogen atom, $CH_3$, $CF_3$, or $CH_2OH$.

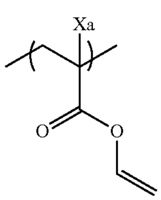

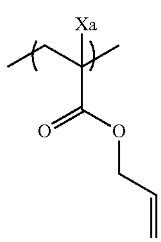

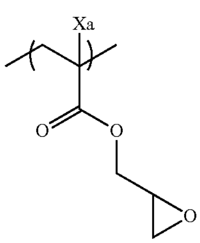

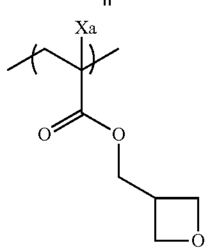

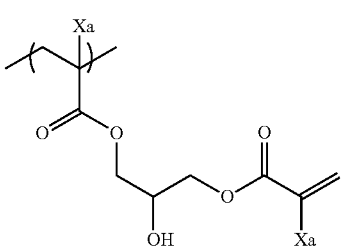

-continued

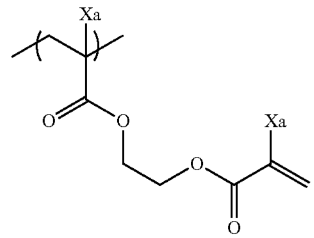

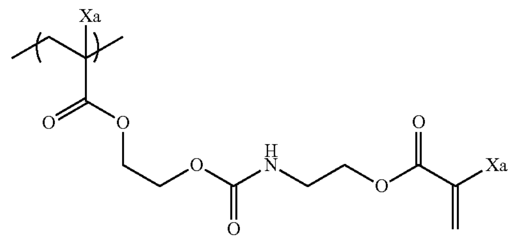

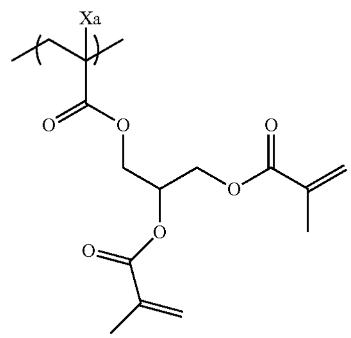

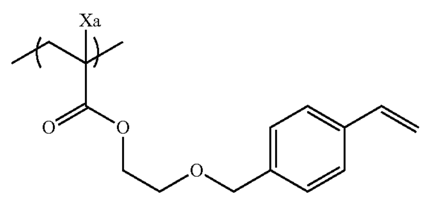

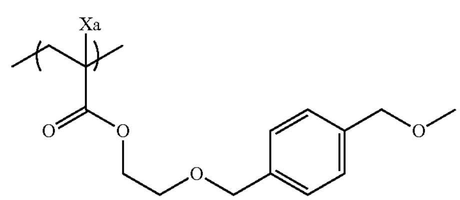

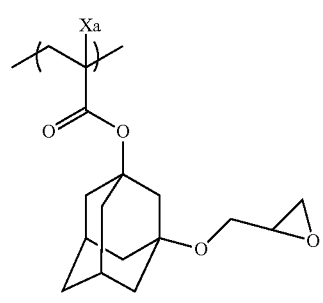

-continued

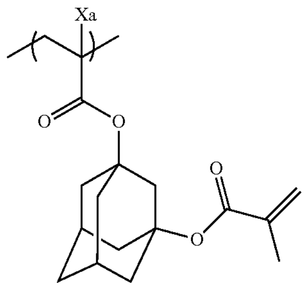
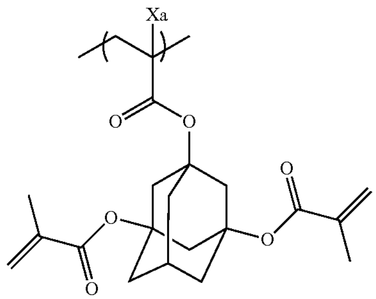
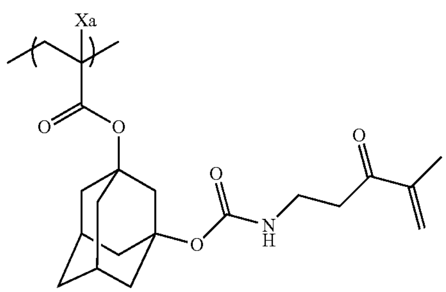
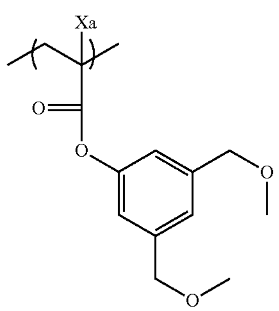
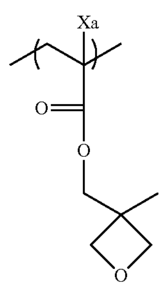
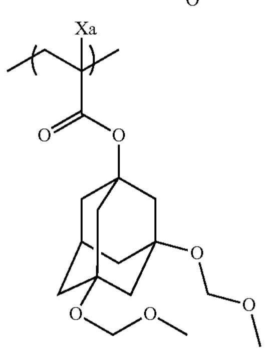
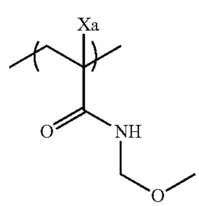
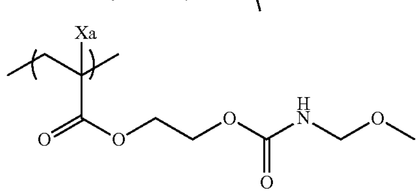

-continued

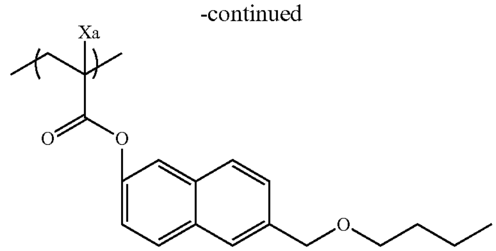
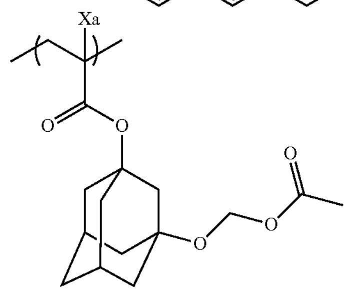
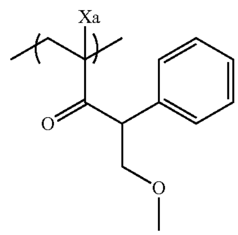
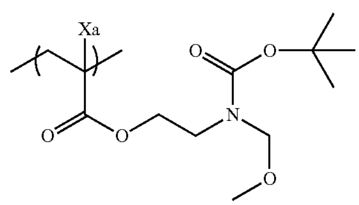

When the resin (A) contains the repeating unit having a polymerizable group, the content (total content when the resin (A) contains plural kinds of repeating units) of the repeating unit having a polymerizable group is preferably in a range of from 5 mol % to 60 mol %, and more preferably in a range of from 10 mol % to 50 mol %, based on all repeating units in the resin.

The resin (A) preferably contains a repeating unit having a lactone structure.

Any structure can be used as the lactone structure as long as the structure has a lactone structure, but the lactone structure is preferably a 5- to 7-membered lactone structure. It is preferable that another ring structure be condensed with the 5- to 7-membered lactone structure while forming a bicyclo structure or a spiro structure. The lactone structure more preferably includes a repeating unit having a lactone structure that is represented by any one of the following General Formulae (LC1-1) to (LC1-17). In addition, the lactone structure may directly bind to the main chain. Preferable lactone structures are (LC1-1), (LC1-4), (LC1-5), (LC1-6), (LC1-13), (LC1-14), and (LC1-17), and particularly preferable lactone structure is (LC1-4). With the use of such a specific lactone structure, the LER and development defects of the resist film are improved.

-continued
LC1-1
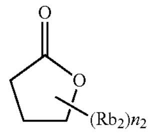
LC1-2
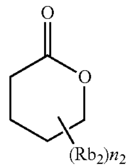
LC1-3
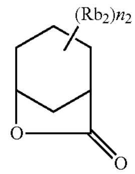
LC1-4
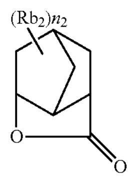
LC1-5
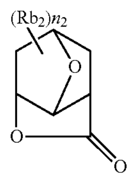
LC1-6
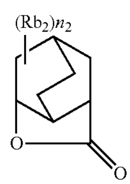
LC1-7
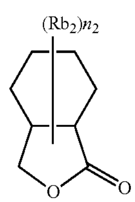
LC1-8
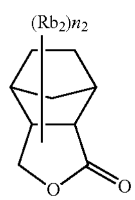
LC1-9
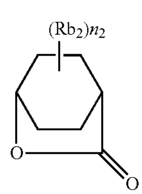
LC1-10
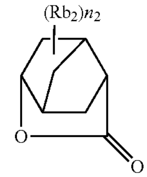
LC1-11
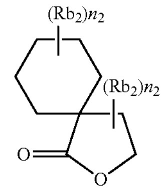
LC1-12
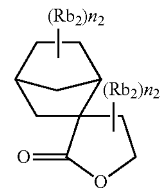
LC1-13
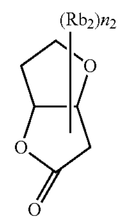
LC1-14
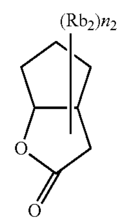
LC1-15
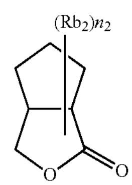
LC1-16
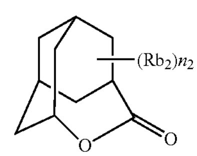
LC1-17
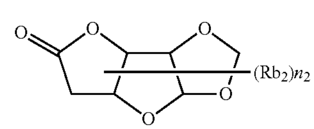
The lactone structure portion may or may not have a substituent ($Rb_2$). Examples of a preferable substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-degradable group, and the like. The substituent ($Rb_2$) is more preferably an alkyl group having 1 to 4 carbon atoms, a cyano group, or an acid-degradable group. $n_2$ represents an integer of 0 to 4. When $n_2$ is 2 or greater, a plurality of substituents ($Rb_2$) may be the same as or different from each other, and the plurality of substituents ($Rb_2$) may form a ring by binding to each other.

The repeating unit having a lactone group has optical isomers in general, and any of the optical isomers may be used. Furthermore, one kind of optical isomer may be used alone, or a plurality of optical isomers may be used in combination. When one kind of optical isomer is mainly used, the optical purity (ee) thereof is preferably 90% or higher, and more preferably 95% or higher.

The repeating unit having a lactone structure is preferably a unit represented by the following General Formula (III).

(III)

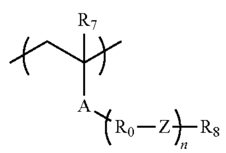

In the General Formula (III),

A represents an ester bond (a group represented by —COO—) or an amide bond (a group represented by —CONH—).

When there is a plurality of $R_0$s, each $R_0$ independently represents an alkylene group, a cycloalkylene group, or a combination thereof.

When there is a plurality of Zs, each Z independently represents a single bond, an ether bond, an ester bond, an amide bond, a urethane bond (a group represented by

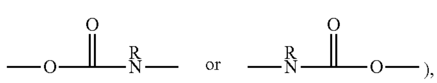

or a urea bond (a group represented by

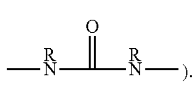

Herein, each R independently represents a hydrogen atom, an alkyl group, a cycloalkyl group, or an aryl group.

$R_8$ represents a monovalent organic group having a lactone structure.

n is a repeating number of a structure represented by —$R_0$—Z—, and represents an integer of 0 to 5. n is preferably 0 or 1, and more preferably 0. When n is 0, —$R_0$—Z— dose not exist, and a single bond is formed.

$R_7$ represents a hydrogen atom, a halogen atom, or an alkyl group.

The alkylene group and the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group.

The alkylene group and the cycloalkylene group of $R_0$ and the alkyl group of $R_7$ may be substituted respectively. Examples of the substituent include a halogen atom such as a fluorine atom, a chlorine atom, or a bromine atom; a hydroxyl group; a mercapto group; an alkoxy group such as a methoxy group, an ethoxy group, an isopropoxy group, a t-butoxy group, or a benzyloxy group; an acyloxy group such as an acetyloxy group or a propionyloxy group; and the like.

$R_7$ is preferably a hydrogen atom, a methyl group, a trifluoromethyl group, or a hydroxymethyl group.

A chain-like alkylene group in $R_0$ is preferably a chain-like alkylene group having 1 to 10 carbon atoms, and more preferably a chain-like alkylene group having 1 to 5 carbon atoms. Examples of the chain-like alkylene group include a methylene group, an ethylene group, a propylene group, and the like. The cycloalkylene group is preferably a cycloalkylene group having 3 to 20 carbon atoms, and examples thereof include a cyclohexylene group, a cyclopentylene group, a norbornylene group, an adamantylene group, and the like. In order to bring about the effects of the present invention, a chain-like alkylene group is preferable, and a methylene group is particularly preferable.

The monovalent organic group having a lactone structure, which is represented by $R_8$, is not particularly limited so long as this group has a lactone structure, and specific examples thereof include lactone structures represented by General Formulae (LC1-1) to (LC1-17). Among these, the structure represented by (LC1-4) is particularly preferable. $n_2$ in (LC1-1) to (LC1-17) is preferably 2 or smaller.

$R_8$ is preferably an unsubstituted monovalent organic group having a lactone structure or a monovalent organic group having a lactone structure that has a methyl group, a cyano group, or an alkoxycarbonyl group as a substituent. $R_8$ is more preferably a monovalent organic group having a lactone structure (cyanolactone) that has a cyano group as a substituent.

Specific examples of the repeating unit having a lactone structure will be shown below, but the present invention is not limited thereto.

In the following specific examples, R represents a hydrogen atom, an alkyl group which may have a substituent, or a halogen atom, and preferably represents a hydrogen atom, a methyl group, a hydroxymethyl group, or an acetyloxymethyl group.

(In the formulae, Rx represents H, $CH_3$, $CH_2OH$, or $CF_3$)

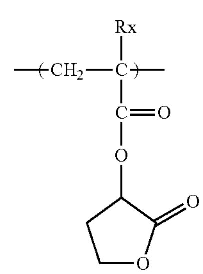

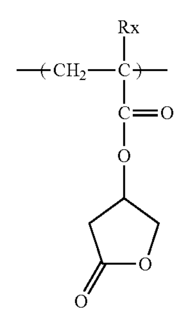

-continued
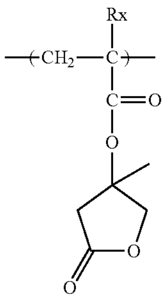
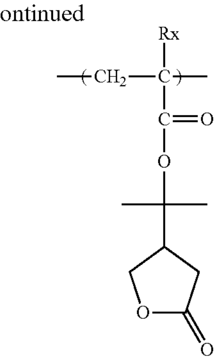
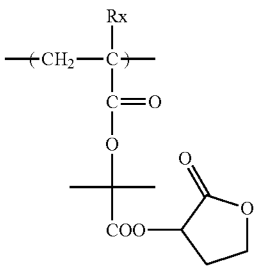
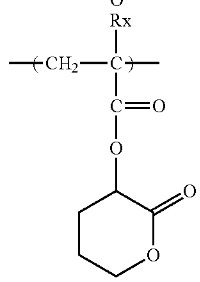
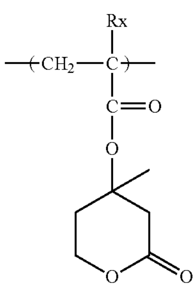
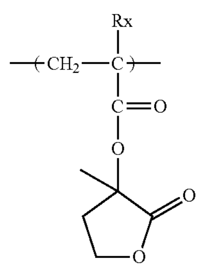
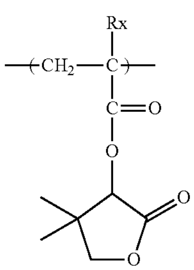
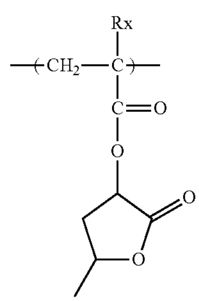
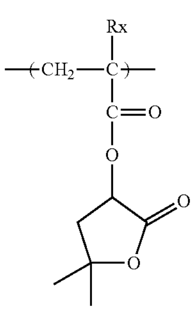
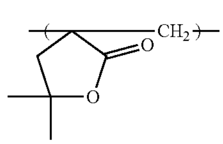
-continued
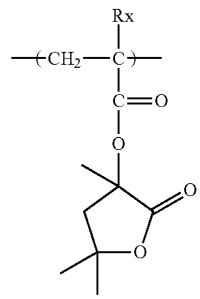
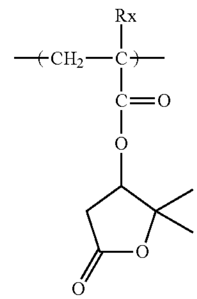
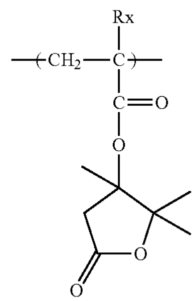
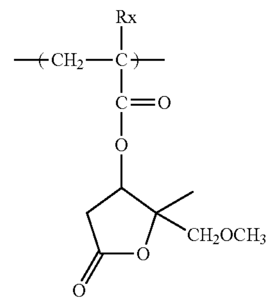
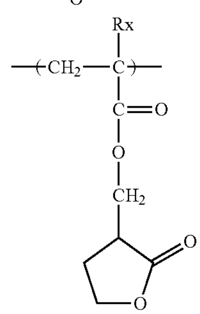
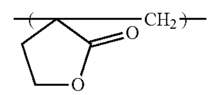
(In the formulae, Rx represents $CH_3$, $CH_2OH$, or $CF_3$)
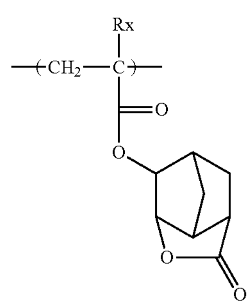
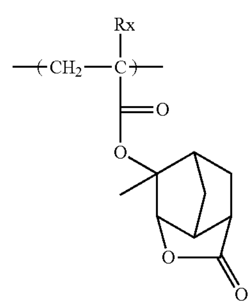
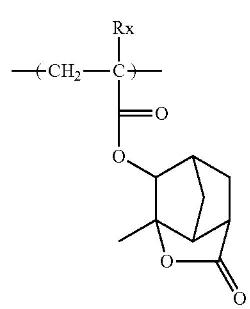
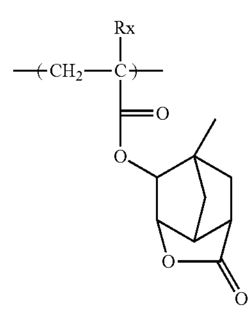

-continued
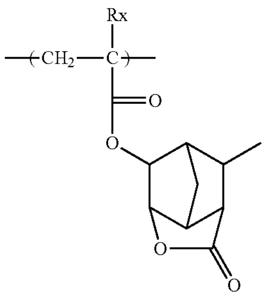
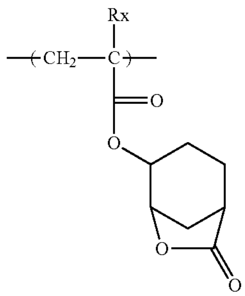
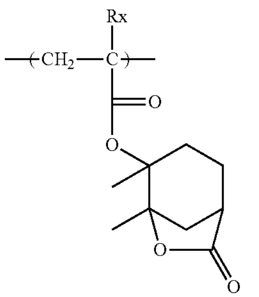
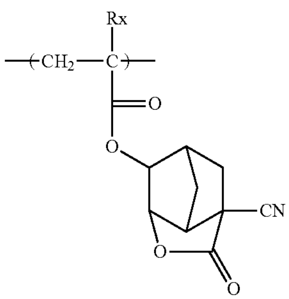
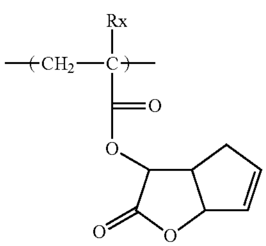
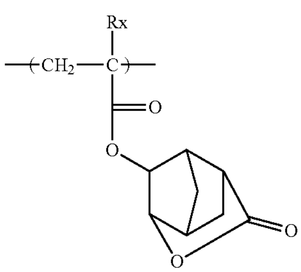
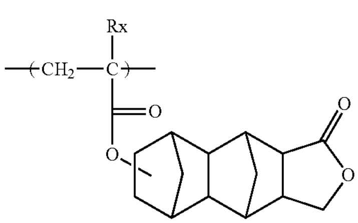
-continued
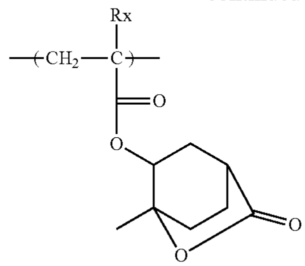
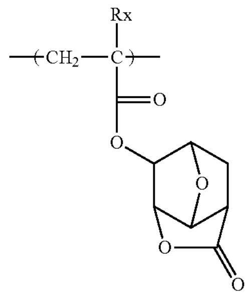
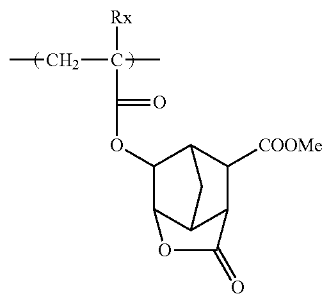
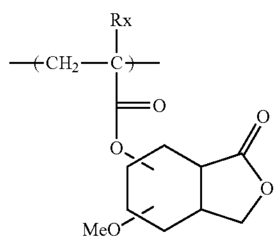
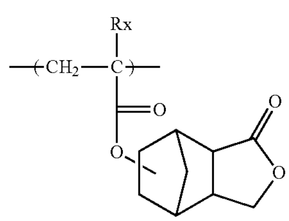
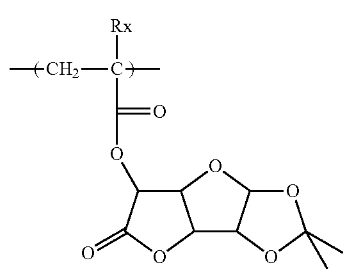

-continued
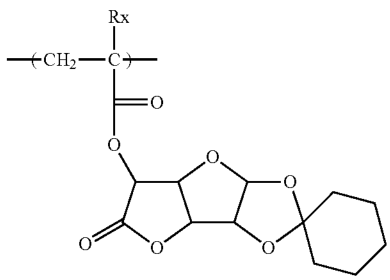
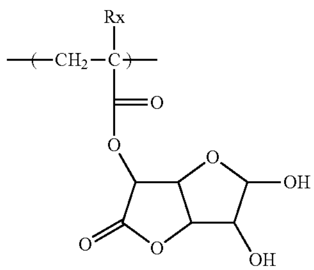
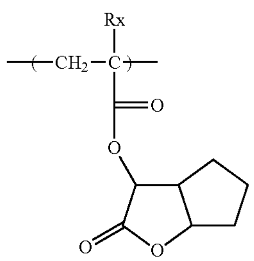
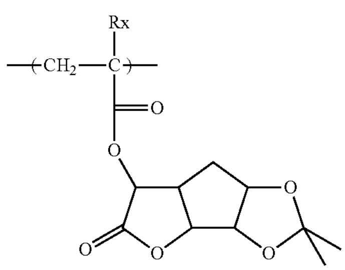
(In the formulae, Rx represents $CH_3$, $CH_2OH$, or $CF_3$)
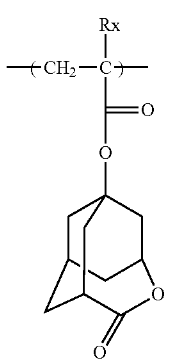
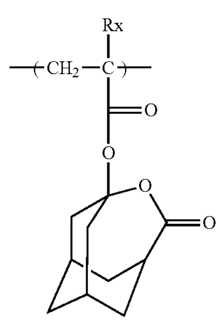
-continued
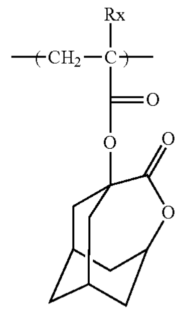
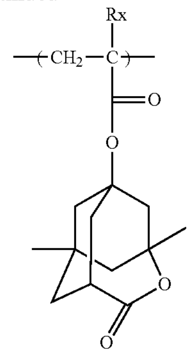
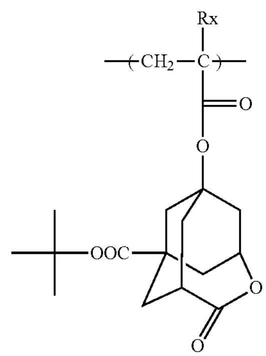
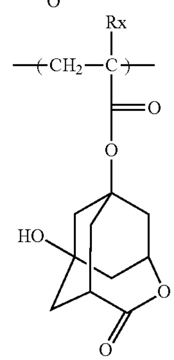
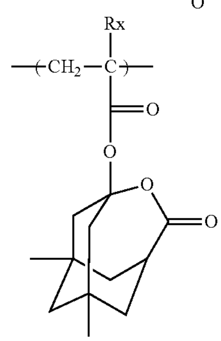
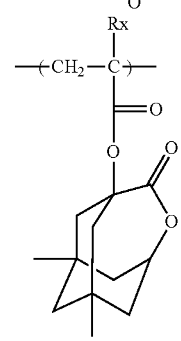
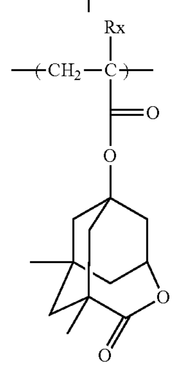
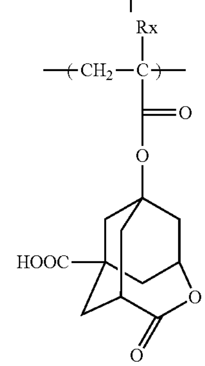
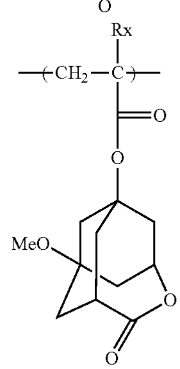
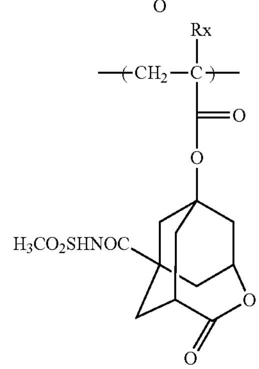

-continued
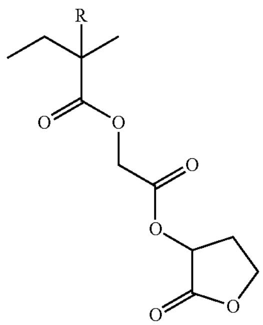
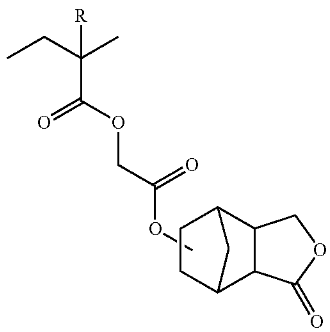
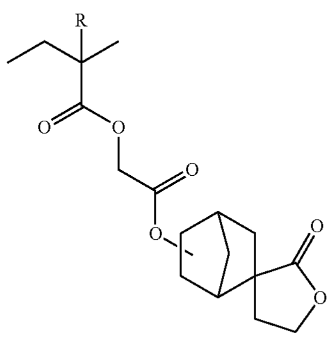
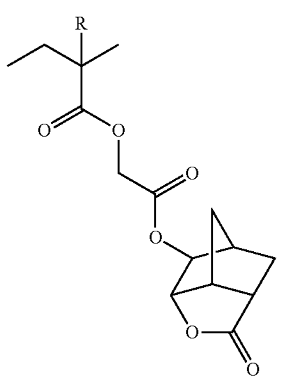
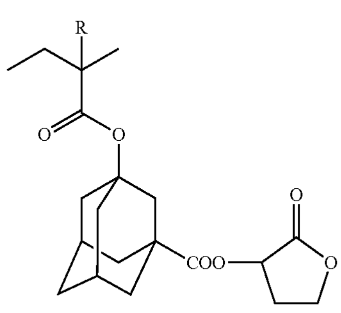
-continued
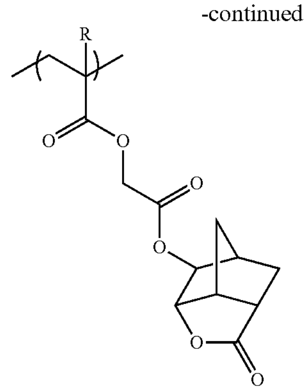
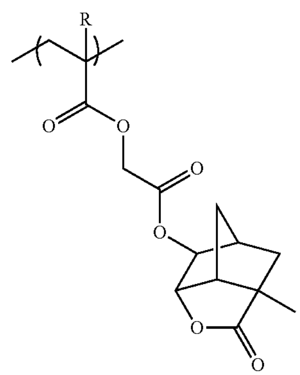
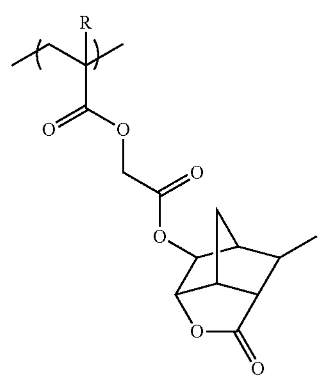
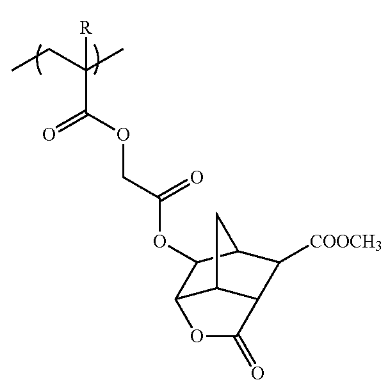

-continued
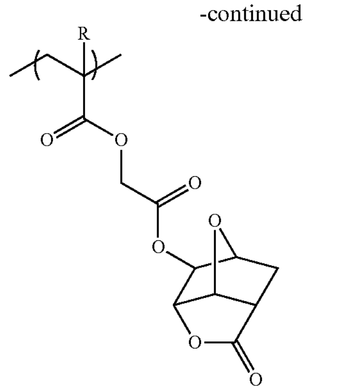
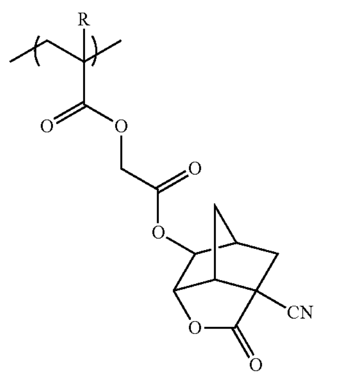
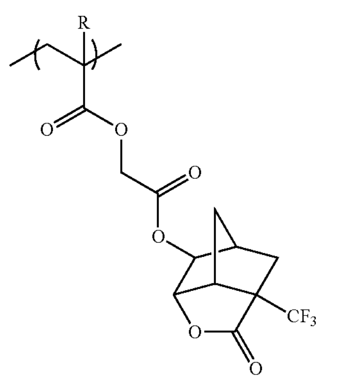
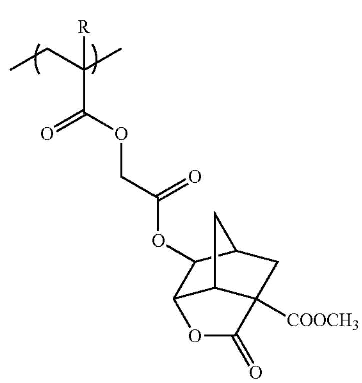
-continued
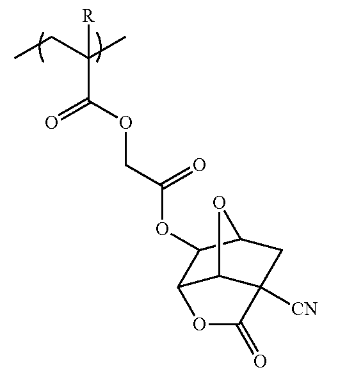
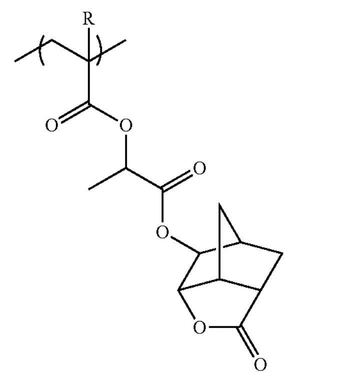
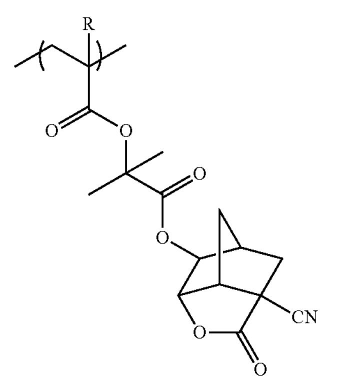
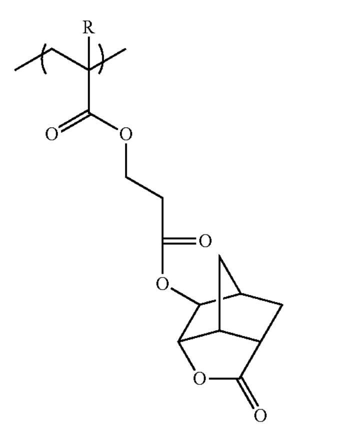

-continued
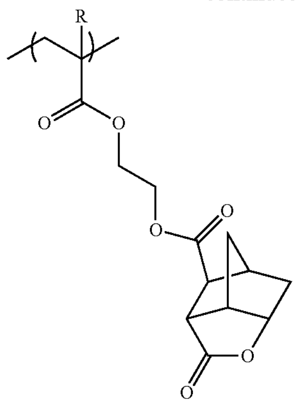
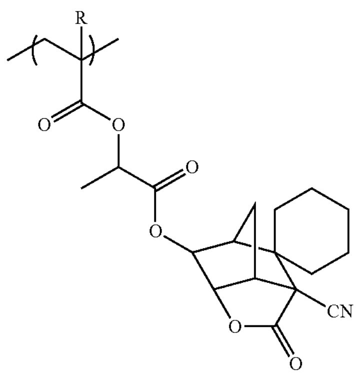
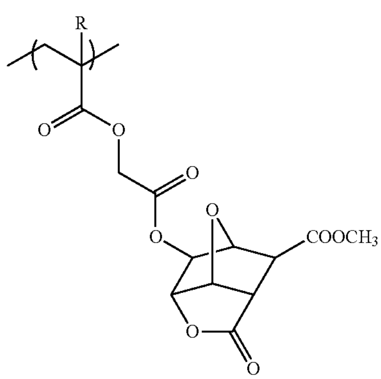
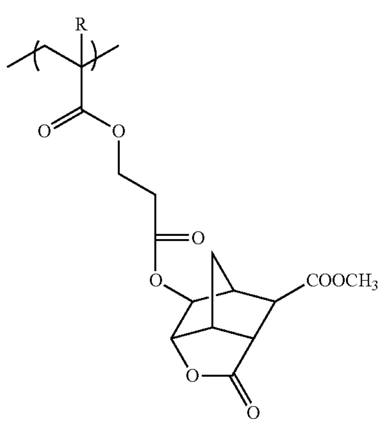
-continued
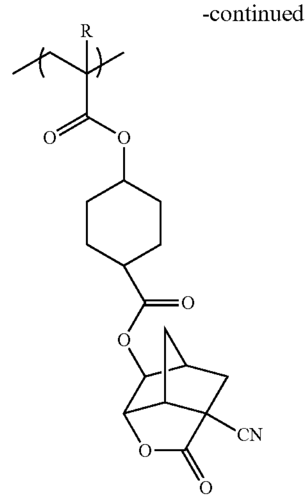
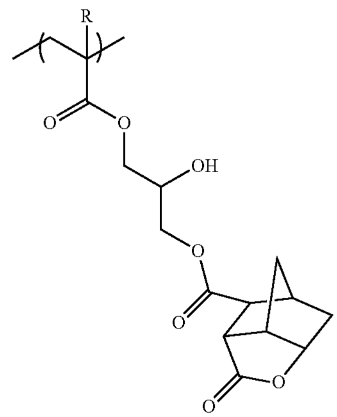
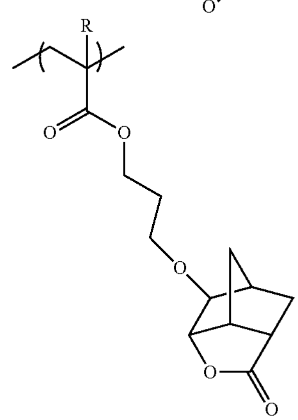
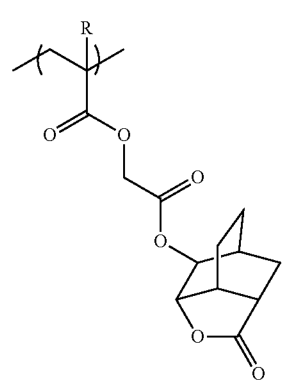

-continued

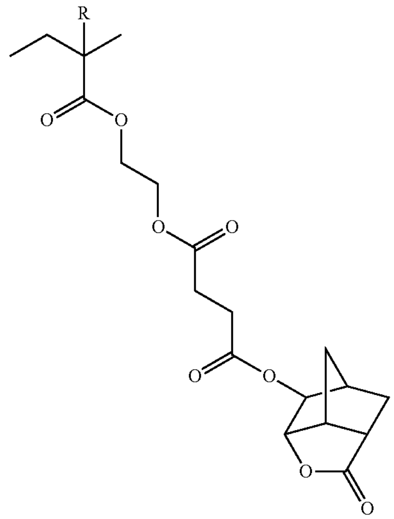

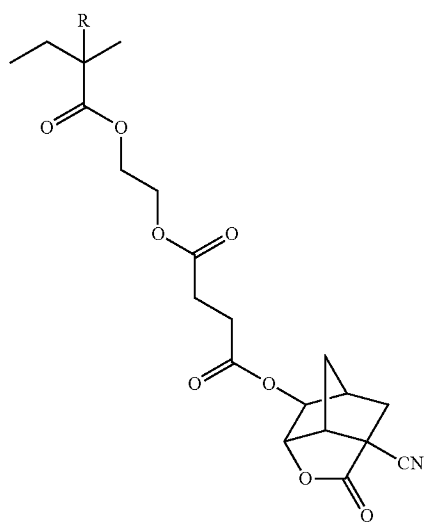

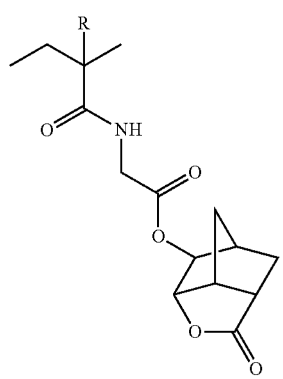

-continued

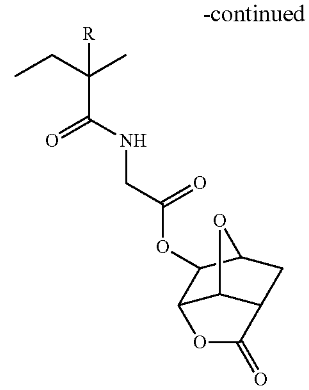

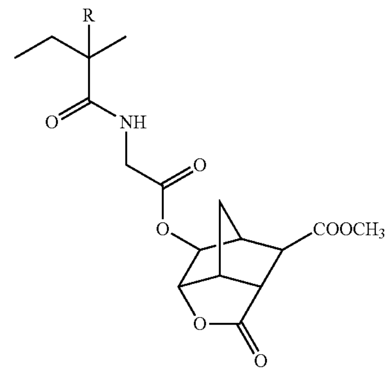

In order to enhance the effects of the present invention, two or more kinds of repeating units having a lactone structure can be concurrently used.

When the resin (A) contains the repeating unit having a lactone structure, the content of the repeating unit having a lactone structure is preferably 15 mol % to 60 mol %, more preferably 20 mol % to 50 mol %, and even more preferably 25 mol % to 50 mol %, based on all repeating units in the resin (A).

The resin (A) preferably contains a repeating unit having a hydroxyl group or a cyano group other than General Formula (III). In this manner, adhesion to a substrate and affinity with a developer are improved. The repeating unit having a hydroxyl group or a cyano group is preferably a repeating unit having an alicyclic hydrocarbon structure that has been substituted with a hydroxyl group or a cyano group, and preferably does not include an acid-degradable group. The alicyclic hydrocarbon structure that has been substituted with a hydroxyl group or a cyano group is preferably an adamantyl group, a diadamantyl group, or a norbornane group. As the alicyclic hydrocarbon structure that has been preferably substituted with a hydroxyl group or a cyano group, partial structures represented by the following General Formulae (VIIa) to (VIId) are preferable.

(VIIa)

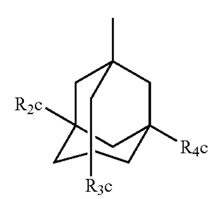

-continued (VIIb)

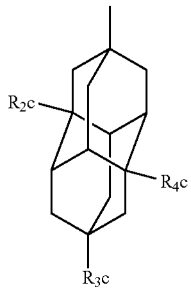

(VIIc)

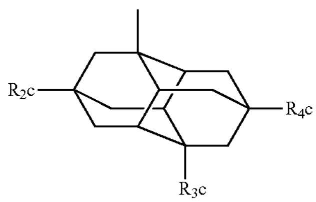

(VIId)

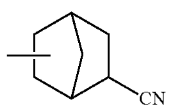

In General Formulae (VIIa) to (VIId), each of $R_{2c}$ to $R_{4c}$ independently represents a hydrogen atom, a hydroxyl group, or a cyano group. Here, at least one of $R_{2c}$ to $R_{4c}$ represents a hydroxyl group or a cyano group. Preferably, one or two out of $R_{2c}$ to $R_{4c}$ are hydroxyl groups, and the remainder is a hydrogen atom. In General Formula (VIIa), it is more preferable that two out of $R_{2c}$ to $R_{4c}$ be hydroxyl groups, and the remainder be a hydrogen atom.

Examples of the repeating unit having the partial structure represented by General Formulae (VIIa) to (VIId) include repeating units represented by the following General Formulae (AIIa) to (AIId).

(AIIa)

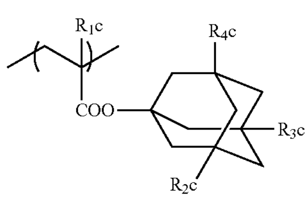

(AIIb)

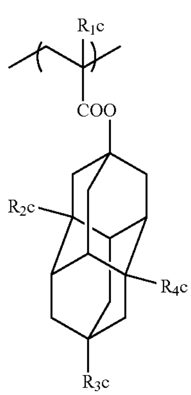

-continued (AIIc)

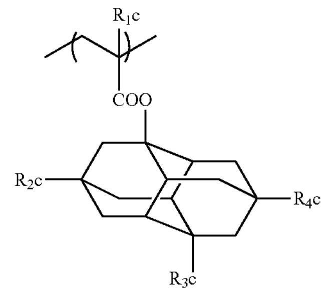

(AIId)

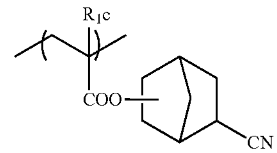

In General Formulae (AIIa) to (AIId), $R_1c$ represents a hydrogen atom, a methyl group, a trifluoromethyl group, or a hydroxymethyl group.

$R_2c$ to $R_4c$ have the same definition as that of $R_2c$ to $R_4c$ in General Formulae (VIIa) to (VIIc).

When the resin (A) contains the repeating unit having a hydroxyl group or a cyano group, the content of the repeating unit having a hydroxyl group or a cyano group is preferably 5 mol % to 40 mol %, more preferably 5 mol % to 30 mol %, and even more preferably 10 mol % to 30 mol %, based on all repeating units in the resin (A).

Specific examples of the repeating unit having a hydroxyl group or a cyano group will be shown below, but the present invention is not limited thereto.

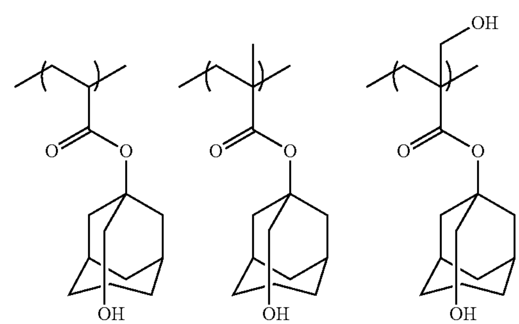

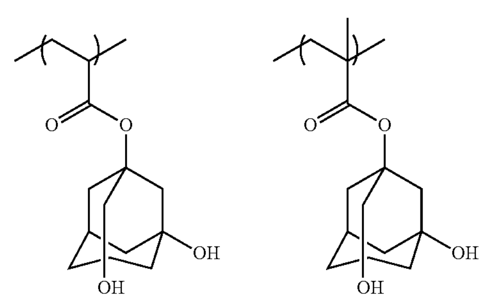

-continued

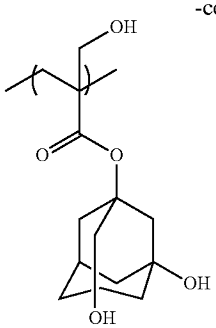
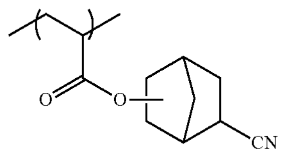
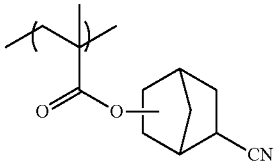
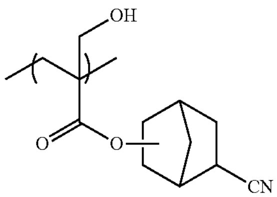
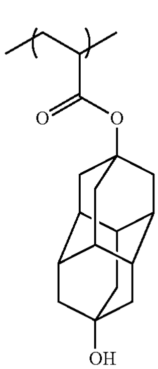
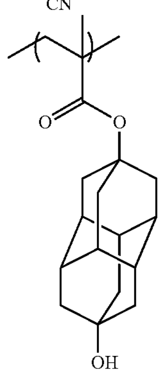
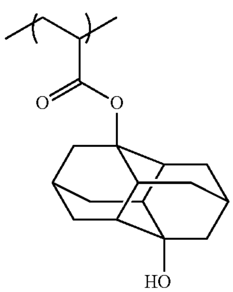
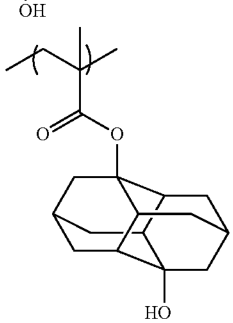

The resin (A) may contain a repeating unit having an acid group. Examples of the acid group include a carboxyl group, a sulfonamide group, a sulfonylimide group, a bissulfonylimide group, and an aliphatic alcohol (such as a hexafluoroisopropanol group) in which an α-position has been substituted with an electron-attracting group. The resin (A) more preferably contains a repeating unit having a carboxyl group. If the resin (A) contains the repeating unit having an acid group, resolution increases when the resin is used for contact holes. As the repeating unit having an acid group, any of a repeating unit in which an acid group directly binds to the main chain of a resin, such as a repeating unit of acrylic acid or methacrylic acid, a repeating unit in which an acid group binds to the main chain of a resin via a linking group, and a repeating unit obtained by introducing a polymerization initiator or a chain transfer agent having an acid group to the terminal of a polymer chain during polymerization are preferable. The linking group may have a monocyclic or polycyclic hydrocarbon structure. Particularly preferable repeating units are repeating units of acrylic acid or methacrylic acid.

The resin (A) may or may not contain the repeating unit having an acid group. When the resin (A) contains the repeating unit, the content of the repeating unit having an acid group is preferably 25 mol % or less, and more preferably 20 mol % or less, based on all repeating units in the resin (A). When the resin (A) contains the repeating unit having an acid group, the content of this repeating unit having an acid group in the resin (A) is generally 1 mol % or more.

Specific examples of the repeating unit having an acid group will be shown below, but the present invention is not limited thereto.

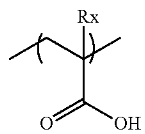
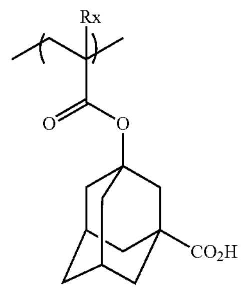
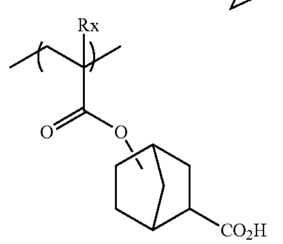
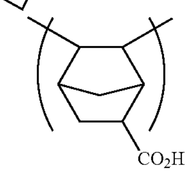
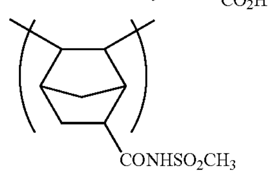
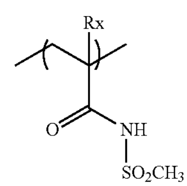
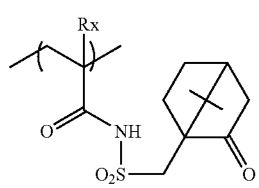
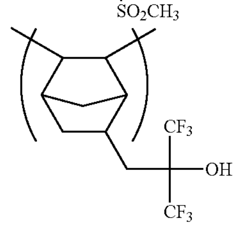
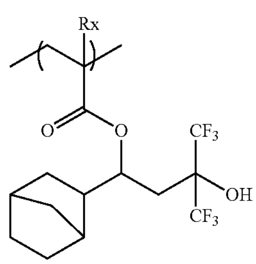
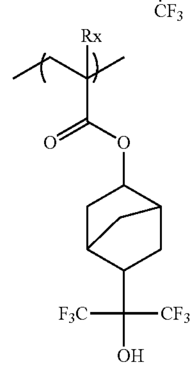

-continued

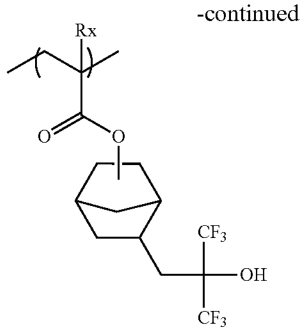

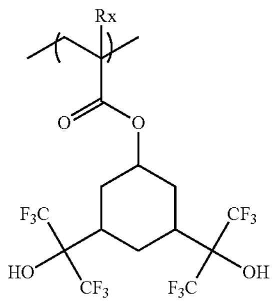

The resin (A) of the present invention can also have an alicyclic hydrocarbon structure that does not include a polar group (for example, the acid group, hydroxyl group, and cyano group described above), and can contain a repeating unit that does not exhibit acid-degradability. In this manner, the elution of components having a low molecular weight to a liquid for liquid immersion from the resist film can be reduced during liquid immersion exposure, and the solubility of the resin can be appropriately adjusted during development performed using a developer containing an organic solvent. Examples of such a repeating unit include a repeating unit represented by General Formula (IV).

(IV)

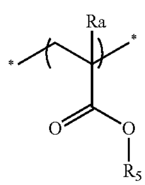

In General formula (IV), $R_5$ represents a hydrocarbon group that has at least one cyclic structure and does not include a polar group. Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

The cyclic structure of $R_5$ includes a monocyclic hydrocarbon group and a polycyclic hydrocarbon group. Examples of the monocyclic hydrocarbon group include cycloalkyl groups having 3 to 12 carbon atoms such as a cyclopentyl group, a cyclohexyl group, a cycloheptyl group, and a cyclooctyl group and cycloalkenyl groups having 3 to 12 carbon atoms such as a cyclohexenyl group. Examples of the preferable monocyclic hydrocarbon group include a monocyclic hydrocarbon group having 3 to 7 carbon atoms, and among these, a cyclopentyl group and a cyclohexyl group are more preferable.

The polycyclic hydrocarbon group includes a ring-aggregated hydrocarbon group and a crosslinked cyclic hydrocarbon group. Examples of the ring-aggregated hydrocarbon group include a bicyclohexyl group, a perhydronaphthalenyl group, and the like. Examples of the crosslinked cyclic hydrocarbon ring include bicyclic hydrocarbon rings such as a pinane ring, a bornane ring, a norpinane ring, a norbornane ring, and a bicyclooctane ring (bicyclo[2.2.2]octane ring, bicyclo[3.2.1]octane ring, and the like); tricyclic hydrocarbon rings such as a homobrendane ring, an adamantane ring, a tricyclo[$5.2.1.0^{2,6}$]decane ring, and a tricyclo[$4.3.1.1^{2,5}$]undecane ring; and tetracyclic hydrocarbon rings such as a tetracyclo[$4.4.0.1^{2,5}.1^{7,10}$]dodecane ring and a perhydro-1,4-methano-5,8-methanonaphthalene ring. The crosslinked cyclic hydrocarbon ring also includes a condensed hydrocarbon ring, for example, a condensed ring in which a plurality of 5 to 8-membered cycloalkane rings such as a perhydronaphthalene ring (decalin), a perhydroanthracene ring, a perhydrophenanthrene ring, a perhydroacenaphthene ring, a perhydrofluorene ring, a perhydroindene ring, and a perhydrophenalene ring are condensed.

Examples of a preferable crosslinked cyclic hydrocarbon ring include a norbornyl group, an adamantyl group, a bicyclooctanyl group, a tricyclo[$5,2,1,0^{2,6}$]decanyl group, and the like. Examples of the more preferable crosslinked cyclic hydrocarbon ring include a norbornyl group, and an adamantyl group.

These alicyclic hydrocarbon groups may have a substituent, and examples of preferable substituents include a halogen atom, an alkyl group, a hydroxyl group in which a hydrogen atom has been substituted, an amino group in which a hydrogen atom has been substituted, and the like. Examples of a preferable halogen atom include a bromine atom, a chlorine atom, and a fluorine atom, and examples of a preferable alkyl group include a methyl group, an ethyl group, a butyl group, and a t-butyl group. This alkyl group may further have a substituent, and examples of this substituent that the alkyl group may further have include a halogen atom, an alkyl group, a hydroxyl group in which a hydrogen atom has been substituted, and an amino group in which a hydrogen atom has been substituted.

Examples of the substituent of the above hydrogen atom include an alkyl group, a cycloalkyl group, an aralkyl group, a substituted methyl group, a substituted ethyl group, an alkoxycarbonyl group, and an aralkyloxycarbonyl group. Examples of a preferable alkyl group include an alkyl group having 1 to 4 carbon atoms; examples of a preferable substituted methyl group include a methoxymethyl group, a methoxythiomethyl group, a benzyloxymethyl group, a t-butoxymethyl group, and a 2-methoxyethoxymethyl group; examples of a preferable substituted ethyl group include 1-ethoxyethyl and 1-methyl-1-methoxyethyl; examples of a preferable acyl group include an aliphatic acyl group having 1 to 6 carbon atoms such as a formyl group, an acetyl group, a propionyl group, a butyryl group, an isobutyryl group, a valeryl group, and a pivaloyl group; and examples of the alkoxycarbonyl group include an alkoxycarbonyl group having 1 to 4 carbon atoms.

The resin (A) may or may not contain a repeating unit that has an alicyclic hydrocarbon structure not including a polar group and does not exhibit acid-degradability. When the resin (A) contains such a repeating unit, the content of the repeating unit is preferably 1 mol % to 50 mol %, and more preferably 10 mol % to 50 mol %, based on all repeating units in the resin (A).

Specific examples of the repeating unit that has an alicyclic hydrocarbon structure not including a polar group and does not exhibit acid-degradability will be shown below, but the present invention is not limited thereto. In the formulae, Ra represents H, $CH_3$, $CH_2OH$, or $CF_3$.

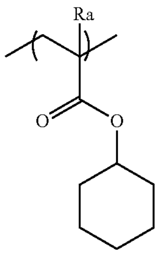
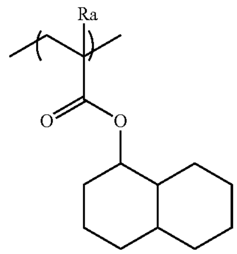
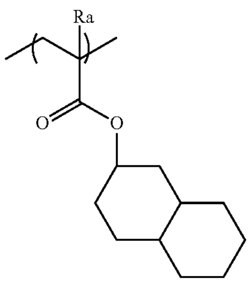
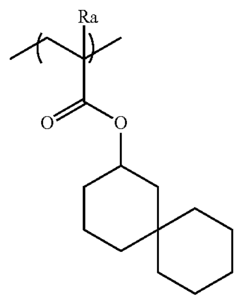
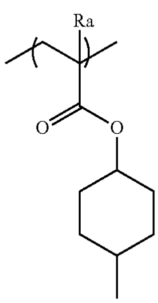
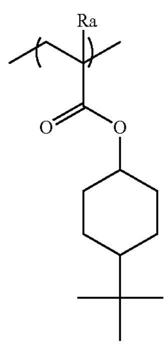
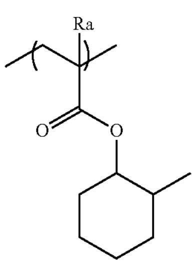
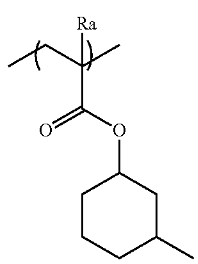
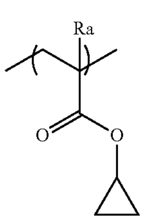
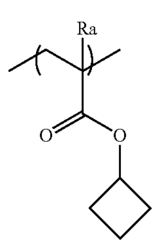
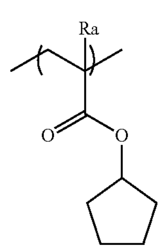

-continued

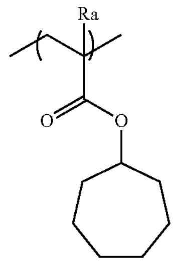
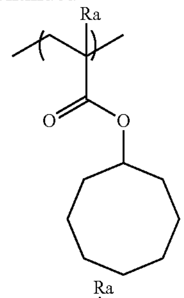
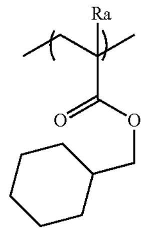
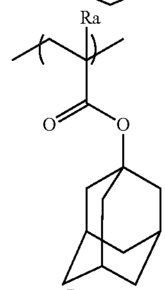
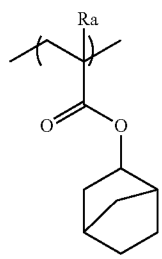
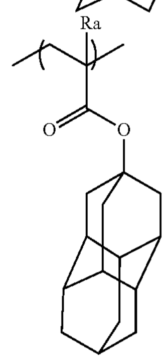
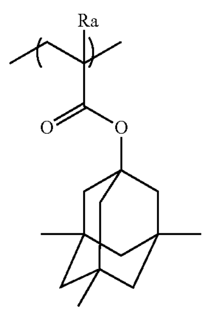
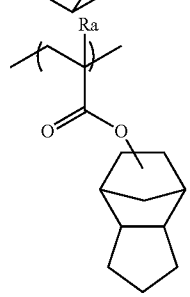

The resin (A) used for the composition of the present invention can contain various repeating structural units in addition to the repeating structural unit described above, for adjusting dry etching resistance, suitability with a standard developer, adhesion to a substrate, resist profile, and properties that are generally required for an actinic-ray-sensitive or radiation-sensitive resin composition, such as resolution, heat resistance, sensitivity, and the like.

Examples of such repeating structural units include repeating structural units corresponding to the monomers described below, but the present invention is not limited thereto.

If the resin (A) contains such repeating structural units, performances required for the resin used for the composition according to the present invention, particularly, (1) solubility in a coating solvent, (2) film formability (glass transition point), (3) alkali developability, (4) film thinning (selection of a hydrophilic or hydrophobic group and an alkali-soluble group), (5) adhesion of an unexposed portion to a substrate, (6) dry etching resistance, and the like can be finely adjusted.

Examples of such monomers include compounds having one addition-polymerizable unsaturated bond selected from acrylic acid esters, methacrylic acid esters, acrylamides, methacrylamides, allyl compounds, vinyl ethers, vinyl esters, and the like.

In addition, other addition-polymerizable unsaturated compounds may be copolymerized so long as these compounds are copolymerizable with the monomers corresponding to the various repeating structural units described above.

The molar ratio of the respective repeating structural units contained in the resin (A) used for the composition of the present invention is appropriately set so as to adjust the dry etching resistance, and the suitability with a standard developer of the actinic-ray-sensitive or radiation-sensitive resin composition, adhesion to a substrate, resist profile, properties that are generally required for an actinic-ray-sensitive or radiation-sensitive resin composition, such as resolution, heat resistance, sensitivity, and the like. Here, needless to say, the total content of the respective repeating structural units does not exceed 100 mol %.

When the composition of the present invention is for ArF exposure, it is preferable that the resin (A) used for the composition of the present invention substantially do not contain an aromatic ring (specifically, the proportion of the repeating units having an aromatic group in the resin is preferably 5 mol % or less, more preferably 3 mol % or less, and ideally 0 mol %, that is, it is desirable that the resin do not contain an aromatic group), in respect of transparency to ArF light. It is preferable that the resin (A) have a monocyclic or polycyclic alicyclic hydrocarbon structure.

When the composition of the present invention contains a resin (D) described later, it is desirable that the resin (A) do not contain a fluorine atom and a silicon atom, from a viewpoint of the compatibility between the resin (A) and the resin (D).

As the resin (A) used for the composition of the present invention, a resin in which all repeating units are constituted with a (meth)acrylate-based repeating unit is preferable. In this case, any of a resin in which all repeating units are methacrylate-based repeating units, a resin in which all repeating units are acrylate-based repeating units, and a resin in which all repeating units are methacrylate-based repeating units and acrylate-based repeating units can be used, but the acrylate-based repeating units are preferably 50 mol % or less of all repeating units. It is also preferable to use a copolymer which includes 20 mol % to 50 mol % of (meth)acrylate-based repeating units having an acid-degradable group, 20 mol % to 50 mol % of (meth)acrylate-based repeating units having a lactone group, 5 mol % to 30 mol % of (meth) acrylate-based repeating units having an alicyclic hydrocarbon structure substituted with a hydroxyl group or a cyano group, and 0 mol % to 20 mol % of other (meth)acrylate-based repeating units.

When the composition of the present invention is irradiated with KrF excimer laser light, an electron beam, X-rays, or high energy light rays (EUV and the like) having a wavelength of 50 nm or less, the resin (A) preferably further contains a hydroxystyrene-based repeating unit. More preferably, the resin (A) contains the hydroxystyrene-based repeating unit, a hydroxystyrene-based repeating unit protected with an acid-degradable group, and an acid-degradable repeating unit such as a (meth)acrylic acid tertiary alkyl ester.

Examples of a preferable hydroxystyrene-based repeating unit having an acid-degradable group include t-butoxycarbonyloxystyrene, 1-alkoxyethoxystyrene, a repeating unit of a (meth)acrylic acid tertiary alkyl ester, and the like, and repeating units of 2-alkyl-2-adamantyl (meth)acrylate and dialkyl (1-adamantyl)methyl (meth)acrylate are more preferable.

The resin (A) of the present invention can be synthesized by a common method (for example, radical polymerization). Example of the general synthesis method include batch polymerization in which polymerization is performed by dissolving monomer materials and initiators in a solvent and heating the resultant, and drop polymerization in which a solution including monomer materials and initiators is added dropwise to a heated solvent for 1 to 10 hours. A preferable method is the drop polymerization. Examples of a reaction solvent include tetrahydrofuran, 1,4-dioxane, ethers such as diisopropyl ether, ketones such as methyl ethyl ketone and methyl isobutyl ketone, ester solvents such as ethyl acetate, amide solvents such as dimethylformamide and dimethylacetamide, and solvents dissolving the composition of the present invention, such as propylene glycol monomethyl ether acetate, propylene glycol monomethyl ether, and cyclohexanone described later. It is more preferable to perform polymerization by using the same solvents as those used in the actinic-ray-sensitive or radiation-sensitive resin composition of the present invention, and by doing this, the generation of particles during storage can be inhibited.

It is preferable to perform the polymerization reaction in an atmosphere of inert gas such as nitrogen or argon. As the polymerization initiator, a commercially available radical initiator (azo-based initiator, peroxide, or the like) is used to initiate the polymerization. As the radical initiator, an azo-based initiator is preferable, and an azo-based initiator having an ester group, a cyano group, or a carboxyl group is preferable. Examples of preferable initiators include azobisisobutyronitrile, azobisdimethylvaleronitrile, dimethyl 2,2'-azobis (2-methylpropionate), and the like. The initiator is added as desired or added in divided portions, and then introduced to a solvent after the reaction ends, thereby allowing recovery of desired polymers by methods of recovering powder or solids. The concentration of reaction is 5% by mass to 50% by mass, and preferably 10% by mass to 30% by mass. The reaction temperature is generally 10° C. to 150° C., preferably 30° C. to 120° C., and more preferably 60° C. to 100° C.

After the reaction ends, the temperature is cooled to room temperature, and purification is performed. For the purification, general methods such as liquid-liquid extraction in which residual monomer or oligomer components are removed by washing with water or by appropriately combined solvents; purification implemented in a solution state, such as ultrafiltration in which only components having a certain level of molecular weight or less are removed by extraction; reprecipitation in which residual monomers or the like are removed by clotting a resin in a poor solvent by means of adding the resin solution dropwise to the poor solvent; and a purification method implemented in a solid state in which a resin slurry is washed with a poor solvent can be used. For example, by bringing the resin into contact with a solvent (poor solvent) that poorly dissolves or does not dissolve the resin, in such an amount that the volume of the resin is 10 times or less, and preferably 10 to 5 times the reaction solution, the resin is precipitated as a solid.

As a solvent (solvent for precipitation or reprecipitation) used for performing precipitation or reprecipitation from a polymer solution, any solvent may be used as long as the solvent is a poor solvent of the polymer. The solvent to be used can be appropriately selected from hydrocarbons, halogenated hydrocarbons, nitro compounds, ethers, ketones, esters, carbonates, alcohols, carboxylic acids, water, and a mixed solvent containing these solvents, depending on the type of the polymer. Among these, as a solvent for precipitation or reprecipitation, a solvent containing at least an alcohol (particularly, methanol or the like) or water is preferable.

The amount of the solvent for precipitation or reprecipitation to be used can be appropriately selected in consideration of efficiency, yield, or the like, but generally, the amount is 100 parts by mass to 10000 parts by mass, preferably 200 parts by mass to 2000 parts by mass, and more preferably 300 parts by mass to 1000 parts by mass, based on 100 parts by mass of a polymer solution.

The temperature in the precipitation or reprecipitation can be appropriately selected in consideration of efficiency, yield, or the like, but the temperature is generally about 0° C. to 50° C., and preferably around room temperature (for example, about 20° C. to 35° C.). The precipitation or reprecipitation can be carried out by a well-known method such as a batch method, a continuous method, or the like and using a widely used mixing container such as a stirring tank.

The precipitated or reprecipitated polymer is generally subjected to widely used solid-liquid separation such as filtration or centrifugation, followed by drying, and then used. The filtration is performed preferably under reduced pressure by using a solvent-resistant filtering medium. The drying is performed under normal pressure or reduced pressure (preferably reduced pressure) at about 30° C. to 100° C., and preferably about 30° C. to 50° C.

In addition, once the resin is precipitated and separated, the resin may be dissolved again in a solvent and brought into contact with a solvent that poorly dissolves or does not dissolve the resin. That is, a method may also be used which includes (step a) precipitating the resin by bringing the polymer into contact with a solvent that poorly dissolves or does not dissolve the polymer after the above-described radical polymerization reaction is completed, (step b) separating the resin from the solution, (step c) preparing a resin solution A by dissolving the resin again in a solvent, (step d) then precipitating a resin solid by bringing the resin solution A into contact with a solvent that poorly dissolves or does not dissolve the resin, in such an amount that the volume of the solvent is less than 10 times (preferably 5 times or less) the resin solution A, and (step e) separating the precipitated resin.

In order to inhibit the resin from aggregating after the composition is prepared, for example, a step of preparing a solution by dissolving the synthesized resin in a solvent and heating the solution at about 30° C. to 90° C. for about 30 minutes to 4 hours may be added as described in JP2009-037108A.

The weight average molecular weight of the resin (A) of the present invention is preferably 1,000 to 200,000, more preferably 2,000 to 20,000, even more preferably 3,000 to 18,000, and particularly preferably 3,000 to 10,000, in terms of a polystyrene-converted value measured by GPC. If the weight average molecular weight is 1,000 to 200,000, the deterioration of heat resistance, dry etching resistance, developability, and the deterioration of film formability caused by the viscosity increase can be prevented.

The degree of dispersion (molecular weight distribution) is generally in a range of from 1.0 to 3.0, preferably from 1.0 to 2.6, more preferably from 1.0 to 2.0, and particularly preferably from 1.4 to 2.0. The smaller the molecular weight distribution, the better the resolution, resist shape, and roughness, and the smoother the side wall of a resist pattern.

In the actinic-ray-sensitive or radiation-sensitive resin composition of the present invention, the mixing proportion of the resin (A) in the whole composition is preferably 30% by mass to 99% by mass, and more preferably 60% by mass to 95% by mass, based on the total solid content.

In addition, in the present invention, one kind of the resin (A) may be used, or a plurality of kinds of the resin (A) may be used concurrently.

[2] compound (B) having a polymerizable group and generating an acid by being irradiated with actinic rays or radiations The actinic-ray-sensitive or radiation-sensitive resin composition according to the present invention contains, as an acid-generating agent, a compound (B) (hereinafter, also referred to as a "compound (B)" or an "acid-generating agent (B)") that has a polymerizable group and generates an acid by being irradiated with actinic rays or radiations.

As described above, the polymerizable group is preferably a polymerizable group that can be polymerized by the action of an acid or a radical. In addition, the polymerizable group also includes a crosslinkable group.

The compound (B) is not particularly limited so long as this compound has a polymerizable group and generates an acid by being irradiated with actinic rays or radiations, and examples of the compound (B) include a diazonium salt, a phosphonium salt, a sulfonium salt, an iodonium salt, imidosulfonate, oxime sulfonate, diazosulfonate, disulfone, o-nitrobenzyl sulfonate, and the like. The compound (B) is preferably an onium salt compound such as a sulfonium salt and more preferably represented by the following General Formula (ZI).

(ZI)

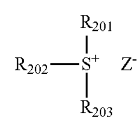

In the General Formula (ZI), each of $R_{201}$, $R_{202}$, and $R_{203}$ independently represents an organic group.

The organic group represented by $R_{201}$, $R_{202}$, and $R_{203}$ generally has 1 to 30 carbon atoms, and preferably has 1 to 20 carbon atoms.

In addition, two out of $R_{20}$ to $R_{203}$ may form a ring structure by binding to each other, and the ring may contain an oxygen atom, a sulfur atom, an ester bond, an amide bond, or a carbonyl group in the ring. Examples of the group that two out of $R_{201}$ to $R_{203}$ form by binding to each other include an alkylene group (for example, a butylene group or a pentylene group).

$Z^-$ represents a non-nucleophilic anion.

At least one of $R_{201}$, $R_{202}$, $R_{203}$, and $Z^-$ has a polymerizable group. From the viewpoint of inhibiting diffusion of the generated acid, it is preferable that $Z^-$ have a polymerizable group.

The polymerizable group of the compound (B) is not particularly limited, and examples of the polymerizable group include an ethylenic unsaturated group, an epoxy group, an oxetane group, a group represented by the following General Formula (ZII), and the like.

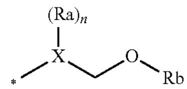

(ZII)

In the General Formula (ZII), each of X, Ra, Rb, and n independently has the same definition as that of X, Ra, Rb, and n in the group of the polymerizable group represented by General Formula (ZII) that the resin (A) can have, and the specific and preferable examples thereof are also the same. * represents a direct link.

The polymerizable group of the compound (B) is particularly preferably a (meth)acrylate group, an epoxy group, or a group represented by the General Formula (ZII).

The number of the polymerizable groups in one molecule of the compound (B) is not particularly limited, and the number is preferably 1 to 10, more preferably 1 to 5, and particularly preferably 1 to 3.

Examples of the non-nucleophilic anion represented by $Z^-$ include a sulfonic acid anion, a carboxylic acid anion, a sulfonylimide anion, a bis(alkylsulfonyl)imide anion, a tris(alkylsulfonyl)methyl anion, and the like.

The non-nucleophilic anion is an anion with a very low ability of causing a nucleophilic reaction, which is an anion that can inhibit temporal degradation caused by an intramolecular nucleophilic reaction. Due to this property, the temporal stability of the resist is improved.

Examples of the sulfonic acid anion include an aliphatic sulfonic acid anion, an aromatic sulfonic acid anion, a camphorsulfonic acid anion, and the like.

Examples of the carboxylic acid anion include an aliphatic carboxylic acid anion, an aromatic carboxylic acid anion, an aralkyl carboxylic acid anion, and the like.

The aliphatic moiety in the aliphatic sulfonic acid anion may be an alkyl group or a cycloalkyl group, and is preferably an alkyl group having 1 to 30 carbon atoms and a cycloalkyl group having 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a bornyl group, and the like.

As the aromatic group in the aromatic sulfonic acid anion, an aryl group having 6 to 14 carbon atoms is preferable. Examples thereof include a phenyl group, a tolyl group, a naphthyl group, and the like.

The alkyl group, cycloalkyl group, and aryl group in the aliphatic sulfonic acid anion and aromatic sulfonic acid anion may have a substituent. Examples of the substituent of the alkyl group, cycloalkyl group, and aryl group in the aliphatic sulfonic acid anion and aromatic sulfonic acid anion include a nitro group, a halogen atom (a fluorine atom, a chlorine atom, a bromine atom, or an iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxy sulfonyl group (preferably having 7 to 20 carbon atoms), a cycloalkylaryloxy sulfonyl group (preferably having 10 to 20 carbon atoms), an alkyloxy alkyloxy group (preferably having 5 to 20 carbon atoms), a cycloalkylalkyloxy alkyloxy group (preferably having 8 to 20 carbon atoms), and the like. Regarding the aryl group and the ring structure of the respective groups, an alkyl group (preferably having 1 to 15 carbon atoms) can be further exemplified as a substituent.

Examples of the aliphatic moiety in the aliphatic carboxylic acid anion include the same alkyl group and cycloalkyl group as those in aliphatic sulfonic acid anion.

Examples of the aromatic group in the aromatic carboxylic acid anion include the same aryl group as that in the aromatic sulfonic acid anion.

The aralkyl group in the aralkyl carboxylic acid anion is preferably an aralkyl group having 7 to 12 carbon atoms, and examples thereof include a benzyl group, a phenethyl group, a naphthyl methyl group, a naphthyl ethyl group, a naphthyl butyl group, and the like.

The alkyl group, cycloalkyl group, aryl group, and aralkyl group in the aliphatic carboxylic acid anion, aromatic carboxylic acid anion, and aralkyl carboxylic acid anion may have a substituent. Examples of the substituent of the alkyl group, cycloalkyl group, aryl group, and aralkyl group in the aliphatic carboxylic acid anion, aromatic carboxylic acid anion, and aralkyl carboxylic acid anion include the same halogen atom, alkyl group, cycloalkyl group, alkoxy group, alkylthio group, and the like as those in the aromatic sulfonic acid anion.

Examples of the sulfonylimide anion include a saccharin anion.

The alkyl group in the bis(alkylsulfonyl)imide anion and tris(alkylsulfonyl)methyl anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, a neopentyl group, and the like. Examples of a substituent of these alkyl groups include a halogen atom, an alkyl group substituted with a halogen atom, an alkoxy group, an alkylthio group, an alkyloxysulfonyl group, an aryloxysulfonyl group, a cycloalkylaryloxy sulfonyl group, and the like, and an alkyl group substituted with a fluorine atom is preferable.

As other non-nucleophilic anions, fluorinated phosphorous (for example, $PF_6^-$), fluorinated boron (for example, $BF_4^-$), fluorinated antimony (for example, $SbF_6^-$), and the like can be exemplified.

As the non-nucleophilic anion of $Z^-$, an aliphatic sulfonic acid anion in which an α-position of the sulfonic acid has been substituted with a fluorine atom, an aromatic sulfonic acid anion substituted with a fluorine atom or a group having a fluorine atom, a bis(alkylsulfonyl)imide anion in which the alkyl group has been substituted with a fluorine atom, and a tris(alkylsulfonyl)methide anion in which the alkyl group has been substituted with a fluorine atom are preferable. The non-nucleophilic anion is more preferably a perfluoro aliphatic sulfonic acid anion having 4 to 8 carbon atoms or a benzenesulfonic acid anion having a fluorine atom, and even more preferably a nonafluorobutanesulfonic acid anion, a perfluorooctanesulfonic acid anion, a pentafluorobenzenesulfonic acid anion, or a 3,5-bis(trifluoromethyl)benzenesulfonic acid anion.

When the compound (B) is represented by (ZI), the non-nucleophilic anion represented by $Z^-$ is preferably a structure represented by the following General Formula (I).

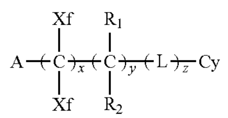

(I)

In the formula, each Xf independently represents a fluorine atom or an alkyl group substituted with at least one fluorine atom.

Each of $R_1$ and $R_2$ independently represents a hydrogen atom, a fluorine atom, or an alkyl group. When there is a plurality of $R_1$s and $R_2$s, each of the $R_1$s and $R_2$s may be the same as or different from each other.

L represents a divalent linking group, and when there is a plurality of Ls, the Ls may be the same as or different from each other.

Cy represents a cyclic organic group.

A represents $HO_3S$— or $RfSO_2$—NH—$SO_2$—. Rf represents an alkyl group having at least one fluorine atom, a cycloalkyl group having at least one fluorine atom, or an aryl group having at least one fluorine atom. A fluorine atom may be introduced to a cycloalkyl group and an aryl group not only by fluorine atom substitution, but also by alkyl fluoride (such as —$CF_3$) substitution. Specific examples of the alkyl group represented by Rf and having at least one fluorine atom are the same as those described later for Xf. Specific examples of the cycloalkyl group represented by Rf and having at least one fluorine atom include perfluorocyclopentyl, perfluorocyclohexyl, and the like. Specific examples of the aryl group represented by Rf and having at least one fluorine atom include perfluorophenyl and the like. Each of these groups may be substituted with a substituent that does not contain a fluorine atom.

x represents an integer of 1 to 20, y represents an integer of 0 to 10, and z represents an integer of 0 to 10.

General Formula (I) will be described in more detail.

The alkyl group of Xf, which is substituted with a fluorine atom, preferably has 1 to 10 carbon atoms, and more preferably has 1 to 4 carbon atoms. Moreover, the alkyl group of Xf, which is substituted with a fluorine atom, is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, a fluorine atom and $CF_3$ are preferable. Particularly, Xfs at both sides are preferably fluorine atoms.

The alkyl group of $R_1$ and $R_2$ is preferably an alkyl group which may be substituted with a substituent (preferably a fluorine atom) and has 1 to 4 carbon atoms. As the alkyl group, a perfluoroalkyl group having 1 to 4 carbon atoms is more preferable. Specific examples of the alkyl group of $R_1$ and $R_2$ that has a substituent include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F$ $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

$R_1$ and $R_2$ are preferably a fluorine atom or $CF_3$.

y is preferably 0 to 4, and more preferably 0. x is preferably 1 to 8, more preferably 1 to 4, and particularly preferably 1. z is preferably 0 to 8, and more preferably 0 to 4.

The divalent linking group of L is not particularly limited, and examples of the divalent linking group include —COO—, —COO—, —CONH—, —NHCO—, —CO—, —O—, —S—, —SO—, —$SO_2$—, an alkylene group (preferably having 1 to 6 carbon atoms), a cycloalkylene group (preferably having 3 to 10 carbon atoms), an alkenylene group (preferably having 2 to 6 carbon atoms), and a linking group in which a plurality of the above groups are combined, and a linking group having 12 or less carbon atoms in total is preferable. Among these, —COO—, —COO—, —CONH—, —NHCO—, —COO-alkylene group-, —OCO-alkylene group-, —CONH-alkylene group-, —NHCO-alkylene group-, —CO—, —O—, and —$SO_2$— are more preferable, and —COO—, —COO—, and —$SO_2$— are even more preferable, and —$SO_2$— is particularly preferable.

The cyclic organic group of Cy is not particularly limited so long as the group has a cyclic structure. Examples of the cyclic organic group include an alicyclic group, an aryl group, a heterocyclic group (including both the groups having and not having aromaticity, such as a tetrahydropirane ring and a lactone ring structure), and the like.

The alicyclic group may be monocyclic or polycyclic. A monocyclic cycloalkyl group such as a cyclopentyl group, a cyclohexyl group, and a cyclooctyl group and a polycyclic cycloalkyl group such as a norbornyl group, a tricyclodecanyl group, a tetracyclodecanyl group, a tetracyclododecanyl group, and an adamantyl group are preferable. Among these, alicyclic groups with a bulky structure having 7 or more carbon atoms, such as norbornyl group, a tricyclodecanyl group, a tetracyclodecanyl group, a tetracyclododecanyl group, and an adamantyl group, are preferable. By such an alicyclic group, the generated acid can be inhibited from being diffused in the film during a PEB (Post Exposure Bake) process, and a MEEF (Mask Error Enhancement Factor) can be improved. MEEF indicates the amount of change in a pattern size with respect to errors in mask dimensions. If the value of MEEF is great, a very high cost is required for manufacturing a Mask, and yield of device manufacture is dropped.

The aryl group may be monocyclic or polycyclic. Examples of the aryl group include a phenyl group, a naphthyl group, a phenanthryl group, an anthryl group, and the like. Among these, naphthalene showing low light absorbance is preferable from the viewpoint of light absorbance at 193 nm.

The heterocyclic group may be monocyclic or polycyclic. Examples of the heterocyclic group include heterocyclic groups derived from a furan ring, a thiophene ring, a benzofuran ring, a benzothiophene ring, a dibenzofuran ring, a dibenzothiophene ring, a pyridine ring, piperidine ring, and a decahydroisoquinoline ring. Among these, heterocyclic groups derived from a furan ring, a thiophene ring, pyridine ring, piperidine ring, and a decahydroisoquinoline ring are preferable.

As the cyclic organic group, a lactone structure can also be exemplified. Specific examples of the lactone structure include lactone structures represented by General Formulae (LC1-1) to (LC1-17) that the resin (A) may have.

The cyclic organic group may have a substituent. Examples of the substituent include an alkyl group (which may be linear, branched, or cyclic and preferably has 1 to 12 carbon atoms), a cycloalkyl group (which may be monocyclic, polycyclic, or a spiro ring and preferably has 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, a sulfonic acid ester group, and the like. In addition, the carbon (which helps the formation of a ring) constituting the cyclic organic group may be carbonyl carbon.

When included in the anion represented by the General Formula (I), the polymerizable group may be included in any group of Xf, $R_1$, $R_2$, L, Cy, and Rf, but the polymerizable group is included preferably in Rf or Cy, and particularly preferably in Cy.

Specific and preferable examples of the polymerizable group are as described above.

When the anion $Z^-$ (for example, an acid-generating anion represented by the General Formula (I)) has a polymerizable group, the polymerizable group may bind to the anion via a divalent linking group. For example, an embodiment is exemplified in which Cy has been substituted with the polymerizable group via a divalent linking group.

Such a divalent linking group is not particularly limited, and examples thereof include —COO—, —COO—, —O—, an alkylene group, a linking group in which a plurality of these groups are combined, and the like.

As more preferable structures of (ZI), compounds (ZI-1), (ZI-2), (ZI-3), and (ZI-4) described below can be exemplified.

The compound (ZI-1) is an aryl sulfonium compound in which at least one of $R_{201}$ to $R_{203}$ of the General formula (ZI) is an aryl group, that is, a compound having aryl sulfonium as a cation.

In the aryl sulfonium compound, all of $R_{201}$ to $R_{203}$ may be aryl groups; alternatively, a portion of $R_{201}$ to $R_{203}$ may be an aryl group, and the remaining group may be an alkyl group or a cycloalkyl group.

Examples of the aryl sulfonium compound include a triaryl sulfonium compound, a diaryl alkyl sulfonium group, an aryl dialkyl sulfonium compound, a diaryl cycloalkyl sulfonium compound, and an aryl dicycloalkyl sulfonium compound.

As the aryl group of the aryl sulfonium compound, a phenyl group and a naphthyl group are preferable, and a phenyl group is more preferable. The aryl group may be an aryl group having a heterocyclic structure containing an oxygen atom, a nitrogen atom, a sulfur atom, and the like. Examples of the aryl group having a heterocyclic structure include a pyrrole residue (a group formed when pyrrole loses one hydrogen atom), a furan residue (a group formed when furan loses one hydrogen atom), a thiophene residue (a group formed when thiophene loses one hydrogen atom), an indole residue (a group formed when indole loses one hydrogen atom), a benzofuran residue (a group formed when benzofuran loses one hydrogen atom), a benzothiophene residue (a group formed when benzothiophene loses one hydrogen atom), and the like. When the aryl sulfonium compound has two or more aryl groups, the two or more aryl groups may be the same as or different from each other.

The alkyl group or cycloalkyl group that the aryl sulfonium compound optionally has is preferably a linear or branched alkyl group having 1 to 15 carbon atoms and a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, a cyclohexyl group, and the like.

When the compound (ZI-1) has a polymerizable group on an anion, at least one of $R_{201}$ to $R_{203}$ can have the polymerizable group.

Specific and preferable examples of the polymerizable group that $R_{201}$ to $R_{203}$ can have are as described above.

When at least one of $R_{201}$ to $R_{203}$ has a polymerizable group, the polymerizable group may binds to the cation structure via a divalent linking group.

Such a divalent linking group is not particularly limited, and examples thereof include —COO—, —COO—, —O—, —CO—, —NH—, an alkylene group, a linking group in which a plurality of these groups are combined, and the like.

Particularly, when the polymerizable group is a group represented by the General Formula (ZII), and X in the General Formula (ZII) is an aromatic group having a valency of (n+2), at least one aryl group of $R_{201}$ to $R_{203}$ may be X as the aromatic group having a valency of (n+2).

The aryl group, alkyl group, and cycloalkyl group of $R_{201}$ to $R_{203}$ may have an alkyl group (having 1 to 15 carbon atoms, for example), a cycloalkyl group (having 3 to 15 carbon atoms, for example), an aryl group (having 6 to 14 carbon atoms, for example), an alkoxy group (having 1 to 15 carbon atoms, for example), a halogen atom, a hydroxyl group, or a phenylthio group as a substituent, in addition to the polymerizable group. The substituent is preferably a linear or branched alkyl group having 1 to 12 carbon atoms, a cycloalkyl group having 3 to 12 carbon atoms, a linear, branched, or cyclic alkoxy group having 1 to 12 carbon atoms, and more preferably an alkyl group having 1 to 4 carbon atoms or an alkoxy group having 1 to 4 carbon atoms. The substituent may be substituted with at least one out of three of $R_{201}$ to $R_{203}$, or may be substituted with all of three. When $R_{201}$ to $R_{203}$ are aryl groups, the substituent is preferably substituted with a p-position of the aryl group.

Next, the compound (ZI-2) will be described.

The compound (ZI-2) is a compound in which each of $R_{201}$ to $R_{203}$ in Formula (ZI) independently represents an organic group not having an aromatic ring. The aromatic ring herein also includes an aromatic ring containing a hetero atom.

The organic group not containing an aromatic ring represented by $R_{201}$ to $R_{203}$ has generally 1 to 30 carbon atoms, and preferably 1 to 20 carbon atoms.

Each of $R_{201}$ to $R_{203}$ is independently an alkyl group, a cycloalkyl group, an allyl group, or a vinyl group preferably, and more preferably a linear or branched 2-oxoalkyl group, a 2-oxocycloalkyl group, or an alkoxycarbonyl methyl group, and particularly preferably a linear or branched 2-oxoalkyl group.

Preferable examples of the alkyl group and cycloalkyl group of $R_{201}$ to $R_{203}$ include a linear or branched alkyl group (for example, a methyl group, an ethyl group, a propyl group, a butyl group, or a pentyl group) having 1 to 10 carbon atoms and a cycloalkyl group (a cyclopentyl group, a cyclohexyl group, or a norbornyl group) having 3 to 10 carbon atoms. More preferable examples of the alkyl group include a 2-oxoalkyl group and an alkoxycarbonyl methyl group. More preferable examples of the cycloalkyl group include a 2-oxocycloalkyl group.

The 2-oxoalkyl group may be linear or branched, and more preferable examples thereof include a group having >C═O in the second position of the above alkyl group.

Preferable examples of the 2-oxocycloalkyl group include a group having >C═O in the second position of the above cycloalkyl group.

Preferable examples of the alkoxy group in the alkoxycarbonyl methyl group include an alkoxy group (a methoxy group, an ethoxy group, a propoxy group, a butoxy group, or a pentoxy group) having 1 to 5 carbon atoms.

When the compound (ZI-2) has a polymerizable group on a cation, at least one of $R_{201}$ to $R_{203}$ can have the polymerizable group.

Specific and preferable examples of the polymerizable group that $R_{201}$ to $R_{203}$ can have are as described above.

When at least one of $R_{201}$ to $R_{203}$ has a polymerizable group, the polymerizable group may bind to the cation structure via a divalent linking group.

Such a divalent linking group is not particularly limited, and examples thereof include —COO—, —COO—, —O—, —CO—, —NH—, an alkylene group, a linking group in which a plurality of these groups are combined, and the like.

$R_{201}$ to $R_{203}$ may be further substituted with a halogen atom, an alkoxy group (having 1 to 5 carbon atoms, for example), a hydroxyl group, a cyano group, or a nitro group other than the polymerizable group.

The compound (ZI-3) is a compound represented by the following General formula (ZI-3), which is a compound having a phenacyl sulfonium salt structure.

(ZI-3)

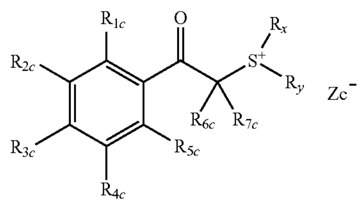

In General formula (ZI-3), each of $R_{1c}$ to $R_{5c}$ independently represents a polymerizable group, a hydrogen atom, an alkyl group, a cycloalkyl group, an aryl group, an alkoxy group, an aryloxy group, an alkoxycarbonyl group, an alkyl carbonyloxy group, a cycloalkyl carbonyloxy group, a halogen atom, a hydroxyl group, a nitro group, an alkylthio group, or an arylthio group.

Each of $R_{6c}$ and $R_{7c}$ independently represents a polymerizable group, a hydrogen atom, an alkyl group, a cycloalkyl group, a halogen atom, a cyano group, or an aryl group.

Each of $R_x$ and $R_y$ independently represents an alkyl group, a cycloalkyl group, a 2-oxoalkyl group, a 2-oxocycloalkyl group, an alkoxycarbonyl alkyl group, an aryl group, or a vinyl group.

Any two or more out of $R_{1c}$ to $R_{5c}$, $R_{5c}$ and $R_{6c}$, $R_{6c}$, and $R_{7c}$, $R_{5c}$ and $R_x$, and $R_x$ and $R_y$ may form a ring structure by binding to each other respectively, and this ring structure may include an oxygen atom, a sulfur atom, a ketone group, an ester bond, or an amide bond.

Examples of the ring structure include an aromatic or non-aromatic hydrocarbon ring, an aromatic or non-aromatic hetero ring, and a polycyclic condensed ring formed of a combination of two or more of these rings. Examples of the ring structure include a 3- to 10-membered ring, and the ring structure is preferably a 4- to 8-membered ring and more preferably a 5- to 6-membered ring.

Examples of the group that any two or more out of $R_{1c}$ to $R^{5c}$, $R_{6c}$ and $R_{7c}$, and $R_x$ and $R_y$ form by binding to each other include a butylene group, a pentylene group, and the like.

The group that $R_{5c}$ and $R_{6c}$, and $R_{5c}$ and $R_x$ form by binding to each other is preferably a single bond or an alkylene group, and examples of the alkylene group include a methylene group, an ethylene group, and the like.

$Zc^-$ represents a non-nucleophilic anion, and examples thereof include the same non-nucleophilic anion represented by $Z^-$ in General formula (ZI).

The alkyl group represented by $R_{1c}$ to $R_{7c}$ may be linear or branched. Examples of the alkyl group include an alkyl group having 1 to 20 carbon atoms, and preferably include a linear or branched alkyl group (for example, a methyl group, an ethyl group, a linear or branched propyl group, a linear or branched butyl group, or a linear or branched pentyl group) having 1 to 12 carbon atoms. Examples of the cycloalkyl group include a cycloalkyl group (for example, a cyclopentyl group or a cyclohexyl group) having 3 to 8 carbon atoms.

The aryl group represented by $R_{1c}$ and $R_{5c}$ preferably has 5 to 15 carbon atoms, and examples thereof include a phenyl group and a naphthyl group.

The alkoxy group represented by $R_{1c}$ to $R_{5c}$ may be linear, branched, or cyclic. Examples of the alkoxy group include an alkoxy group having 1 to 10 carbon atoms, and preferably include a linear or branched alkoxy group (for example, a methoxy group, an ethoxy group, a linear or branched propoxy group, a linear or branched butoxy group, or a linear or branched pentoxy group) having 1 to 5 carbon atoms and a cyclic alkoxy group (for example, a cyclopentyloxy group or a cyclohexyloxy group) having 3 to 8 carbon atoms.

Specific examples of the alkoxy group in the alkoxycarbonyl group represented by $R_{1c}$ to $R_{5c}$ are the same as the above specific examples of the alkoxy group represented by $R_{1c}$ to $R_{5c}$.

Specific examples of the alkyl group in the alkylcarbonyloxy group and the alkylthio group represented by $R_{1c}$ to $R_{5c}$ are the same as the above specific examples of the alkyl group represented by $R_{1c}$ to $R_{5c}$.

Specific examples of the cycloalkyl group in the cycloalkyl carbonyloxy group represented by $R_{1c}$ to $R_{5c}$ are the same as the above specific examples of the cycloalkyl group represented by $R_{1c}$ to $R_{5c}$.

Specific examples of the aryl group in the aryloxy group and the arylthio group represented by $R_{1c}$ to $R_{5c}$ are the same as the above specific examples of the aryl group represented by $R_{1c}$ to $R_{5c}$.

Any one of $R_{1c}$ to $R_{5c}$ is preferably a linear or branched alkyl group, a cycloalkyl group, or a linear, branched, or cyclic alkoxy group. More preferably, the sum of the number of carbon atoms of $R_{1c}$ to $R_{5c}$ is 2 to 15. In this structure, solvent solubility of the compound (B) is further improved, and the generation of particles during storage is inhibited.

Examples of the ring structure that any two out of $R_{1c}$ to $R_{5c}$ may form by binding to each other preferably include a 5- or 6-membered ring, and particularly preferably include a 6-membered ring (for example, a phenyl ring).

Examples of the ring structure that $R_{5c}$ and $R_{6c}$ may form by binding to each other include a 4- or more membered ring (particularly preferably a 5- to 6-membered ring) that is formed in a manner in which $R_{5c}$ and $R_{6c}$ constitute a single bond or an alkylene group (a methylene group, an ethylene group, or the like) by binding to each other, and this single bond or alkylene group forms the 4- or more membered ring together with a carbonyl carbon atom and a carbon atom in General Formula (ZI-3).

The aryl group represented by $R_{6c}$ and $R_{7c}$ preferably includes 5 to 15 carbon atoms, and examples thereof include a phenyl group and a naphthyl group.

When $R_{6c}$ and $R_{7c}$ form a ring by binding to each other, the group that $R_{6c}$ and $R_{7c}$ form by binding to each other is preferably an alkylene group having 2 to 10 carbon atoms, and examples thereof include an ethylene group, a propylene group, a butylene group, a pentylene group, a hexylene group, and the like. The ring that $R_{6c}$ and $R_{7c}$ form by binding to each other may include a hetero atom such as oxygen atoms and the like in the ring.

Examples of the alkyl group and the cycloalkyl group represented by $R_x$ and $R_y$ include the same alkyl group and cycloalkyl group as the respective group in $R_{1c}$ to $R_{7c}$. The alkyl group and the cycloalkyl group are more preferably a 2-oxoalkyl group, a 2-oxocycloalkyl group, or an alkoxycarbonyl methyl group.

Examples of the 2-oxoalkyl group and the 2-oxocycloalkyl group represented by $R_x$ and include the group having >C═O in the second position of the alkyl group and the cycloalkyl group represented by $R_{1c}$ to $R_{7c}$.

Examples of the alkoxy group in the alkoxycarbonyl alkyl group represented by $R_x$ and $R_y$ include the same alkoxy group as the respective group in $R_{1c}$ to $R_{5c}$. Examples of the alkyl group include an alkyl group having 1 to 12 carbon atoms, and preferably include a linear alkyl group (for example, a methyl group or an ethyl group) having 1 to 5 carbon atoms.

The aryl group represented by $R_x$ and $R_y$ is not particularly limited, but this aryl group is preferably an unsubstituted aryl group or an aryl group substituted with a monocyclic or polycyclic cycloalkyl group (preferably a cycloalkyl group having 3 to 10 carbon atoms).

The vinyl group represented by $R_x$ and $R_y$ is not particularly limited, but this vinyl group is preferably an unsubstituted vinyl group or a vinyl group substituted with a monocyclic or polycyclic cycloalkyl group (preferably a cycloalkyl group having 3 to 10 carbon atoms).

Examples of the ring structure that $R_{5c}$ and $R_x$ may form by binding to each other include a 5- or more membered ring (particularly preferably a 5-membered ring) that is formed in a manner in which $R_{5c}$ and $R_x$ constitute a single bond or an alkylene group (a methylene group, an ethylene group, or the like) by binding to each other, and this single bond or alkylene group forms the 5- or more membered ring together with a sulfur atom and a carbonyl carbon atom in General Formula (ZI-3).

Examples of the ring structure that $R_x$ and $R_y$ may form by binding to each other include a 5- or 6-membered ring, and particularly preferably include a 5-membered ring (that is, a tetrahydrothiophene ring) that the divalent $R_x$ and $R_y$ (for example, a methylene group, an ethylene group, a propylene group, or the like) form together with a sulfur atom in General Formula (ZI-3).

$R_x$ and $R_y$ are an alkyl group or a cycloalkyl group having preferably 4 or more carbon atoms, more preferably 6 or more carbon atoms, and even more preferably 8 or more carbon atoms.

When the compound (ZI-3) has a polymerizable group on a cation, any of $R_{1c}$ to $R_{7c}$ may be the polymerizable group, and at least one of $R_{1c}$ to $R_{7c}$ and $R_x$ and $R_y$ may have the polymerizable group as a substituent.

In addition, the polymerizable group may bind to a cation structure via a divalent linking group.

Such a divalent linking group is not particularly limited, and examples thereof include —COO—, —COO—, —O—, —CO—, —NH—, an alkylene group, a linking group in which a plurality of these groups are combined, and the like.

Specific and preferable examples of the polymerizable group include the same ones as described as the polymerizable group that $R_{201}$ to $R_{203}$ can have.

Particularly, when the polymerizable group is a group represented by the General Formula (ZII), and X in the General Formula (ZII) is an aromatic group having a valency of (n+2), the benzene ring in General Formula (ZI-3) may be X as the aromatic group having a valency of (n+2).

$R_{1c}$ to $R_{7c}$ and $R_x$ and $R_y$ may further have a substituent in addition to the polymerizable group, and examples of the substituent include a halogen atom (for example, a fluorine atom), an hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, an aryloxycarbonyloxy group, and the like.

Examples of the alkyl group include linear or branched alkyl groups having 1 to 12 carbon atoms, such as a methyl group, an ethyl group, an n-propyl group, an i-propyl group, an n-butyl group, a 2-methylpropyl group, a 1-methylpropyl group, and a t-butyl group.

Examples of the cycloalkyl group include cycloalkyl groups having 3 to 10 carbon atoms, such as a cyclopentyl group and a cyclohexyl group.

Examples of the aryl group include aryl groups having 6 to 15 carbon atoms, such as a phenyl group and a naphthyl group.

Examples of the alkoxy group include linear, branched, or cyclic alkoxy groups having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the aryloxy group include aryloxy groups having 6 to 10 carbon atoms, such as a phenyloxy group and a naphthyloxy group.

Examples of the acyl group include linear or branched acyl groups having 2 to 12 carbon atoms, such as an acetyl group, a propionyl group, an n-butanoyl group, an i-butanoyl group, an n-heptanoyl group, a 2-methylbutanoyl group, a 1-methylbutanoyl group, and a t-heptanoyl group.

Examples of the arylcarbonyl group include arylcarbonyl groups having 6 to 10 carbon atoms, such as a phenylcarbonyl group and a naphthylcarbonyl group.

Examples of the alkoxyalkyl group include linear, branched, or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the aryloxyalkyl group include aryloxyalkyl group having 7 to 12 carbon atoms, such as a phenyloxymethyl group, a phenyloxyethyl group, a naphthyloxymethyl group, and a naphthyloxyethyl group.

Examples of the alkoxycarbonyl group include linear, branched, or cyclic alkoxycarbonyl groups having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the aryloxycarbonyl group include aryloxycarbonyl groups having 7 to 11 carbon atoms, such as a phenyloxycarbonyl group and a naphthyloxycarbonyl group.

Examples of the alkoxycarbonyloxy group include linear, branched, or cyclic alkoxycarbonyloxy groups having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

Examples of the aryloxycarbonyloxy group include aryloxycarbonyloxy groups having 7 to 11 carbon atoms, such as a phenyloxycarbonyloxy group and a naphthyloxycarbonyloxy group.

In the General Formula (ZI-3), it is more preferable that each of $R_{1c}$, $R_{2c}$, $R_{4c}$, and $R_{5c}$ independently represent a hydrogen atom, and that $R_{3c}$ represent a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Next, the compound (ZI-4) will be described.

The compound (ZI-4) is a compound represented by the following General Formula (ZI-4).

(ZI-4)

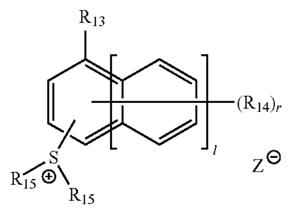

In General formula (ZI-4), $R_{13}$ represents a polymerizable group, a hydrogen atom, a fluorine atom, a hydroxyl group, an alkyl group, a cycloalkyl group, an alkoxy group, an alkoxycarbonyl group, or a group having a cycloalkyl group. These groups may have a substituent.

When there is a plurality of $R_{14}$s, each $R_{14}$ independently represents a polymerizable group, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group, or an aryl group. These groups may have a substituent. Two $R_{15s}$ may form a ring by binding to each other.

l represents an integer of 0 to 2.

r represents an integer of 0 to 8.

$Z^-$ represents a non-nucleophilic anion, and examples thereof include the same non-nucleophilic anion as represented by $Z^-$ in General formula (ZI).

In General formula (Z-14), the alkyl group of $R_{13}$, $R_{14}$, and $R_{15}$ may be linear or branched and preferably has 1 to 10 carbon atoms. Examples of the alkyl group include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, and the like. Among these alkyl groups, a methyl group, an ethyl group, an n-butyl group, a t-butyl group, and the like are preferable.

Examples of the cycloalkyl group of $R_{13}$, $R_{14}$, and $R_{15}$ include a monocyclic or polycyclic cycloalkyl group (preferably a cycloalkyl group having 3 to 20 carbon atoms), cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl, and the like. Particularly, cyclopropyl, cyclopentyl, cyclohexyl, cycloheptyl, and cyclooctyl are preferable.

Examples of the alkoxy group of $R_{13}$ and $R_{14}$ include linear or branched alkoxy groups having 1 to 10 carbon atoms such as a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like. Among these alkoxy groups, a methoxy group, an ethoxy group, an n-propoxy group, an n-butoxy group, and the like are preferable.

The alkoxycarbonyl group of $R_{13}$ and $R_{14}$ is linear or branched, and preferably has 2 to 11 carbon atoms. Examples of the alkoxycarbonyl group include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group, and the like. Among these alkoxycarbonyl groups, a methoxycarbonyl group, an ethoxycarbonyl group, an n-butoxycarbonyl group, and the like are preferable.

Examples of the cycloalkyl group of $R_{13}$ and $R_{14}$ include monocyclic or polycyclic cycloalkyl groups (preferably a cycloalkyl group having 3 to 20 carbon atoms) such as a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has 7 or more carbon atoms in total, and more preferably has 7 to 15 carbon atoms in total. In addition, the cycloalkyloxy group preferably has a monocyclic cycloalkyl group. Examples of the monocyclic cycloalkyloxy group having 7 or more carbon atoms in total include a cycloalkyloxy group such as a cyclopropyloxy group, a cyclobutyloxy group, a cyclopentyloxy group, a cyclohexyloxy group, a cyclooctyloxy group, a cyclododecanyloxy group, or the like which arbitrarily has a substituent including an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, or an iso-amyl group; a hydroxyl group; a halogen atom (fluorine, chlorine, bromine, or iodine); a nitro group; a cyano group; an amide group; a sulfonamide group; an alkoxy group such as a methoxy group, an ethoxy group, a hydroxyethoxy group, a propoxy group, a hydroxypropoxy group, or a butoxy group; an alkoxycarbonyl group such as a methoxycarbonyl group, or an ethoxycarbonyl group; an acyl group such as a formyl group, an acetyl group, or a benzoyl group; an acyloxy group such as an acetoxy group, a butyryloxy group, or the like; and a carboxy group. The total number of the carbon atoms of the monocyclic or polycyclic cycloalkyloxy group is 7 or more including an arbitrary substituent on the cycloalkyl group.

Examples of the polycyclic cycloalkyloxy group having 7 or more carbon atoms in total include a norbornyloxy group, a tricyclodecanyloxy group, a tetracyclodecanyloxy group, an adamantyloxy group, and the like.

The alkoxy group of $R_{13}$ and $R_{14}$, which has a monocyclic or polycyclic cycloalkyl group, preferably has 7 or more carbon atoms in total, and more preferably has 7 to 15 carbon atoms in total. In addition, this alkoxy group is preferably an alkoxy group having a monocyclic cycloalkyl group. The alkoxy group that has 7 or more carbon atoms in total and a monocyclic cycloalkyl group is a group that is obtained by substituting a monocyclic cycloalkyl group which may have the substituent described above with an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, or iso-amyloxy. The substituent is also included in the total 7 or more carbon atoms. Examples of this alkoxy group include a cyclohexyl methoxy group, a cyclopentyl ethoxy group, a cyclohexyl ethoxy group, and the like, and among these, a cyclohexyl methoxy group is preferable.

Examples of the alkoxy group having a polycyclic cycloalkyl group that has 7 or more carbon atoms in total include a norbornyl methoxy group, a norbornyl ethoxy group, a tricyclodecanyl methoxy group, a tricyclodecanyl ethoxy group, a tetracyclodecanyl methoxy group, a tetracyclodecanyl ethoxy group, an adamantyl methoxy group, an adamantyl ethoxy group, and the like. Among these, a norbornyl methoxy group, a norbornyl ethoxy group, and the like are preferable.

Examples of the alkyl group of the alkylcarbonyl group of $R_{14}$ include the same specific examples as the alkyl group represented by $R_{13}$ to $R_{15}$ described above.

The alkylsolfonyl group and cycloalkylsulfonyl group of $R_{14}$ are preferably linear, branched, or cyclic, and preferably have 1 to 10 carbon atoms. Examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group, and the like. Among these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group, and the like are preferable.

The aryl group represented by $R_{15}$ preferably has 6 to 10 carbon atoms, and specific examples of the aryl group include a phenyl group and a naphthyl group.

l is preferably 0 or 1, and more preferably 1.

r is preferably 0 to 2.

When the compound (ZI-4) has a polymerizable group on a cation, any one of $R_{13}$ and $R_{14}$ may be the polymerizable group, and at least one of $R_{13}$ to $R_{15}$ may have the polymerizable group as a substituent.

In addition, the polymerizable group may bind to the cation structure via a divalent linking group.

Such a divalent linking group is not particularly limited, and examples thereof include —COO—, —COO—, —O—, —CO—, —NH—, an alkylene group, a linking group in which a plurality of these groups are combined, and the like.

Specific and preferable examples of the polymerizable group include the same ones as those that were described above as the polymerizable group that $R_{201}$ to $R_{203}$ can have.

Particularly, when the polymerizable group is a group represented by the General Formula (ZII), Ra in the General Formula (ZII) and an aromatic ring to which $R_{13}$ in the General Formula (ZI-4) binds may form a ring (preferably a 5- or 6-membered ring) by binding to each other.

In General Formula (ZI-4), an alkyl group, a cycloalkyl group, an alkoxy group, and an alkoxycarbonyl group of $R_{13}$; an alkyl group, a cycloalkyl group, an alkoxy group, an alkylsulfonyl group, and a cycloalkylsulfonyl group of $R_{14}$; an alkyl group and a cycloalkyl group of $R_{15}$; and the ring structure that two $R_{15s}$ may form by binding to each other may further have a substituent other than the polymerizable group.

Examples of the substituent other than the polymerizable group that $R_{13}$, $R_{14}$, and $R_{15}$ may have include a halogen atom (for example, a fluorine atom), a hydroxyl group, a carboxyl group, a cyano group, a nitro group, an alkoxy group, an alkoxyalkyl group, an alkoxycarbonyl group, an alkoxycarbonyloxy group, and the like.

Examples of the alkoxy group include linear, branched, or cyclic alkoxy groups having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include linear, branched, or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include linear, branched, or cyclic alkoxycarbonyl groups having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the alkoxycarbonyloxy group include linear, branched, or cyclic alkoxycarbonyloxy groups having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

These substituents other than the polymerizable group that may be further included are preferably a hydroxyl group, an alkoxy group, an alkoxycarbonyl group, a fluorine atom, and a halogen atom.

The ring structure that two $R_{15s}$ may form by binding to each other is desirably a group that forms a 5- or 6-membered ring, and particularly preferably a 5-membered ring (that is, a tetrahydrothiophene ring) together with a sulfur atom in General Formula (ZI-4). Examples of the substituent of the divalent group described above include a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group, and the like. $R_{15}$ in General Formula (ZI-4) is preferably a methyl group, an ethyl group, a phenyl group, a 4-methoxyphenyl group, a 1-naphthyl group, a divalent group that forms a tetrahydrothiophene ring structure when two $R_{15s}$ bind to each other and form this ring together with a sulfur atom, or the like.

The alkyl group, cycloalkyl group, alkoxy group, and alkoxycarbonyl group of $R_{13}$ and the alkyl group, cycloalkyl group, alkoxy group, alkylsulfonyl group, and cycloalkylsulfonyl group of $R_{14}$ may be substituted with a substituent other than the polymerizable group as described above. The substituent is preferably a hydroxyl group, an alkoxy group, an alkoxycarbonyl group, or a halogen atom (particularly, a fluorine atom).

Hereinafter, specific examples of the compound (B) that has a polymerizable group and generates an acid by being irradiated with actinic rays or radiations will be shown, but the present invention is not limited to the examples.

(A1)
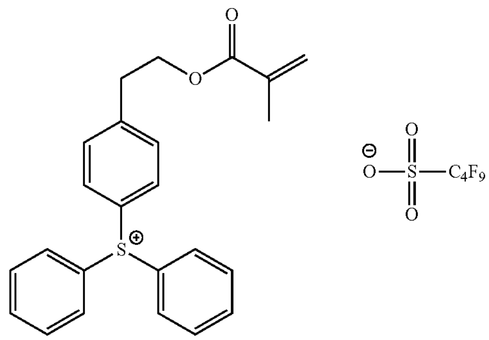
(A2)
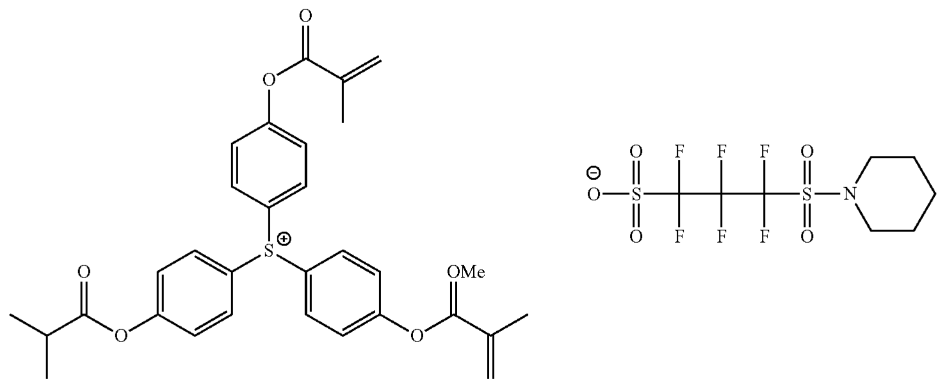
(A3)
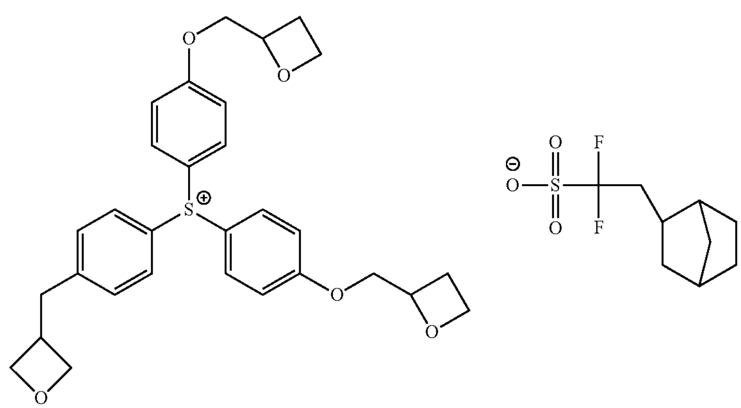
(A4)
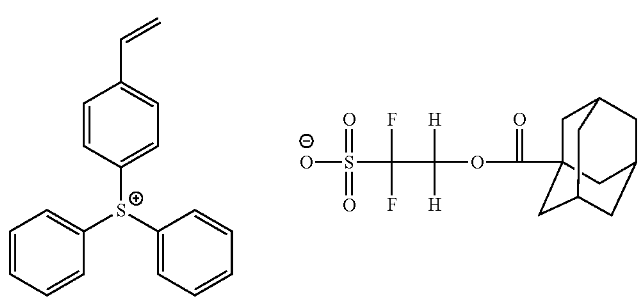

-continued
(A5)
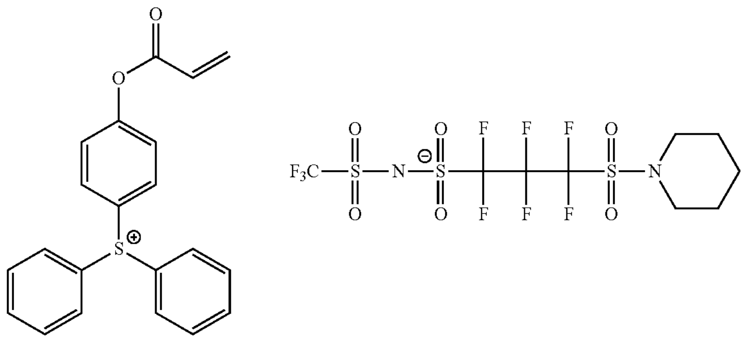
(A6)
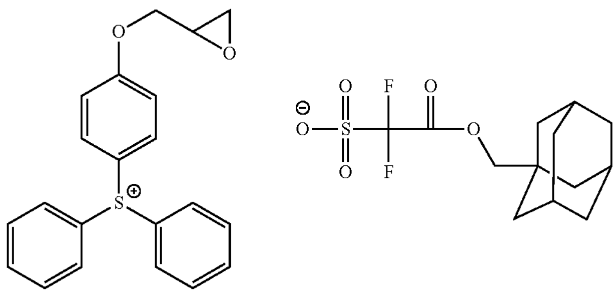
(A7)
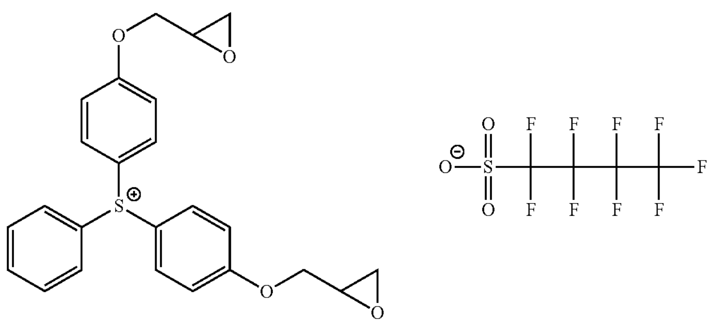
(A8)
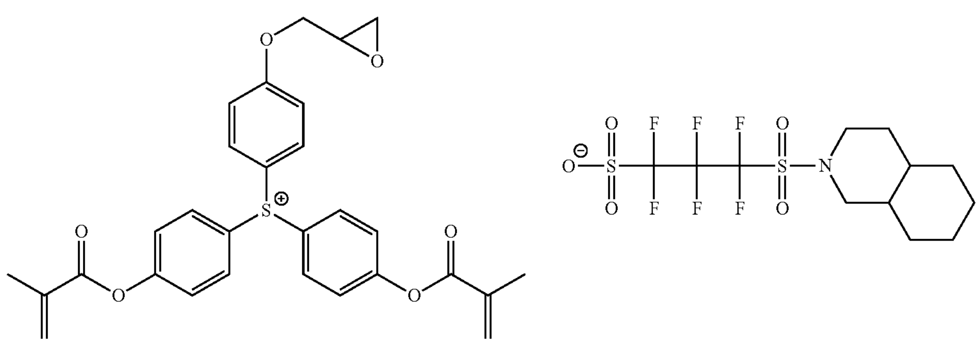
(A9)
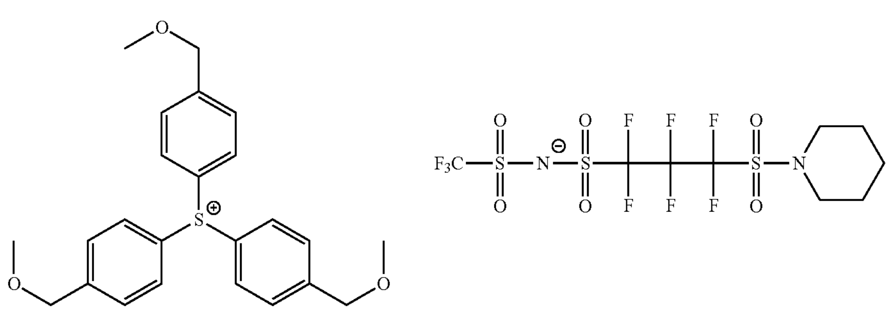

-continued
(A10)
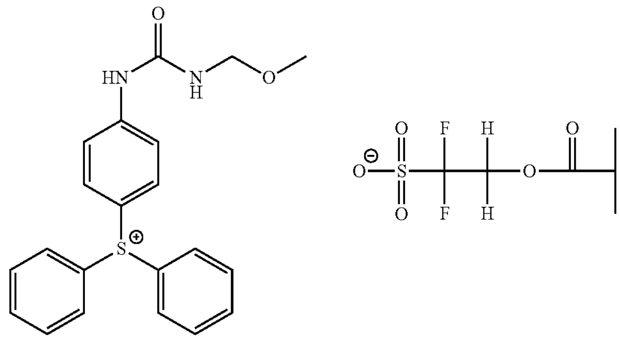
(A11)
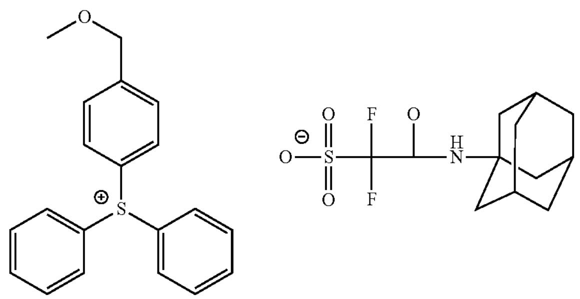
(A12)
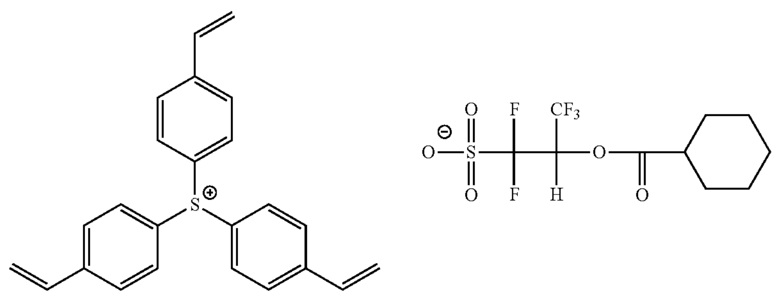
(A13)
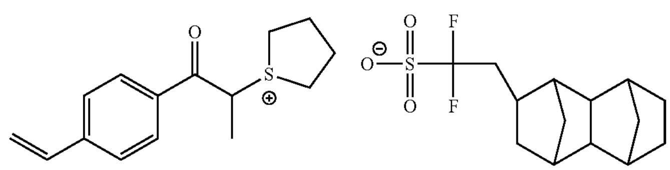
(A14)
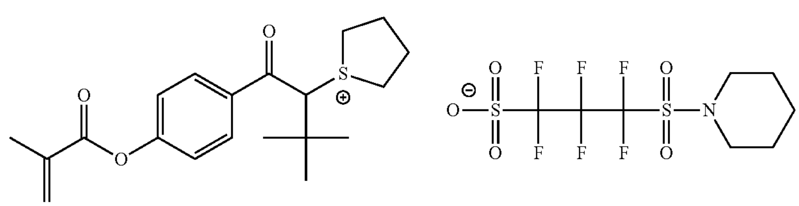
(A15)
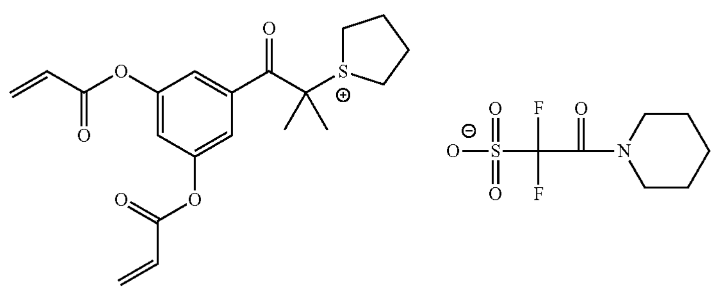

-continued
(A16)
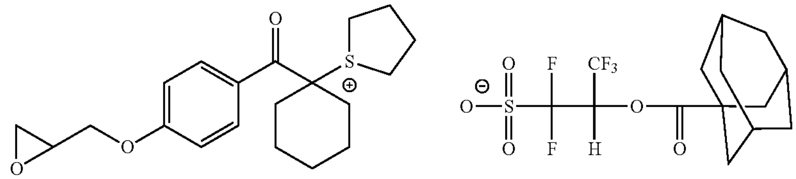
(A17)
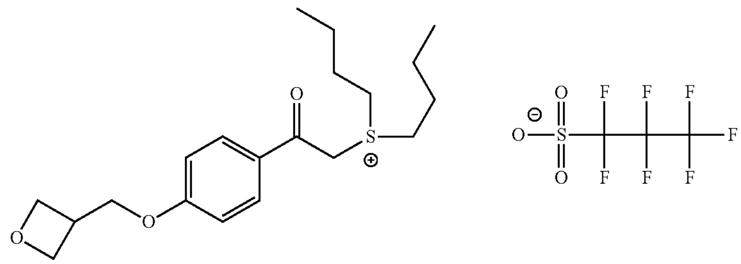
(A18)
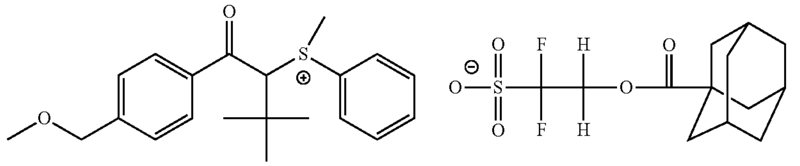
(A19)
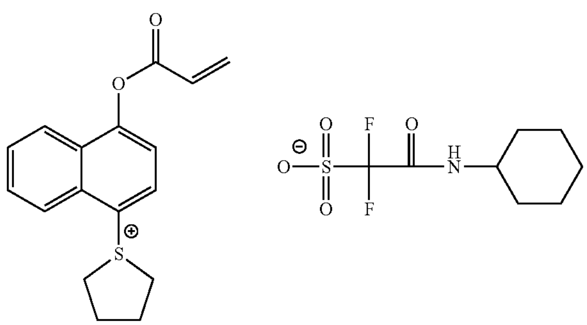
(A20)
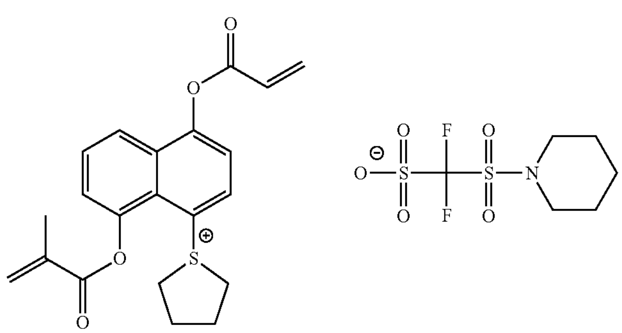
(A21)
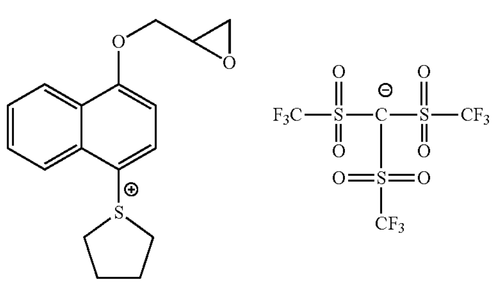

-continued
(A22)
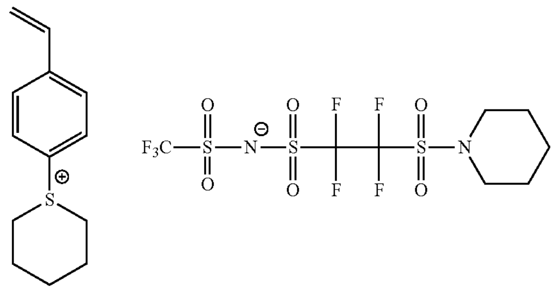
(A23)
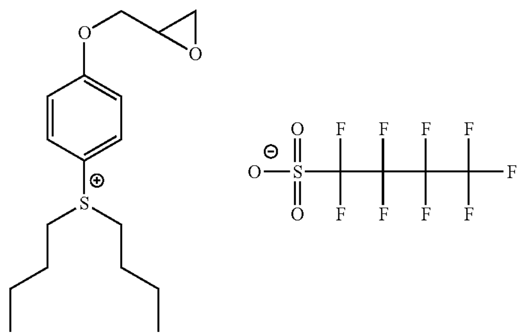
(A24)
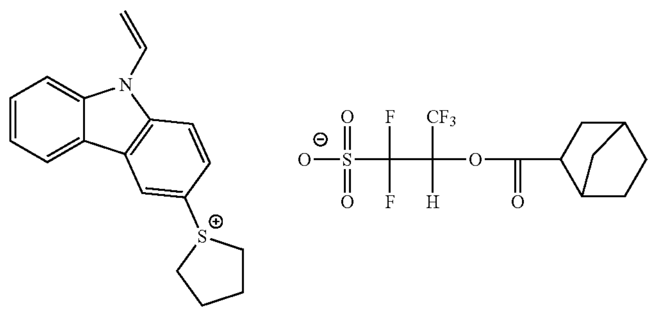
(A25)
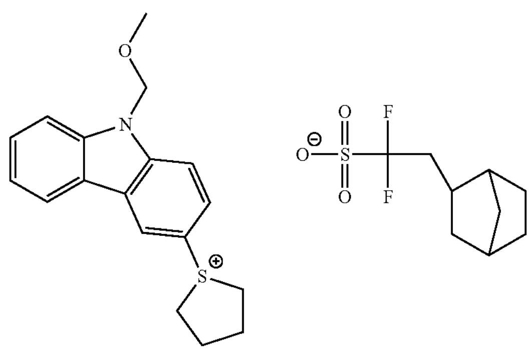
(A26)
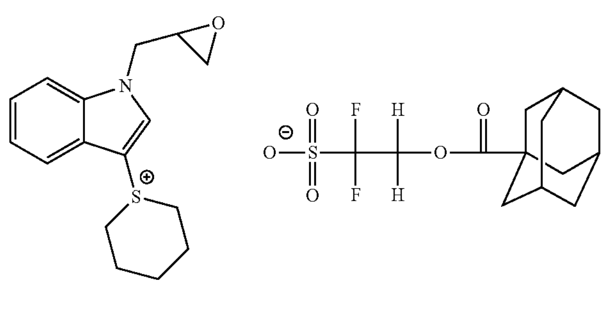

-continued
(A27)
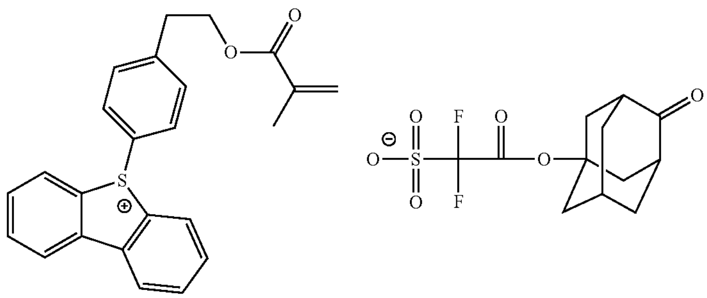
(A28)
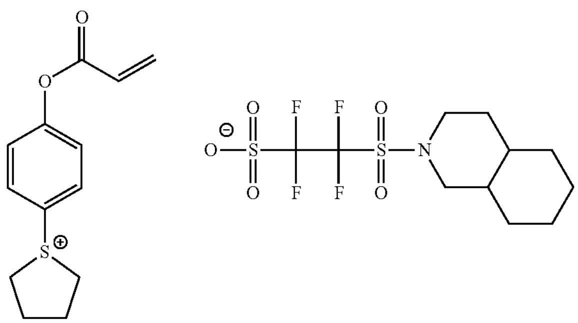
(A29)
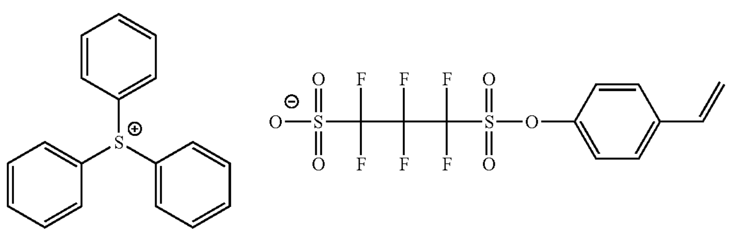
(A30)
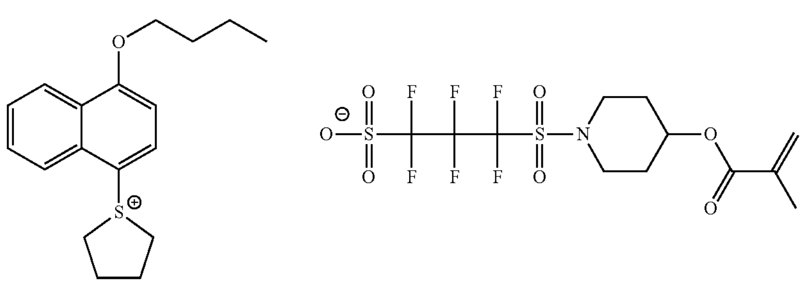
(A31)
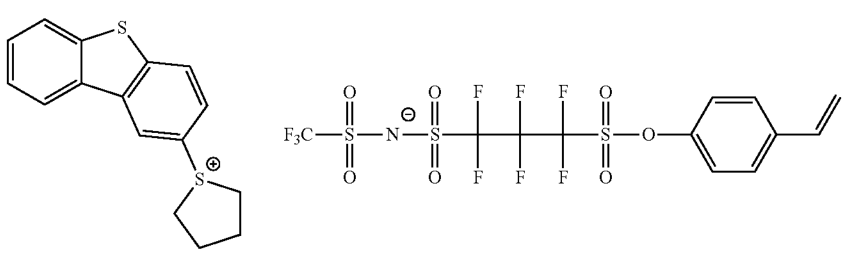

-continued
(A32)
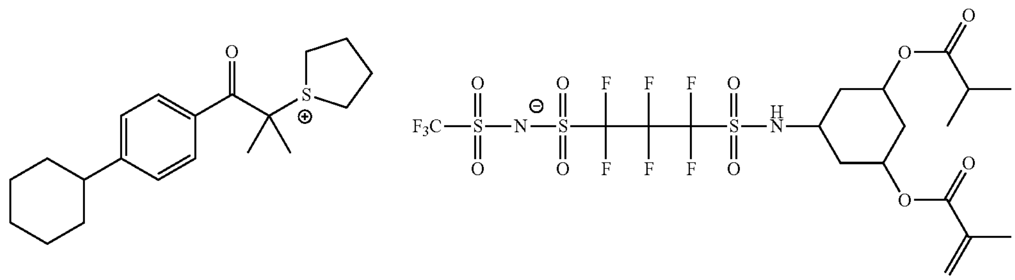
(A33)
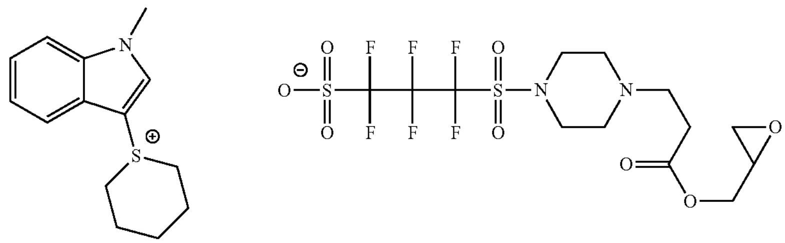
(A34)
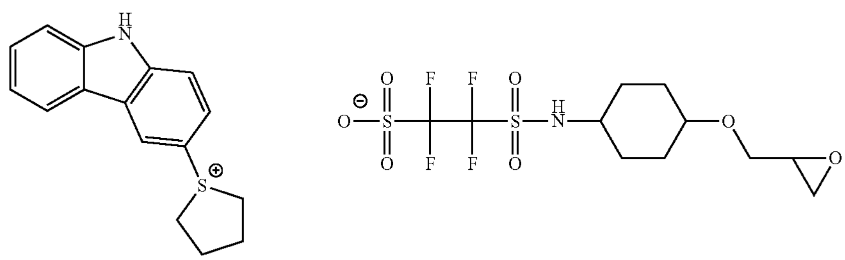
(A35)
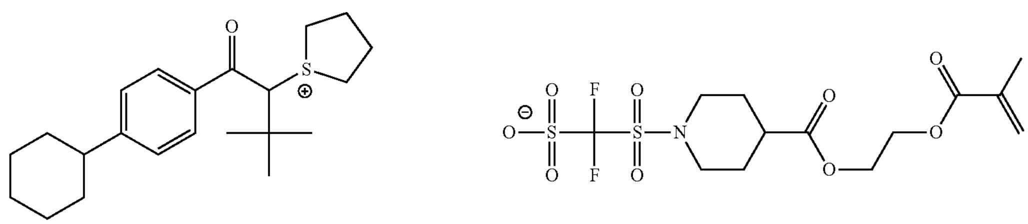
(A36)
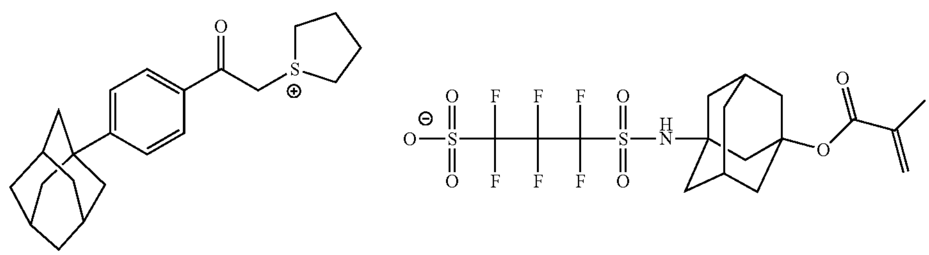
(A37)
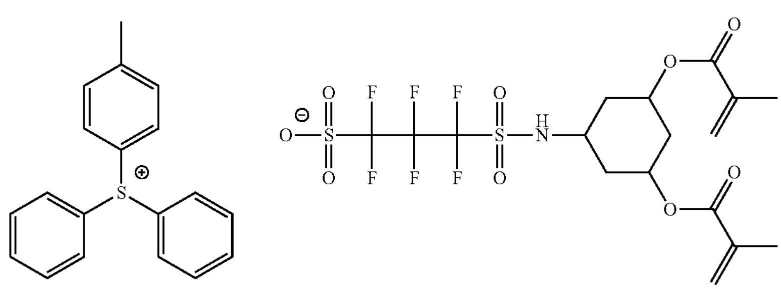

-continued
(A38)
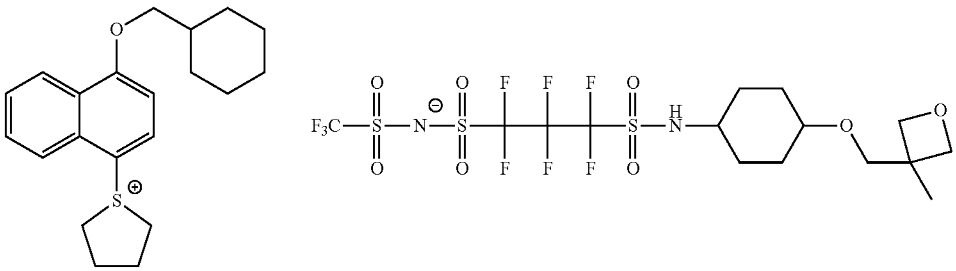
(A39)
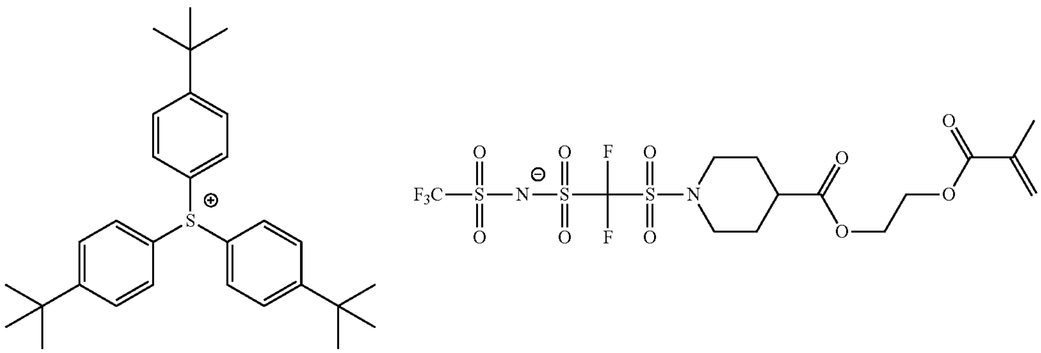
(A40)
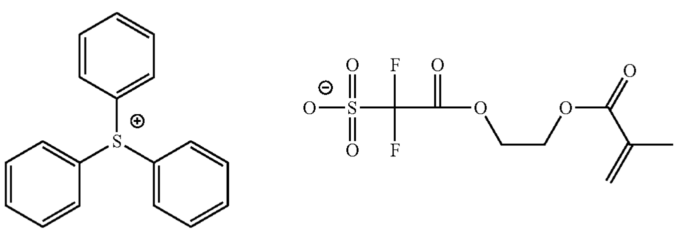
(A41)
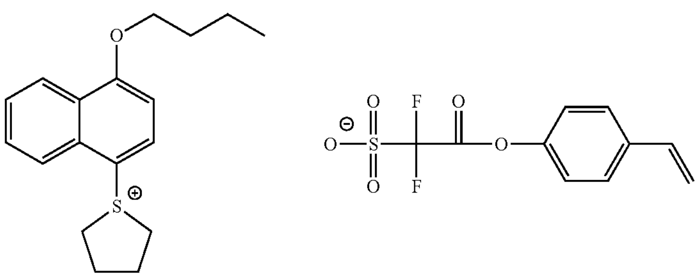
(A42)
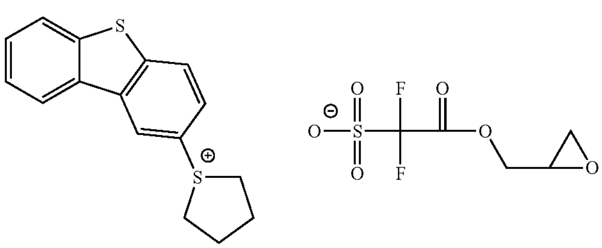
(A43)
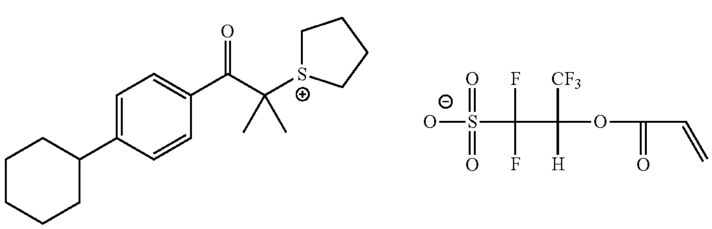

-continued
(A44)
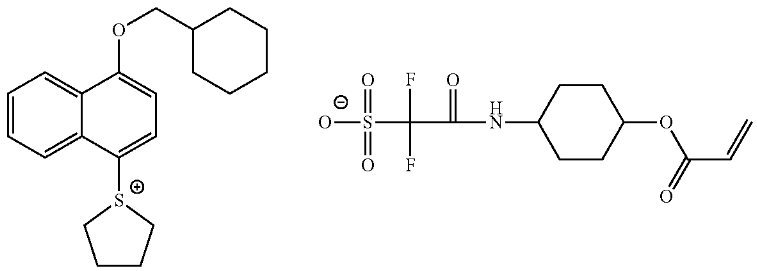
(A45)
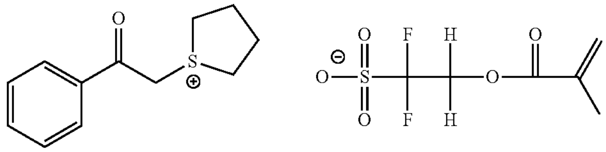
(A46)
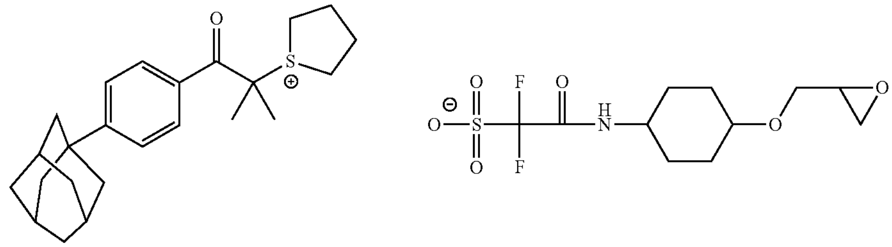
(A47)
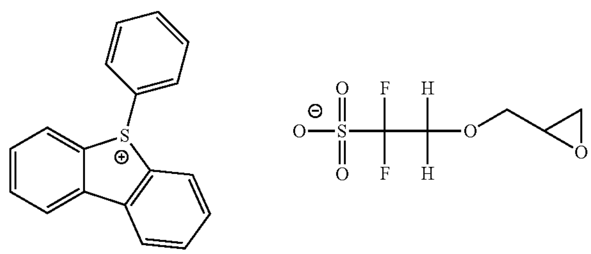
(A48)
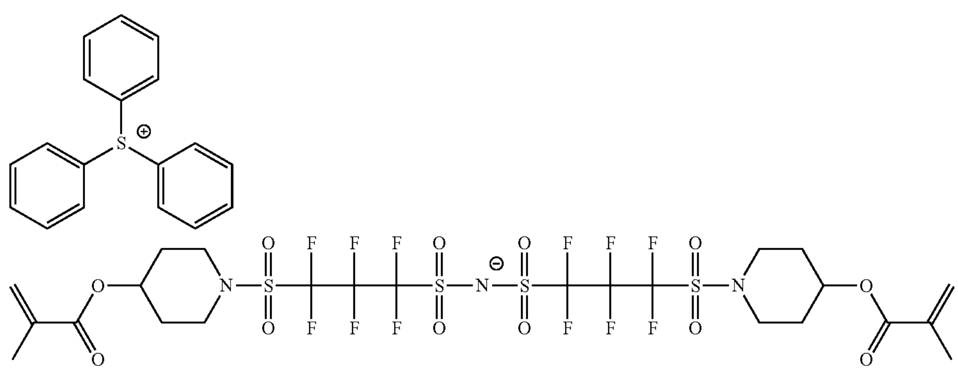
(A49)
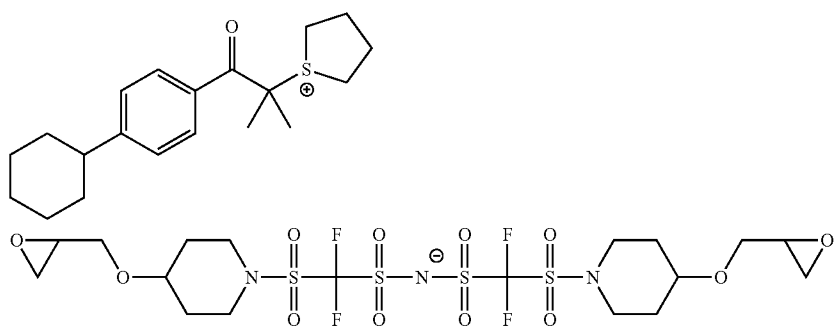

-continued
(A50)
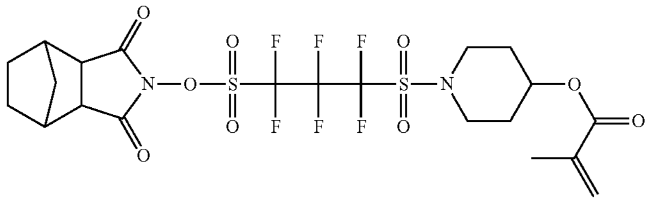
(A51)
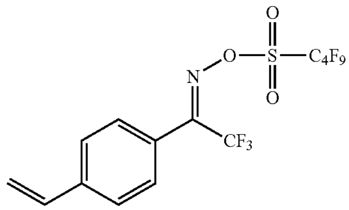
(A52)
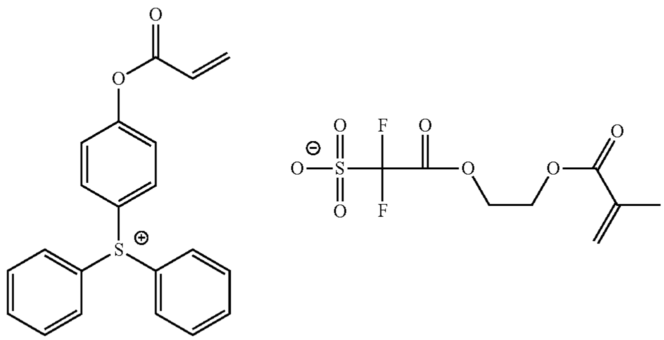
(A53)
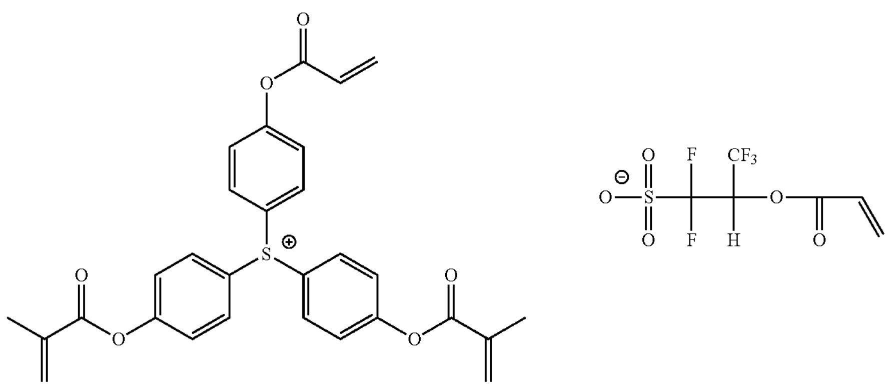
(A54)
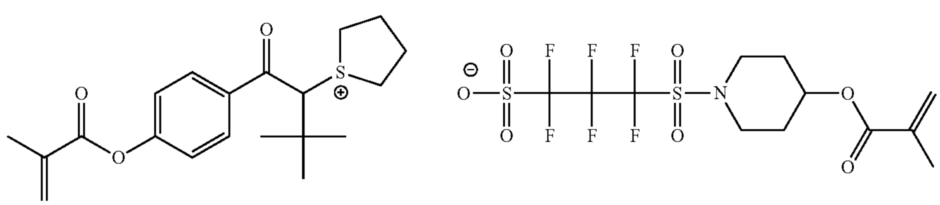
(A55)
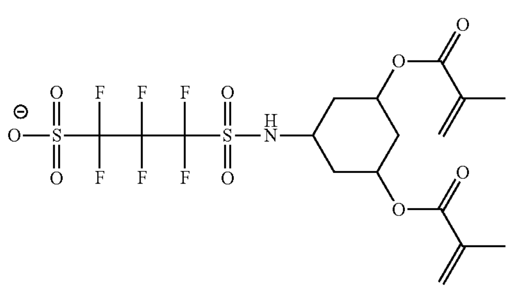

-continued (A56)

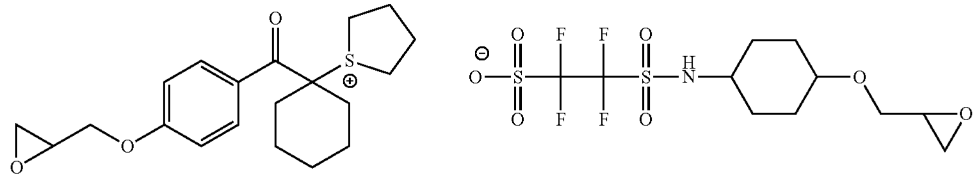

(A57)

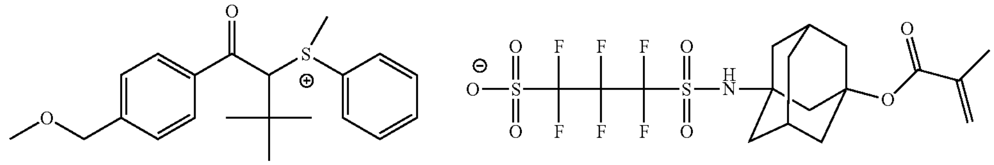

(A58)

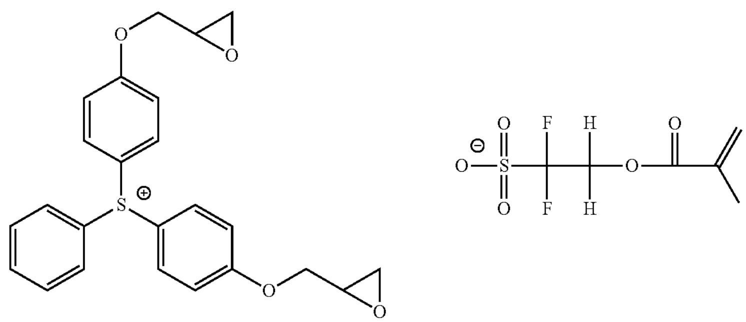

(A59)

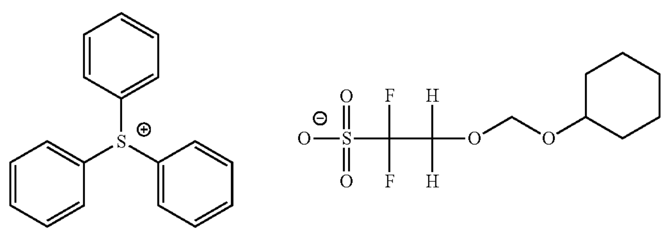

(A60)

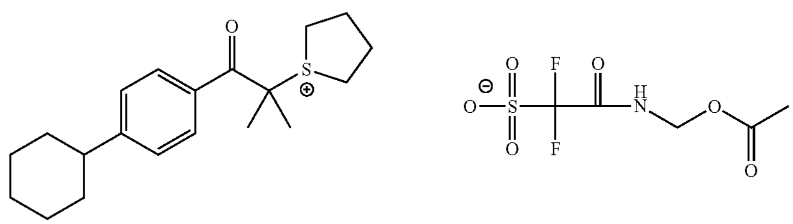

In the actinic-ray-sensitive or radiation-sensitive resin composition according to the present invention, one kind of the compound (B) may be used alone, or two or more kinds thereof may be used in combination. The content of the compound (B) is preferably 0.1% by mass to 20% by mass, more preferably 0.5% by mass to 15% by mass, and even more preferably 3% by mass to 12% by mass, based on the total solid content of the actinic-ray-sensitive or radiation-sensitive resin composition.

The actinic-ray-sensitive or radiation-sensitive resin composition according to the present invention may further contain a compound (hereinafter, also referred to as a "concurrently used acid-generating agent") that generates an acid by being irradiated with actinic rays or radiations, in addition to the compound (B).

Hereinafter, the concurrently used acid-generating agent other than the compound (B) will be described.

As the concurrently used acid-generating agent, well-known compounds generating an acid by being irradiated with actinic rays or radiations, which are used as a photocationic polymerization initiator, a photoradical polymerization initiator, a decolorizer of pigments, an optical discoloring agent, or a microresist, and a mixture of these compounds can be appropriately selected and used.

Examples of the concurrently used acid-generating agent include a diazonium salt, a phosphonium salt, a sulfonium salt, an iodonium salt, imidosulfonate, oxime sulfonate, diazodisulfone, disulfone, and o-nitrobenzyl sulfonate.

Preferable compounds among these concurrently used acid-generating agents are not particularly limited so long as the compounds are well-known, but preferable examples of the compound include compounds represented by the following General Formulae (ZI'), (ZII'), and (ZIII').

(ZI')

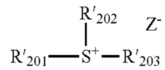

(ZII')

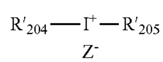

(ZIII')

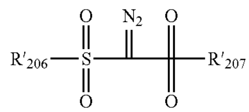

In the General Formula (ZI'), each of $R'_{201}$ to $R'_{203}$ has the same definition as that of $R_{201}$ to $R_{203}$ in the General Formula (ZI), and specific and preferable examples thereof are also the same. Here, $R'_{201}$ to $R'_{203}$ in General Formula (ZI') do not have the polymerizable group.

In General Formulae (ZII') and (ZII'), each of $R'_{204}$ to $R'_{207}$ independently represents an aryl group, an alkyl group, or a cycloalkyl group.

The aryl group of $R'_{204}$ to $R'_{207}$ is preferably a phenyl group or a naphthyl group, and more preferably a phenyl group. The aryl group of $R'_{204}$ to $R'_{207}$ may be an aryl group having a heterocyclic structure that includes an oxygen atom, a nitrogen atom, a sulfur atom, or the like. Examples of the skeleton of the aryl group having a heterocyclic structure include pyrrole, furan, thiophene, indole, benzofuran, benzothiophene, and the like.

Preferable examples of the alkyl group and cycloalkyl group in $R'_{204}$ to $R'_{207}$ include a linear or branched alkyl group (for example, a methyl group, an ethyl group, a propyl group, a butyl group, or a pentyl group) having 1 to 10 carbon atoms and a cycloalkyl group (a cyclopentyl group, a cyclohexyl group, or a norbornyl group) having 3 to 10 carbon atoms.

The aryl group, alkyl group, and cycloalkyl group of $R'_{204}$ to $R'_{207}$ may have a substituent. Examples of the substituent that the aryl group, alkyl group, and cycloalkyl group of $R'_{204}$ to $R'_{207}$ may have include an alkyl group (having 1 to 15 carbon atoms, for example), a cycloalkyl group (having 3 to 15 carbon atoms, for example), an aryl group (having 6 to 15 carbon atoms, for example), an alkoxy group (having 1 to 15 carbon atoms, for example), a halogen atom, a hydroxyl group, a phenylthio group, and the like.

In addition, in the General Formulae (ZI') and (ZII'), $Z^-$ represents a non-nucleophilic anion (an anion with a very low ability of causing a nucleophilic reaction), and each $Z^-$ has the same definition as that described for $Z^-$ in the General Formula (ZI). Here, this $Z^-$ does not have the polymerizable group described above.

As more preferable (ZI') components, compounds (ZI'-1), (ZI'-2), (ZI'-3), and (ZI'-4) described below can be exemplified.

The compound (ZI'-1) is an arylsulfonium compound in which at least one of $R'_{201}$ to $R'_{203}$ in the General Formula (ZI') is an aryl group, that is, a compound that has arylsulfonium as a cation.

In the aryl sulfonium compound, all of $R'_{201}$ to $R'_{203}$ may be aryl groups; alternatively, a portion of $R'_{201}$ to $R'_{203}$ may be an aryl group, and the remaining group may be an alkyl group or a cycloalkyl group.

Specific and preferable examples of the arylsulfonium compound are the same as those described for the compound (ZI-1), except that this arylsulfonium compound does not have the polymerizable group described above.

The compound (ZI'-2) is a compound in which each of $R'_{201}$ to $R'_{203}$ in Formula (ZI') independently represents an organic group that does not have an aromatic ring.

Examples of the organic group that does not contain an aromatic ring and is represented by $R'_{201}$ to $R'_{203}$ are the same as those described for the compound (ZI-2), except that this organic group does not have the polymerizable group described above.

The compound (ZI'-3) is a compound which is represented by the following General Formula (ZI'-3) and has a phenacyl sulfonium salt structure.

(ZI'-3)

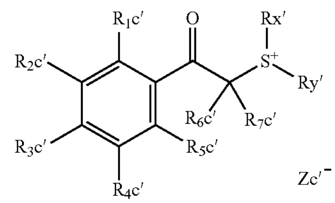

In General Formula (ZI'-3), each of $R_{1c}'$ to $R_{7c}'$, and $R_x'$ and $R_y'$ independently has the same definition as that of $R_{1c}$ to $R_{7c}$, and $R_x$ and $R_y$ described for General Formula (ZI-3). Here, none of $R_{1c}'$ to $R_7'$ is the polymerizable group described above and has the polymerizable group as a substituent.

$Zc'^-$ represents a non-nucleophilic anion, and examples thereof include the same non-nucleophilic anion as $Z^-$ in General Formula (ZI). Here, $Zc'^-$ does not have the polymerizable group described above.

Specific examples of the cation of the compound represented by General Formula (ZI'-2) or (ZI'-3) include the following ones.

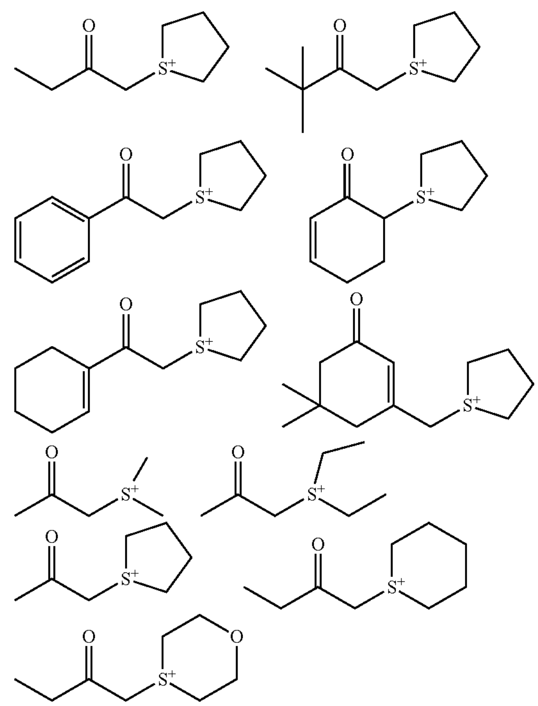

-continued
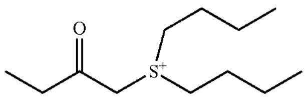
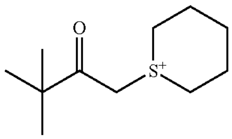
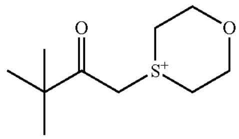
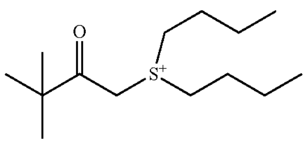
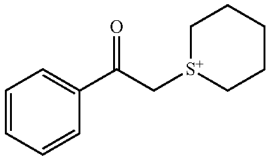
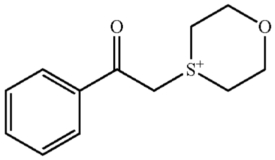
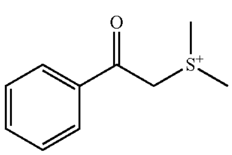
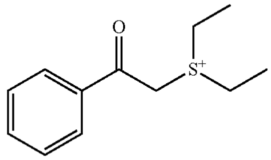
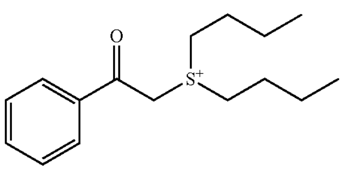
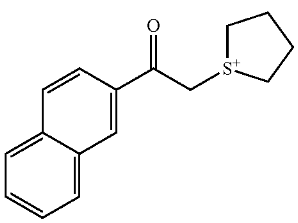
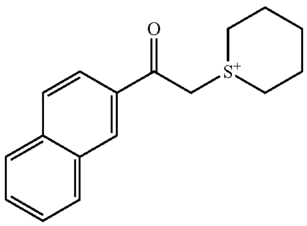
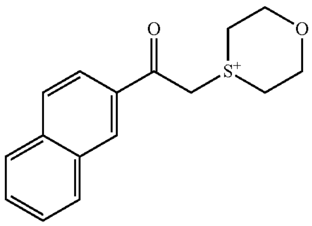
-continued
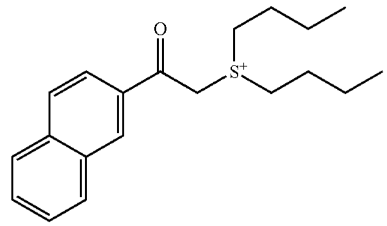
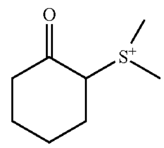
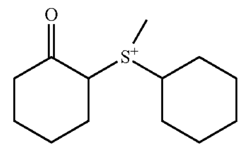
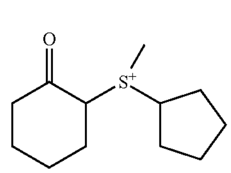
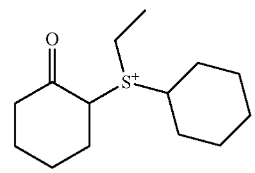
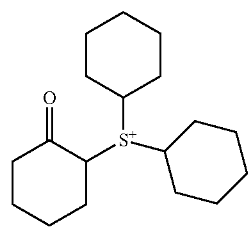
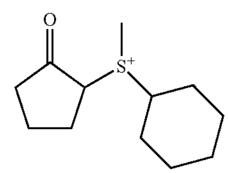
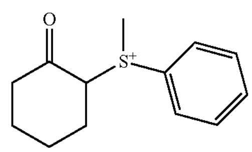
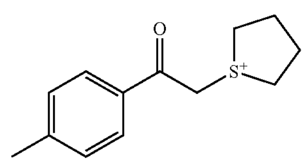
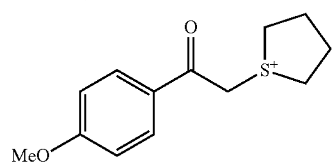
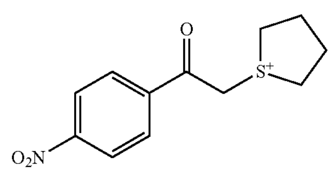
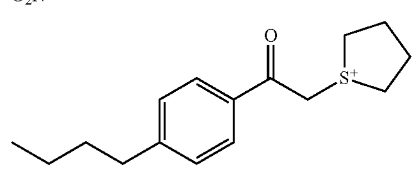
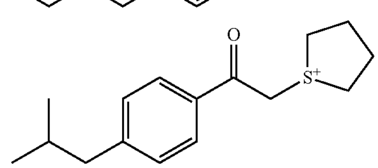

-continued
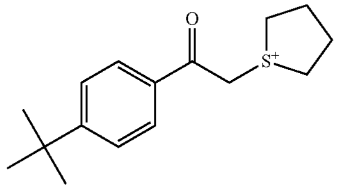
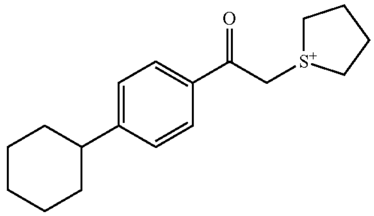
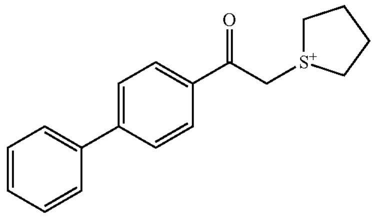
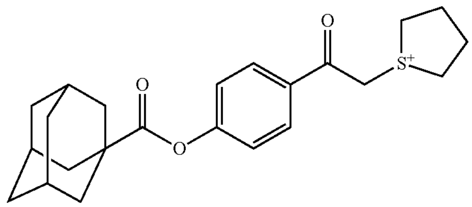
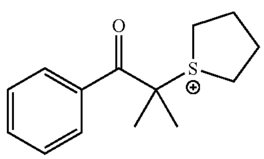
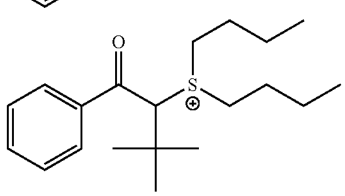
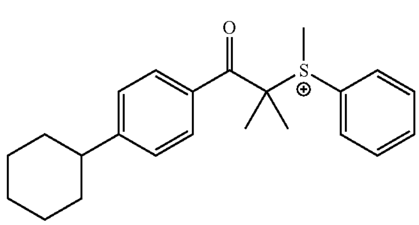
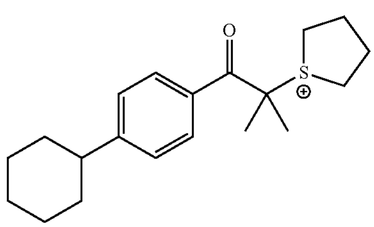
-continued
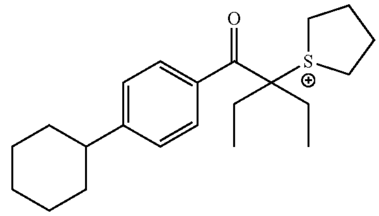
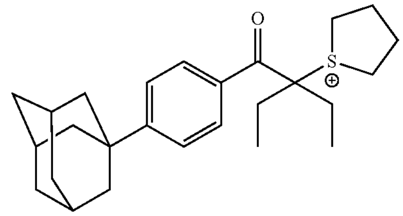
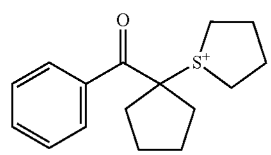
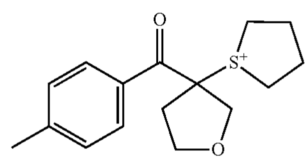
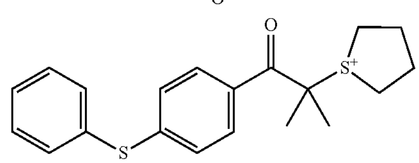
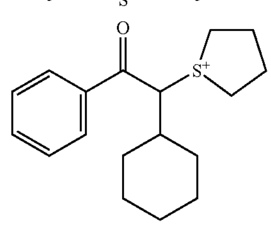
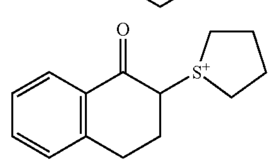
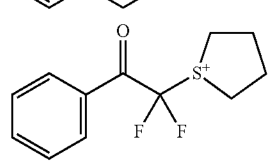
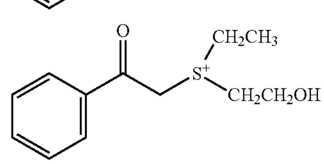
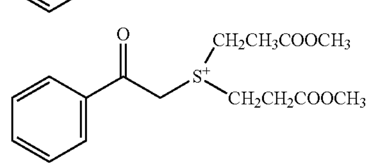

-continued
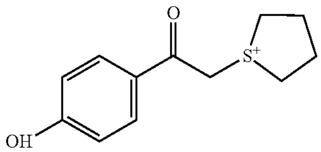
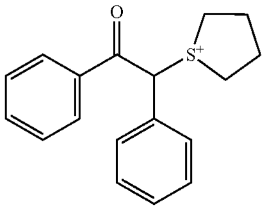
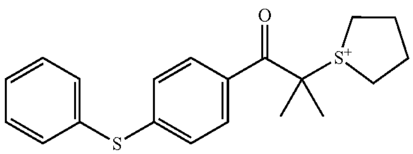
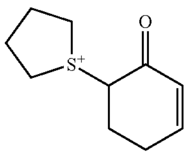
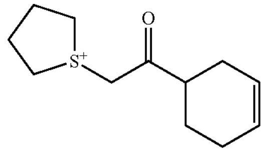
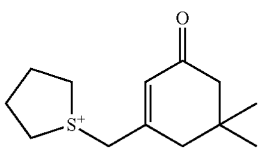
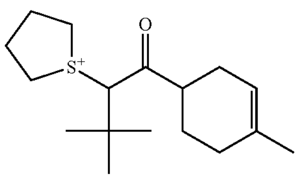
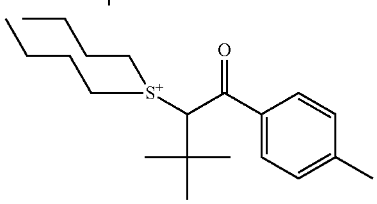
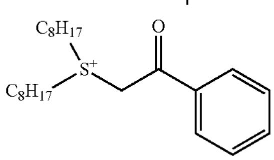
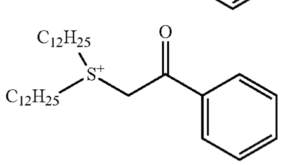
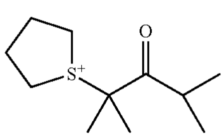
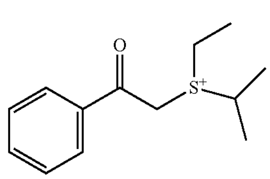
-continued
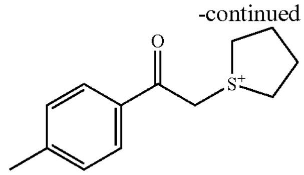
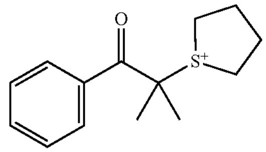
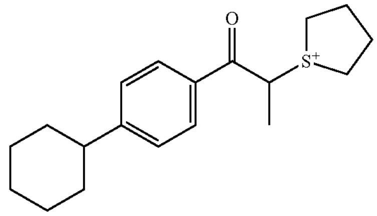
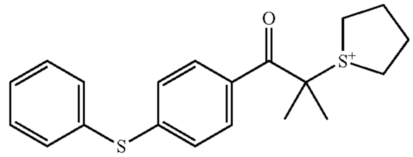
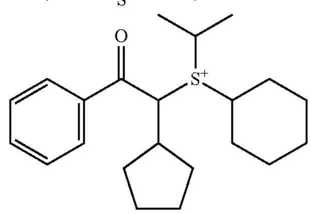
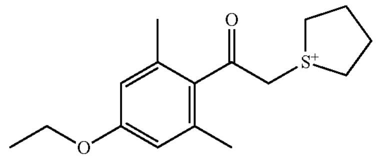
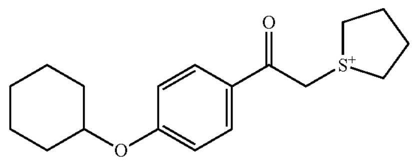
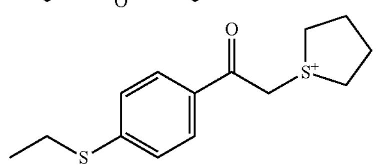
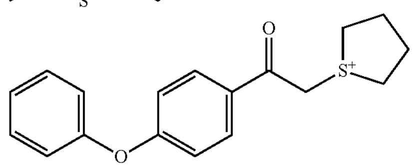
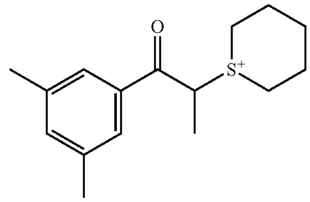 [SMILES: Cc1cc(C)cc(C(=O)C(C)[S+]2CCCCC2)c1]

The compound (ZI'-4) is represented by the following general formula.

(ZI'-4)

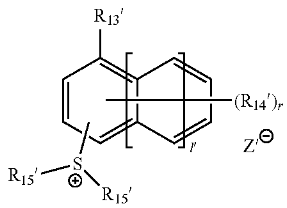

In General Formula (ZI'-4), each of $R_{13}'$ to $R_{15}'$ independently has the same definition as that of $R_{13}$ to $R_{15}$ described for General Formula (ZI-4). Here, none of $R_{13}'$ and $R_{14}'$ is the polymerizable group described above, and none of $R_{13}'$ to $R_{15}'$ has the polymerizable group as a substituent.

Each of l' and r' has the same definition as l and r described for General Formula (ZI-4).

$Z'^{-}$ represents a non-nucleophilic anion, and examples thereof include the same non-nucleophilic anions as those of $Z^{-}$ in General Formula (ZI). Here, this $Z'^{-}$ does not have the polymerizable group described above.

Specific examples of the cation of the compound represented by General Formula (ZI'-4) include the following ones.

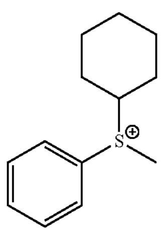

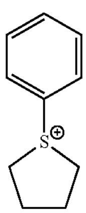

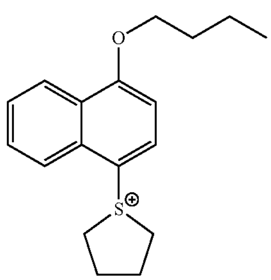

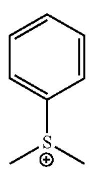

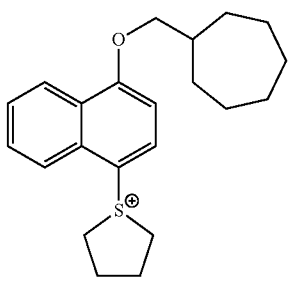

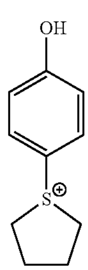

-continued

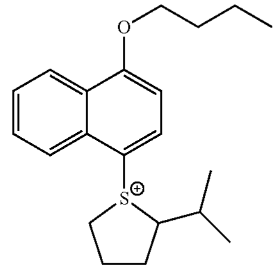

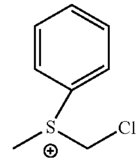

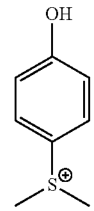

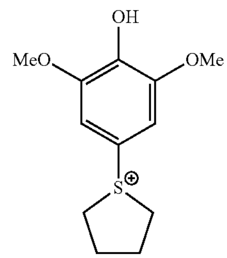

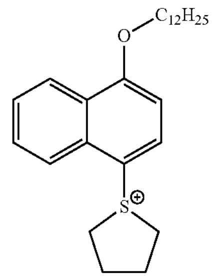

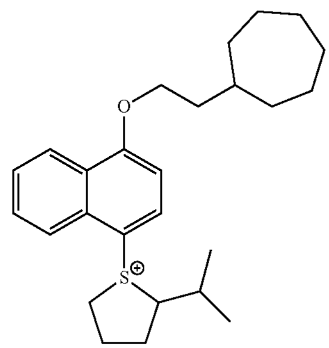

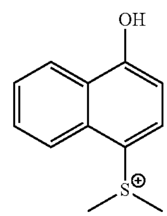

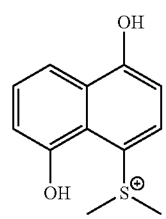

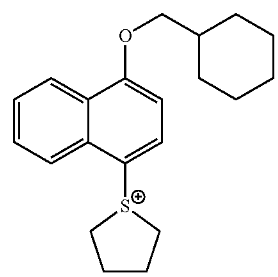

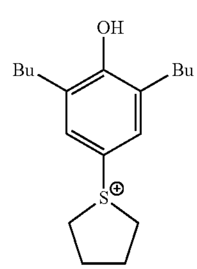

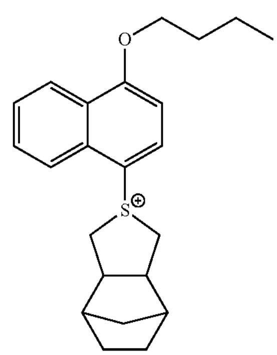

-continued
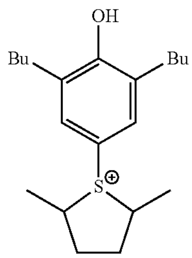
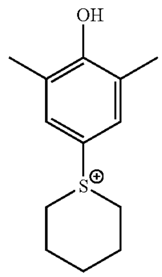
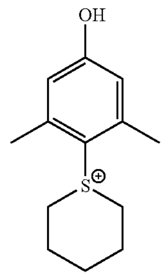
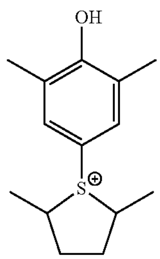
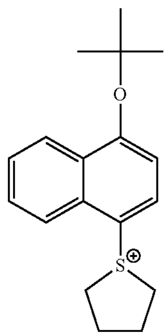
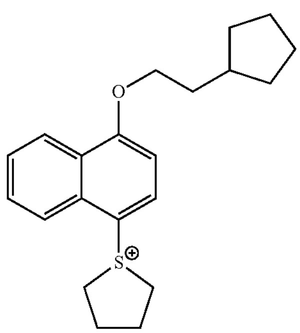
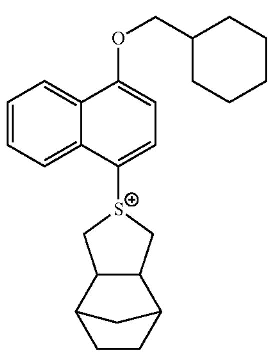
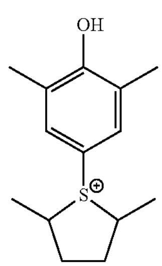
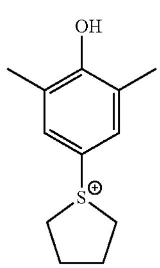
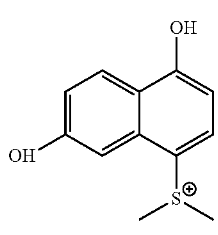
-continued
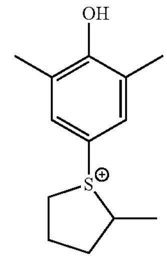
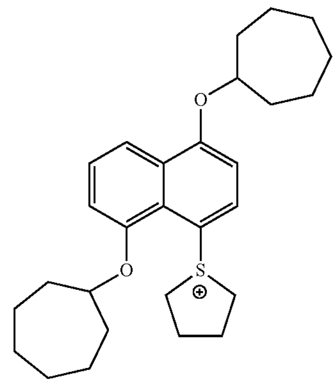
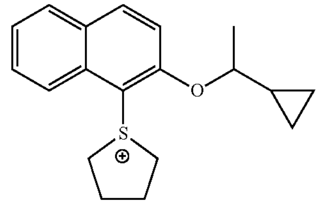
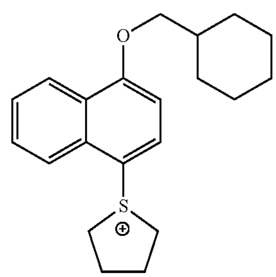
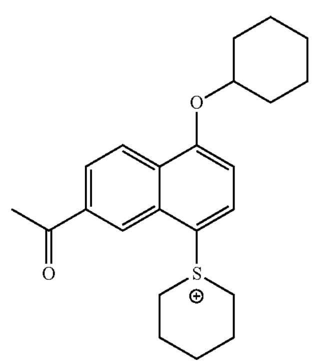
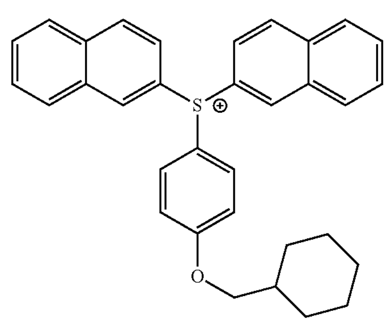

-continued
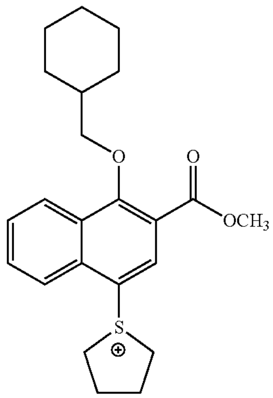
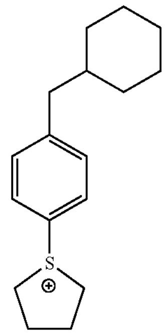
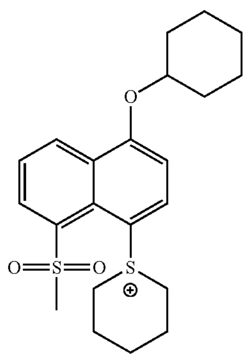
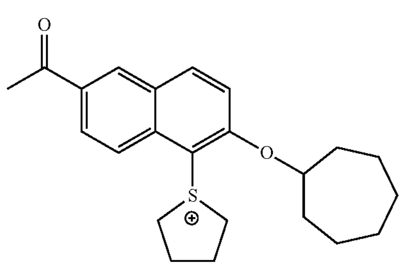
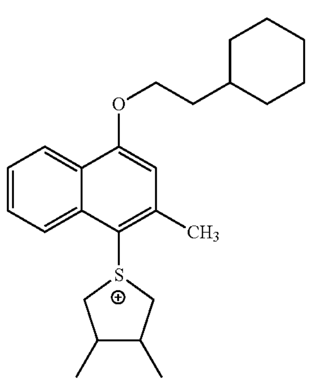
-continued
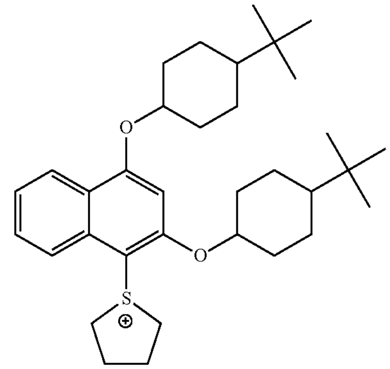
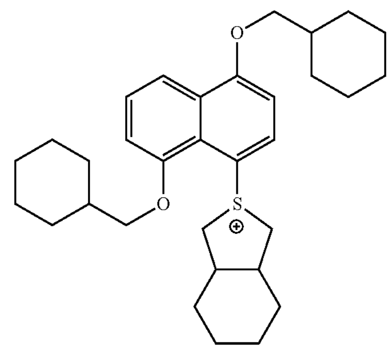
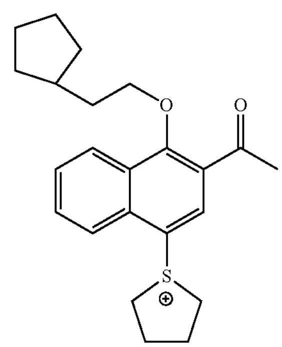
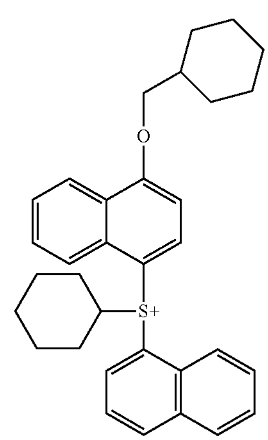
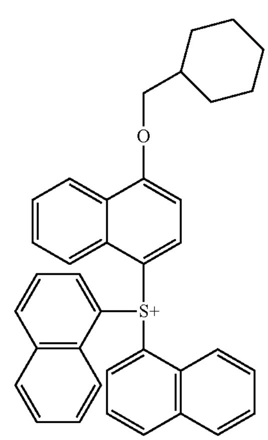

-continued

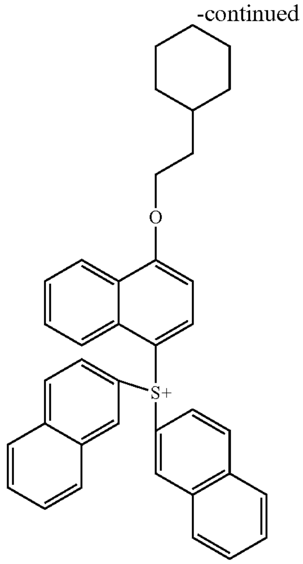

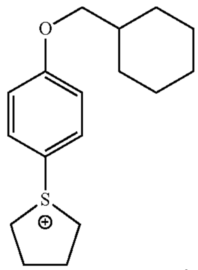

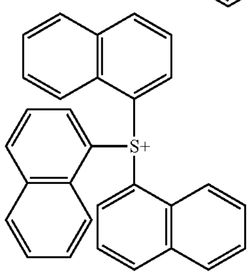

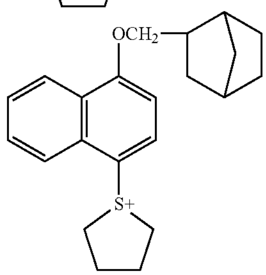

In addition, examples of the concurrently used acid-generating agent further include compounds represented by the following General Formulae (ZIV'), (ZV'), and (ZVI').

$$Ar'_3—SO_2—SO_2—Ar'_4 \qquad (ZIV')$$

(ZV')

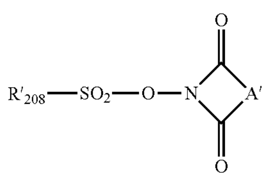

(ZVI')

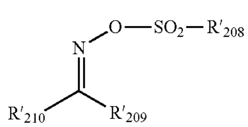

In General Formula (ZIV'), each of $Ar'_3$ and $Ar'_4$ independently represents an aryl group.

In General Formulae (ZV') and (ZVI'), each of $R'_{208}$, $R'_{209}$, and $R'_{210}$ independently represents an alkyl group, a cycloalkyl group, or an aryl group.

A' represents an alkylene group, an alkenylene group, or an arylene group.

Specific examples of the aryl group of $Ar'_3$, $Ar'_4$, $R'_{208}$, $R'_{209}$, and $R'_{210}$ include the same ones as the specific examples of the aryl group represented by $R_{201}$, $R_{202}$, and $R_{203}$ in the General Formula (ZI-1).

Specific examples of the alkyl group and the cycloalkyl group of $R'_{208}$, $R'_{209}$, and $R'_{210}$ include the same ones as the specific examples of the alkyl group and the cycloalkyl group represented by $R_{201}$, $R_{202}$, and $R_{203}$ in the General Formula (ZI-2).

Examples of the alkylene group of A' include an alkylene group (for example, a methylene group, an ethylene group, a propylene group, an isopropylene group, a butylene group, an isobutylene group, or the like) having 1 to 12 carbon atoms; examples of the alkenylene group of A' include an alkenylene group (for example, an ethenylene group, a propenylene group, a butenylene group, or the like) having 2 to 12 carbon atoms; and examples of the arylene group of A' include an arylene group (for example, a phenylene group, a tolylene group, a naphthylene group, or the like) having 6 to 10 carbon atoms.

Among the concurrently used acid-generating agents, compounds represented by General Formulae (ZI') to (ZIII') are preferable.

The concurrently used acid-generating agent is preferably a compound that has one sulfonic acid group or an imide group and generates an acid, more preferably a compound generating monovalent perfluoroalkane sulfonic acid, a compound generating an aromatic sulfonic acid substituted with a monovalent fluorine atom or with a group containing a fluorine atom, or a compound generating an imidic acid substituted with a monovalent fluorine atom or with a group containing a fluorine atom, and even more preferably a sulfonium salt of a fluorine-substituted alkanesulfonic acid, a fluorine-substituted benzenesulfonic acid, a fluorine-substituted imidic acid, or a fluorine-substituted methidic acid. The usable acid-generating agent is particularly preferably a fluorine-substituted alkanesulfonic acid, a fluorine-substituted benzenesulfonic acid, or a fluorine-substituted imidic acid generating acid of pKa=−1 or less, and this acid-generating agent improves the sensitivity of a resist film.

Specific examples of the concurrently used acid-generating agent will be shown below.

(z1)

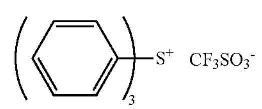

(z2)

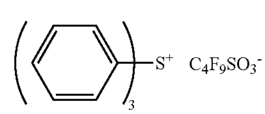

(z3)

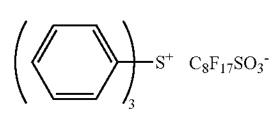

(z4)

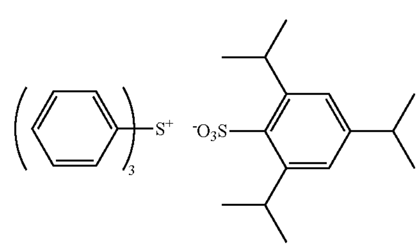

-continued
(z5)
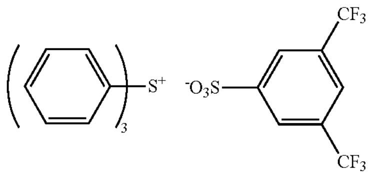
(z6)
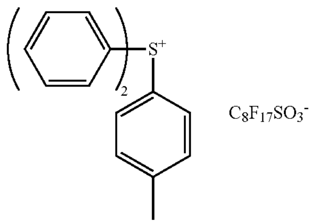
(z7)
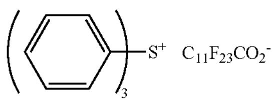
(z8)
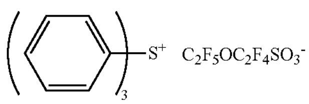
(z9)
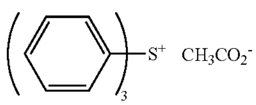
(z10)
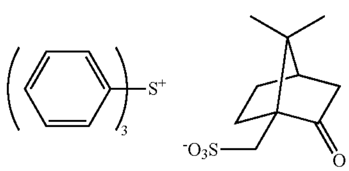
(z11)
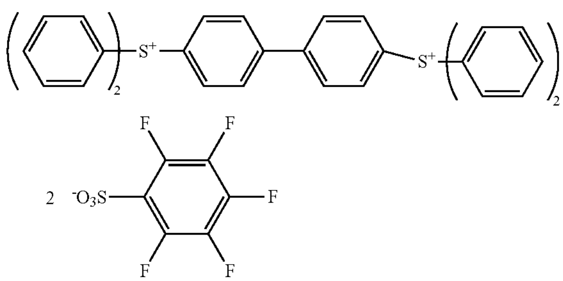
(z12)
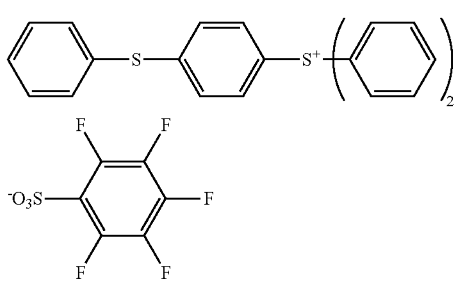
(z13)
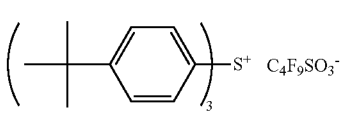
-continued
(z14)
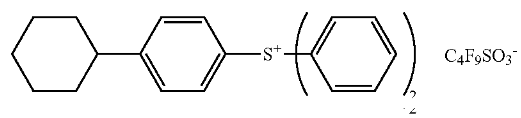
(z15)
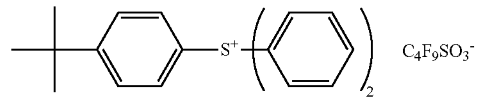
(z16)
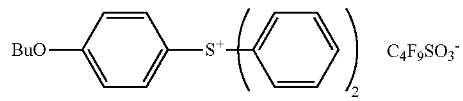
(z17)
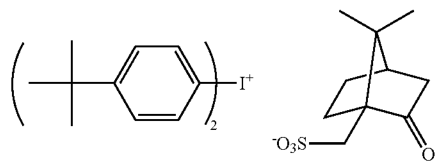
(z18)
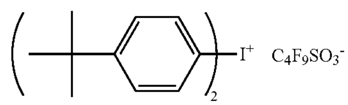
(z19)
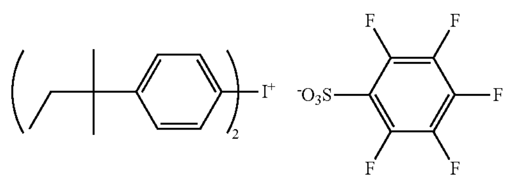
(z20)
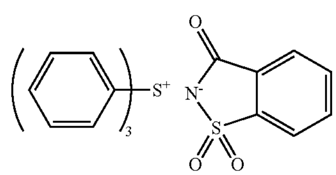
(z21)
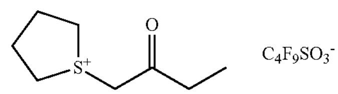
(z22)
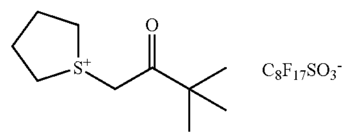
(z23)
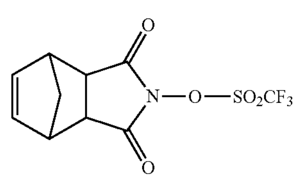
(z24)
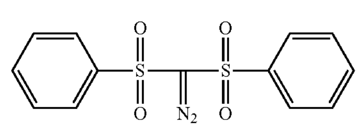

-continued
(z25)
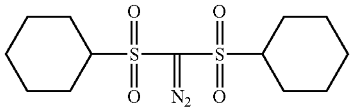
(z26)
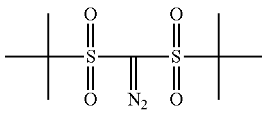
(z27)
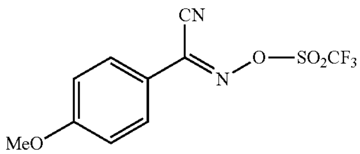
(z28)
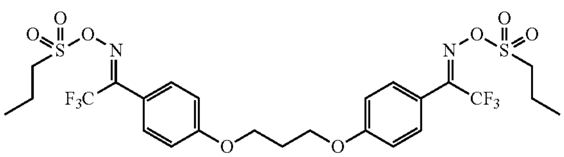
(z29)
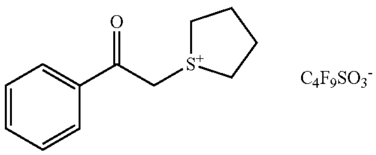
(z30)
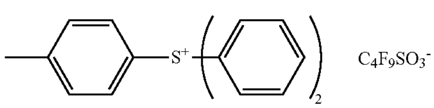
(z31)
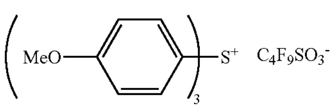
(z32)
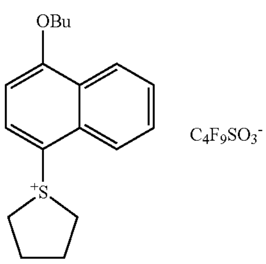
(z33)
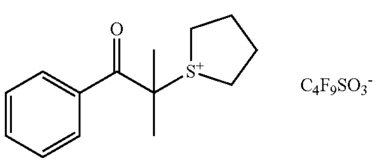
(z34)
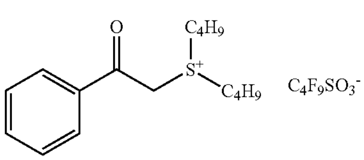
-continued
(z35)
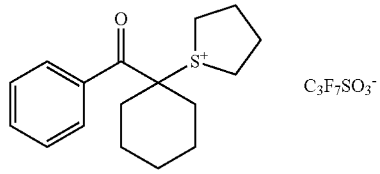
(z36)
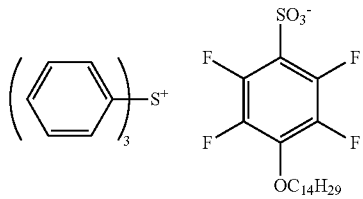
(z37)
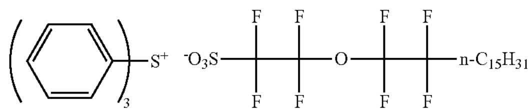
(z38)
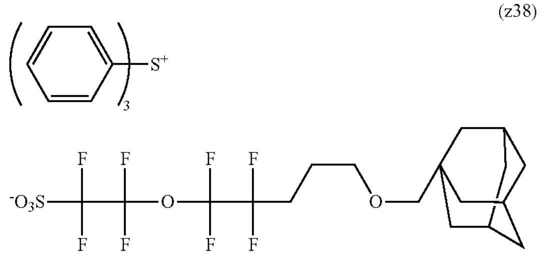
(z39)
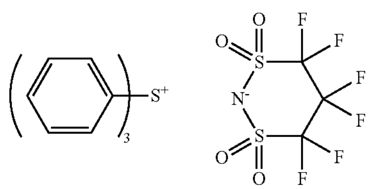
(z40)
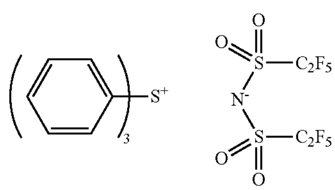
(z41)
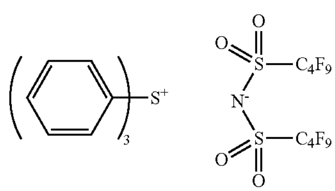
(z42)
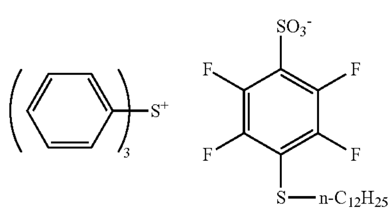

-continued
(z43)
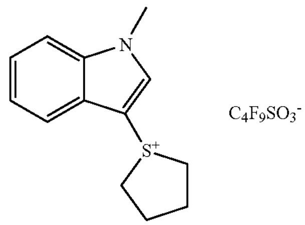
(z44)
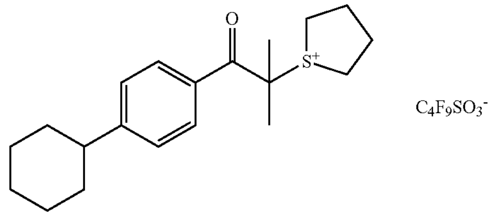
(z45)
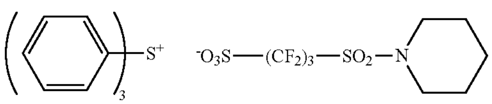
(z46)
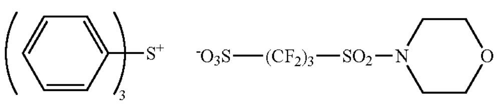
(z47)
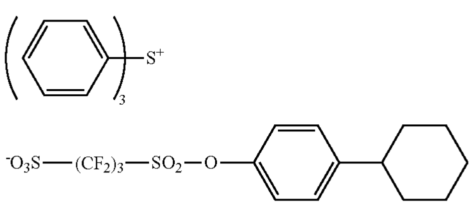
(z48)
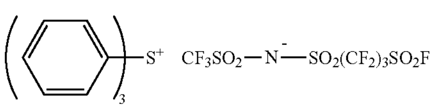
(z49)
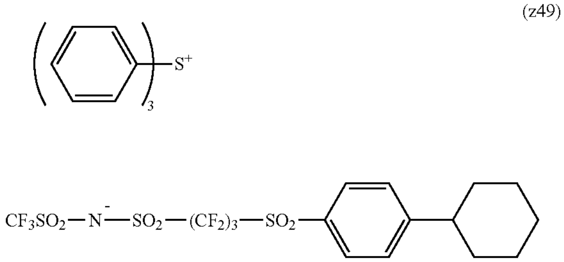
(z50)
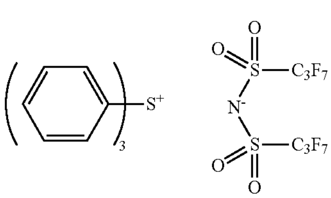
-continued
(z51)
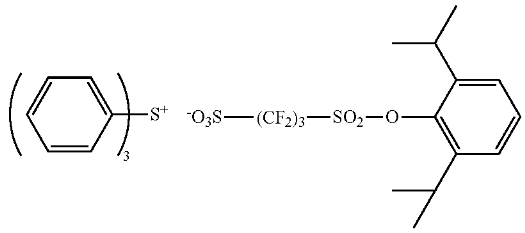
(z52)
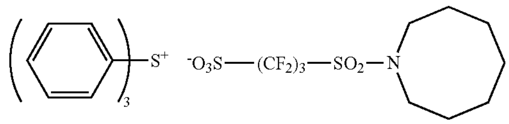
(z53)
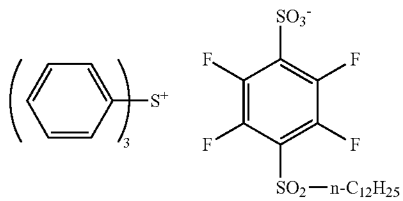
(z54)
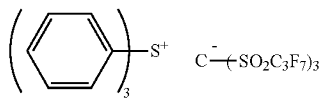
(z55)
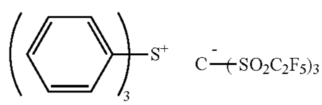
(z56)
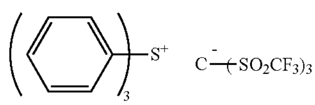
(z57
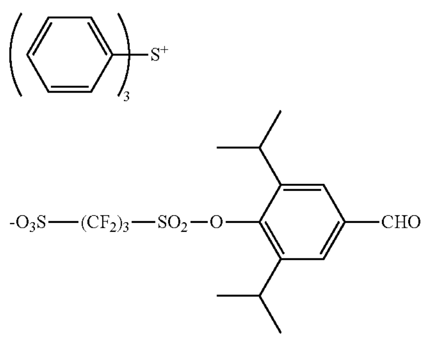
(z58)
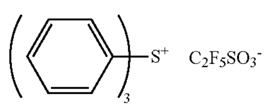
(z59)
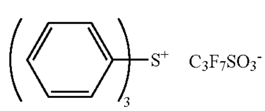
(z60)
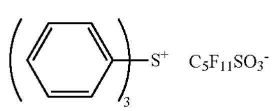

-continued
(z61)
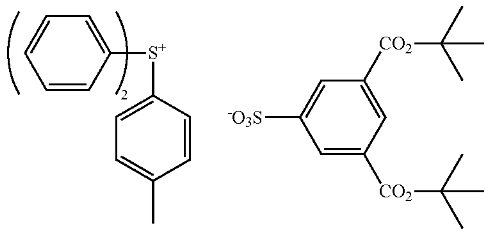
(z62)
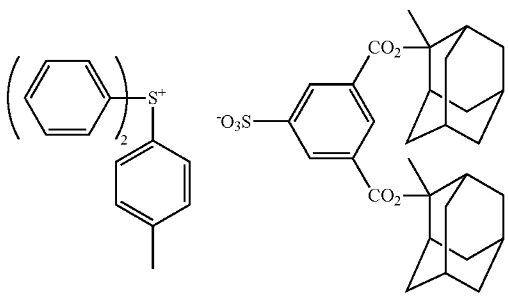
(z63)
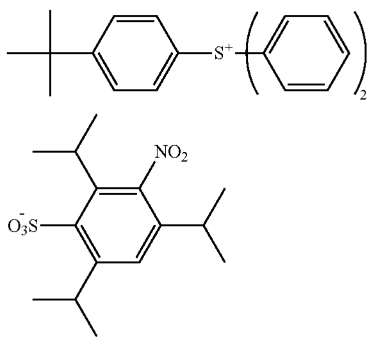
(z64)
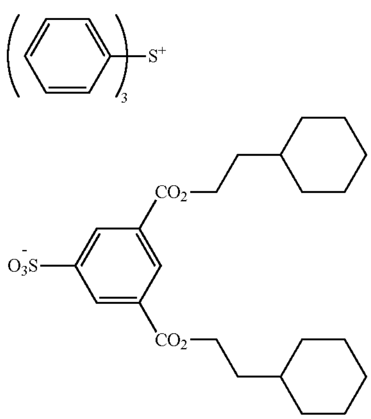
(z65)
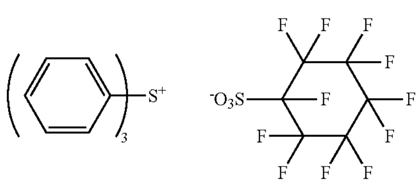
(a66)
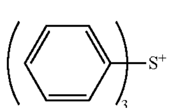
-continued
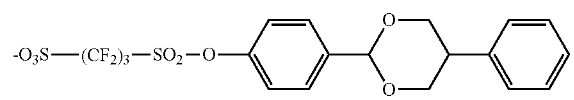
(z67)
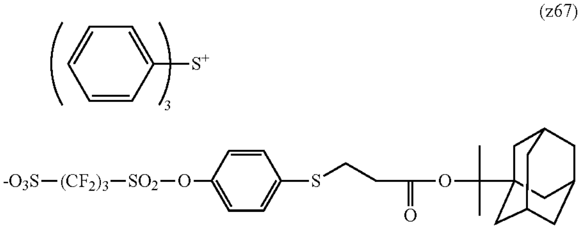
(z68)
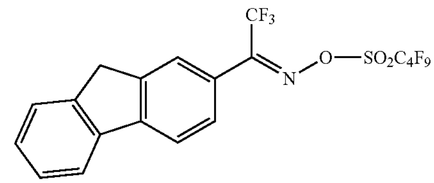
(z69)
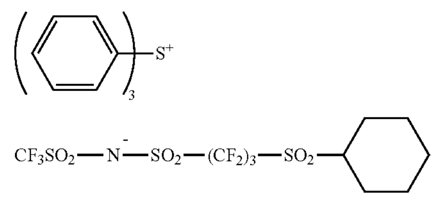
(z70)
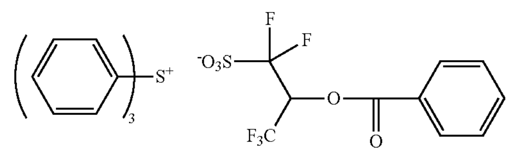
(z71)
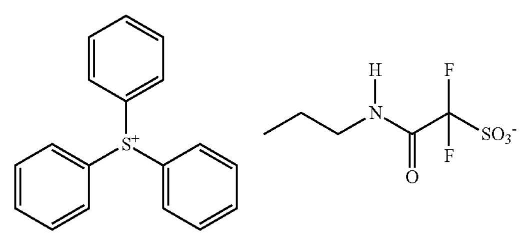
(z72)
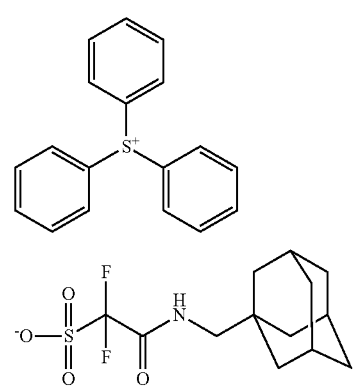

-continued
(z73)
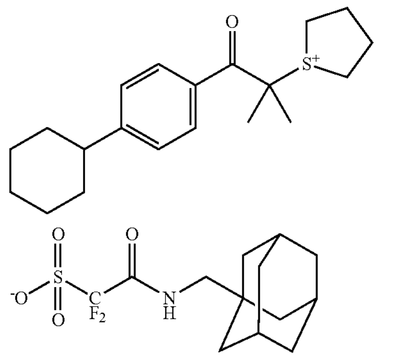
(z74)
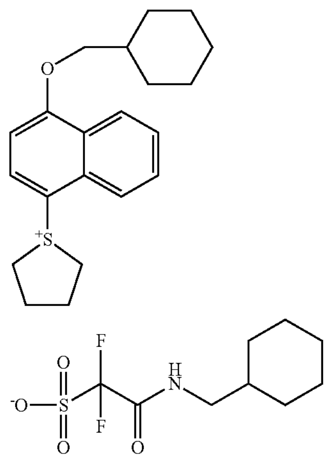
(z75)
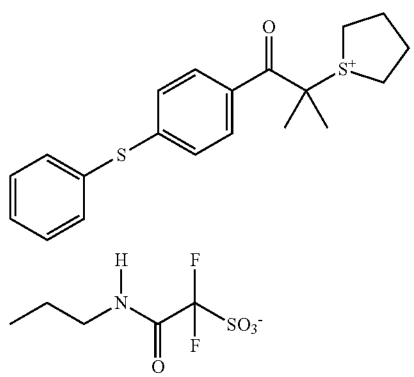
(z76)
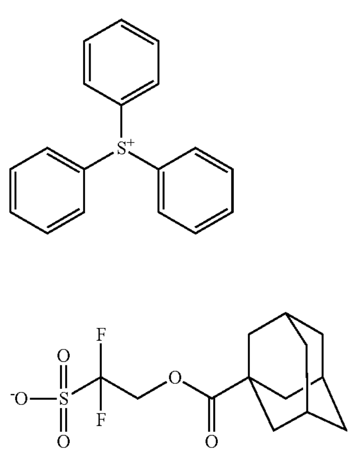
(z77)
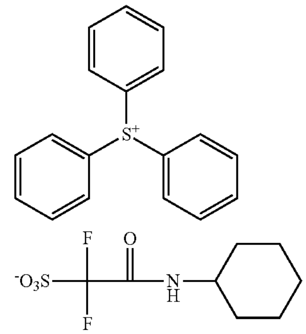
(z78)
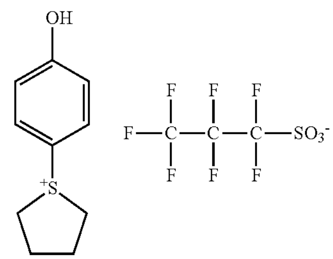
(z79)
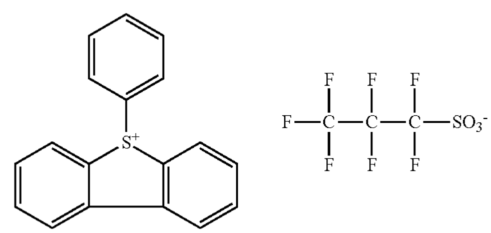
(z80)
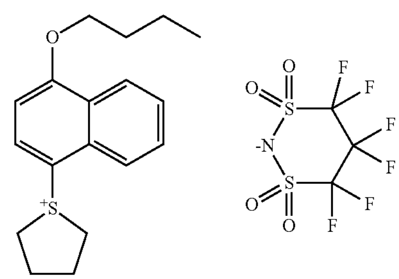
(z81)
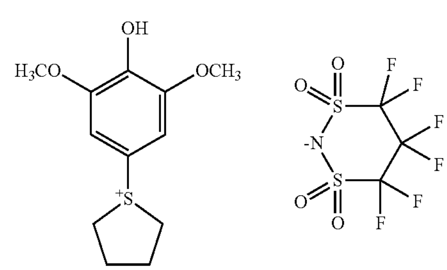
(z82)
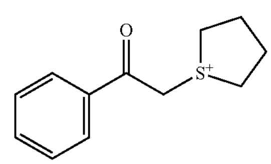

-continued

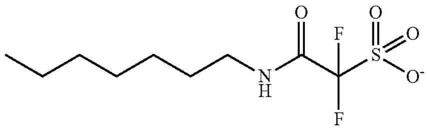

(z83)

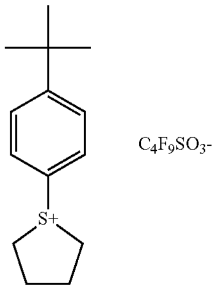

(z84)

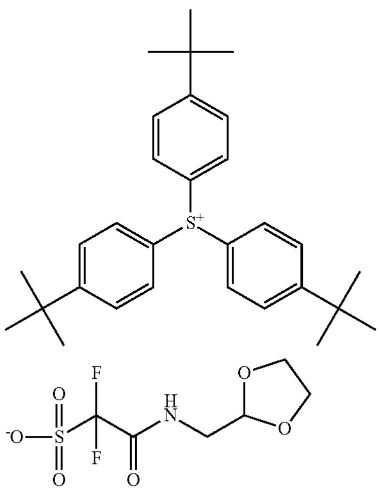

(z85)

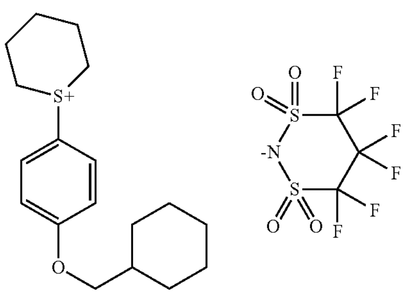

(z86)

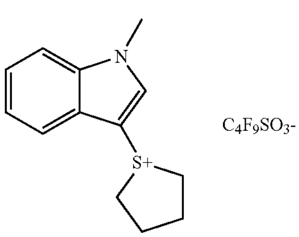

(z87)

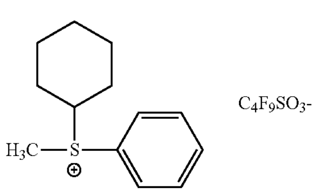

-continued (z88)

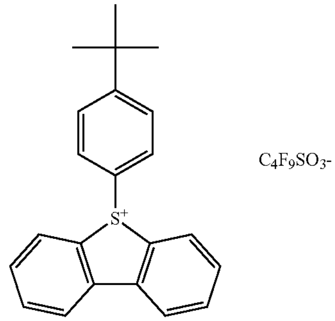

(z89)

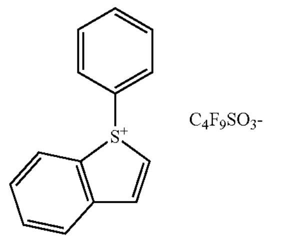

(z90)

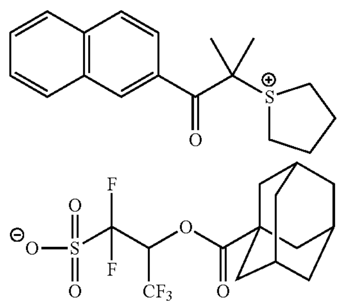

(z91)

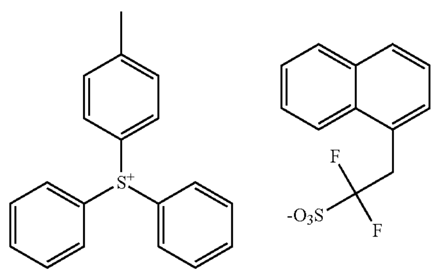

The concurrently used acid-generating agent can be synthesized based on well-known methods, for example, the method disclosed in JP2007-161707A.

The concurrently used acid-generating agent can be used alone or in combination of two or more kinds thereof.

The content of the concurrently used acid-generating agent in the composition is preferably 0.05% by mass to 15% by mass, more preferably 0.1% by mass to 10% by mass, and even more preferably 1% by mass to 6% by mass, based on the total solid contents of the actinic-ray-sensitive or radiation-sensitive resin composition.

[3] (C) Solvent

Examples of the solvent that can be used for preparing the actinic-ray-sensitive or radiation-sensitive resin composition of the present invention include organic solvents such as alkylene glycol monoalkyl ether carboxylate, alkylene glycol monoalkyl ether, alkyl lactate ester, alkyl alkoxy propionate, cyclic lactone (preferably having 4 to 10 carbon atoms), a monoketone compound (preferably having 4 to 10 carbon atoms) that may have a ring, alkylene carbonate, alkyl alkoxy acetate, and alkyl pyruvate.

Specific examples of these solvents include the solvents disclosed in Paragraphs [0441] to [0455] in the specification of US2008/0187860A.

In the present invention, as an organic solvent, a mixed solvent which is a mixture of a solvent containing a hydroxyl group in the structure and a solvent not containing a hydroxyl group may be used.

The solvent containing a hydroxyl group and the solvent not containing a hydroxyl group can be appropriately selected from the example compounds described above. The solvent containing a hydroxyl group is preferably alkylene glycol monoalkyl ether, alkyl lactate, or the like, and more preferably propylene glycol monomethyl ether (PGME, having another name of 1-methoxy-2-propanol) or ethyl lactate. The solvent not containing a hydroxyl group is preferably alkylene glycol monoalkyl ether acetate, alkyl alkoxy propionate, a monoketone compound that may contain a ring, cyclic lactone, alkyl acetate, or the like. Among these, propylene glycol monomethyl ether acetate (PGMEA, having another name of 1-methoxy-2-acetoxypropane), ethyl ethoxy propionate, 2-heptanone, γ-butyrolactone, cyclohexanone, and butyl acetate are particularly preferable, and propylene glycol monomethyl ether acetate, ethyl ethoxy propionate, and 2-heptanone are most preferable.

The mixing ratio (mass) between the solvent containing a hydroxyl group and the solvent not containing a hydroxyl group is 1/99 to 99/1, preferably 10/90 to 90/10, and more preferably 20/80 to 60/40. A mixed solvent that contains 50% by mass or more of the solvent not containing a hydroxyl group is particularly preferable in respect of coating uniformity.

The solvent preferably contains propylene glycol monomethyl ether acetate. In addition, the solvent is preferably a single solvent of propylene glycol monomethyl ether acetate or a mixed solvent of two or more kinds of solvents containing propylene glycol monomethyl ether acetate.

[4] (D) Hydrophobic Resin

When the actinic-ray-sensitive or radiation-sensitive resin composition of the present invention is applied particularly to the liquid immersion exposure, this composition may contain a hydrophobic resin (hereinafter, also referred to as a "hydrophobic resin (D)" or simply as a "resin (D)") that contains at least one of a fluorine atom and a silicon atom. In this manner, the hydrophobic resin (D) is localized on the surface layer of a film, and the static and dynamic contact angle of the resist film surface with respect to water (a liquid immersion medium) is improved accordingly, whereby traceability of the resist film with respect to the liquid for liquid immersion is improved.

It is preferable to design such that the hydrophobic resin (D) is localized in the interface as described above. However, contrary to a surfactant, the hydrophobic resin does not necessarily have a hydrophilic group in a molecule and may not help a polar substance and a non-polar substance to be evenly mixed.

The hydrophobic resin (D) typically contains a fluorine atom and/or a silicon atom. The fluorine atom and/or the silicon atom in the hydrophobic resin (D) may be contained in either the main chain or the side chain of the resin.

When the hydrophobic resin (D) contains a fluorine atom, the resin is preferably a resin including, as a partial structure containing the fluorine atom, an alkyl group having a fluorine atom, a cycloalkyl group having a fluorine atom, or an aryl group having a fluorine atom.

The alkyl group (preferably having 1 to 10 carbon atoms, and more preferably having 1 to 4 carbon atoms) having a fluorine atom is a linear or branched alkyl group in which at least one hydrogen atom has been substituted with a fluorine atom, and may further have a substituent other than a fluorine atom.

The cycloalkyl group having a fluorine atom is a monocyclic or polycyclic cycloalkyl group in which at least one hydrogen atom has been substituted with a fluorine atom, and may further have a substituent other than a fluorine atom.

Examples of the aryl group having a fluorine atom include aryl groups such as a phenyl group and naphthyl group in which at least one hydrogen atom has been substituted with a fluorine atom. The aryl group may further have a substituent other than a fluorine atom.

Examples of the alkyl group having a fluorine atom, the cycloalkyl group having a fluorine atom, or the aryl group having a fluorine atom preferably include groups represented by the following General formulae (F2) to (F4), but the present invention is not limited thereto.

(F2)

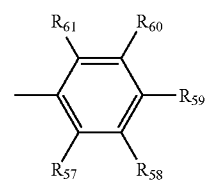

(F3)

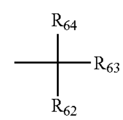

(F4)

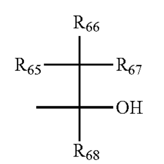

In General formulae (F2) to (F4), each of $R_{57}$ to $R_{68}$ independently represents a hydrogen atom, a fluorine atom, or a (linear or branched) alkyl group. Here, at least one of $R_{57}$ to $R_{61}$, at least one of $R_{62}$ to $R_{64}$, and at least one of $R_{65}$ to $R_{68}$ independently represent a fluorine atom or an alkyl group (preferably having 1 to 4 carbon atoms) in which at least one hydrogen atom has been substituted with a fluorine atom.

All of $R_{57}$ to $R_{61}$ and $R_{65}$ to $R_{67}$ are preferably fluorine atoms. $R_{62}$, $R_{63}$, and $R_{68}$ are preferably alkyl groups (preferably having 1 to 4 carbon atoms) in which at least one hydrogen atom has been substituted with a fluorine atom, and more preferably perfluoroalkyl groups having 1 to 4 carbon atoms. $R_{62}$ and $R_{63}$ may form a ring by being linked to each other.

Specific examples of the group represented by General formula (F2) include a p-fluorophenyl group, a pentafluorophenyl group, a 3,5-di(trifluoromethyl)phenyl group, and the like.

Specific examples of the group represented by General formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group, and the like. Among these, a hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferable, and a hexafluoroisopropyl group and a heptafluoroisopropyl group are more preferable.

Specific examples of the group represented by General formula (F4) include —$C(CF_3)_2OH$, —$C(C_2F_5)_2OH$, —$C(CF_3)(CH_3)OH$, —$CH(CF_3)OH$, and the like, and —$C(CF_3)_2OH$ is preferable.

The partial structure having a fluorine atom may directly bind to the main chain, or may bind to the main chain via a group selected from a group consisting of an alkylene group, a phenylene group, an ether bond, a thioether bond, a carbonyl group, an ester bond, an amide bond, a urethane bond, and a ureylene bond, or via a group including a combination of two or more kinds of the above ones.

Examples of suitable repeating units having a fluorine atom include repeating units shown below.

(C-Ia)

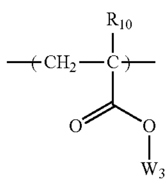

(C-Ib)

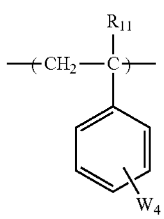

(C-Ic)

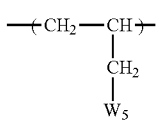

(C-Id)

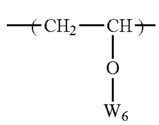

In the formulae, each of $R_{10}$ and $R_{11}$ independently represents a hydrogen atom, a fluorine atom, or an alkyl group. The alkyl group is preferably a linear or branched alkyl group having 1 to 4 carbon atoms, and may have a substituent. Examples of the alkyl group having a substituent particularly include a fluorinated alkyl group.

Each of $W_3$ to $W_6$ independently represents an organic group containing at least one fluorine atom. Specific examples thereof include atomic groups of (F2) to (F4) described above.

In addition to the above repeating units, the hydrophobic resin (D) may include units shown below as the repeating unit having a fluorine atom.

(C-II)

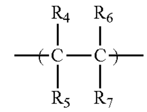

(C-III)

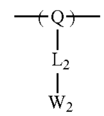

In the formulae, each of $R_4$ to $R_7$ independently represents a hydrogen atom, a fluorine atom, or an alkyl group. The alkyl group is preferably a linear or branched alkyl group having 1 to 4 carbon atoms, and may have a substituent. Examples of the alkyl group having a substituent particularly include a fluorinated alkyl group.

Here, at least one of $R_4$ to $R_7$ represents a fluorine atom. $R_4$ and $R_5$ or $R_6$ and $R_7$ may form a ring.

$W_2$ represents an organic group containing at least one fluorine atom, and specific examples thereof include atomic groups of (F2) to (F4) described above.

$L_2$ represents a single bond or a divalent linking group. The divalent linking group represents a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or alkyl), —$NHSO_2$—, or a divalent linking group including a combination of a plurality of the above ones.

Q represents an alicyclic structure. The alicyclic structure may have a substituent, and may be a monocyclic or polycyclic. If the structure is polycyclic, the structure may be a bridged structure. The monocyclic structure is preferably a cycloalkyl group having 3 to 8 carbon atoms, and examples thereof include a cyclopentyl group, a cyclohexyl group, a cyclobutyl group, a cyclooctyl group, and the like. Examples of the polycyclic structure include groups having a bicyclo, tricyclo, or tetracyclo structure having 5 or more carbon atoms, and a cycloalkyl group having 6 to 20 carbon atoms is preferable. Examples thereof include an adamantyl group, a norbornyl group, a dicyclopentyl group, a tricyclodecanyl group, a tetracyclododecyl group, and the like. A portion of the carbon atoms in the cycloalkyl group may be substituted with hetero atoms such as oxygen atoms. Preferable examples of Q include a norbornyl group, a tricyclodecanyl group, a tetracyclododecyl group, and the like.

Specific examples of the repeating unit having a fluorine atom will be shown below, but the present invention is not limited to the examples.

In the specific examples, $X_1$ represents a hydrogen atom, —$CH_3$, —F, or —$CF_3$, and $X_2$ represents —F, or —$CF_3$.

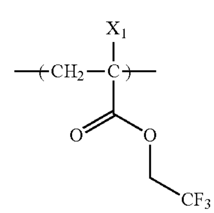

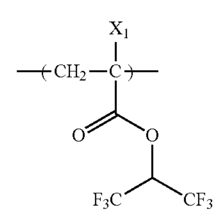

-continued
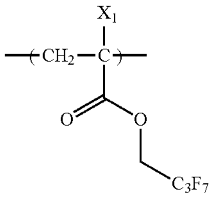
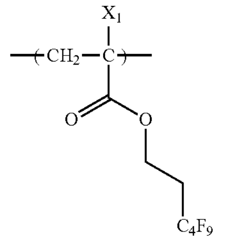
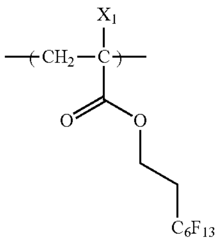
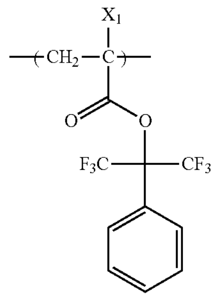
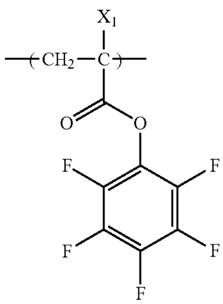
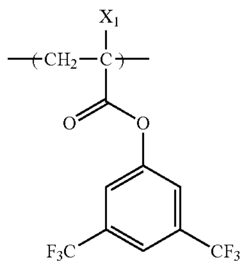
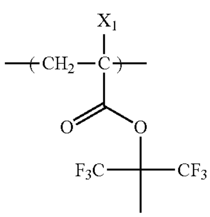
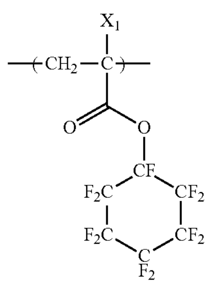
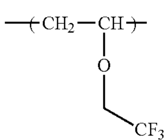
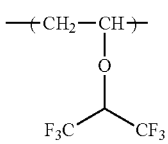
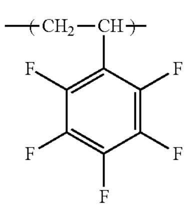
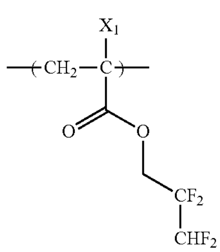
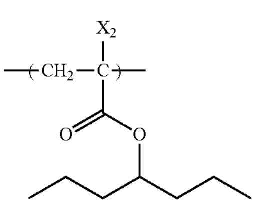
-continued
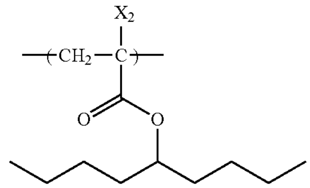
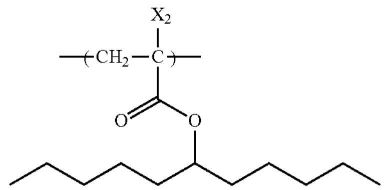
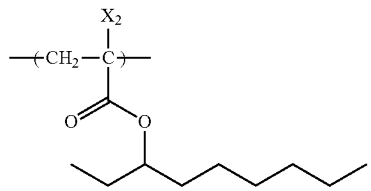
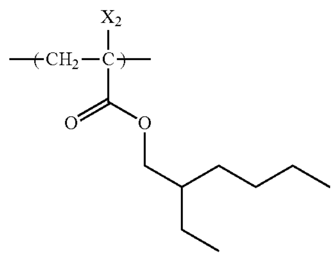
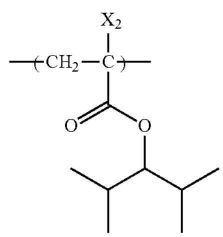
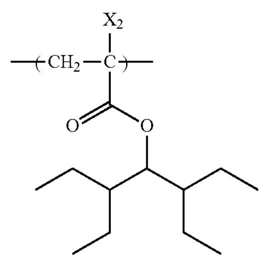
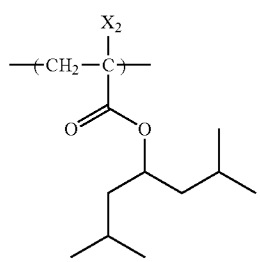
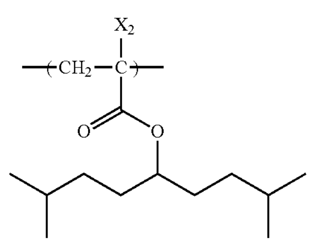

-continued

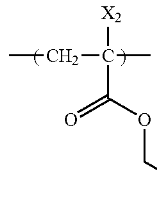

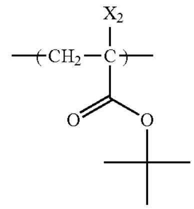

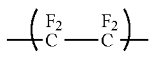

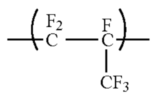

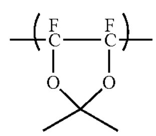

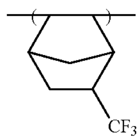

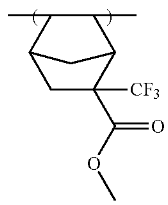

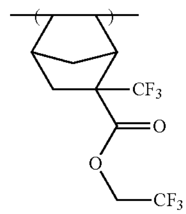

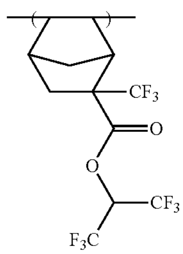

The hydrophobic resin (D) may contain a silicone atom. The hydrophobic resin (D) preferably has an alkylsilyl structure (preferably a trialkylsilyl group) or a cyclic siloxane structure as a partial structure having a silicon atom.

Specific examples of the alkylsilyl structure or the cyclic siloxane structure include groups represented by the following General formulae (CS-1) to (CS-3).

(CS-1)

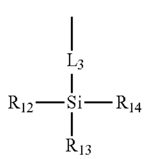

(CS-2)

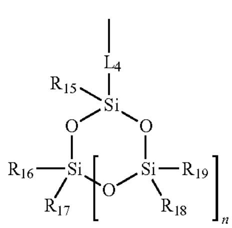

-continued (CS-3)

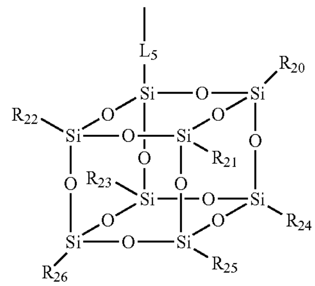

In General formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

$L_3$ to $L_5$ represent a single bond or a divalent linking group. Examples of the divalent linking group include a single group or a combination of two or more kinds of groups (preferably having 12 or less carbon atoms) selected from a group consisting of an alkylene group, a phenylene group, an ether bond, a thioether bond, a carbonyl group, an ester bond, an amide bond, a urethane bond, and a ureylene bond. n represents an integer of 1 to 5, and is preferably an integer of 2 to 4.

Specific examples of the repeating unit having the group represented by General Formulae (CS-1) to (CS-3) will be shown below, but the present invention is not limited thereto. In the specific examples, $X_1$ represents a hydrogen atom, —$CH_3$, —F, or —$CF_3$.

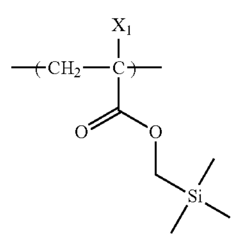

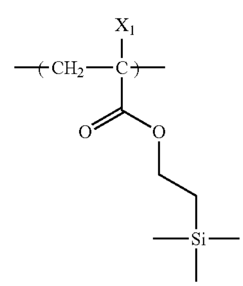

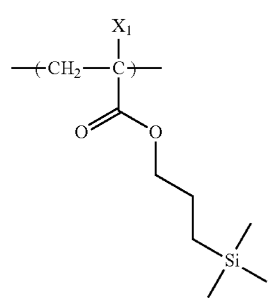

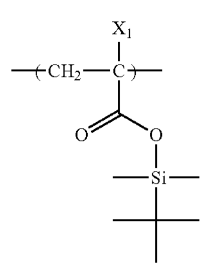

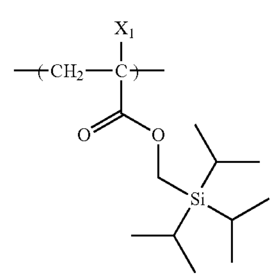

-continued

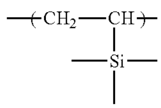

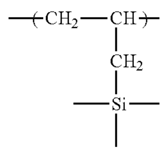

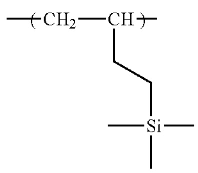

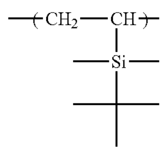

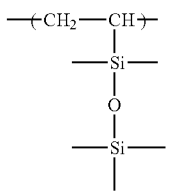

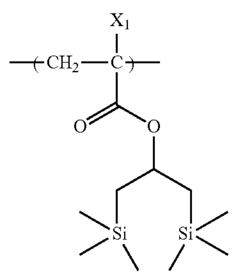

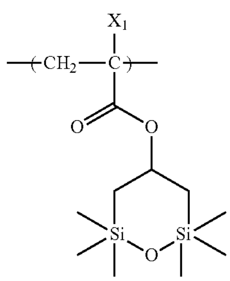

-continued

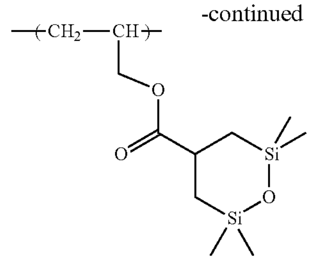

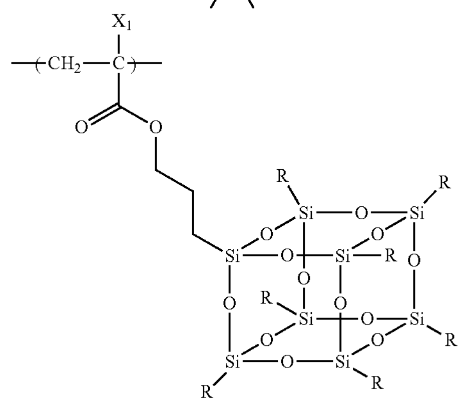

R = $CH_3$, $C_2H_5$, $C_3H_7$, $C_4H_9$

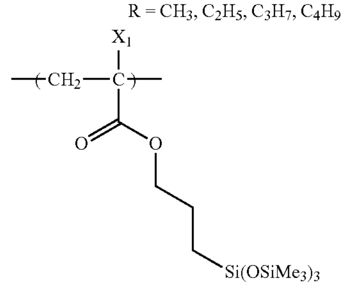

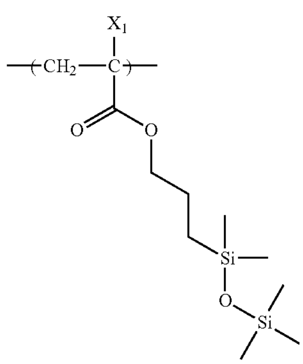

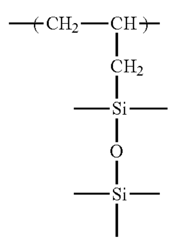

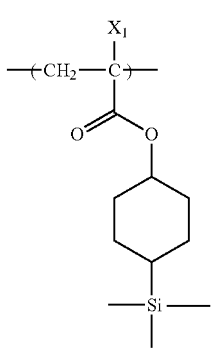

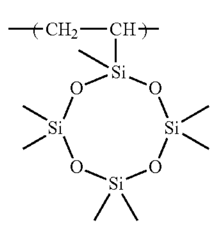

The hydrophobic resin (D) may contain at least one group selected from a group consisting of (x) to (z) shown below.

(x) an acid group (y) a group having a lactone structure, an acid anhydride group, or an acid imide group (z) a group degraded by the action of an acid Examples of the acid group (x) include a phenolic hydroxyl group, a carboxylic group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and the like.

Examples of the preferable acid group include a fluorinated alcohol group (preferably a hexafluoroisopropanol), a sulfonimide group, and a bis(alkylcarbonyl)methylene group.

Examples of a repeating unit having the acid group (x) include a repeating unit in which the acid group directly binds to the main chain of a resin, such as a repeating unit of acrylic acid or methacrylic acid, a repeating unit in which the acid group binds to the main chain of a resin via a linking group, and the like. In addition, a polymerization initiator and a chain transfer agent having an acid group can be introduced to the terminal of a polymer chain during polymerization, and any of cases is preferable. The repeating unit having the acid group (x) may contain at least any one of a fluorine atom and a silicon atom.

The content of the repeating unit having the acid group (x) is preferably 1 mol % to 50 mol %, more preferably 3 mol % to 35 mol %, and even more preferably 5 mol % to 20 mol %, based on all repeating units in the hydrophobic resin (D).

Specific examples of the repeating unit having the acid group (x) will be shown below, but the present invention is not limited thereto. In the formula, Rx represents a hydrogen atom, $CH_3$, $CF_3$, or $CH_2OH$.

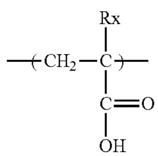
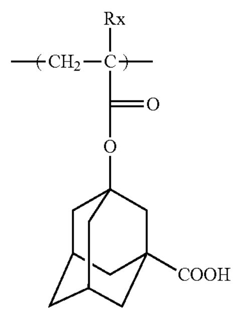
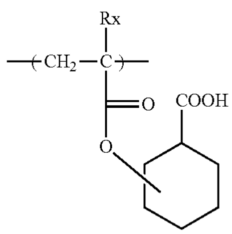
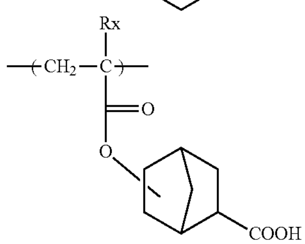
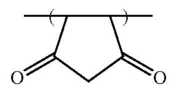
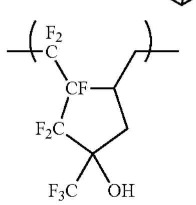
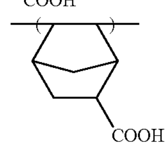
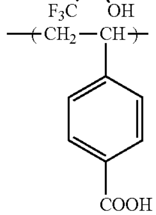
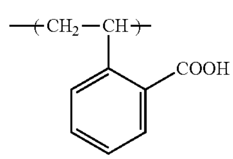
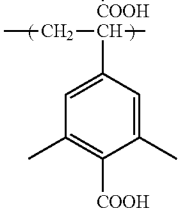
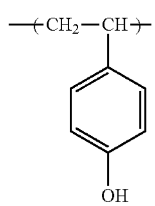
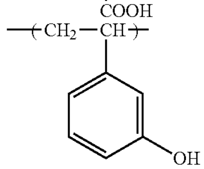
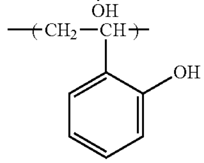

-continued

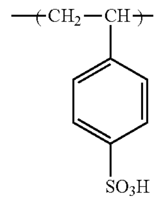
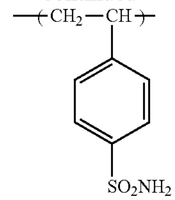
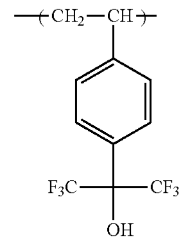
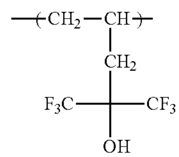
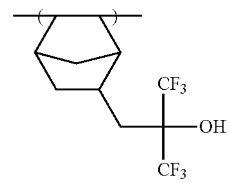
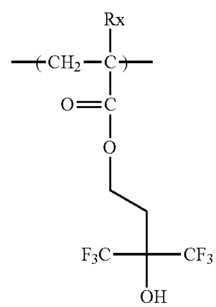
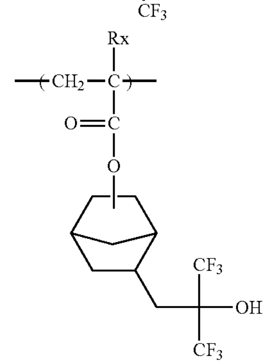
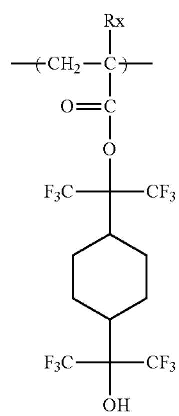
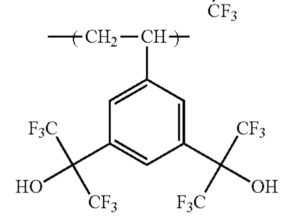
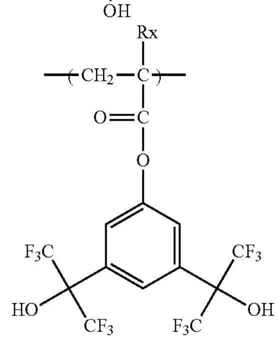
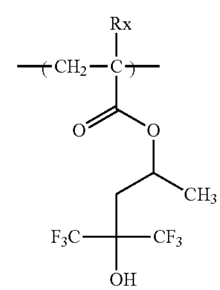
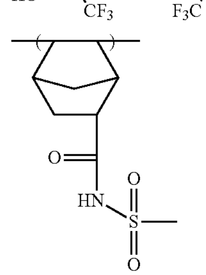
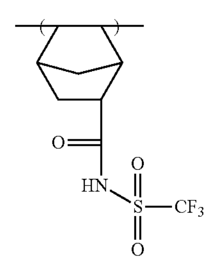

-continued

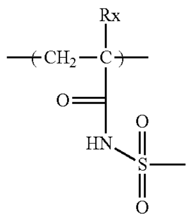

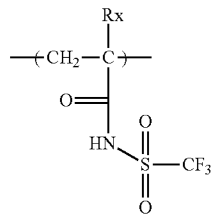

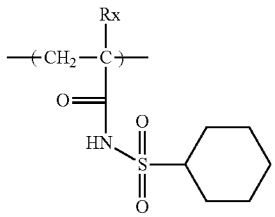

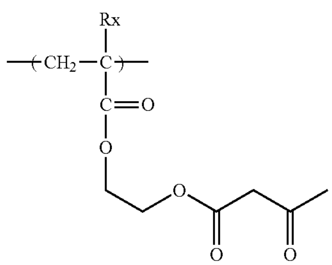

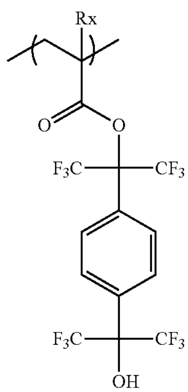

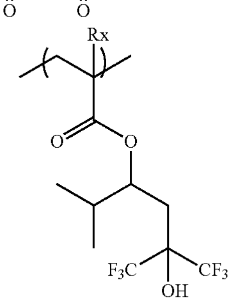

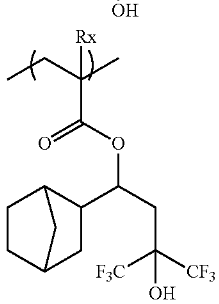

As the group having a lactone structure, the acid anhydride group, or the acid imide group (y), a group having a lactone structure is particularly preferable.

The repeating unit having these groups is a repeating unit in which these groups directly bind to the main chain of the resin, such as a repeating unit of acrylic acid ester or methacrylic acid ester. Alternatively, the repeating unit may be a repeating unit in which these groups bind to the main chain of the resin via a linking group. As another option, the repeating unit may be introduced to the terminal of the resin by using a polymerization initiator or a chain transfer agent containing these groups during polymerization.

Examples of the repeating unit containing the group having a lactone structure include the same ones as those of the repeating unit having a lactone structure described above for the acid-degradable resin (A).

The content of the repeating unit containing the group having a lactone structure, the acid anhydride group, or the acid imide group is preferably 1 mol % to 100 mol %, more preferably 3 mol % to 98 mol %, and even more preferably 5 mol % to 95 mol %, based on all repeating units in the hydrophobic resin.

Examples of the repeating unit containing the group (z) degraded by the action of an acid in the hydrophobic resin (D) include the same ones as those of the repeating unit containing an acid-degradable group exemplified for the resin (A). The repeating unit containing the group (z) degraded by the action of an acid may include at least any one of a fluorine atom and a silicon atom. The content of the repeating unit containing the group (z) degraded by the action of an acid in the hydrophobic resin (D) is preferably 1 mol % to 80 mol %, more preferably 10 mol % to 80 mol %, and even more preferably 20 mol % to 60 mol %, based on all repeating units in the resin (D).

The hydrophobic resin (D) may further contain a repeating unit represented by the following General Formula (CIII).

(CIII)

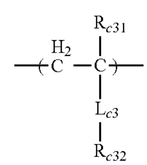

In General Formula (CIII), $R_{c31}$ represents a hydrogen atom, an alkyl group (which may be substituted with a fluorine atom or the like), a cyano group, or a —CH$_2$—O—Rac$_2$ group. In the formula, Rac$_2$ represents a hydrogen atom, an alkyl group, or an acyl group. $R_{c31}$ is preferably a hydrogen atom, a methyl group, a hydroxymethyl group, or a trifluoromethyl group, and particularly preferably a hydrogen atom, or a methyl group.

$R_{c32}$ represents a group having an alkyl group, a cycloalkyl group, an alkenyl group, a cycloalkenyl group, or an aryl group. These groups may be substituted with a group containing a fluorine atom or a silicon atom.

$L_{c3}$ represents a single bond or a divalent linking group.

The alkyl group of $R_{c32}$ in General Formula (CIII) is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group. These groups may have a substituent.

$R_{c32}$ is an unsubstituted alkyl group or an alkyl group substituted with a fluorine atom.

The divalent linking group of $L_c$; is preferably an alkylene group (preferably having 1 to 5 carbon atoms), an ether bond, a phenylene group, or an ester bond (a group represented by —COO—).

The content of the repeating unit represented by General Formula (CIII) is preferably 1 mol % to 100 mol %, more preferably 10 mol % to 90 mol %, and even more preferably 30 mol % to 70 mol %, based on all repeating units in the hydrophobic resin.

The hydrophobic resin (D) preferably contains the repeating unit represented by the following General Formula (CII-AB).

(C11-AB)

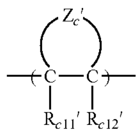

In Formula (CII-AB), each of $Rc_{11}'$ and $Rc_{12}'$ independently represents a hydrogen atom, a cyano group, a halogen atom, or an alkyl group.

Zc' contains two carbon atoms (C—C) binding to each other, and represents an atomic group necessary for forming an alicyclic structure.

The content of the repeating unit represented by General Formula (CII-AB) is preferably 1 mol % to 100 mol %, more preferably 10 mol % to 90 mol %, and even more preferably 30 mol % to 70 mol %, based on all repeating units in the hydrophobic resin.

Specific examples of the repeating units represented by General Formulae (III) and (CII-AB) will be shown below, but the present invention is not limited thereto. In the formulae, Ra represents H, $CH_3$, $CH_2OH$, $CF_3$, or CN.

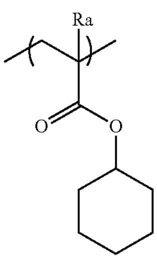

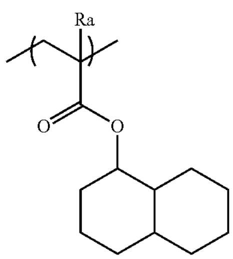

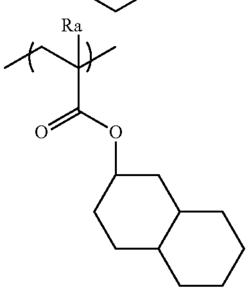

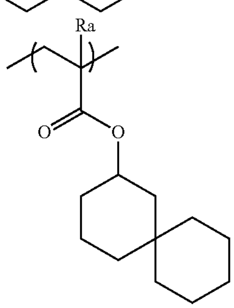

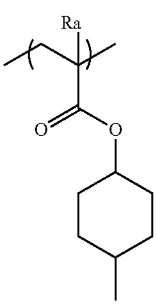

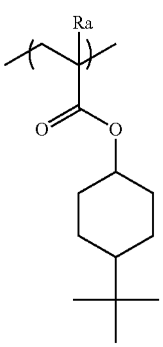

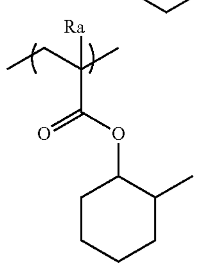

-continued

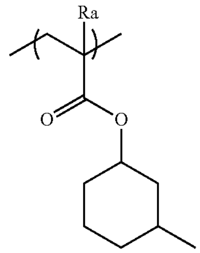

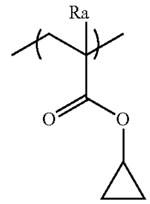

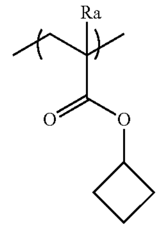

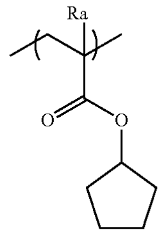

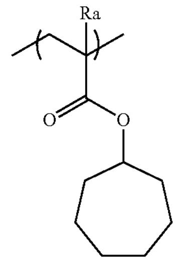

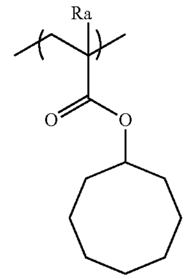

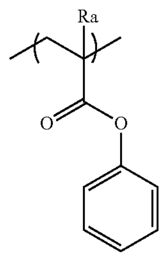

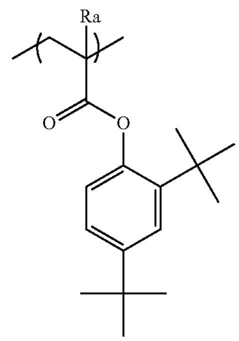

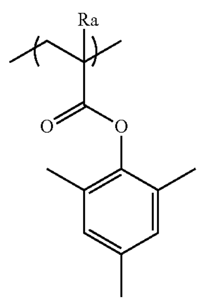

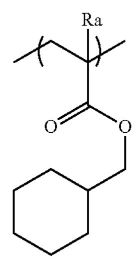

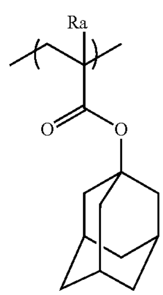

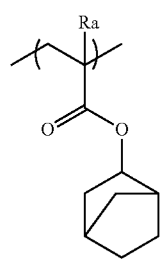

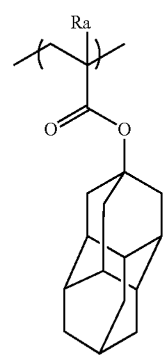

-continued

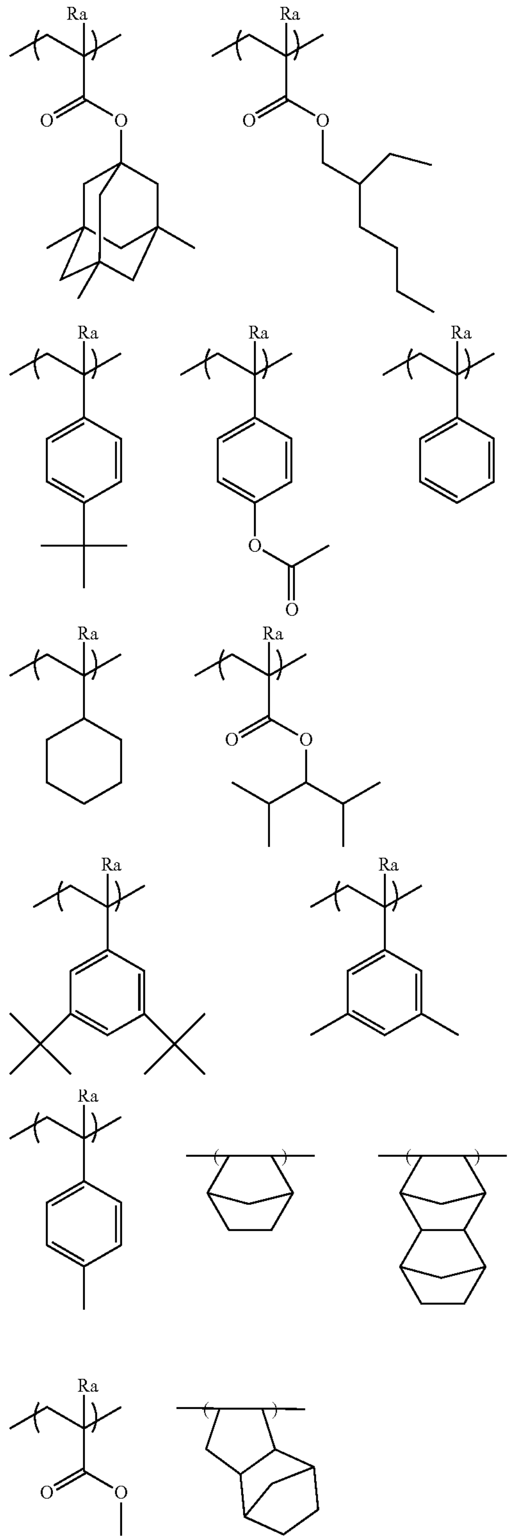

When the hydrophobic resin (D) contains a fluorine atom, the content of the fluorine atom is preferably 5% by mass to 80% by mass, and more preferably 10% by mass to 80% by mass, based on the weight average molecular weight of the hydrophobic resin (D). In addition, the content of the repeating unit containing a fluorine atom is preferably 10 mol % to 100 mol %, and more preferably 30 mol % to 100 mol %, based on all repeating units contained in the hydrophobic resin (D).

When the hydrophobic resin (D) contains a silicon atom, the content of the silicon atom is preferably 2% by mass to 50% by mass, and more preferably 2% by mass to 30% by mass, based on the weight average molecular weight of the hydrophobic resin (D). In addition, the content of the repeating unit containing a silicon atom is preferably 10 mol % to 100 mol %, and more preferably 20 mol % to 100 mol %, based on all repeating units contained in the hydrophobic resin (D).

The weight average molecular weight of the hydrophobic resin (D) calculated in terms of standard polystyrene is preferably 1,000 to 100,000, more preferably 1,000 to 50,000, and even more preferably 2,000 to 15,000.

The hydrophobic resin (D) may be used alone, or a plurality of hydrophobic resins (D) may be used concurrently.

The content of the hydrophobic resin (D) in the composition is preferably 0.01% by mass to 10% by mass, more preferably 0.05% by mass to 8% by mass, and even more preferably 0.1% by mass to 5% by mass, based on the total solid content in the composition of the present invention. In addition, needless to say, the content of the above repeating unit in the hydrophobic resin (D) does not exceed 100 mol % in total.

It is natural that the hydrophobic resin (D) contains a small amount of impurities such as metals, similarly to the resin (A), and the amount of residual monomers and oligomer components is preferably 0.01% by mass to 5% by mass, more preferably 0.01% by mass to 3% by mass, and even more preferably 0.05% by mass to 1% by mass. In this amount, an actinic-ray-sensitive or radiation-sensitive resin composition is obtained which does not have foreign substances in a liquid and does not show the change in sensitivity or the like over time. The molecular weight distribution (Mw/Mn, which is also referred to as degree of dispersion) is preferably in a range of from 1 to 5, more preferably in a range of from 1 to 3, and even more preferably in a range of from 1 to 2, in respect of resolution, the resist shape, side walls of the resist pattern, roughness, and the like.

As the hydrophobic resin (D), various commercially available products can be used, and the hydrophobic resin can also be synthesized by a common method (for example, a radical polymerization). Examples of the general synthesis method include batch polymerization in which polymerization is performed by dissolving monomer materials and initiators in a solvent and heating the resultant, and drop polymerization in which a solution including monomer materials and initiators is added dropwise to a heated solvent for 1 to 10 hours. A preferable method is the drop polymerization.

The reaction solvent, polymerization initiator, reaction conditions (temperature, concentration, and the like), and a method of purification after the reaction are the same as those that were described for the resin (A). However, for synthesizing the hydrophobic resin (D), the reaction concentration is preferably 30% by mass to 50% by mass.

Specific examples of the hydrophobic resin (D) will be shown below. In addition, the molar ratio (corresponding to the respective repeating units from left in order), weight average molecular weight, degree of dispersion of repeating units in the respective resins will be shown in the following Tables 1 and 2.

(HR-1)
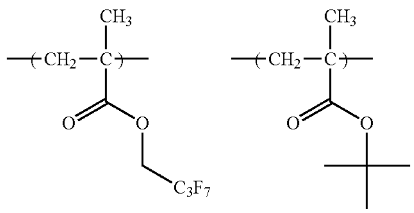
(HR-2)
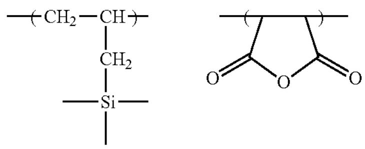
(HR-3)
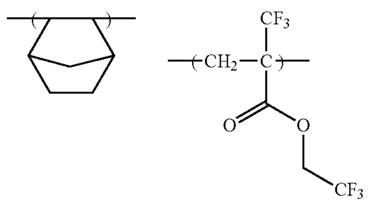
(HR-4)
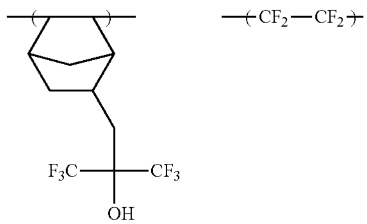
(HR-5)
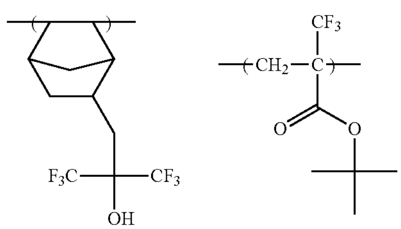
(HR-6)
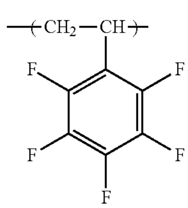
(HR-7)
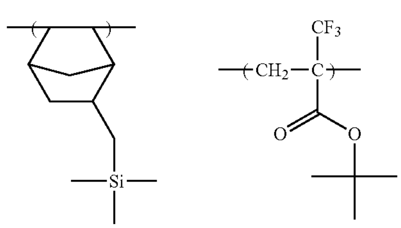
-continued
(HR-8)
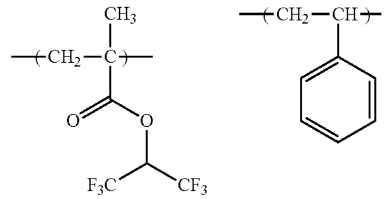
(HR-9)
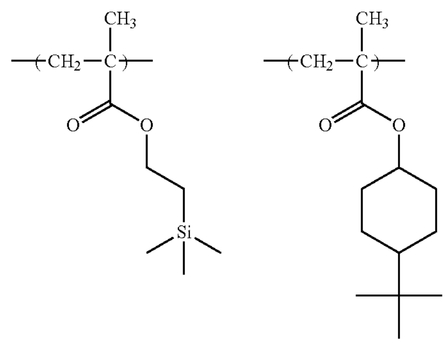
(HR-10)
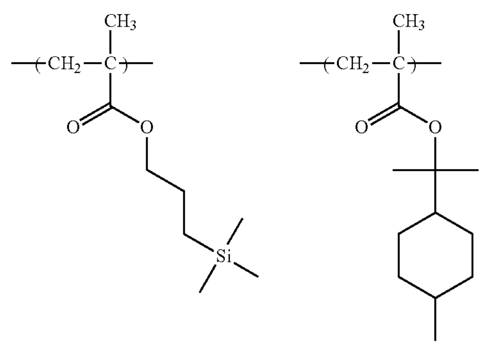
(HR-11)
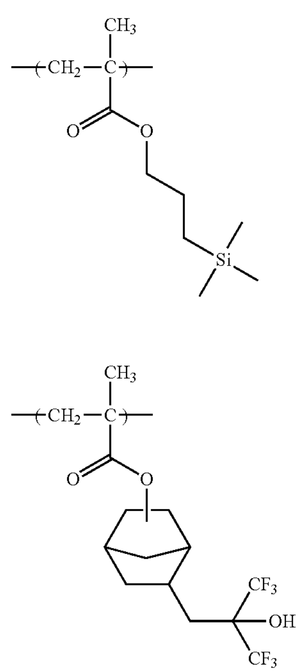

-continued
(HR-12)
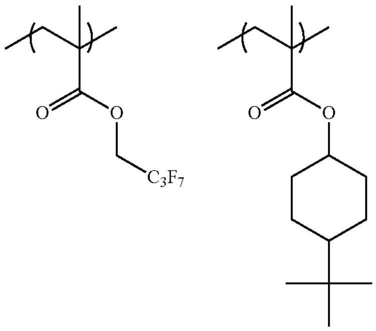
(HR-13)
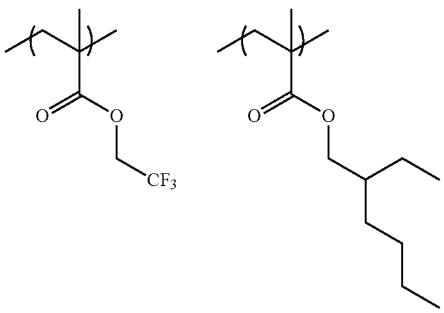
(HR-14)
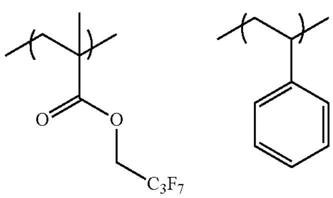
(HR-15)
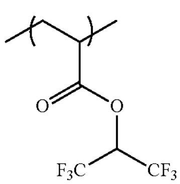
(HR-16)
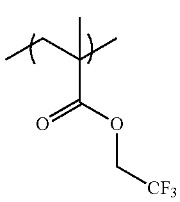
(HR-17)
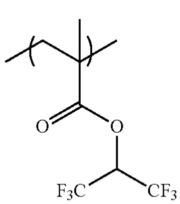
-continued
(HR-18)
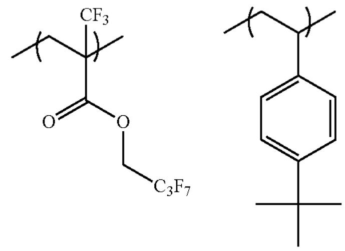
(HR-19)
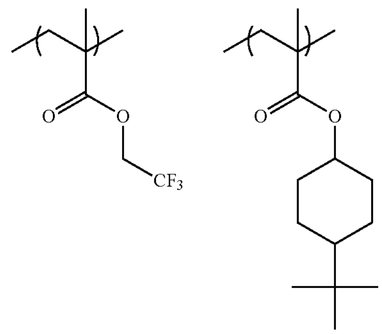
(HR-20)
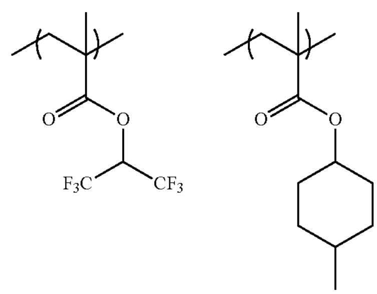
(HR-21)
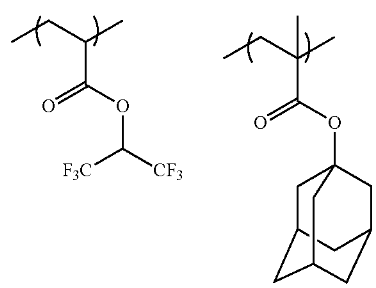
(HR-22)
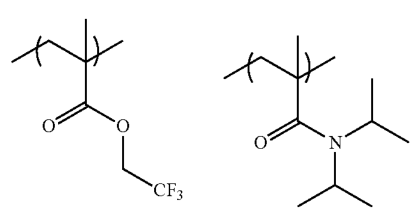

-continued
(HR-23)
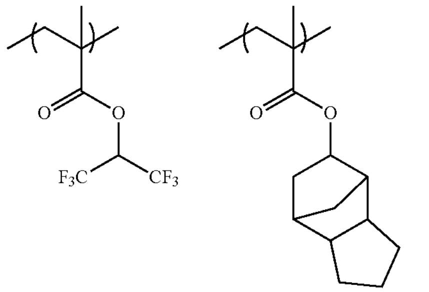
(HR-24)
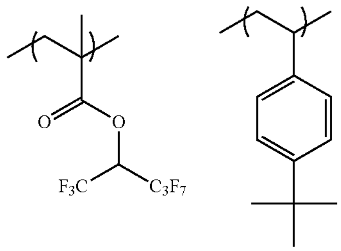
(HR-25)
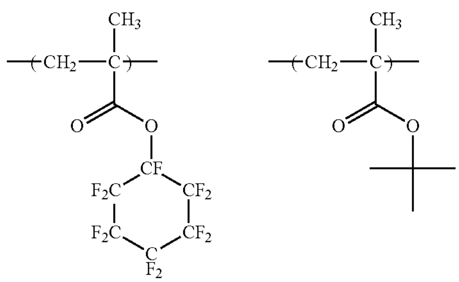
(HR-26)
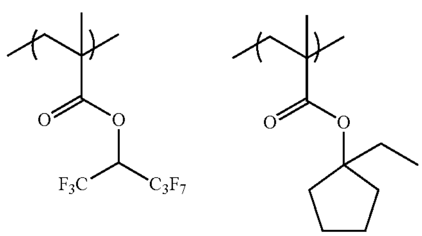
(HR-27)
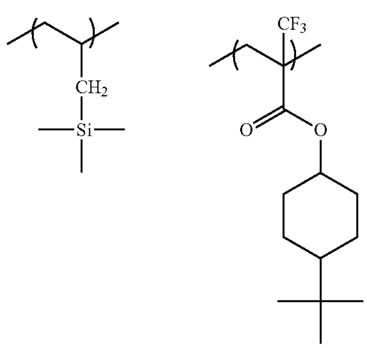
(HR-28)
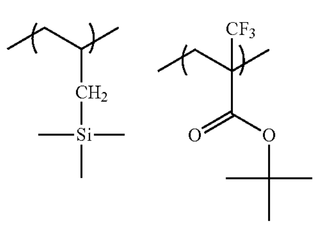
-continued
(HR-29)
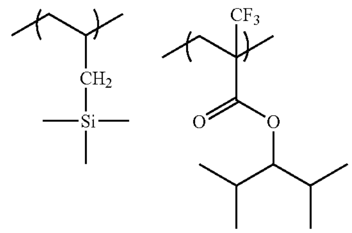
(HR-30)
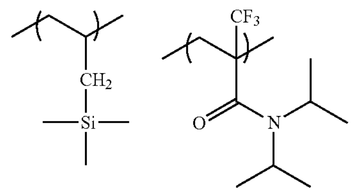
(HR-31)
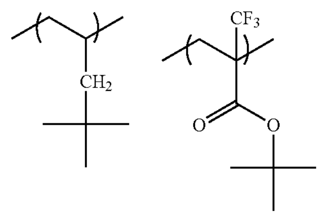
(HR-32)
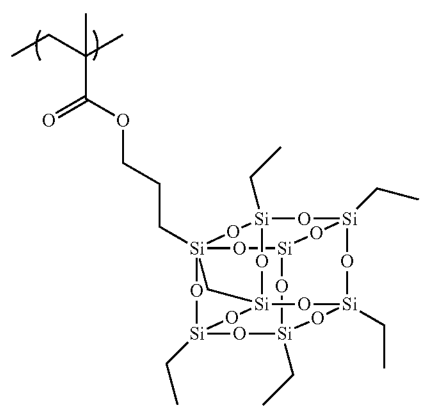
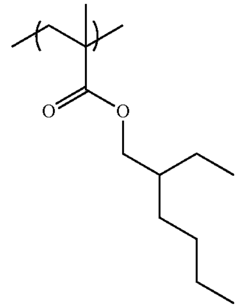

-continued
(HR-33)
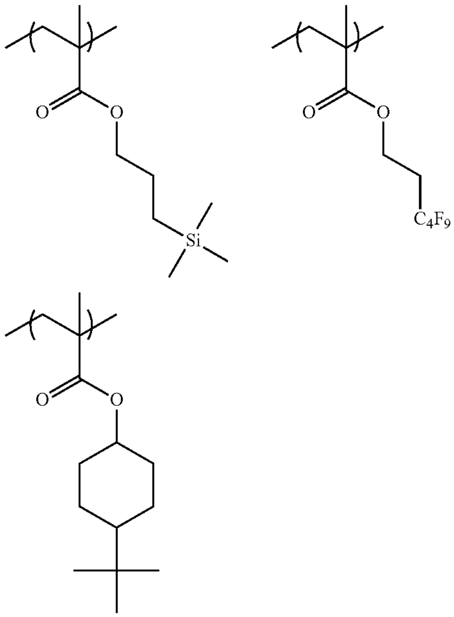
(HR-34)
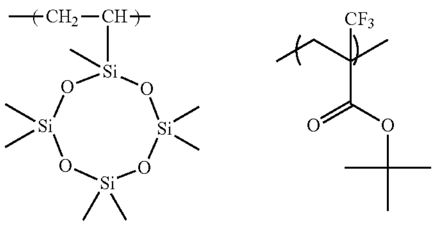
(HR-35)
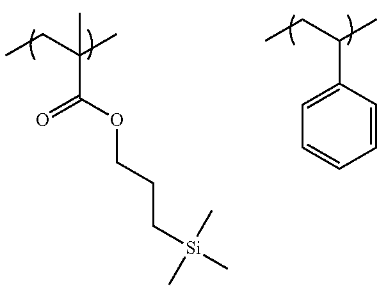
(HR-36)
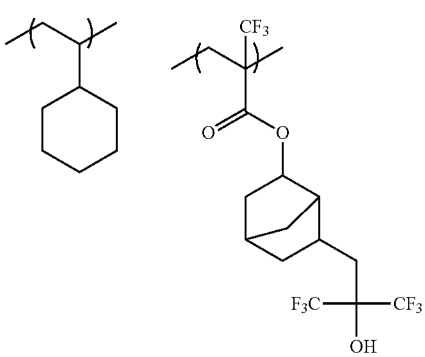
-continued
(HR-37)
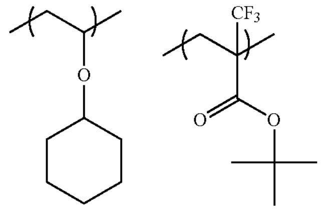
(HR-38)
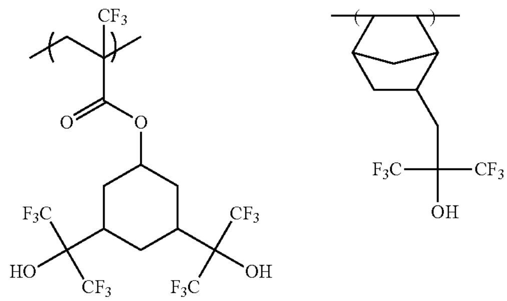
(HR-39)
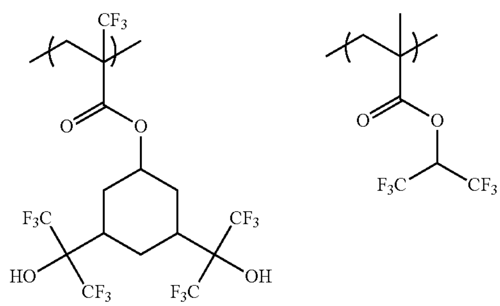
(HR-40)
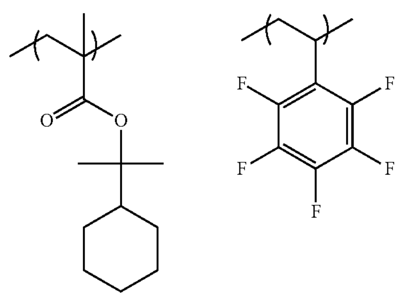
(HR-41)
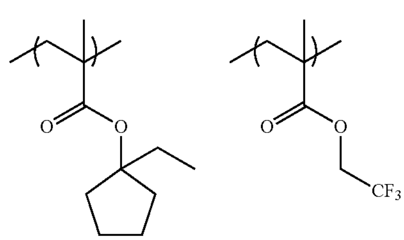
(HR-42)
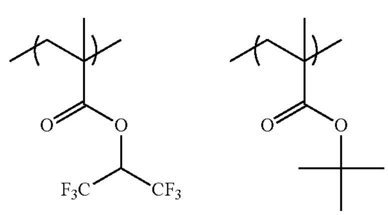

-continued
(HR-43)
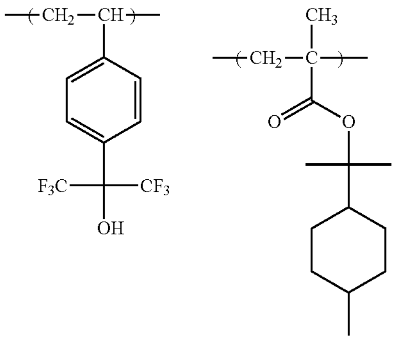
(HR-44)
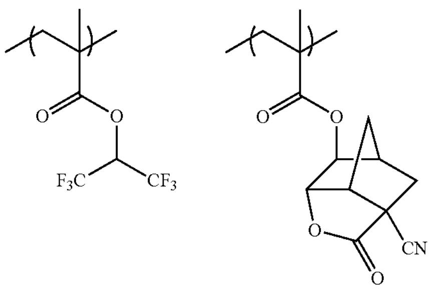
(HR-45)
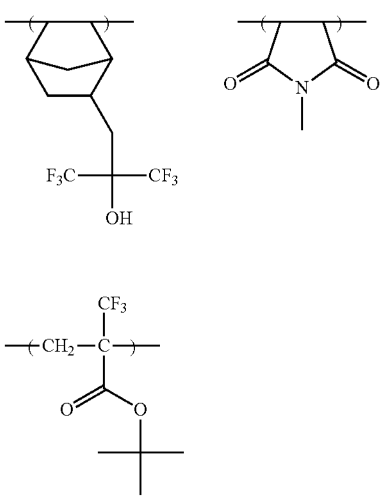
(HR-46)
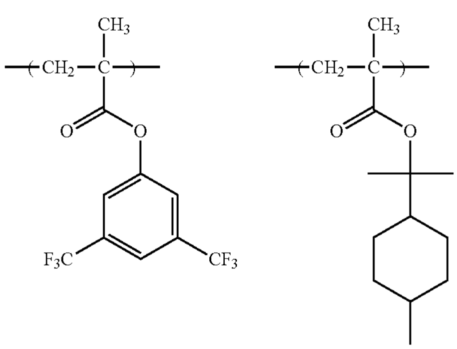
-continued
(HR-47)
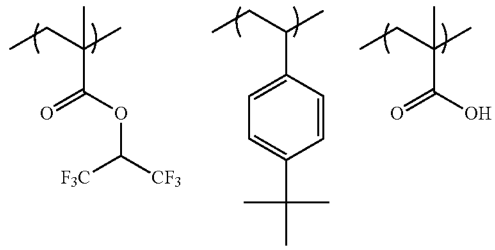
(HR-48)
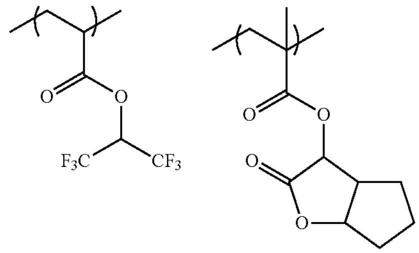
(HR-49)
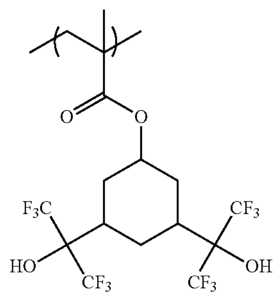
(HR-50)
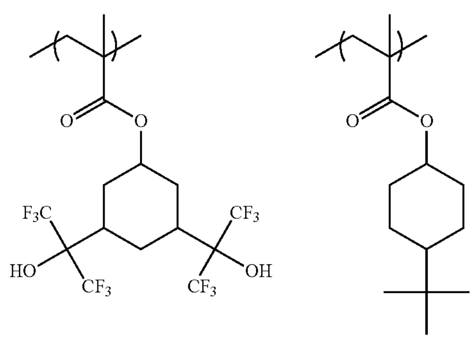
(HR-51)
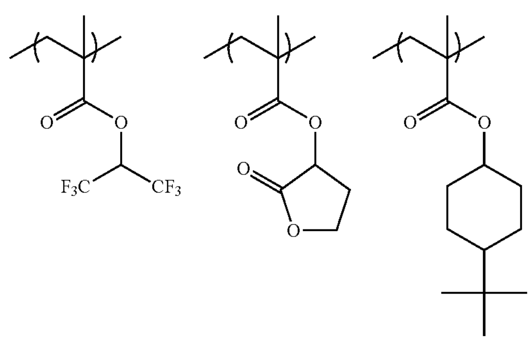

-continued
(HR-52)
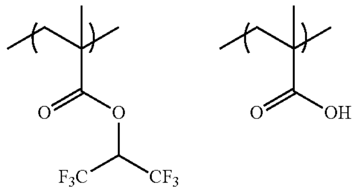
(HR-53)
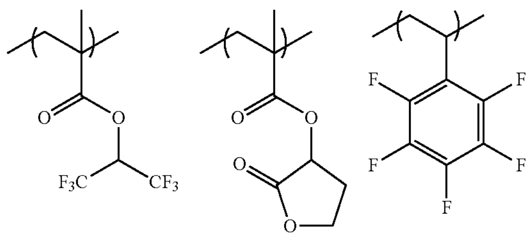
(HR-54)
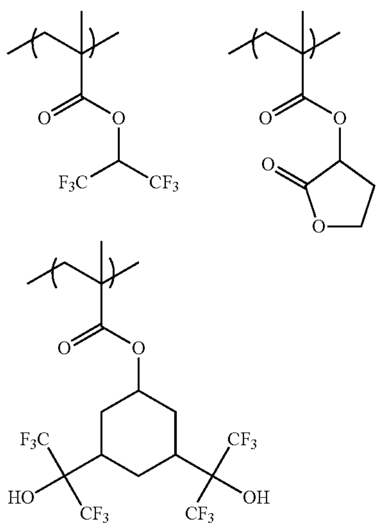
(HR-55)
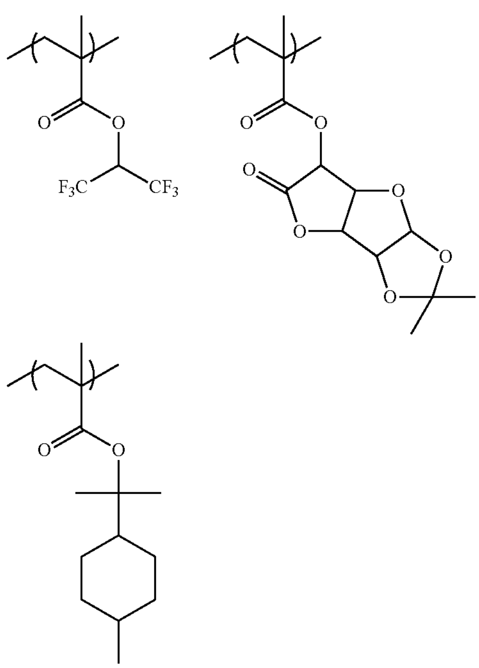
-continued
(HR-56)
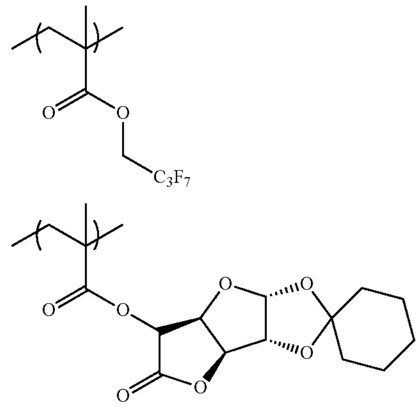
(HR-57)
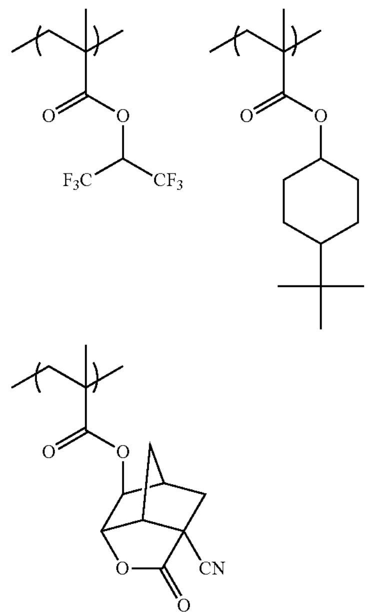
(HR-58)
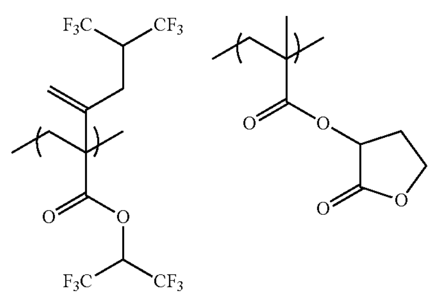
(HR-59)
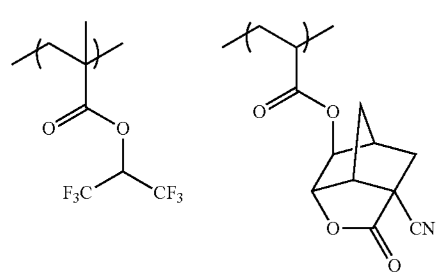

-continued
(HR-60)
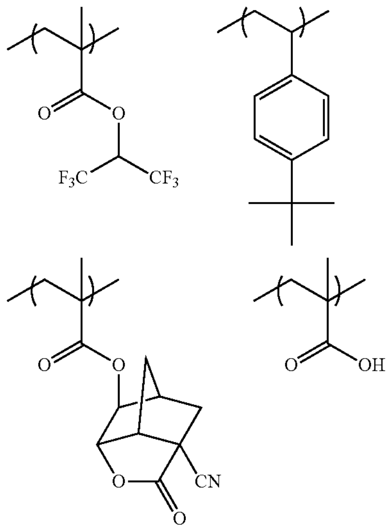
(HR-61)
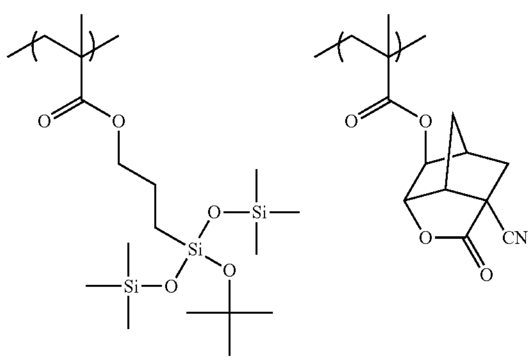
(HR-62)
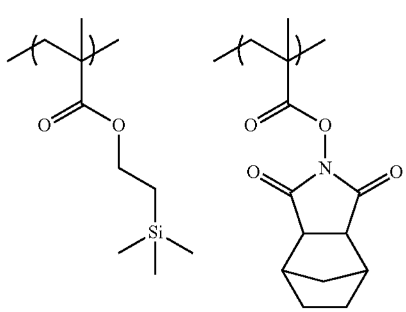
(HR-63)
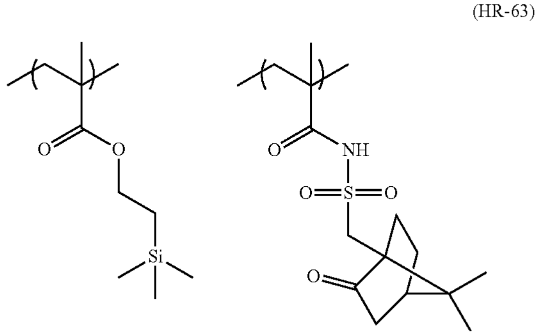
-continued
(HR-64)
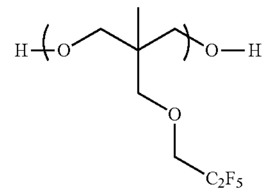
(HR-65)
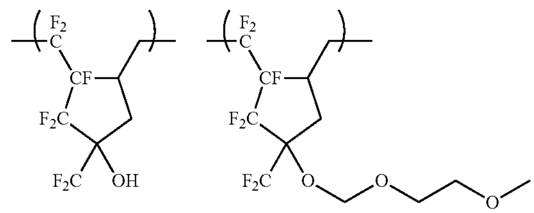
(HR-66)
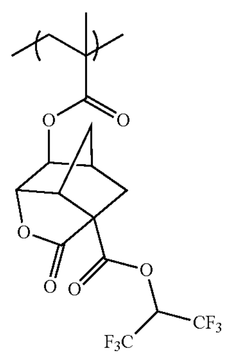
(HR-67)
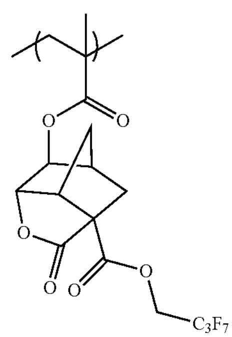
(HR-68)
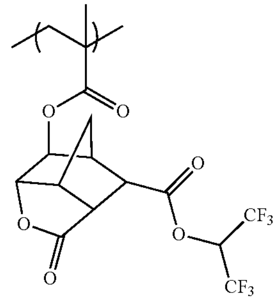

-continued
(HR-69)
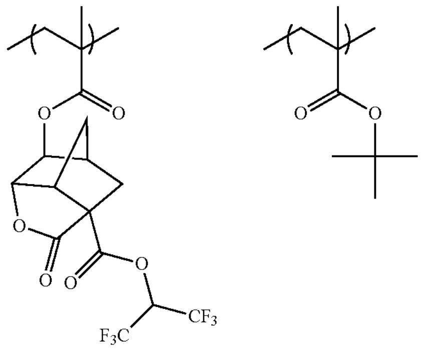
(HR-70)
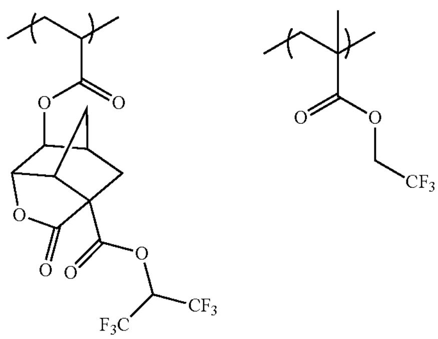
(HR-71)
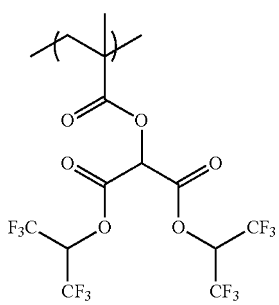
(HR-72)
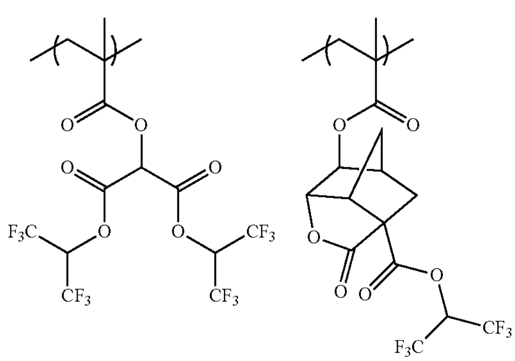
-continued
(HR-73)
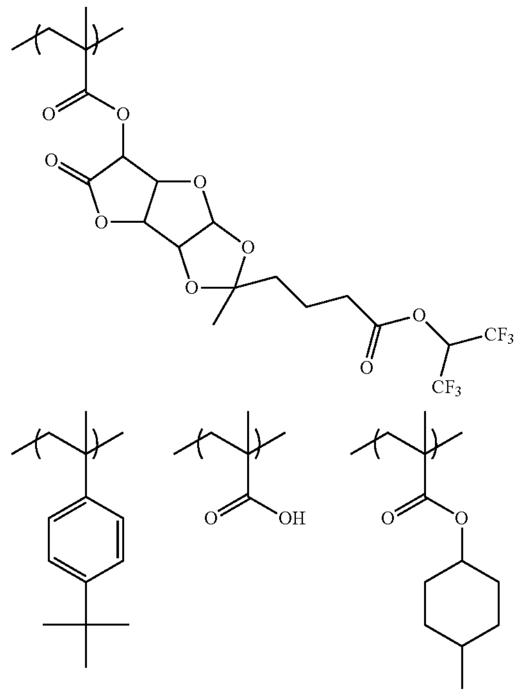
(HR-74)
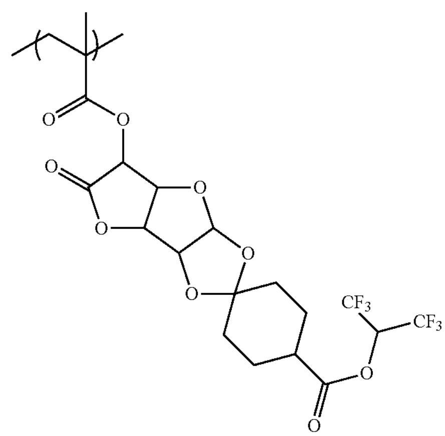
(HR-75)
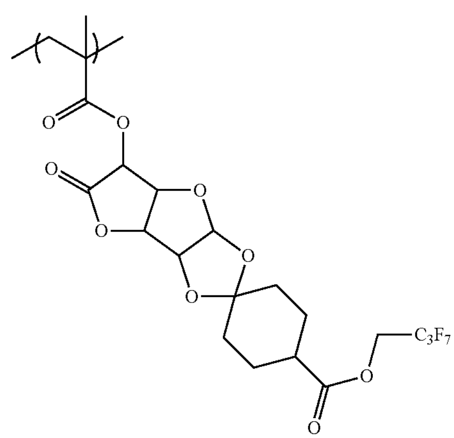

-continued
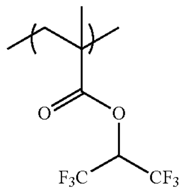
(HR-76)
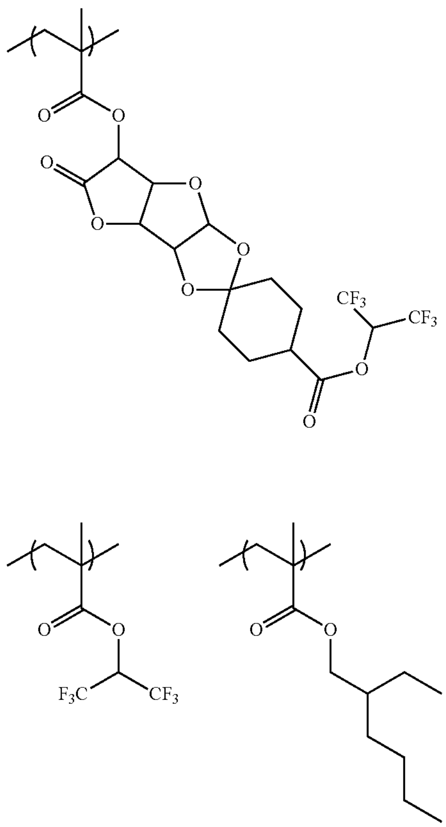
(HR-77)
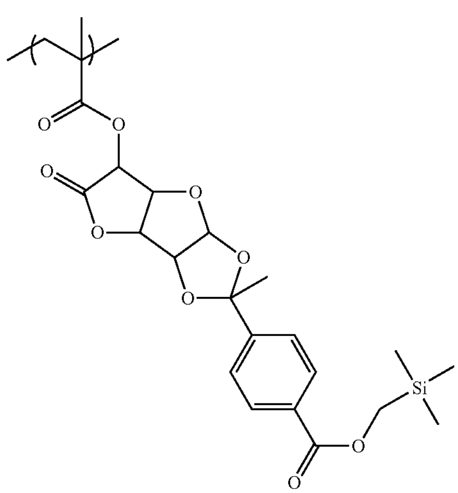
-continued
(HR-78)
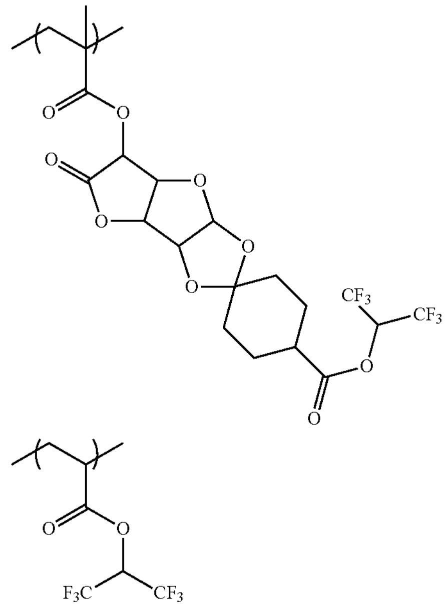
(HR-79)
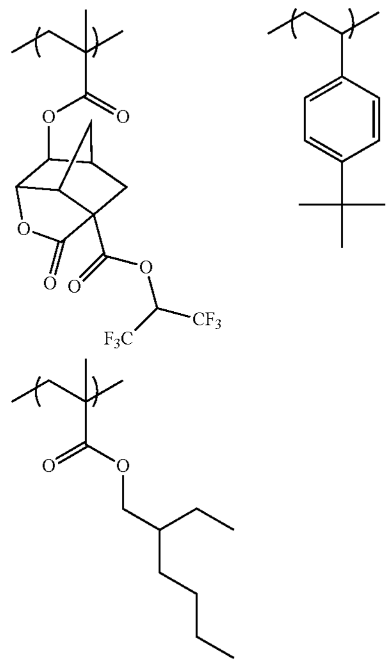
(HR-80)
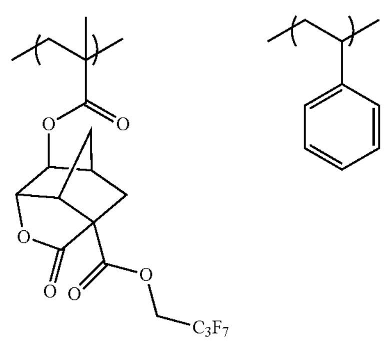

-continued
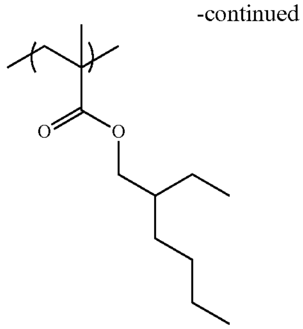
(HR-81)
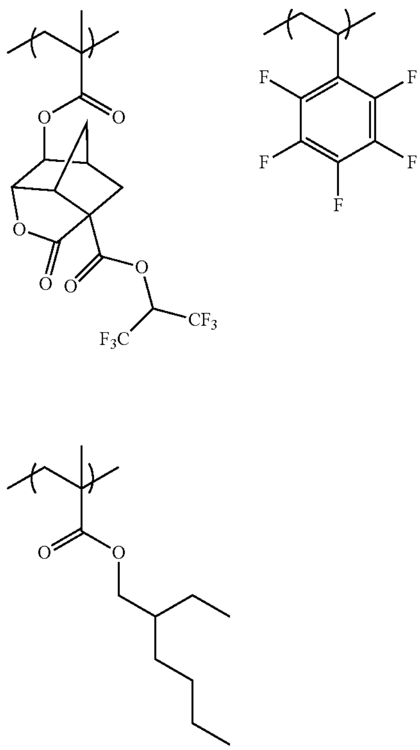
(HR-82)
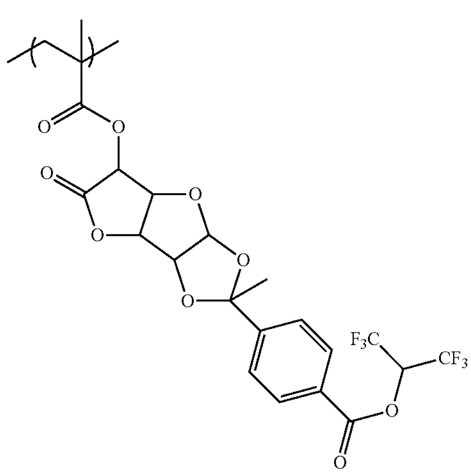
-continued
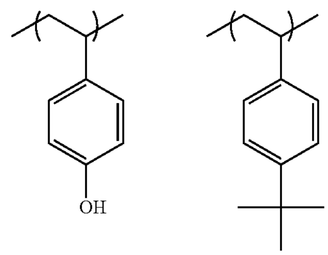
(HR-83)
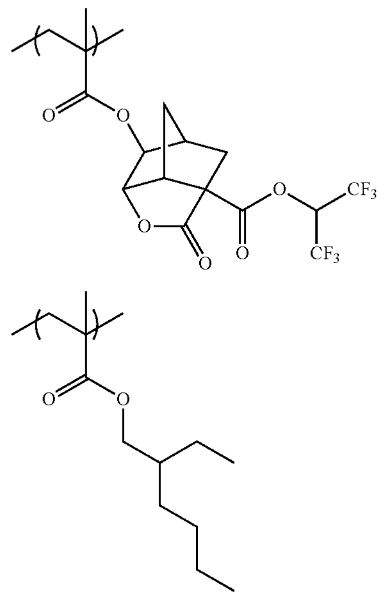
(HR-84)
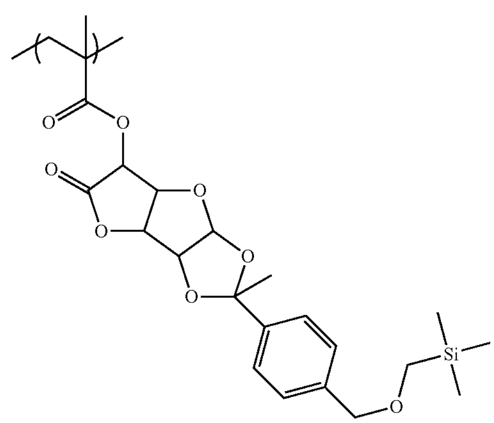
(HR-85)
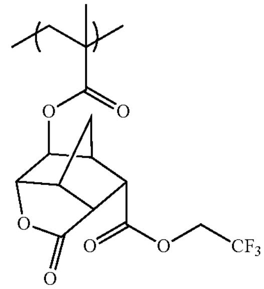

-continued
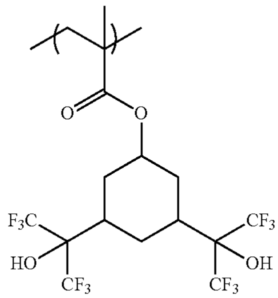
(HR-86)
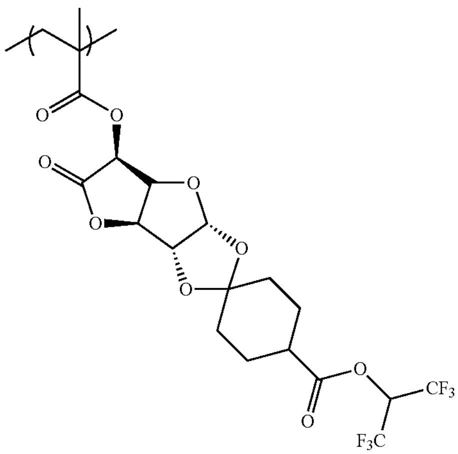
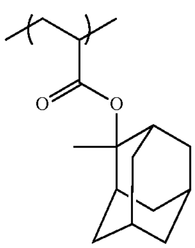
(HR-87)
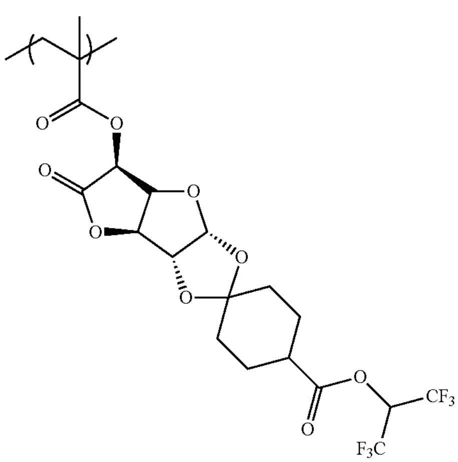
-continued
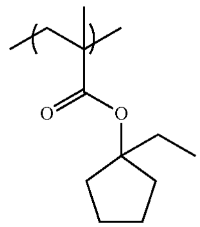
(HR-88)
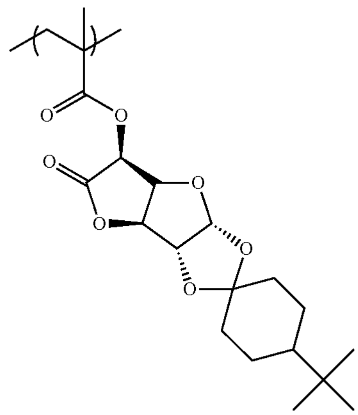
(HR-89)
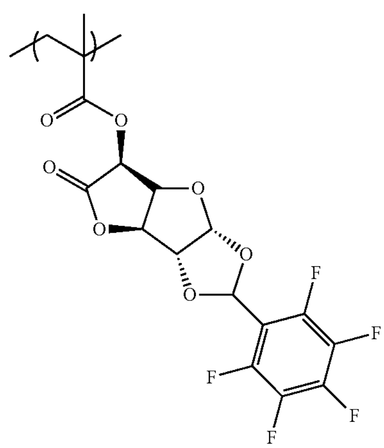
(HR-90)
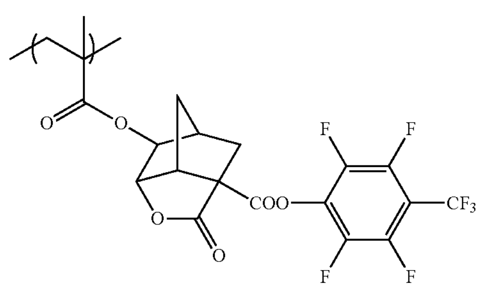

-continued

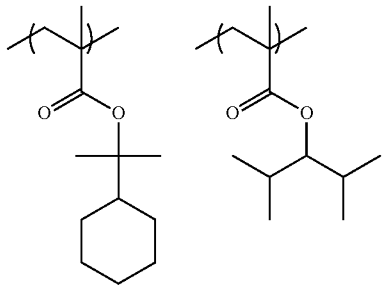

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/20 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |

TABLE 1-continued

| Resin | Composition | Mw | Mw/Mn |
|---|---|---|---|
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[5] (E) Basic Compound

The actinic-ray-sensitive or radiation-sensitive resin composition of the present invention preferably contains the (E) basic compound so as to reduce the change in performance caused over time from exposure to heating.

Preferable examples of the basic compound include compounds having structures represented by the following Formulae (A) to (E).

(A)

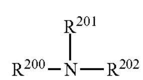

(B)

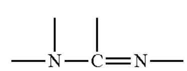

(C)

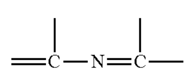

(D)

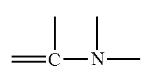

(E)

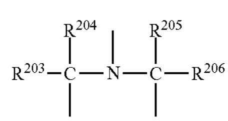

In General Formulae (A) and (E), $R^{200}$, $R^{201}$, and $R^{202}$ may be the same as or different from each other, and represent a hydrogen atom, an alkyl group (preferably having 1 to 20 carbon atoms), a cycloalkyl group (preferably having 3 to 20 carbon atoms), or an aryl group (having 6 to 20 carbon atoms). Herein, $R^{201}$ and $R^{202}$ may form a ring by binding to each other. $R^{203}$, $R^{204}$, $R^{205}$, and $R^{206}$ may be the same as or different from each other, and represent an alkyl group having 1 to 20 carbon atoms.

Regarding the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms are preferable.

These alkyl groups in General Formulae (A) and (E) are preferably unsubstituted.

Examples of preferable compounds include guanidine, aminopyrrolidine, pyrazole, pyrazoline, piperazine, aminomorpholine, aminoalkyl morpholine, piperidine, and the like. Examples of more preferable compounds include compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, aniline derivatives having a hydroxyl group and/or an ether bond, and the like.

Examples of the compound having an imidazole structure include imidazole, 2,4,5-triphenylimidazole, benzimidazole, and the like. Examples of the compound having a diazabicyclo structure include 1,4-diazabicyclo[2,2,2]octane, 1,5-diazabicyclo[4,3,0]nona-5-ene, 1,8-diazabicyclo[5,4,0]undeca-7-ene, and the like. Examples of the compound having an onium hydroxide structure include triaryl sulfonium hydroxide, phenacyl sulfonium hydroxide, sulfonium hydroxide having a 2-oxoalkyl group, and specifically, triphenyl sulfonium hydroxide, tris(t-butylphenyl) sulfonium hydroxide, bis(t-butylphenyl)iodonium hydroxide, phenacyl thiophenium hydroxide, 2-oxopropyl thiophenium hydroxide, and the like are exemplified. The compound having an onium carboxylate structure is a compound having an onium hydroxide structure, wherein the anion portion thereof has been carboxylated. Examples of such a compound include acetate, adamantane-1-carboxylate, perfluoroalkyl carboxylate, and the like. Examples of the compound having a trialkylamine structure include tri(n-butyl)amine, tri(n-octyl)amine, and the like. Examples of the compound having an aniline structure include 2,6-diisopropylaniline, N,N-dimethylaniline, N,N-dibutylaniline, N,N-dihexylaniline, and the like. Examples of the alkylamine derivative having a hydroxyl group and/or an ether bond include ethanolamine, diethanolamine, triethanolamine, tris(methoxyethoxyethyl)amine, and the like. Examples of the aniline derivative having a hydroxyl group and/or an ether bond include N,N-bis(hydroxyethyl)aniline and the like.

Preferable examples of the basic compound further include an amine compound having a phenoxy group, an ammonium salt compound having a phenoxy group, an amine compound having a sulfonic acid ester group, and an ammonium salt compound having a sulfonic acid ester group.

It is preferable that at least one alkyl group bind to a nitrogen atom in the amine compound having a phenoxy group, the ammonium salt compound having a phenoxy group, the amine compound having a sulfonic acid ester group, and the ammonium salt compound having a sulfonic acid ester group. It is also preferable that these compounds have an oxygen atom in the alkyl chain described above, and that an oxyalkylene group be formed in the compounds. The number of the oxyalkylene group in a molecule is 1 or more, preferably 3 to 9, and more preferably 4 to 6. Among the oxyalkylene groups, a structure of $—CH_2CH_2O—$, $—CH(CH_3)CH_2O—$, or $—CH_2CH_2CH_2O—$ is preferable.

Specific examples of the amine compound having a phenoxy group, the ammonium salt compound having a phenoxy group, the amine compound having a sulfonic acid ester group, and the ammonium salt compound having a sulfonic acid ester group include compounds (C1-1) to (C3-3) exemplified in [0066] of the specification of US2007/0224539A, but the present invention is not limited thereto.

As a kind of the basic compound, a nitrogen-containing organic compound having a group eliminated by the action of an acid can be used. Examples of such a compound include a compound represented by the following General Formula (e1). In addition, in the compound represented by the following General Formula (e1), the group eliminated by the action of an acid is eliminated, whereby the basicity is effectively exhibited in a system.

(e1)

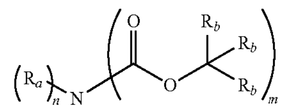

In General Formula (e1), $R_a$ independently represents a hydrogen atom, an alkyl group, a cycloalkyl group, an aryl group, or an aralkyl group. When n=2, two $R_a$s may be the same as or different from each other, and the two $R_a$s may form a divalent heterocyclic hydrocarbon group (preferably having 20 or less carbon atoms) or a derivative thereof by binding to each other.

$R_b$ independently represents a hydrogen atom, an alkyl group, a cycloalkyl group, an aryl group, or an aralkyl group. Here, in $—C(R_b)(R_b)(R_b)$, when one or more $R_b$s are hydrogen atoms, at least one of the remaining $R_b$s is a cyclopropyl group or a 1-alkoxyalkyl group.

At least two $R_b$s may form an alicyclic hydrocarbon group, an aromatic hydrocarbon group, a heterocyclic hydrocarbon group, or a derivative thereof by binding to each other.

n represents an integer of 0 to 2, m represents an integer of 1 to 3, and n+m=3.

In General Formula (e1), the alkyl group, cycloalkyl group, aryl group, and aralkyl group represented by $R_a$ and $R_b$ may be substituted with a functional group such as a hydroxyl group, a cyano group, an amino group, a pyrrolidino group, a piperidino group, a morpholino group, an oxo group or with an alkoxy group or a halogen atom.

Examples of the alkyl group, cycloalkyl group, aryl group, or aralkyl group (these alkyl group, cycloalkyl group, aryl group, and aralkyl group may be substituted with the functional group, alkoxy group, or halogen atom described above) of the $R_a$ and/or $R_b$ include

- a group derived from a linear or branched alkane such as methane, ethane, propane, butane, pentane, hexane, heptane, octane, nonane, decane, undecane, or dodecane; a group obtained by substituting these alkane-derived groups with one or more kinds or one or more cycloalkyl groups such as a cyclobutyl group, a cyclopentyl group, or a cyclohexyl group;
- a group derived from cycloalkane such as cyclobutane, cyclopentane, cyclohexane, cycloheptane, cyclooctane, norbornane, adamantane, or noradamantane; a group obtained by substituting these cycloalkane-derived groups with one or more kinds or one or more linear or branched alkyl groups such as a methyl group, an ethyl group, an n-propyl group, an i-propyl group, an n-butyl group, a 2-methylpropyl group, a 1-methylpropyl group, or a t-butyl group;

a group derived from aromatic compounds such as benzene, naphthalene and anthracene; a group obtained by substituting these aromatic group-derived groups with one or more kinds or one or more linear or branched alkyl groups such as a methyl group, an ethyl group, an n-propyl group, an i-propyl group, an n-butyl group, a 2-methylpropyl group, a 1-methylpropyl group, or a t-butyl group;

a group derived from heterocyclic compounds such as pyrrolidine, piperidine, morpholine, tetrahydrofuran, tetrahydropyran, indole, indoline, quinoline, perhydroquinoline, indazole, and benzimidazole; a group obtained by substituting these heterocyclic compound-derived groups with one or more kinds or one or more of groups derived from a linear or branched alkyl group or a group derived from aromatic compounds; a group obtained by substituting a group derived from a linear or branched alkane and a group derived form cycloalkane with one or more kinds or one or more groups derived from aromatic compounds such as a phenyl group, a naphthyl group, and an anthracenyl group; or a group obtained by substituting the above-described substituents with a functional group such as a hydroxyl group, a cyano group, an amino group, a pyrrolidine group, a piperidine group, a morpholino group, or an oxo group.

Examples of the divalent heterocyclic hydrocarbon group (preferably having 1 to 20 carbon atoms) or the derivative thereof that the $R_a$s form by binding to each other include a group obtained by substituting a group derived from heterocyclic compounds such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane and a group derived from these heterocyclic compounds with one or more kinds or one or more groups derived from a linear or branched alkane, a group derived from a cycloalkane, a group derived from aromatic compounds, a group derived from heterocyclic compounds, or a functional group such as a hydroxyl group, a cyano group, an amino group, a pyrrolidino group, a piperidino group, a morpholino group, or an oxo group.

Specific examples of the particularly preferable examples of the present invention include N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylmorpholine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t- butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and the like.

As the compound represented by the General Formula (e1), commercially available ones may be used. Alternatively, the compound may be synthesized from commercially available amine through a method disclosed in Protective Groups in Organic Synthesis, the $4^{th}$ edition, or the like. The compound can be synthesized based on the most common method, for example, the method disclosed in JP-2009-199021A.

The molecular weight of the basic compound is preferably 250 to 2000, and even more preferably 400 to 1000. From the viewpoint of further reducing LER, the molecular weight of the basic compound is preferably 400 or more, more preferably 500 or more, and even more preferably 600 or more.

These basic compounds may be used alone or in combination of two or more kinds thereof.

The amount of the basic compound used is generally 0.001% by mass to 10% by mass, and preferably 0.01% by mass to 5% by mass, based on the solid content of the actinic-ray-sensitive or radiation-sensitive resin composition.

The ratio between the acid-generating agent and the basic compound used in the composition is preferably an acid-generating agent/a basic compound (molar ratio)=2.5 to 300. That is, in respect of the sensitivity and resolution of the resist film, the molar ratio is preferably 2.5 or higher, and in respect of inhibiting the reduction in resolution resulting from thickening of a resist pattern caused with time elapsing to heating treatment after exposure, the molar ratio is preferably 300 or lower. The acid-generating agent/basic compound (molar ratio) is more preferably 5.0 to 200, and more preferably 7.0 to 150.

[6] (F) Surfactant

The actinic-ray-sensitive or radiation-sensitive resin composition of the present invention may or may not further contain a surfactant. When the actinic-ray-sensitive or radiation-sensitive resin composition further contains the surfactant, the composition preferably contains any one of a fluorine-based surfactant and/or a silicon-based surfactant (a fluorine-based surfactant, a silicon-based surfactant, and a surfactant including both a fluorine atom and a silicon atom) or two or more kinds of these surfactants.

If the actinic-ray-sensitive or radiation-sensitive resin composition of the present invention contains the surfactant, a resist pattern having small adhesion and development defects can be provided with excellent sensitivity and resolution, when an exposure light source of 250 nm or less, particularly, an exposure light source of 220 nm or less is used.

Examples of the fluorine-based surfactant and/or silicon-based surfactant include surfactants disclosed in Paragraph [0276] of the specification of US2008/0248425A, which are, for example, EFtop, EF301 and EF303 (manufactured by Shin-Akita Kasei K.K.); Fluorad FC430, 431, and 4430 (manufactured by Sumitomo 3M Inc); Magafac F171, F173, F176, F189, F113, F110, F177, F120, and R08 (manufactured by DIC CORPORATION); Surflon S-382, SC101, 102, 103, 104, 105, and 106 (manufactured by ASAHI GLASS CO., LTD.); Troysol S-366 (manufactured by Troy Chemical); GF-300 and GF-150 (manufactured by TOAGOSEI, CO., LTD.); Surflon S-393 (manufactured by SEIMI CHEMICAL CO., LTD.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA solutions Inc.); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) can also be used as the silicon-based surfactant.

As the surfactant, surfactants that use a polymer having a fluoroaliphatic group derived from fluoroaliphatic compounds which are produced by a telomerization method (which is also called a telomer method) or an oligomerization method (which is also called an oligomer method) can also be used, in addition to the well-known surfactants described above. The fluoroaliphatic compound can be synthesized by the method disclosed in JP2002-90991A.

Examples of the surfactants corresponding to those described above include Megafac F178, F-470, F-473, F-475, F-476, and F-472 (manufactured by DIC CORPORATION), a copolymer of acrylate (or methacrylate) having a $C_6F_{13}$ group and (poly(oxyalkylene))acrylate (or methacrylate), a copolymer of acrylate (or methacrylate) having a $C_3F_7$ group, (poly(oxyethylene))acrylate (or methacrylate), and (poly(oxypropylene))acrylate (or methacrylate), and the like.

In the present invention, surfactants other than the fluorine-based surfactant and/or silicon-based surfactant, which are described in Paragraph [0280] of the specification of US2008/0248425A, can also be used.

These surfactants may be used alone or in combination of several surfactants.

When the actinic-ray-sensitive or radiation-sensitive resin composition contains the surfactant, the amount of the surfactant used is preferably 0.0001% by mass to 2% by mass, and more preferably 0.0005% by mass to 1% by mass, based on the total amount (excluding a solvent) of the actinic-ray-sensitive or radiation-sensitive resin composition.

Meanwhile, if the amount of the surfactant added is set to 10 ppm or less based on the total amount (excluding a solvent) of the actinic-ray-sensitive or radiation-sensitive resin composition, the surface-localization property of the hydrophobic resin is more improved. As a result, the resist film surface can be more hydrophobic, whereby the water-traceability of the resist film in the liquid immersion exposure can be improved.

[7] (G) Crosslinking Agent

The actinic-ray-sensitive or radiation-sensitive resin composition of the present invention may contain a crosslinking agent.

Herein, the crosslinking agent refers to a compound with a molecular weight of 2000 or less having one or more polymerizable groups. The polymerizable group of the crosslinking agent is not particularly limited, and examples thereof include an ethylenic unsaturated group, an epoxy group, an oxetane group, a group represented by the following General Formula (ZII), and the like.

(ZII)

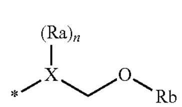

In the General Formula (ZII), each of X, Ra, Rb, and n independently has the same definition as that of X, Ra, Rb, and n in the group represented by General Formula (ZII) of the polymerizable group that the resin (A) can have, and specific and preferable examples thereof are also the same. * represents a direct link.

As the polymerizable group of the crosslinking agent, a (meth)acrylate group, an epoxy group, or a group represented by the General Formula (ZII) is particularly preferable.

Examples of the crosslinking agent particularly include (1) an ethylenic unsaturated compound, (2) an epoxy compound, (3) an oxetane compound, (4) N-methylol compound, and the like.

(1) Ethylenic Unsaturated Compound

The ethylenic unsaturated compound used in the present invention is an addition-polymerizable compound having at least one ethylenic unsaturated double bond. The ethylenic unsaturated compound is selected from compounds having at least one, and preferably two or more terminal ethylenic unsaturated bonds. Such a compound group is widely known in the related industrial field, and the compound can be used in the present invention without particular limitation. The compounds have chemical forms of, for example, a monomer or prepolymer, in other words, a dimer, a trimer, or an oligomer, or a mixture and a copolymer of these. Examples of the monomer and a copolymer thereof include unsaturated carboxylic acids (for example, acrylic acid, methacrylic acid, itaconic acid, crotonic acid, isocrotonic acid, maleic acid, or the like) and esters or amides thereof. Among these, esters of unsaturated carboxylic acid and an aliphatic polyhydric alcohol compound, and amides of unsaturated carboxylic acid and an aliphatic polyamine compound are preferably used. In addition, an addition reaction product obtained from a reaction between unsaturated carboxylic acid esters or amides having a non-nucleophilic substituent such as a hydroxyl group, an amino group, or a mercapto group and monofunctional or polyfunctional isocyanates or epoxies, and a dehydration condensation reaction product obtained from a reaction between the ethylenic unsaturated compound and monofunctional or polyfunctional carboxylic acids are also suitably used. Moreover, an addition reaction product obtained from a reaction between unsaturated carboxylic acid esters or amides having an electrophilic substituent such as an isocyanate group or an epoxy group and monofunctional or polyfunctional alcohols, amines, or thiols, and a substitution reaction product obtained from a reaction between unsaturated carboxylic acid esters or amides having an elimination substituent such as a halogen group or a tosyloxy group and monofunctional or polyfunctional alcohols, amines, or thiols are also suitable. As another example, instead of the above unsaturated carboxylic acid, a compound group substituted with unsaturated phosphonic acid, styrene, vinyl ether, or the like can also be used.

Specific examples of the monomer of ester of an aliphatic polyhydric alcohol compound with unsaturated carboxylic acid include, as acrylic acid ester, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO)-modified triacrylate, a polyester acrylate oligomer, and the like.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane, bis-[p-(methacryloxyethoxy)phenyl]dimethylmethane, and the like.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the like. Examples of the crotonic acid ester include ethylene glycol dicrotonate, tetramethylene glycol dicrotonate, pentaerythritol dicorotonate, sorbitol tetradicrotonate, and the like. Examples of the isocrotonic acid ester include ethylene glycol diisocrotonate, pentaerythritol diisocrotonate, sorbitol tetraisocrotonate, and the like. Examples of the maleic acid ester include ethylene glycol dimaleate, triethylene glycol dimaleate, pentaerythritol dimaleate, sorbitol tetramaleate, and the like.

As examples of other esters, aliphatic alcohol-based esters disclosed respectively in the JP1976-47334B (JP-S5'-47334B) and JP1982-196231A (JP-S57-196231A); esters having an aromatic skeleton disclosed respectively in JP1984-5240A (JP-S59-5240A), JP1984-5241A (JP-S59-5241A), and JP1990-226149A (JP-H2-226149A); esters containing an amino group disclosed in JP1989-165613A (JP-H1-165613A); and the like are also suitably used. In addition, the ester monomer described above can be used as a mixture.

Specific examples of the monomer of amide of an aliphatic polyamine compound with unsaturated carboxylic acid include methylenebis-acrylamide, methyelenebis-methacrylamide, 1,6-hexamethylenebis-acrylamide, 1,6-hexamethylenebis-methacrylamide, diethylenetriaminetrisacrylamide, xylylenebisacrylamide, xylylenebismethacrylamide, and the like. Examples of another preferable amide-based monomer include a monomer having a cyclohexylene structure disclosed in JP1979-21726B (JP-S54-21726B).

In addition, a urethane-based addition-polymerizable compound produced using an addition reaction between isocyanate and a hydroxyl group is also preferable. Specific examples of such a compound include a vinyl urethane compound containing two or more polymerizable vinyl groups in one molecule, which is obtained by adding a hydroxyl group-containing vinyl monomer that is represented by the following General Formula (A) to a polyisocyanate compound (disclosed in JP1973-41708B (JP-S48-41708B)) that has two or more isocyanate groups in one molecule.

$$CH_2{=}C(R_4)COOCH_2CH(R_5)OH \qquad (A)$$

(Here, $R_4$ and $R_5$ represent H or $CH_3$)

In addition, urethane acrylates disclosed in JP1976-37193A (JP-S51-37193A), JP1990-32293B (JP-H2-32293B), and JP1990-16765B (JP-H2-16765B), and urethane compounds having an ethylene oxide-based skeleton disclosed JP1983-49860B (JP-S58-49860B), JP1981-17654B (JP-S56-17654B), JP1987-39417B (JP-S62-39417B), and JP1987-39418B (JP-S62-39418B) are also suitable. Furthermore, by using addition-polymerizable compounds having an amino structure or a sulfide structure in a molecule, which are disclosed in JP1988-277653A (JP-S63-277653A), JP1988-260909A (JP-S63-260909A), and JP1989-105238A (JP-H1-105238), a photopolymerizable composition that is very excellent in photosensitization speed can be obtained.

As other examples, polyfunctional acrylates or methacrylates such as polyester acrylates disclosed respectively in JP1973-64183A (JP-S48-64183A), JP1974-43191B (JP-S49-43191B), JP1977-30490B (JP-S52-30490B) and epoxy acrylates obtained by reacting an epoxy resin with (meth) acrylic acid, and the like can be exemplified. In addition, specific unsaturated compounds disclosed respectively in JP1971-43946B (JP-S46-43946B), JP1989-40337B (JP-H1-40337B), and JP1989-40336B (JP-H1-40336B), a vinyl phosphoric acid-based compound disclosed in JP1990-25493A (JP-H2-25493A), and the like can also be exemplified. Furthermore, in some cases, a structure containing a perfluoroalkyl group disclosed in JP1986-22048A (JP-S61-22048A) is suitably used. Additionally, those introduced as photocurable monomers and oligomers in Journal of The Adhesion Society of Japan, vol. 20, No. 77, pp 300308 (1984) can also be used.

(2) Epoxy Compound

Examples of the epoxy compound include aromatic epoxide, alicyclic epoxide, aliphatic epoxide, and the like.

Examples of the aromatic epoxide include di- or polyglycidyl ether which is produced from a reaction between polyphenol having at least one aromatic nucleus or an alkylene oxide adduct of the polyphenol and epichlorohydrin. The examples include di- or polyglycidyl ether of bisphenol A or an alkylene oxide adduct thereof, di- or polyglycidyl ether of hydrogenated bisphenol A or an alkylene oxide adduct thereof, a novolac type epoxy resin, and the like. Herein, examples of the alkylene oxide include ethylene oxide, propylene oxide, and the like.

Preferable examples of the alicyclic epoxide include a cyclohexene oxide- or cyclopentene oxide-containing compound which is obtained by epoxidating a compound having at least one cycloalkane ring such as cyclohexene ring or cyclopentene ring by using an appropriate oxidizing agent such as hydrogen peroxide or peracid.

Examples of the aliphatic epoxide include di- or polyglycidyl ether of aliphatic polyhydric alcohol or an alkylene oxide adduct thereof, and typical examples thereof include diglycidyl ether of alkylene glycol such as diglycidyl ether of ethylene glycol, diglycidyl ether of propylene glycol, or diglycidyl ether of 1,6-hexanediol; polyglycidyl ether of polyhydric alcohol such as di- or polyglycidyl ether of glycerin or an alkylene oxide adduct thereof; diglycidyl ether of polyethylene glycol or an alkylene oxide adduct thereof; diglycidyl ether of polyalkylene glycol represented by diglycidyl ether of polypropylene glycol or an alkylene oxide thereof; and the like. Herein, examples of the alkylene oxide include ethylene oxide, propylene oxide, and the like.

Examples of the monofunctional and polyfunctional epoxy compounds that can be used in the present invention will be shown in detail.

Examples of the monofunctional epoxy compound include phenyl glycidyl ether, p-tert-butyl phenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide, cyclohexene oxide, 3-methacryloyloxy methyl cyclohexene oxide, 3-acryloyloxy methyl cyclohexene oxide, 3-vinylcyclohexene oxide, and the like.

Examples of the polyfunctional epoxy compound include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4- epoxycyclohexylmethyl)adipate, vinyl cyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), dicyclopentadiene diepoxide, di(3,4-epoxycyclohexylmethyl)ether of ethylene glycol, ethylenebis(3,4-epoxycyclohexane carboxylate), dioctyl epoxyhexahydrophthlate, di-2-ethylhexyl epoxyhexahydrophthalate, 1,4-butanediol diglycidyl ether, 1,6-hexanediole diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, 1,2,5,6-diepoxycyclooctane, and the like.

(3) Oxetane Compound

The oxetane compound usable in the present invention refers to a compound having at least one oxetane ring, and as the oxetane compound to be used, known oxetane compounds as disclosed in each of JP2001-220526A, JP2001-310937A, and JP2003-341217A can be arbitrarily selected.

Examples of the compound having 1 to 2 oxetane rings in a molecule include compounds represented by the following Formulae (1) to (3).

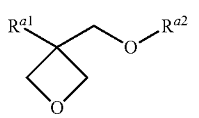

(1)

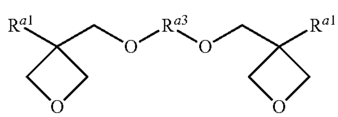

(2)

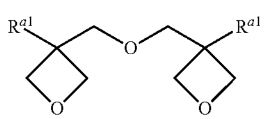

(3)

$R^{a1}$ represents a hydrogen atom, an alkyl group having 1 to 6 carbon atoms, a fluoroalkyl group having 1 to 6 carbon atoms, an allyl group, an aryl group, a furyl group, or a thienyl group. When there are two $R^{a1}$s in a molecule, the $R^{a1}$s may be the same as or different from each other.

Examples of the alkyl group represented by $R^{ai}$ include a methyl group, an ethyl group, a propyl group, a butyl group, and the like, and examples of the fluoroalkyl group represented by $R^{a1}$ preferably include those obtained in a manner in which some hydrogen in the above alkyl groups are substituted with fluorine atoms.

The aryl group represented by $R^{a1}$ is preferably an aryl group having 6 to 10 carbon atoms, such as a phenyl group or a naphthyl group.

$R^{a2}$ represents a hydrogen atom, an alkyl group having 1 to 6 carbon atoms, an alkenyl group having 2 to 6 carbon atoms, a group having an aromatic ring, an alkyl carbonyl group having 2 to 6 carbon atoms, alkoxy carbonyl group having 2 to 6 carbon atoms, and an N-alkyl carbamoyl group having 2 to 6 carbon atoms. Examples of the alkyl group include a methyl group, an ethyl group, a propyl group, a butyl group, and the like. Examples of the alkenyl group include a 1-propenyl group, a 2-propenyl group, a 2-methyl-1-propenyl group, a 2-methyl-2-propenyl group, a 1-butenyl group, a 2-butenyl group, a 3-butenyl group, and the like. Examples of the group having an aromatic ring include a phenyl group, a benzyl group, a fluorobenzyl group, a methoxybenzyl group, a phenoxyethyl group, and the like. Examples of the alkyl carbonyl group include an ethyl carbonyl group, a propyl carbonyl group, a butyl carbonyl group, and the like. Examples of the alkoxy carbonyl group include an ethoxy carbonyl group, a propoxy carbonyl group, a butoxy carbonyl group, and the like. Examples of the N-alkyl carbamoyl group include an ethyl carbamoyl group, a propyl carbamoyl group, a butyl carbamoyl group, a pentyl carbamoyl group, and the like. $R^{a2}$ may have a substituent, and examples of the substituent include an alkyl group having 1 to 6 carbon atoms and a fluorine atom.

$R^{a3}$ represents a linear or branched alkylene group, a linear or branched poly(alkyleneoxy) group, a linear or branched unsaturated hydrocarbon group, a carbonyl group or an alkylene group containing a carbonyl group, an alkylene group containing a carboxyl group, an alkylene group containing a carbamoyl group, or groups shown below. Examples of the alkylene group include an ethylene group, a propylene group, and a butylene group, and examples of the poly(alkyleneoxy) group include a poly(ethyleneoxy) group, a poly(propyleneoxy) group, and the like. Examples of the unsaturated hydrocarbon group include a propenylene group, a methyl propenylene group, a butenylene group, and the like.

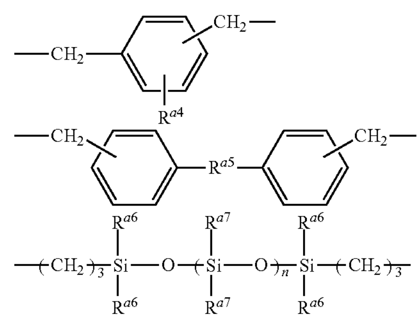

When $R^{a3}$ is a polyvalent group described above, $R^{a4}$ represents a hydrogen atom, an alkyl group having 1 to 4 carbon atoms, an alkoxy group having 1 to 4 carbon atoms, a halogen atom, a nitro group, a cyano group, a mercapto group, a lower alkyl carboxyl group, a carboxyl group, or a carbamoyl group.

$R^{a5}$ represents an oxygen atom, a sulfur atom, a methylene group, NH, SO, $SO_2$, $C(CF_3)_2$, or $C(CH_3)_2$.

$R^{a6}$ represents an alkyl group having 1 to 4 carbon atoms or an aryl group, and n is an integer of 0 to 2000. $R^{a7}$ represents an alkyl group having 1 to 4 carbon atoms, an aryl group, or a monovalent group having the following structure. In the following formula, $R^{a8}$ represents an alkyl group having 1 to 4 carbon atoms or an aryl group, and in is an integer of 0 to 100.

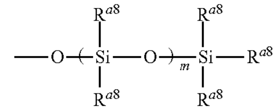

Examples of the compound represented by Formula (1) include 3-ethyl-3-hydroxymethyloxetane (OXT-101: manufactured by TOAGOSEI, CO., LTD.), 3-ethyl-3-(2-ethylhexyloxymethyl)oxetane (OXT-212: manufactured by TOAGOSEI, CO., LTD.), and 3-ethyl-3-phenoxymethyloxetane (OXT-211: manufactured by TOAGOSEI, CO., LTD.). Examples of the compound represented by Formula (2) include 1,4-bi s[(3-ethyl-3-oxetanylmethoxy)methyl]benzene (OXT-121: manufactured by TOAGOSEI, CO., LTD.). Examples of the compound represented by Formula (3) include bis(3-ethyl-3-oxetanylmethyl)ether (OXT-221: manufactured by TOAGOSEI, CO., LTD.).

Examples of the compound having 3 to 4 oxetane rings include the compound represented by the following Formula (4).

(4)

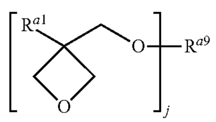

In Formula (4), $R^{a1}$ has the same definition as $R^{a1}$ in the Formula (1). Examples of $R^{a9}$ as a polyvalent linking group include a branched alkylene group having 1 to 12 carbon atoms such as groups represented by the following A to C, a branched poly(alkyleneoxy) group such as a group represented by the following D, a branched polysiloxy group such as a group represented by the following E, and the like. j is 3 or 4.

A

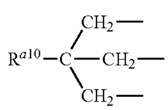

B

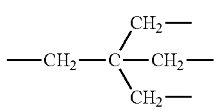

C

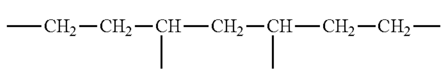

D

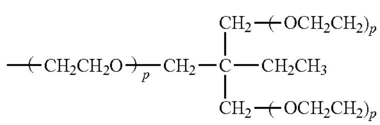

E

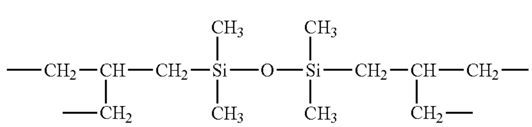

In the above A, $R^{a10}$ represents a methyl group, an ethyl group, or a propyl group, and in the above D, p is an integer of 1 to 10.

(4) N-Methylol Compound (N-Methylol Type Crosslinking Agent)

The N-methylol type crosslinking agent can be appropriately selected from compounds disclosed in JP2004-117876A and JP2002-262880A, and is preferably a compound having two or more partial structures represented by the following General Formula (CLNM-1)

The crosslinking agent is more preferably a compound having 2 to 8 partial structures represented by General Formula (CLNM-1).

(CLNM-1)

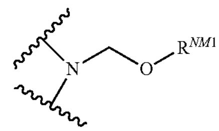

In Formula (CLNM-1), $R^{NM1}$ represents a hydrogen atom, an alkyl group, a cycloalkyl group, or an oxoalkyl group.

The alkyl group of $R^{NM1}$ in General Formula (CLNM-1) is preferably an alkyl group having 1 to 6 carbon atoms, and examples thereof include a methyl group, an ethyl group, a propyl group, an isopropyl group, a butyl group, an isobutyl group, a t-butyl group, a pentyl group, a hexyl group, and the like.

The cycloalkyl group of $R^{NM1}$ is preferably a cycloalkyl group having 5 to 6 carbon atoms, and examples thereof include a cyclopentyl group, a cyclohexyl group, and the like.

The oxoalkyl group of $R^{NM1}$ is preferably an oxoalkyl group having 3 to 6 carbon atoms, and examples thereof include a β-oxopropyl group, a β-oxobutyl group, a β-oxopentyl group, a β-oxohexyl group, and the like.

As more preferable embodiments of the compound having two or more partial structures represented by General Formula (CLNM-1), a urea-based crosslinking agent represented by the following General Formula (CLNM-2), an alkylene urea-based crosslinking agent represented by the following General Formula (CLNM-3), a glycol uryl-based crosslinking agent represented by the following General Formula (CLNM-4), and a melamine-based crosslinking agent represented by the following General Formula (CLNM-5) are exemplified.

(CLNM-2)

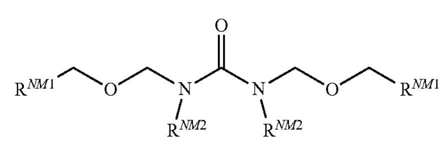

In General Formula (CLNM-2), each $R^{NM1}$ independently is the same as $R^{NM1}$ in General Formula (CLNM-1).

Each $R^{NM2}$ independently represents a hydrogen atom, an alkyl group, or a cycloalkyl group.

More specific examples of the alkyl group (preferably having 1 to 6 carbon atoms) and cycloalkyl group (preferably having 5 to 6 carbon atoms) of $R^{NM2}$ include a methyl group, an ethyl group, a propyl group, an isopropyl group, a butyl group, an isobutyl group, a t-butyl group, a pentyl group, a cyclopentyl group, a hexyl group, a cyclohexyl group, and the like.

Specific examples of the urea-based crosslinking agent represented by General Formula (CLNM-2) include N,N-di(methoxymethyl)urea, N,N-di(ethoxymethyl)urea, N,N-di(propoxymethyl)urea, N,N-di(isopropoxymethyl)urea, N,N-di(butoxymethyl)urea, N,N-di(t-butoxymethyl)urea, N,N-di(cyclohexyloxymethyl)urea, N,N-di(cyclopentyloxymethyl)urea, N,N-di(adamantyloxymethyl)urea, N,N-di(norbornyloxymethyl)urea, and the like.

(CLNM-3)

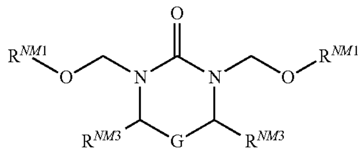

In General Formula (CLNM-3), each $R^{NM1}$ independently is the same as $R^{NM1}$ in General Formula (CLNM-1).

Each $R^{NM3}$ independently represents a hydrogen atom, a hydroxyl group, an alkyl group, a cycloalkyl group, an oxoalkyl group, an alkoxy group, or an oxoalkoxy group.

G represents a single bond, an oxygen atom, a sulfur atom, an alkylene group, or a carbonyl group.

More specific examples of the alkyl group (preferably having 1 to 6 carbon atoms), cycloalkyl group (preferably having 5 to 6 carbon atoms), oxoalkyl group (preferably having 3 to 6 carbon atoms), alkoxy group (preferably having 1 to 6 carbon atoms), and oxoalkoxy group (preferably having 1 to 6 carbon atoms) of $R^{NM3}$ include a methyl group, an ethyl group, a propyl group, an isopropyl group, a butyl group, an isobutyl group, a t-butyl group, a pentyl group, a cyclopentyl group, a hexyl group, a cyclohexyl group, a β-oxopropyl group, a 3-oxobutyl group, a β-oxopentyl group, a β-oxohexyl group, a methoxy group, an ethoxy group, a propyloxy group, an isopropyloxy group, a butoxy group, an isobutoxy group, a t-butoxy group, a pentoxy group, a hexyloxy group, a β-oxopropoxy group, a β-oxobutoxy group, a β-oxopentoxy group, a β-oxohexyloxy group, and the like.

More specific examples of the alkylene group (preferably having 1 to 3 carbon atoms) of G include a methylene group, an ethylene group, a propylene group, a 1-methylethylene group, a hydroxymethylene group, a cyanomethylene group, and the like.

Specific examples of the alkylene urea-based crosslinking agent represented by General Formula (CLNM-3) include N,N-di(methoxymethyl)-4,5-di(methoxymethyl)ethylene urea, N,N-di(ethoxymethyl)-4,5-di(ethoxymethyl)ethylene urea, N,N-di(propoxymethyl)-4,5-di(propoxymethyl)ethylene urea, N,N-di(isopropoxymethyl)-4,5-di(isopropoxymethyl)ethylene urea, N,N-di(butoxymethyl)-4,5-di(butoxymethyl)ethyl ene urea, N,N-di(t-butoxymethyl)-4,5-di(t-butoxymethyl)ethyl ene urea, N,N-di(cyclohexyl oxymethyl)-4,5-di(cyclohexyloxymethyl)ethyl ene urea, N,N-di(cyclopentyloxymethyl)-4,5-di(cyclopentyloxymethyl)ethylene urea, N,N-di(adamantyloxymethyl)-4,5-di (adamantyloxymethyl)ethylene urea, N,N-di(norbornyloxymethyl)-4,5-di(norbornyloxymethyl)ethylene urea, and the like.

(CLNM-4)

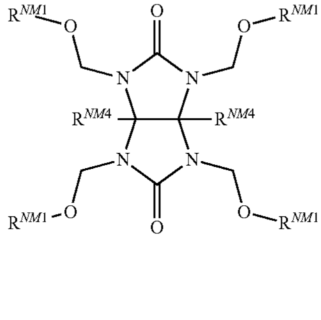

In General Formula (CLNM-4), each $R^{NM1}$ independently is the same as $R^{NM1}$ in General Formula (CLNM-1).

Each $R^{NM4}$ independently represents a hydrogen atom, a hydroxyl group, an alkyl group, a cycloalkyl group, or an alkoxy group.

More specific examples of the alkyl group (preferably having 1 to 6 carbon atoms), cycloalkyl group (preferably having 5 to 6 carbon atoms), and alkoxy group (preferably having 1 to 6 carbon atoms) of $R^{NM4}$ include a methyl group, an ethyl group, a butyl group, a cyclopentyl group, a cyclohexyl group, a methoxy group, an ethoxy group, a butoxy group, and the like.

Specific examples of the glycol uryl-based crosslinking agent represented by General Formula (CLNM-4) include N,N,N,N-tetra(methoxymethyl)glycol uryl, N,N,N,N-tetra (ethoxymethyl)glycol uryl, N,N,N,N-tetra(propoxymethyl) glycol uryl, N,N,N,N-tetra(isopropoxymethyl)glycol uryl, N,N,N,N-tetra(butoxymethyl)glycol uryl, N,N,N,N-tetra(t-butoxymethyl)glycol uryl, N,N,N,N-tetra(cyclohexyloxymethyl)glycol uryl, N,N,N,N-tetra(cyclopentyloxymethyl)glycol uryl, N,N,N,N-tetra(adamantyloxymethyl)glycol uryl, N,N,N,N-tetra(norbornyloxymethyl)glycol uryl, and the like.

(CLNM-5)

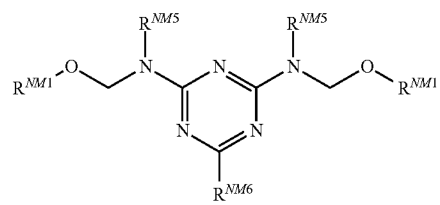

In General Formula (CLNM-5), each $R^{NM1}$ independently is the same as $R^{NM1}$ in General Formula (CLNM-1).

Each $R^{NM5}$ independently represents a hydrogen atom, an alkyl group, a cycloalkyl group, an aryl group, or an atomic group represented by the following General Formula (CLNM-5').

$R^{NM6}$ represents a hydrogen atom, an alkyl group, a cycloalkyl group, an aryl group, or an atomic group represented by the following General Formula (CLNM-5").

(CLNM-5′)

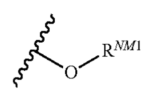

(CLNM-5″)

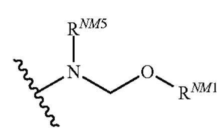

In General Formula (CLNM-5'), $R^{NM1}$ is the same as $R^{NM1}$ in General Formula (CLNM-1).

In General Formula (CLNM-5"), $R^{NM1}$ is the same as $R^{NM1}$ in General Formula (CLNM-1), and $R^{NM5}$ is the same as $R^{NM5}$ in General Formula (CLNM-5).

More specific examples of the alkyl group (preferably having 1 to 6 carbon atoms), cycloalkyl group (preferably having 5 to 6 carbon atoms), and aryl group (preferably having 6 to 10 carbon atoms) of $R^{NM5}$ and $R^{NM6}$ include a methyl group, an ethyl group, a propyl group, an isopropyl group, a butyl group, an isobutyl group, a t-butyl group, a pentyl group, a cyclopentyl group, a hexyl group, a cyclohexyl group, a phenyl group, a naphthyl group, and the like.

Examples of the melamine-based crosslinking agent represented by General Formula (CLNM-5) include N,N,N,N,N,N-hexa(methoxymethyl)melamine, N,N,N,N,N,N-hexa(ethoxymethyl)melamine, N,N,N,N,N,N-hexa(propoxymethyl)melamine, N,N,N,N,N,N-hexa(isopropoxymethyl)melamine, N,N,N,N,N,N-hexa(butoxymethyl)melamine, N,N,N,N,N,N-hexa(t-butoxymethyl)melamine, N,N,N,N,N,N-hexa(cyclohexyloxymethyl)melamine, N,N,N,N,N,N-hexa(cyclopentyloxymethyl)melamine, N,N,N,N,N,N-hexa(adamantyloxymethyl)melamine, N,N,N,N,N,N-hexa(norbornyloxymethyl)melamine, N,N,N,N,N,N-hexa(methoxymethyl)acetoguanamine, N,N,N,N,N,N-hexa(ethoxymethyl)acetoguanamine, N,N,N,N,N,N-hexa(propoxymethyl)acetoguanamine, N,N,N,N,N,N-hexa(isopropoxymethyl)acetoguanamine, N,N,N,N,N,N-hexa(butoxymethyl)acetoguanamine, N,N,N,N,N,N-hexa(t-butoxymethyl)acetoguanamine, N,N,N,N,N,N-hexa(methoxymethyl)benzoguanamine, N,N,N,N,N,N-hexa(ethoxymethyl)benzoguanamine, N,N,N,N,N,N-hexa(propoxymethyl)benzoguanamine, N,N,N,N,N,N-hexa(isopropoxymethyl)benzoguanamine, N,N,N,N,N,N-hexa(butoxymethyl)benzoguanamine, N,N,N,N,N,N-hexa(t-butoxymethyl)benzoguanamine, and the like.

The groups represented by $R^{NM1}$ to $R^{NM6}$ in General Formulae (CLNM-1) to (CLNM-5) may further have a substituent. Examples of the substituent that $R^{NM1}$ to $R^{NM6}$ may have include a halogen atom, a hydroxyl group, a nitro group, a cyano group, a carboxyl group, a cycloalkyl group (preferably having 3 to 20 carbon atoms), an aryl group (preferably having 6 to 14 carbon atoms), an alkoxy group (preferably having 1 to 20 carbon atoms), a cycloalkoxy group (preferably having 3 to 20 carbon atoms), an acyl group (preferably having 2 to 20 carbon atoms), an acyloxy group (preferably having 2 to 20 carbon atoms), and the like.

In the present invention, the crosslinking agent may be used alone or as a mixture of plural kinds thereof.

When the actinic-ray-sensitive or radiation-sensitive resin composition according to the present invention contains the crosslinking agent, the content of the crosslinking agent is preferably 0.1% by mass to 20% by mass, more preferably 1% by mass to 15% by mass, and even more preferably 2% by mass to 10% by mass of the total solid content of the actinic-ray-sensitive or radiation-sensitive resin composition.

[8] (H) Other Additives

The actinic-ray-sensitive or radiation-sensitive resin composition of the present invention may or may not contain a carboxylic acid onium salt. Examples of the carboxylic acid onium salt include those disclosed in Paragraphs [0605] to [0606] of the specification of US2008/0187860A.

These carboxylic acid onium salts can be synthesized by reacting sulfonium hydroxide, iodonium hydroxide, or ammonium hydroxide with carboxylic acid and silver oxide in an appropriate solvent.

When the actinic-ray-sensitive or radiation-sensitive resin composition contains the carboxylic acid onium salt, the content of the carboxylic acid onium salt is generally 0.1% by mass to 20% by mass, preferably 0.5% by mass to 10% by mass, and more preferably 1% by mass to 7% by mass based on the total solid content of the composition.

The actinic-ray-sensitive or radiation-sensitive resin composition of the present invention can optionally further contain a dye, a plasticizer, a photosensitizer, a light absorber, an alkali-soluble resin, a dissolution inhibitor, and a compound (for example, a phenol compound having a molecular weight of 1000 or less, or an alicyclic or aliphatic compound having a carboxyl group) promoting solubility with respect to a developer, and the like. Needless to say, the total solid content amount of the respective components that constitute the actinic-ray-sensitive or radiation-sensitive resin composition does not exceed 100% by mass.

A person skilled in the art can easily synthesize the phenol compound having a molecular weight of 1000 or less with reference to methods disclosed in, for example, JP1992-122938A (JP-H4-122938A), JP1990-28531A (JP-H2-28531A), U.S. Pat. No. 4,916,210A, EP219294B, and the like.

Specific examples of the alicyclic or aliphatic compound having a carboxyl group include carboxylic acid derivatives having a steroid structure such as cholic acid, deoxycholic acid, and lithocholic acid, adamantane carboxylic acid derivatives, adamantane dicarboxylic acid, cyclohexane carboxylic acid, cyclohexane dicarboxylic acid, and the like, but the present invention is not limited thereto.

The solid content concentration of the actinic-ray-sensitive or radiation-sensitive resin composition of the present invention is generally 1.0% by mass to 10% by mass, preferably 2.0% by mass to 5.7% by mass, and more preferably 2.0% by mass to 5.3% by mass. By setting the solid content concentration within the above range, a resist solution can be evenly coated onto a substrate, and a resist pattern that is excellent in the line edge roughness can be formed. Though unclear, the reason is assumed to be that, by setting the solid content concentration to 10% by mass or less, preferably 5.7% by mass or less, the aggregation of a material, particularly, the photoacid-generating agent in the resist solution is inhibited, and consequently, a uniform resist film can be formed.

The solid content concentration is percent by weight of the weight of resist components excluding a solvent, based on the total weight of the actinic-ray-sensitive or radiation-sensitive resin composition.

To use the actinic-ray-sensitive or radiation-sensitive resin composition of the present invention, the above-described components are dissolved in a solvent, followed by filtering through a filter, and coated on a support. The pore size of the filter is 0.1 μm or less, more preferably 0.05 μm or less, and even more preferably 0.03 μm or less, and the filter is preferably made of polytetrafluoroethylene, polyethylene, or nylon. Moreover, a plurality of filters may be used by being connected in series or in parallel, and the composition may be filtered a plurality of times. In addition, the composition may be subjected to deaeration treatment before and after the filtering.

[9] Pattern Forming Method

The pattern forming method (negative pattern forming method) of the present invention includes at least (1) forming a film (resist film) using an actinic-ray-sensitive or radiation-sensitive resin composition, (2) exposing the film, and (3) developing the exposed film using a developer that contains an organic solvent.

The resist film is formed of the above-described actinic-ray-sensitive or radiation-sensitive resin composition of the present invention. More specifically, the resist film is preferably formed on a substrate. In the pattern forming method of the present invention, forming the film using an actinic-ray-sensitive or radiation-sensitive resin composition on a substrate, exposing the film, and developing can be performed by a generally known method.

The present invention also includes an actinic-ray-sensitive or radiation-sensitive resin composition to be provided for the above pattern forming method. That is, the present invention includes an actinic-ray-sensitive or radiation-sensitive resin composition for organic solvent development that contains a resin (A) and a compound (B) which has a polymerizable group and generates an acid by being irradiated with actinic rays or radiations. Herein, "for organic solvent development" means the use for which the composition is at least provided in the above step (3).

Before the film is exposed after being formed, the pattern forming method preferably also includes prebake (PB).

In addition, after the exposing and before the developing, the pattern forming method preferably also includes Post Exposure Bake (PEB).

In both the PB and PEB, the baking temperature is preferably 70° C. to 120° C., and more preferably 80° C. to 110° C.

The baking time is preferably 30 seconds to 300 seconds, more preferably 30 seconds to 180 seconds, and even more preferably 30 seconds to 90 seconds.

The baking can be performed using a unit provided to a general exposing and developing machine, and a hot plate or the like may also be used.

By the baking, the reaction of the exposed portion is promoted, and the sensitivity or pattern profile is improved.

There is no limitation on the wavelength of a light source used for an exposure apparatus in the present invention, and a KrF excimer laser wavelength (248 nm), an ArF excimer laser wavelength (193 nm), and an $F_2$ excimer laser wavelength (157 nm), and the like are applicable.

To the exposing of the present invention, liquid immersion exposure can be applied.

The liquid immersion exposure is a technique for improving resolving power, which is a technique of filling a liquid (also referred to as a "liquid for liquid immersion" hereinafter) having a high refractive index between a projection lens and a sample so as to perform exposure.

As described above, provided that $X_0$ is a wavelength of exposure light in the air, n is a refractive index of a liquid for liquid immersion with respect to the air, and that θ is a beam convergence half angle which is $NA_0=\sin\theta$, when the liquid immersion is performed, the "effect of liquid immersion" can be indicated by calculating the resolving power and depth of focus from the following formulae. Herein, $k_1$ and $k_2$ are coefficients relating to the process.

$$(\text{Resolving power})=k_1\cdot(\lambda_0/n)NA_0$$

$$(\text{Depth of focus})=\pm k_2\cdot(\lambda_0/n)NA_0^2$$

That is, the effect of liquid immersion is equivalent to the effect obtained when an exposure wavelength of 1/n is used. In other words, in a case of a projection optical system of the same NA, the depth of focus can be increased n-fold by the liquid immersion. The liquid immersion is effective for various pattern shapes and can be combined with super resolution techniques such as a phase shift method and a modified illumination method that are being examined currently.

When the liquid immersion exposure is performed, (1) before the film is exposed after being formed on a substrate and/or (2) before the film is baked after being exposed through the liquid for liquid immersion, the film surface may be washed with an aqueous chemical liquid.

The liquid for liquid immersion is preferably a liquid which is transparent to the exposure wavelength and has as small a temperature coefficient of a refractive index as possible so as to minimize the distortion of an optical image projected onto the film. Particularly, when the exposure light source is an ArF excimer laser (wavelength: 193 nm), it is preferable to use water in respect that water is easily obtained and handled, in addition to the above-described viewpoints.

When water is used, an additive (liquid) which decreases the surface tension of water and increases surfactant potency may be added in a slight proportion. As the additive, a material which does not dissolve the resist film on a wafer and negligibly affects an optical coat of the lower surface of a lens element is preferable.

As the additive, for example, an aliphatic alcohol that has almost the same refractive index as that of water is preferable, and specific examples thereof include methyl alcohol, ethyl alcohol, isopropyl alcohol, and the like. By adding the alcohol having almost the same refractive index as that of water, an advantage that even if the concentration of the alcohol contained in the water changes due to evaporation of the alcohol component, change in refractive index caused in an overall liquid can be minimized is obtained.

When a substance that is opaque to light of 193 nm and impurities that have a refractive index greatly differing from that of water are mixed in, since the optical image projected onto the resist is distorted, distilled water is preferable as water to be used. In addition, pure water filtered through an ion exchange filter or the like may be used.

In the present invention, the substrate for forming a film is not particularly limited, and inorganic substrates such as silicon, SiN, $SiO_2$, and SiN, a coated inorganic substrate such as SOG, and the like which are generally used in a production process of a semiconductor such as IC, a production process of a circuit board of a liquid crystal, a thermal head, or the like, and other lithography processes of photofabrication can be used. In addition, an organic antireflection film may be optionally formed between the film and the substrate.

When the pattern forming method of the present invention further includes developing using an alkaline developer, as the alkaline developer, for example, an aqueous alkaline solution of inorganic alkalies such as sodium hydroxide, potassium hydroxide, sodium carbonate, sodium silicate, sodium metasilicate, and aqueous ammonia; primary amines such as ethylamine and n-propylamine; secondary amines such as diethylamine, and di-n-butylamine; tertiary amines such as triethylamine and methyl diethylamine; alcohol amines such as dimethylethanolamine and triethanolamine; quaternary ammonium salts such as tetramethyl ammonium hydroxide and tetraethyl ammonium hydroxide; and cyclic amines such as pyrrole and piperidine can be used.

In addition, to the above aqueous alkaline solution, alcohols and a surfactant can be added in an appropriate amount for use.

An alkali concentration of the alkaline developer is generally 0.1% by mass to 20% by mass.

A pH of the alkaline developer is generally 10.0 to 15.0.

Particularly, a 2.38% by mass aqueous tetramethylammonium hydroxide solution is desirable.

As a rinsing liquid used in rinsing treatment performed after alkali development, pure water is used, and a surfactant may be added thereto in an appropriate amount for use.

As the developer (hereinafter, also referred to as an organic developer) used in the developing using a developer that contains an organic solvent, a polar solvent such as a ketone-based solvent, an ester-based solvent, an alcohol-based solvent, an amide-based solvent, or an ether-based solvent and a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, dissobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, and the like.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, methyl formate, ethyl formate, butyl formate, propyl formate, ethyl lactate, butyl lactate, propyl lactate, and the like.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, or n-decanol; glycol-based solvents such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxymethyl butanol; and the like.

Examples of the ether-based solvent include dioxane, tetrahydrofuran, and the like in addition to the above-described glycol ether-based solvents.

As the amide-based solvent, for example, N-methyl-2-pyrrolidone, N,N-dimethylacetamide, N,N-di emtylformamide, hexamethyl phosphoric triamide, 1,3-dimethyl-2-imidazolidinone, and the like can be used.

Examples of the hydrocarbon-based solvent include an aromatic hydrocarbon-based solvent such as toluene or xylene and an aliphatic hydrocarbon-based solvent such as pentane, hexane, octane, or decane.

The above solvent may be used as a mixture of plural kinds thereof or used by being mixed with a solvent other than the above solvents and with water. Here, in order to sufficiently bring about the effects of the present invention, the moisture content in the whole developer is preferably less than 10% by mass, and it is more preferable that the developer substantially do not contain moisture.

That is, the amount of the organic solvent used in the organic developer is preferably 90% by mass to 100% by mass, and more preferably 95% by mass to 100% by mass, based on the total amount of the developer.

Particularly, the organic developer preferably is a developer containing at least one kind of organic solvent selected from a group consisting of a ketone-based solvent, an ester-based solvent, an alcohol-based solvent, an amide-based solvent, and an ether-based solvent.

The vapor pressure of the organic developer is preferably 5 kPa or lower, more preferably 3 kPa or lower, and particularly preferably 2 kPa or lower at 20° C. If the vapor pressure of the organic developer is 5 kPa or lower, the developer is inhibited from being vaporized on the substrate or in a development cup, and the temperature uniformity in a wafer surface is improved. As a result, dimensional uniformity in the wafer surface is improved.

Specific examples of the organic developer having a vapor pressure of 5 kPa or lower include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, or methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, butyl formate, propyl formate, ethyl lactate, butyl lactate, or propyl lactate, an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, or n-decanol; a glycol-based solvent such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxymethyl butanol; an ether-based solvent such as tetrahydrofuran; an amide-based solvent such as N-methyl-2-pyrrolidone, N,N-dimethylacetamide, or N,N-dimethylformamide; an aromatic hydrocarbon-based solvent such as toluene or xylene; and an aliphatic hydrocarbon-based solvent such as octane or decane.

Specific examples of the organic developer having a vapor pressure of 2 kPa or lower which is a particularly preferable range include a ketone-based solvent such as 1-octanone, 2-octanone, 1-nonanone, 2-nonanone, 4-heptanone, 2-hexanone, diisobutyl ketone, cyclohexanone, methyl cyclohexanone, or phenyl acetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, ethyl lactate, butyl lactate, or propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol, or n-decanol; a glycol-based solvent such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxymethyl butanol; an amide-based solvent such as N-methyl-2-pyrrolidone, N,N-dimethylacetamide, or N,N-dimethylformamide; an aromatic hydrocarbon-based solvent such as xylene; and an aliphatic hydrocarbon-based solvent such as octane or decane.

To the organic developer, a surfactant can be optionally added in an appropriate amount.

The surfactant is not particularly limited, and for example, ionic or nonionic fluorine-based surfactants and/or silicon-based surfactants can be used. Examples of these fluorine-based surfactants and/or silicon-based surfactants include surfactants disclosed in JP1987-36663A (JP-S62-36663A), JP1986-226746A (JP-S61-226746A), JP1986-226745A (JP-S61-226745A), JP1987-170950A (JP-S62-170950A), W1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), the specification of U.S. Pat. No. 5,405,720A, the specification of U.S. Pat. No. 5,360,692A, the specification of U.S. Pat. No. 5,529,881A, the specification of U.S. Pat. No. 5,296,330A, the specification of U.S. Pat. No. 5,436,098A, the specification of U.S. Pat. No. 5,576,143A, the specification of U.S. Pat. No. 5,294,511A, and the specification of U.S. Pat. No. 5,824,451A, and among these, nonionic surfactants are preferable. The nonionic surfactant is not particularly limited, but it is more preferable to use fluorine-based surfactants or silicon-based surfactants.

The amount of the surfactant used is generally 0.001% by mass to 5% by mass, preferably 0.005% by mass to 2% by mass, and even more preferably 0.01% by mass to 0.5% by mass, based on the total amount of the developer.

As the developing method, for example, a method (dipping) of dipping a substrate in a tank filled with a developer for a certain time, a method (paddling) in which a developer is heaped on the substrate surface by surface tension and stopped as it is for a certain time to perform developing, a method (spraying) of spraying a developer to the substrate surface, a method (dynamic dispense method) in which a developer is continuously discharged onto a substrate which rotates at a constant speed while a developer-discharging nozzle is scanned at a constant speed, and the like can be applied.

When the above various developing methods include discharging of developer to the resist film from a developing nozzle of the developing apparatus, the discharge pressure (flow rate of the discharged developer per unit area) of the discharged developer is preferably 2 mL/sec/mm$^2$ or less, more preferably 1.5 mL/sec/mm$^2$ or less, and even more preferably 1 mL/sec/mm$^2$ or less. The lower limit of the flow rate is not particularly limited, but in consideration of throughput, the lower limit is preferably 0.2 mL/sec/mm$^2$ or higher.

If the discharge pressure of the discharged developer is in the above range, pattern defectiveness caused by resist residue remaining after developing can be markedly reduced.

The detail of the mechanism is unclear, but presumably, it is considered that, if the discharge pressure is set within the above range, the pressure that the developer applies to the resist film is reduced, whereby a phenomenon in which the resist film or the resist pattern is accidently scraped and collapsed is inhibited.

The discharge pressure (mL/sec/mm$^2$) of the developer is a value of pressure in the outlet of the developing nozzle of the developing apparatus.

Examples of methods of adjusting the discharge pressure of the developer include a method of adjusting the discharge pressure by using a pump, a method of changing the discharge pressure by adjusting the pressure by means of providing pressure from a pressurizing tank, and the like.

In addition, after the developing using a developer that contains an organic solvent, the developing may be stopped while the organic solvent is substituted with another solvent.

After the developing using a developer that contains an organic solvent, it is preferable to wash the resist film with a rinsing liquid.

The rinsing liquid used in rinsing that is performed after the developing using a developer that contains an organic solvent is not particularly limited so long as the rinsing liquid does not dissolve the resist pattern, and a solution containing a general organic solvent can be used as the rinsing liquid. As the rinsing liquid, it is preferable to use a rinsing liquid containing at least one kind of organic solvent selected from a group consisting of a hydrocarbon-based solvent, a ketone-based solvent, an ester-based solvent, an alcohol-based solvent, an amide-based solvent, and an ether-based solvent.

Specific examples of the hydrocarbon-based solvent, ketone-based solvent, ester-based solvent, alcohol-based solvent, amide-based solvent, and ether-based solvent include the same ones as those described for the developer containing an organic solvent.

After the developing using a developer that contains an organic solvent, rinsing is performed more preferably using a rinsing liquid containing at least one kind of organic solvent selected from a group consisting of a ketone-based solvent, an ester-based solvent, an alcohol-based solvent, and an amide-based solvent, even more preferably using a rinsing liquid containing an alcohol-based solvent or an ester-based solvent, particularly preferably using a rinsing liquid containing a monohydric alcohol, and most preferably using a rinsing liquid containing a monohydric alcohol having 5 or more carbon atoms.

Examples of the monohydric alcohol used in the rinsing include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and the like can be used. As particularly preferable monohydric alcohols having 5 or more carbon atoms, 1-hexanol, 2-hexanol, 4-methyl-2-pentanol, 1-pentanol, 3-methyl-1-butanol, and the like can be used.

The respective components described above may be used as a mixture of plural kinds thereof, or may be used by being mixed with organic solvents other than the above ones.

The moisture content in the rinsing liquid is preferably 10% by mass or less, more preferably 5% by mass or less, and particularly preferably 3% by mass or less. If the moisture content is 10% by mass or less, excellent development properties can be obtained.

The vapor pressure of the rinsing liquid used after the developing using a developer that contains an organic solvent is preferably 0.05 kPa to 5 kPa, more preferably 0.1 kPa to 5 kPa, and most preferably 0.12 kPa to 3 kPa at 20° C. If the vapor pressure of the rinsing liquid is 0.05 kPa to 5 kPa, the temperature uniformity in the wafer surface is improved, and swelling caused by the permeation of the rinsing liquid is inhibited, whereby the dimensional uniformity in the wafer surface is improved.

The rinsing liquid to which a surfactant has been added in an appropriate amount can also be used.

In the rinsing, the wafer having undergone the developing using a developer that contains an organic solvent is washed with the rinsing liquid containing the above organic solvent. There is no particular limitation of the washing method, and for example, a method (rotation coating) of continuously discharging the rinsing liquid onto a substrate rotating at a constant speed, a method (dipping) of dipping the substrate in a tank filled with the rinsing liquid for a certain time, a method (spraying) of spraying the rinsing liquid to the substrate surface, and the like can be applied. Among these, it is preferable to wash the wafer by the rotation coating and rotate the washed substrate at a frequency of rotation of 2000 rpm to 4000 rpm so as to remove the rinsing liquid from the substrate. In addition, it is preferable to add post bake after the rinsing. By the baking, the developer and rinsing liquid remaining between or in the patterns are removed. The baking after rinsing is generally performed at 40° C. to 160° C., preferably at 70° C. to 95° C. generally for 10 seconds to 3 minutes, and preferably for 30 seconds to 90 seconds.

EXAMPLES

Hereinafter, the present invention will be described in more detail based on examples, but the content of the present invention is not limited thereto.

<Resin (A)>
The resins (P-1) to (P-13) shown below were synthesized in the following manner.
(P-1)
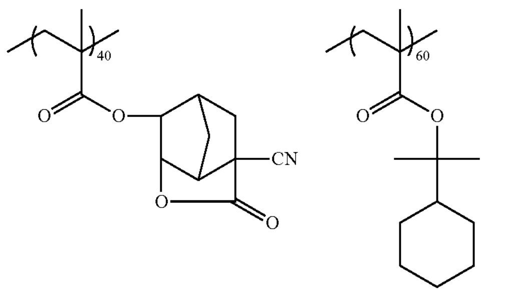
Mw = 9200
Mw/Mn = 1.78
(P-2)
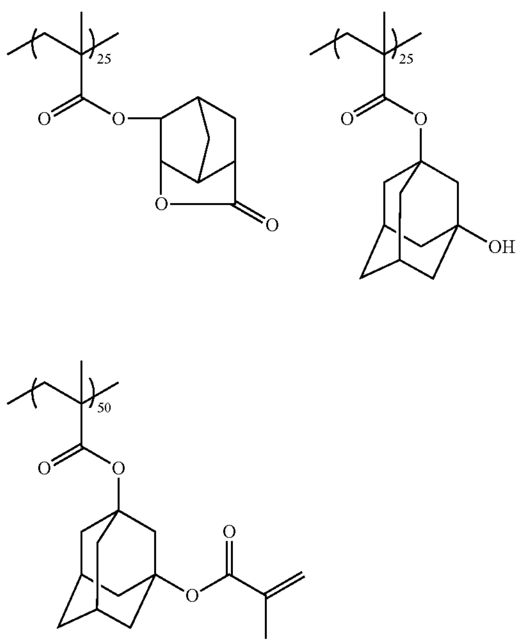
Mw = 12000
Mw/Mn = 1.64
(P-3)
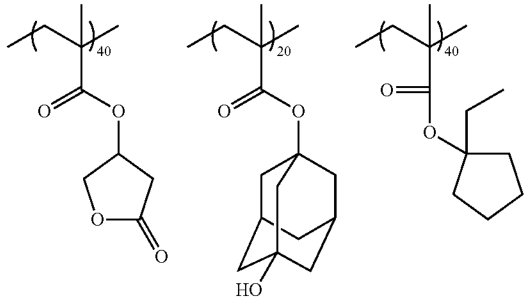
Mw = 7800
Mw/Mn = 1.65
-continued
(P-4)
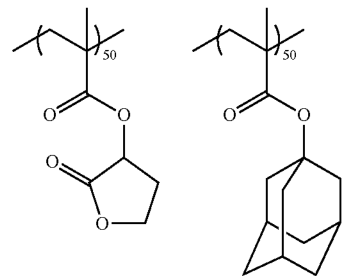
Mw = 15000
Mw/Mn = 1.66
(P-5)
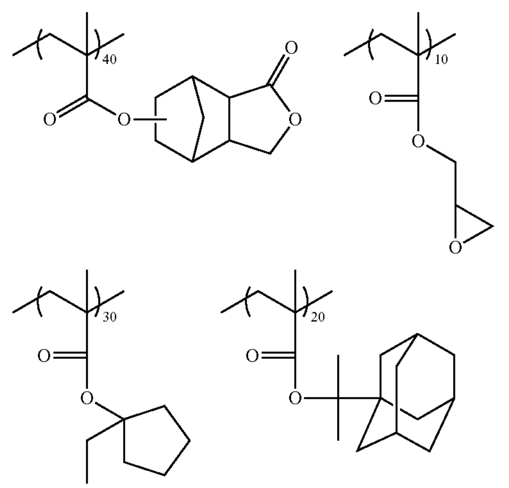
Mw = 18900
Mw/Mn = 1.55
(P-6)
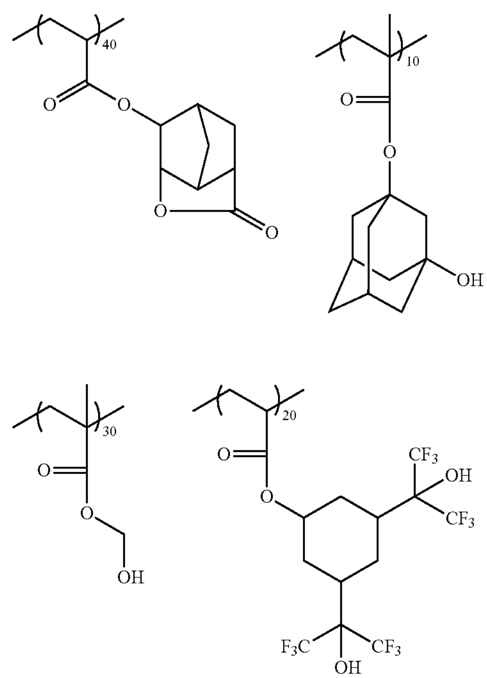
Mw = 8600
Mw/Mn = 1.70

-continued
(P-7)
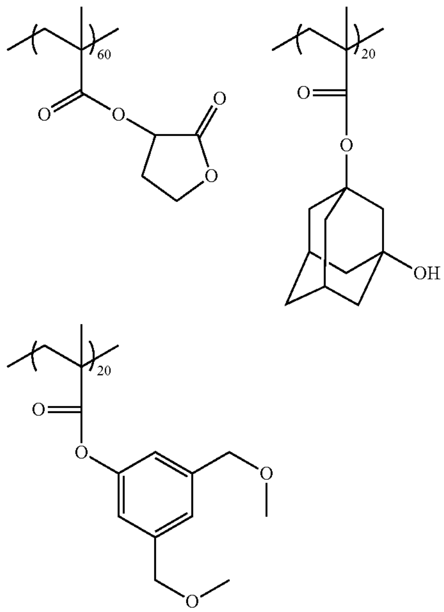
Mw = 11200
Mw/Mn = 1.54
(P-8)
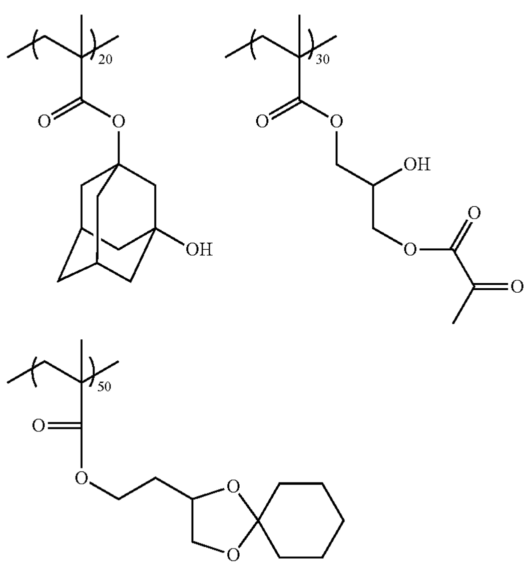
Mw = 14000
Mw/Mn = 1.76
(P-9)
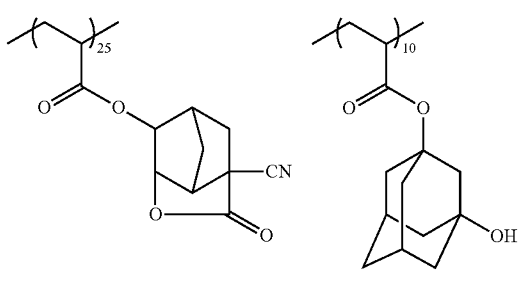
-continued
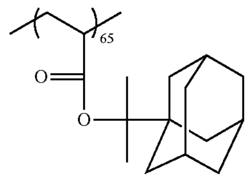
Mw = 6700
Mw/Mn = 1.75
(P-10)
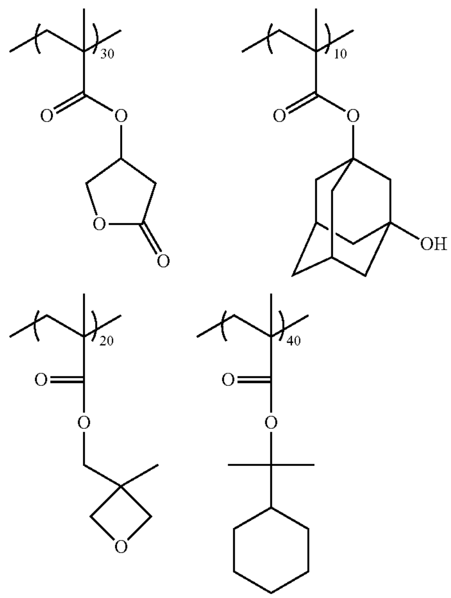
Mw = 7000
Mw/Mn = 1.62
(P-11)
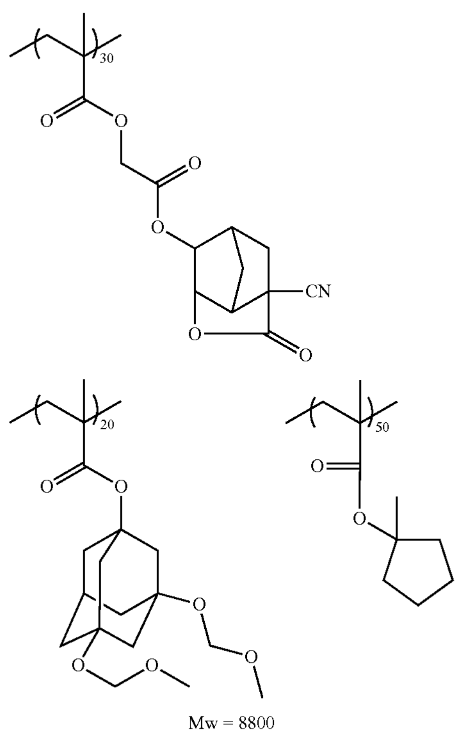
Mw = 8800
Mw/Mn = 1.75

-continued (P-12)

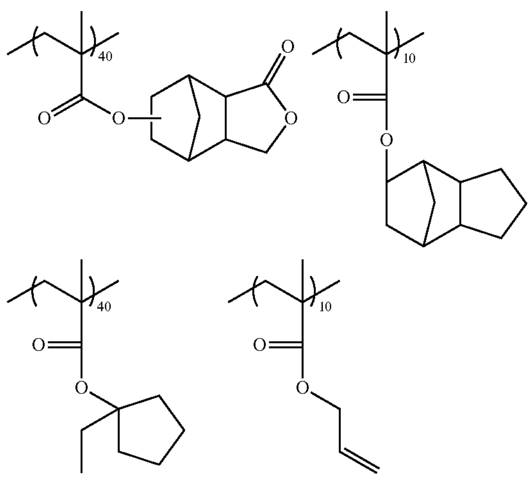

Mw = 12000
Mw/Mn = 1.59

(P-13)

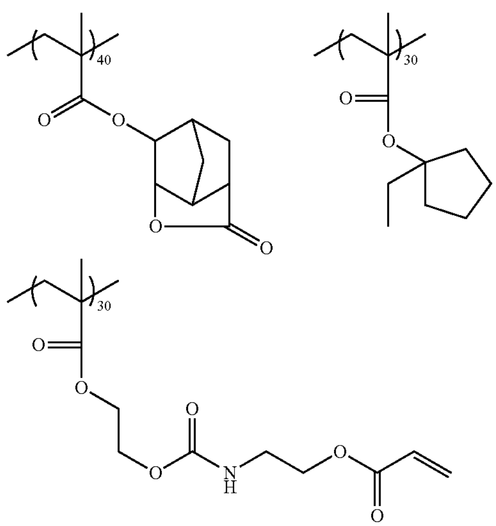

Mw = 8800
Mw/Mn = 1.77

[Synthesis Example of Resin (A)]

First, 200 g of cyclohexanone was introduced to a three-necked flask under a nitrogen gas flow, followed by heating at 80° C., thereby preparing a solvent 1. Subsequently, a monomer-1 (44.5 g) and a monomer-2 (56.8 g) shown below were dissolved in cyclohexanone (373 g), and a polymerization initiator V-601 (manufactured by Wako Pure Chemical Industries, Ltd.) was added thereto at 6.6 mol % based on the total amount of the monomers and dissolved. The thus obtained solution was added dropwise to the solvent 1 for 6 hours, and after the dropwise addition ended, the resultant was allowed to react at 80° C. for 2 hours. After the reaction solution was cooled, the reaction solution was added dropwise to a mixed solvent of heptane 7736 g/ethyl acetate 859 g, and the thus obtained precipitate was collected and dried, thereby obtaining 72 g of a resin (P-1). The weight average molecular weight of the obtained resin (P-1) was 9200, the degree of dispersion (Mw/Mn) was 1.78, and the compositional ratio measured by $^{13}$C-NMR was 40/60.

monomer-1

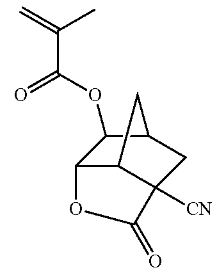

monomer-2

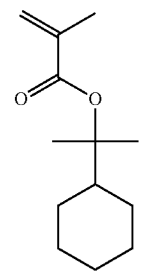

Resins (P-2) to (P-13) were synthesized in the same manner as that of the resin (P-1)

<Acid-Generating Agent>

The above compounds (A1), (A2), (A6), (A9), (A10), (A14), (A16), (A19), (A21), (A23), (A28), (A30), (A34) to (A36), (A40), (A44), (A48), (A50) to (A52), (A54), (A56), and (A60) and the following compounds (Cb-1) and (Cb-2) were synthesized in the following manner.

Cb-1

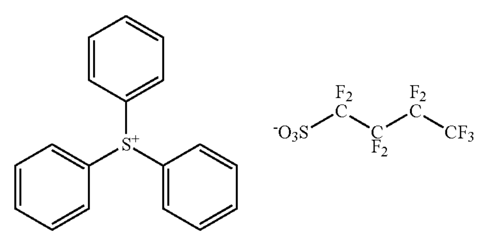

Cb-2

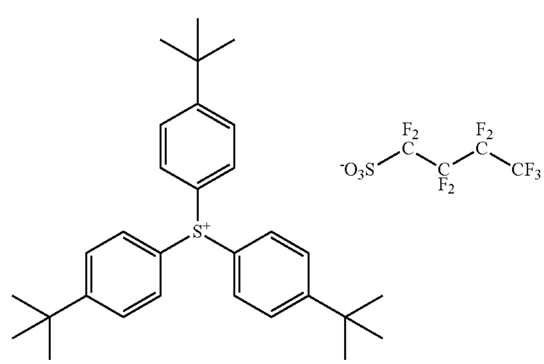

[Synthesis Example of Acid-Generating Agent]

Synthesis of Compound A1

The compound A1 was synthesized by the following scheme.

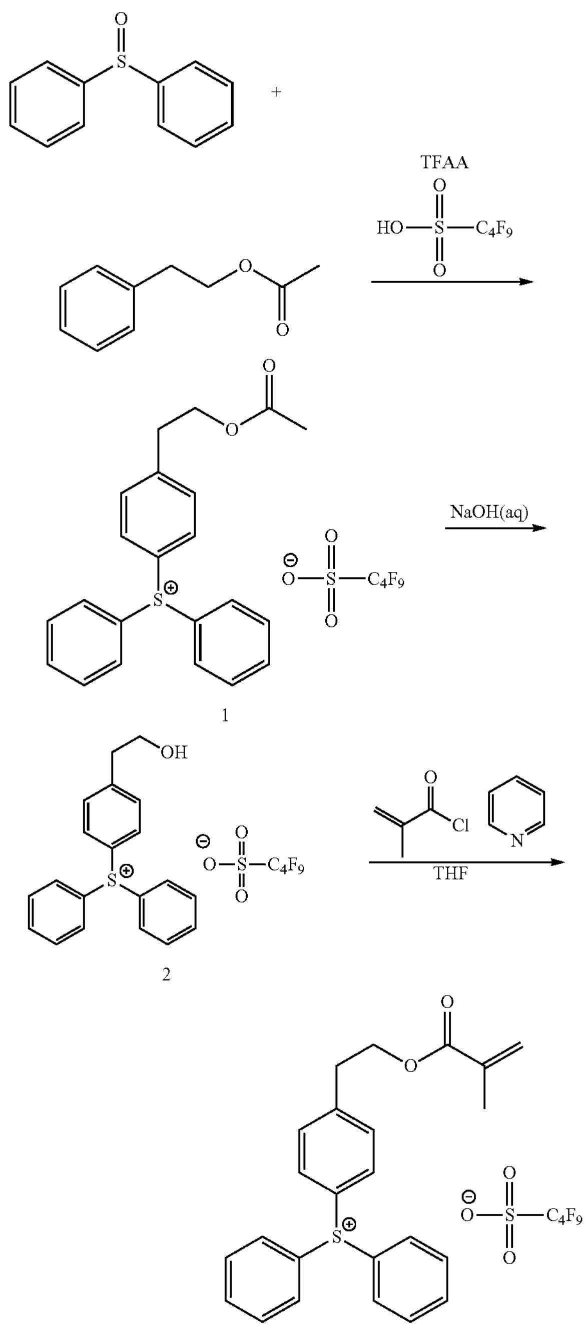

First, 5.12 g (25.3 mmol) of diphenyl sulfoxide was dissolved in 25.0 g (152 mmol) of 2-phenylethyl acetate, and 10.63 g (50.6 mmol) of trifluoroacetic anhydride (TFAA) was added dropwise thereto at 0° C. to 5° C., followed by stirring at 0° C. to 5° C. for 30 minutes. Thereafter, 7.6 g (25.3 mmol) of nonafluorobutane sulfonic acid was added dropwise thereto at 0° C. to 5° C., followed by stirring at 0° C. to 20° C.

for 3 hours. After the reaction, 200 ml of n-hexane was added thereto to perform decantation, followed by vacuum concentration.

To the thus obtained oil, 30 ml of methanol and a solution obtained by dissolving 3.0 g (76 mmol) of sodium hydroxide in 30 ml of water were added, followed by stirring at room temperature for 2 hours. After the reaction, the methanol was distilled away, and 1 N hydrochloric acid was added thereto until the pH became 2. From the thus obtained aqueous layer, the product was extracted using 40 ml of chloroform, and the organic layer was washed with water, followed by vacuum concentration, thereby obtaining 11.7 g (77% yield) of a compound 2.

Second, 10 g (16.5 mmol) of the compound 2 and 1.56 g (19.8 mmol) of pyridine were dissolved in 50 ml of tetrahydrofuran, and 2.07 g (19.8 mmol) of methacrylic acid chloride was added thereto under ice bath cooling. After the resultant was stirred at room temperature for 1 hour, the reaction solution was added to 200 ml of saturated sodium bicarbonate water, whereby the product was extracted using 200 ml of ethyl acetate. The organic layer was washed with water, followed by vacuum concentration, and the resultant was purified by column chromatography (ethyl acetate/methanol=20/1), thereby obtaining 9.8 g (88% yield) of the compound A1.

$^1$H-NMR (400 MHz in DMSO-d6): δ(ppm)=7.90-7.69 (m, 14H), 5.96 (s, 1H), 5.65 (s, 1H), 4.36 (t, 2H), 3.10 (t, 2H), 1.82 (s, 3H)

(A2), (A6), (A9), (A10), (A14), (A16), (A19), (A21), (A23), (A28), (A30), (A34) to (A36), (A40), (A44), (A48), (A50) to (A52), (A54), (A56), and (A60) and the above compounds (Cb-1) and (Cb-2) were synthesized in the same manner as that of (A1).

<Basic Compound>

As basic compounds, the following compounds (N-1) to (N-8) were prepared.

N-1

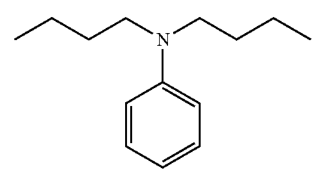

N-2

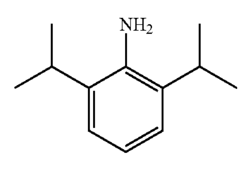

N-3

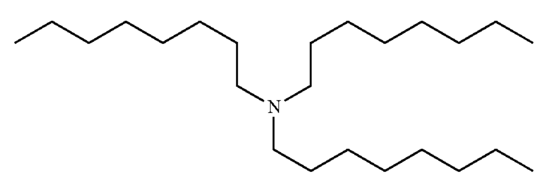

-continued

N-4

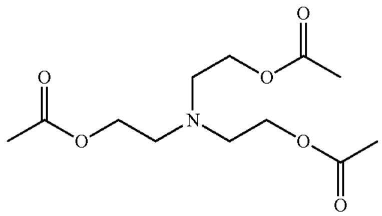

N-5

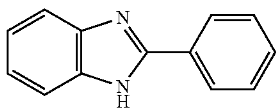

N-6

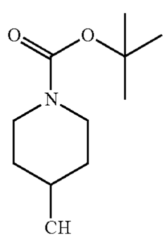

N-7

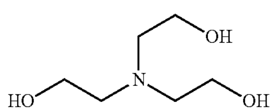

N-8

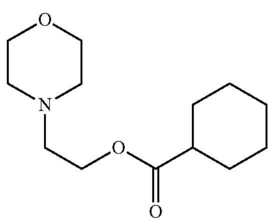

<Hydrophobic Resin>

The hydrophobic resin was used by being appropriately selected form the above-exemplified resins (HR-1) to (HR-90).

The hydrophobic resin (HR-83) was synthesized based on the disclosures of the specification of US2010/0152400A, WO2010/067905A, WO2010/067898A, and the like.

<Crosslinking Agent>

As crosslinking agents, the following ones were used.

L-1: pentaerythritol tetraacrylate

L-2: bis(3-ethyl-3-oxetanylmethyl)ether

L-3: 1,4-butanediol diglycidyl ether

L-4: N,N,N,N-tetra(methoxymethyl)glycoluryl

<Surfactant>

As surfactants, the following ones were prepared

W-1: Megafac F176 (manufactured by DIC CORPORATION; a fluorine-based surfactant)

W-2: Megafac R08 (manufactured by DIC CORPORATION; a fluorine and silicon-based surfactant)

W-3: polysiloxane polymer KP-341 (manufactured by Shin-Etsu Chemical Co., Ltd; a silicon-based surfactant)

W-4: Troysol S-366 (manufactured by Troy Chemical)

W-5: KH-20 (manufactured by Asahi Kasei Corporation)

W-6: PolyFox PF-6320 (manufactured by OMNOVA solution Inc.; a fluorine-based surfactant)

<Solvent>

As solvents, the following ones were prepared.

(A Group)

SL-1: propylene glycol monomethyl ether acetate (PGMEA)

SL-2: propylene glycol monomethyl ether propionate

SL-3: 2-heptanone (B Group)

SL-4: ethyl lactate

SL-5: propylene glycol monomethyl ether (PGME)

SL-6: cyclohexanone (C Group)

SL-7: γ-butyrolactone

SL-8: propylene carbonate

<Developer>

As developers, the following ones were prepared.

SG-1: butyl acetate

SG-2: methyl amyl ketone

SG-3: ethyl-3-ethoxy propionate

SG-4: pentyl acetate

SG-5: isopentyl acetate

SG-6: propylene glycol monomethyl ether acetate

SG-7: cyclohexane

<Rinsing Liquid>

SR-1: 4-methyl-2-pentanol

SR-2: 1-hexanol

SR-3: butyl acetate

SR-4: methyl amyl ketone

SR-5: ethyl-3-ethoxy propionate

<Negative Development>

(Preparation of Resist)

The components shown in the following Table 3 were dissolved in the solvents shown in the same table at 3.5% by mass in terms of a solid content, and the respective solutions were filtered through a polyethylene filter having a pore size of 0.03 μm, thereby preparing actinic-ray-sensitive or radiation-sensitive resin compositions. ARC29SR (manufactured by NISSAN CHEMICAL INDUSTRIES, LTD.) for forming an organic antireflection film was coated onto a silicon wafer, followed by baking at 205° C. for 60 seconds, thereby forming an antireflection film having a film thickness of 95 nm. The actinic-ray-sensitive or radiation-sensitive resin composition was coated onto the antireflection film, followed by baking (PB) at 100° C. for 60 seconds, thereby forming a resist film having a film thickness of 100 nm.

The obtained wafer was subjected to pattern exposure through an exposure mask (line/space=binary mask 60 nm/60 nm) by using an ArF excimer laser liquid immersion scanner (manufactured by ASML; XT 1700i, NA 1.20, C-Quad, outer sigma 0.981, inner sigma 0.895, XY deflection). As the liquid for liquid immersion, ultrapure water was used. Thereafter, the wafer was baked (PEB) at 100° C. for 60 seconds. Next, developing was performed by applying a puddling method with the developer for 30 seconds, and while the developer was shaken off, the wafer was rinsed by applying a puddling method with the rinsing liquid for 30 seconds. Subsequently, the wafer was rotated at a frequency of rotation of 4000 rpm for 30 seconds, followed by baking at 90° C. for 60 seconds. In this manner, a resist pattern with a line and space having a line width of 60 nm (1:1) was obtained.

(Evaluation of Resist)

[Sensitivity (Eopt)]

The obtained pattern was observed using a scanning electron microscope (SEM manufactured by Hitachi, Ltd., S-9380II), and the irradiation energy applied when resolving the resist pattern with a line and space having a line width of 60 nm (1:1) was taken as sensitivity (Eopt). The smaller the value, the higher the sensitivity.

[Resolving Power (Pre-Bridging Dimension)]

In the resist pattern with a line and space having a line width of 60 nm (1:1) used for the sensitivity (Eopt), a minimum space dimension that did not causing bridging defectiveness was observed while changing the exposure amount. The smaller the value, the more difficult it is for the bridging defectiveness to occur, which indicates an excellent performance.

[Line Edge Roughness (LER)]

In the resist pattern with a line and space having a line width of 60 nm (1:1) used for the sensitivity (Eopt), to measure the line edge roughness (nm), a pattern of line and space 1/1 was observed using a scanning electron microscope (SEM) for length measurement. In a 5 range of the edge in the longitudinal direction of the line pattern, a distance from a base line where the edge was supposed to be present was measured at 50 points by using an SEM (manufactured by Hitachi, Ltd S-8840) for distance measurement, and the standard deviation was calculated and 3σ was calculated. The smaller the value, the better the performance.

[Development Time Dependency]

Exposure was performed in the same manner as described above with the exposure amount showing the above sensitivity, and a value, which was obtained by dividing a difference between the line width shown when the developing was performed by by applying a puddling method with the developer for 30 seconds and the line width shown when the developing was performed by applying a puddling method with the developer for 60 seconds by 30, was taken as development time dependency. The smaller the value, the better the performance of the development time dependency. (Development time dependency [nm/sec])=((line width [nm] at the time of 60 seconds of development))−(line width [nm] at the time of 30 seconds of development))/30 [sec]

The evaluation results are shown in the following Table 3.

TABLE 3

| | Resin (A) | (g) | Acid-generating agent | (g) | Hydrophobic resin | (g) | Crosslinking agent | (g) | Basic compound | (g) | Surfactant | (g) |
|---|---|---|---|---|---|---|---|---|---|---|---|---|
| Example | | | | | | | | | | | | |
| 1 | P-1 | 10 | A1 | 0.9 | HR-3 | 0.06 | None | — | N-6 | 0.15 | W-6 | 0.05 |
| 2 | P-2 | 10 | A2 | 1 | HR-9 | 0.06 | None | — | N-8 | 0.15 | W-1 | 0.05 |
| 3 | P-3 | 10 | A54 | 0.9 | HR-9 | 0.06 | None | — | N-7 | 0.15 | W-1 | 0.05 |
| 4 | P-4 | 10 | A50 | 0.8 | HR-9 | 0.06 | None | — | N-6 | 0.15 | W-4 | 0.05 |
| 5 | P-5 | 10 | A14 | 0.9 | HR-3 | 0.06 | None | — | N-7 | 0.15 | W-5 | 0.05 |
| 6 | P-6 | 10 | A10 | 1 | HR-3 | 0.06 | None | — | N-7 | 0.15 | W-6 | 0.05 |
| 7 | P-7 | 10 | A51 | 0.9 | HR-24 | 0.06 | None | — | N-4 | 0.15 | W-5 | 0.05 |
| 8 | P-8 | 10 | A30 | 1.1 | HR-83/HR-24 | 0.03/0.03 | None | — | N-3 | 0.15 | W-6 | 0.05 |
| 9 | P-9 | 10 | A34 | 1 | HR-24 | 0.06 | None | — | N-4 | 0.15 | W-5 | 0.05 |
| 10 | P-10 | 10 | A16 | 1.2 | HR-9 | 0.06 | None | — | N-7 | 0.15 | W-5 | 0.05 |
| 11 | P-11 | 10 | A9 | 0.8 | HR-24 | 0.06 | None | — | N-1 | 0.15 | None | — |
| 12 | P-12 | 10 | A51 | 0.9 | HR-24 | 0.06 | None | — | N-5 | 0.15 | W-6 | 0.05 |
| 13 | P-13 | 10 | A23 | 0.8 | HR-9 | 0.06 | None | — | N-1 | 0.15 | W-2/W-3 | 0.02/0.03 |
| 14 | P-1 | 10 | A9 | 1 | HR-26 | 0.06 | None | — | N-3 | 0.15 | W-4 | 0.05 |
| 15 | P-3 | 10 | A50 | 0.9 | HR-24 | 0.06 | None | — | N-8 | 0.15 | W-1 | 0.05 |
| 16 | P-8 | 10 | A52 | 1 | None | — | None | — | N-6 | 0.15 | W-1 | 0.05 |
| 17 | P-13 | 10 | A10 | 0.8 | HR-26 | 0.06 | None | — | N-3/N-7 | 0.08/0.07 | W-2 | 0.05 |
| 18 | P-8 | 10 | A48 | 1 | HR-24 | 0.06 | None | — | N-2 | 0.15 | W-2 | 0.05 |
| 19 | P-2 | 10 | A14/A44 | 0.6/0.4 | HR-9/HR-24 | 0.04/0.02 | None | — | N-1 | 0.15 | W-3 | 0.04 |
| 20 | P-5/P-13 | 5/5 | A1 | 1.2 | HR-3 | 0.06 | None | — | N-3 | 0.15 | W-1 | 0.05 |
| 21 | P-10 | 10 | A28/Cb-1 | 0.7/0.3 | HR-3 | 0.06 | None | — | N-5 | 0.15 | W-3 | 0.05 |
| 22 | P-1 | 10 | A16 | 0.8 | HR-3 | 0.06 | None | — | N-7 | 0.15 | W-6 | 0.06 |
| 23 | P-4 | 10 | A6 | 1.2 | HR-24 | 0.06 | None | — | N-3 | 0.15 | W-2 | 0.05 |
| 24 | P-7 | 10 | A21 | 1.2 | HR-3 | 0.06 | L-1 | 0.5 | N-4 | 0.15 | W-4 | 0.05 |
| 25 | P-1 | 10 | A19 | 1.4 | HR-9 | 0.06 | L-2 | 0.4 | N-2 | 0.15 | W-3 | 0.05 |
| 26 | P-13 | 10 | A36 | 1 | HR-26 | 0.06 | L-3 | 1 | N-5 | 0.15 | W-2 | 0.05 |
| 27 | P-6 | 10 | A40 | 1 | HR-9 | 0.06 | L-4 | 0.3 | N-4 | 0.15 | W-3 | 0.05 |
| 28 | P-2 | 10 | A56 | 1 | HR-26 | 0.06 | None | — | N-4 | 0.15 | W-2 | 0.05 |
| 29 | P-3 | 10 | A35 | 1 | HR-3 | 0.06 | None | — | N-2 | 0.15 | W-4 | 0.05 |
| 30 | P-9 | 10 | A60 | 1 | HR-3 | 0.06 | None | — | N-4 | 0.15 | W-3 | 0.05 |
| Comparative Example | | | | | | | | | | | | |
| 1 | P-2 | 10 | Cb-1 | 1 | HR-9 | 0.06 | None | — | N-6 | 0.15 | W-3 | 0.05 |
| 2 | P-5 | 10 | Cb-2 | 1 | HR-3 | 0.06 | L-1 | 0.5 | N-8 | 0.15 | W-6 | 0.05 |

| | Solvent | (Mass ratio) | Developer | (Mass ratio) | Rinsing liquid | (Mass ratio) | Sensitivity [mJ/cm$^2$] | Pre-bridge dimensions [nm] | Line edge roughness [nm] | Development time dependency [nm/sec] |
|---|---|---|---|---|---|---|---|---|---|---|
| Example | | | | | | | | | | |
| 1 | SL-3/SL-4 | 80/20 | SG-1/SG-7 | 90/10 | SR-1/SR-5 | 80/20 | 28.4 | 28 | 7.8 | 0.16 |
| 2 | SL-1/SL-5 | 60/40 | SG-3 | 100 | SR-5 | 100 | 31.0 | 29 | 7.9 | 0.15 |
| 3 | SL-1/SL-6 | 80/20 | SG-3/SG-7 | 70/30 | SR-2 | 100 | 29.2 | 28 | 7.6 | 0.18 |
| 4 | SL-3/SL-6 | 70/30 | SG-1 | 100 | SR-5 | 100 | 30.5 | 30 | 7.9 | 0.21 |
| 5 | SL-1/SL-5/SL-7 | 70/20/10 | SG-2 | 100 | SR-3 | 100 | 30.1 | 28 | 7.6 | 0.17 |
| 6 | SL-2/SL-7 | 90/10 | SG-1/SG-3 | 60/40 | SR-1 | 100 | 25.3 | 32 | 7.9 | 0.20 |
| 7 | SL-1/SL-7 | 90/10 | SG-2 | 100 | SR-1/SR-4 | 70/30 | 27.7 | 31 | 7.9 | 0.18 |

TABLE 3-continued

| | | | | | | | | | | |
|---|---|---|---|---|---|---|---|---|---|---|
| 8 | SL-1/SL-5 | 80/20 | SG-3 | 100 | SR-1 | 100 | 27.5 | 27 | 7.4 | 0.15 |
| 9 | SL-1/SL-5 | 70/30 | SG-4 | 100 | SR-2 | 100 | 30.1 | 30 | 8.0 | 0.18 |
| 10 | SL-1/SL-5 | 60/40 | SG-5 | 100 | SR-1 | 100 | 28.8 | 29 | 7.9 | 0.19 |
| 11 | SL-1/SL-6 | 70/30 | SG-1 | 100 | SR-3 | 100 | 26.9 | 30 | 7.9 | 0.17 |
| 12 | SL-1/SL-8 | 90/10 | SG-5 | 100 | SR-3 | 100 | 25.6 | 28 | 7.9 | 0.19 |
| 13 | SL-2/SL-5 | 80/20 | SG-1 | 100 | SR-1 | 100 | 29.8 | 31 | 7.6 | 0.17 |
| 14 | SL-3/SL-6 | 70/30 | SG-5 | 100 | SR-1/SR-3 | 70/30 | 30.9 | 30 | 7.8 | 0.19 |
| 15 | SL-1 | 100 | SG-1 | 100 | SR-1 | 100 | 32.0 | 31 | 7.8 | 0.18 |
| 16 | SL-1/SL-8 | 90/10 | SG-3 | 100 | SR-2 | 100 | 27.4 | 27 | 7.5 | 0.15 |
| 17 | SL-1/SL-6 | 70/30 | SG-2/SG-3 | 50/50 | SR-1 | 100 | 30.1 | 29 | 7.8 | 0.18 |
| 18 | SL-1/SL-6 | 60/40 | SG-1 | 100 | SR-1 | 100 | 28.6 | 26 | 7.4 | 0.16 |
| 19 | SL-3/SL-7 | 90/10 | SG-4 | 100 | SR-2 | 100 | 29.1 | 30 | 7.7 | 0.19 |
| 20 | SL-1/SL-4 | 80/20 | SG-1 | 100 | SR-1/SR-3 | 80/20 | 31.9 | 30 | 7.6 | 0.18 |
| 21 | SL-1/SL-5 | 70/30 | SG-6 | 100 | SR-1 | 100 | 32.2 | 32 | 7.7 | 0.17 |
| 22 | SL-1/SL-6 | 60/40 | SG-1 | 100 | SR-2 | 100 | 31.2 | 31 | 7.9 | 0.18 |
| 23 | SL-2/SL-5 | 70/30 | SG-2 | 100 | SR-1/SR-5 | 90/10 | 27.5 | 30 | 8.0 | 0.20 |
| 24 | SL-1/SL-5/SL-7 | 70/20/10 | SG-1 | 100 | None | — | 26.9 | 29 | 7.9 | 0.12 |
| 25 | SL-1 | 100 | SG-1 | 100 | SR-1 | 100 | 28.6 | 29 | 7.8 | 0.18 |
| 26 | SL-1/SL-5 | 60/40 | SG-2 | 100 | SR-1/SR-4 | 70/30 | 31.9 | 27 | 7.3 | 0.16 |
| 27 | SL-1/SL-5 | 80/20 | SG-6 | 100 | SR-2 | 100 | 27.5 | 30 | 7.8 | 0.18 |
| 28 | SL-1/SL-5 | 60/40 | SG-2/SG-7 | 80/20 | SR-1 | 100 | 30.1 | 28 | 7.7 | 0.17 |
| 29 | SL-1/SL-5 | 60/40 | SG-1/SG-2 | 40/60 | SR-1 | 100 | 29.8 | 28 | 7.6 | 0.17 |
| 30 | SL-1/SL-5 | 60/40 | SG-2/SG-7 | 80/20 | SR-1 | 100 | 29.1 | 29 | 7.7 | 0.17 |
| Comparative Example | | | | | | | | | | |
| 1 | SL-2/SL-5 | 70/30 | SG-1 | 100 | SR-1 | 100 | 35.1 | 38 | 8.5 | 0.28 |
| 2 | SL-1/SL-5 | 60/40 | SG-2 | 100 | SR-2 | 100 | 30.5 | 43 | 8.9 | 0.33 |

From the results shown in Table 3, it can be clearly understood that in the Comparative Examples 1 and 2 that do not contain the acid-generating agent having a polymerizable group, all of the pre-bridging dimension, LER, and development time dependency are great, which shows that the comparative examples are poor in all of the pre-bridging dimension, LER, and development time dependency.

On the other hand, in Examples 1 to 30, all of the pre-bridging dimension, LER, and development time dependency are small, which shows that the examples are excellent in all of the pre-bridging dimension, LER, and development time dependency.

It can be understood that, among the examples, in Examples 1 to 3, 5, 7 to 22, 24 to 26, 28, 29, and 30 in which the resin (A) contains at least either the acid-degradable group or the polymerizable group, all of the pre-bridging dimension, LER, and development time dependency tend to be decreased.

Particularly, it can be understood that, in Examples 5, 8, 10 to 13, 16 to 18, 20, 21, and 26 in which the resin (A) has both the acid-degradable group and the polymerizable group, all of the pre-bridging dimension, LER, and development time dependency tend to be decreased.

What is claimed is:

1. A pattern forming method comprising:

(1) forming a film using an actinic-ray-sensitive or radiation-sensitive resin composition that contains a resin (A) and a compound (B) which has a polymerizable group and generates an acid by being irradiated with actinic rays or radiations;

(2) exposing the film; and (3) developing the exposed film using a developer that contains an organic solvent, wherein a pattern formed in the method is a negative pattern, and the resin (A) is a resin which increases the polarity by the action of an acid to decrease the solubility in a developer containing an organic solvent.

2. The pattern forming method according to claim 1, wherein the content of the organic solvent in the developer that contains the organic solvent is 90% by mass to 100% by mass based on the total amount of the developer.

3. The pattern forming method according to claim 2, wherein the polymerizable group of the compound (B) is an ethylenic unsaturated group, an epoxy group, an oxetane group, or a group represented by the following General Formula (ZII), (ZII)

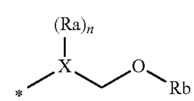

wherein in the General Formula (ZII), X represents an oxygen atom, a nitrogen atom, or an aromatic group having a valency of (n+2), and each of Ra and Rb independently represents a hydrogen atom or a monovalent organic group, n represents an integer of 0 to 6, in a case that X is an oxygen atom, n is 0, in a case that X is a nitrogen atom, n is 1, and in a case that X is an aromatic group having a valency of (n+2), n is an integer of 0 to 6, and

* represents a direct link.

4. The pattern forming method according to claim 3, wherein the compound (B) is a compound having, as the polymerizable group, a (meth)acrylate group, an epoxy group, or a group represented by the General Formula (ZII).

5. The pattern forming method according to claim 1, wherein the polymerizable group of the compound (B) is an ethylenic unsaturated group, an epoxy group, an oxetane group, or a group represented by the following General Formula (ZII), (ZII)

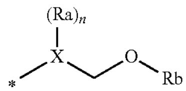

wherein in the General Formula (ZII), X represents an oxygen atom, a nitrogen atom, or an aromatic group having a valency of (n+2), and each of Ra and Rb independently represents a hydrogen atom or a monovalent organic group, n represents an integer of 0 to 6, in a case that X is an oxygen atom, n is 0, in a case that X is a nitrogen atom, n is 1, and in a case that X is an aromatic group having a valency of (n+2), n is an integer of 0 to 6, and

* represents a direct link.

6. The pattern forming method according to claim 5, wherein the compound (B) is a compound having, as the polymerizable group, a (meth)acrylate group, an epoxy group, or a group represented by the General Formula (ZII).

7. The pattern forming method according to claim 1, wherein the compound (B) is an onium salt.

8. The pattern forming method according to claim 1, wherein the resin (A) has a polymerizable group.

9. The pattern forming method according to claim 1, wherein the developer consists essentially of the organic solvent.

10. The pattern forming method according to claim 1, wherein the developer consists of the organic solvent.

11. A pattern forming method comprising:

(1) forming a film using an actinic-ray-sensitive or radiation-sensitive resin composition that contains a resin (A) and a compound (B) which has a polymerizable group and generates an acid by being irradiated with actinic rays or radiations;

(2) exposing the film; and (3) developing the exposed film using a developer that contains an organic solvent, wherein a pattern formed in the method is a negative pattern, the compound (B) includes a non-nucleophilic anion, the anion has the polymerizable group, and the content of the organic solvent in the developer that contains the organic solvent is 90% by mass to 100% by mass based on the total amount of the developer.

12. The pattern forming method according to claim 11, wherein the polymerizable group of the compound (B) is an ethylenic unsaturated group, an epoxy group, an oxetane group, or a group represented by the following General Formula (ZII), (ZII)

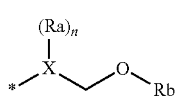

wherein the General Formula (ZII), X represents an oxygen atom, a nitrogen atom, or an aromatic group having a valency of (n+2), and each of Ra and Rb independently represents a hydrogen atom or a monovalent organic group, n represents an integer of 0 to 6, in a case that X is an oxygen atom, n is 0, in a case that X is a nitrogen atom, n is 1, and in a case that X is an aromatic group having a valency of (n+2), n is an integer of 0 to 6, and

* represents a direct link.

13. The pattern forming method according to claim 11, wherein the compound (B) is an onium salt.

14. The pattern forming method according to claim 11, wherein the resin (A) is a resin which increases the polarity by the action of an acid to decrease the solubility in a developer containing an organic solvent.

15. The pattern forming method according to claim 11, wherein the resin (A) has a polymerizable group.

16. A pattern forming method comprising:

(1) forming a film using an actinic-ray-sensitive or radiation-sensitive resin composition that contains a resin (A) and a compound (B) which has a polymerizable group and generates an acid by being irradiated with actinic rays or radiations;

(2) exposing the film; and (3) developing the exposed film using a developer that contains an organic solvent, wherein a pattern formed in the method is a negative pattern, and the polymerizable group of the compound (B) is an epoxy group, an oxetane group, or a group represented by the following General Formula (ZII), (ZII)

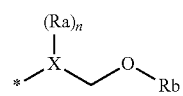

wherein in the General Formula (ZII), X represents an oxygen atom, a nitrogen atom, or an aromatic group having a valency of (n+2), and each of Ra and Rb independently represents a hydrogen atom or a monovalent organic group, n represents an integer of 0 to 6, in a case that X is an oxygen atom, n is 0, in a case that X is a nitrogen atom, n is 1, and in a case that X is an aromatic group having a valency of (n+2), n is an integer of 0 to 6,

* represents a direct link, and the resin (A) is a resin which increases the polarity by the action of an acid to decrease the solubility in a developer containing an organic solvent.

17. The pattern forming method according to claim 16, wherein the content of the organic solvent in the developer that contains the organic solvent is 90% by mass to 100% by mass based on the total amount of the developer.

18. The pattern forming method according to claim 16, wherein the resin (A) has a polymerizable group.

* * * * *